(12) United States Patent
Kimura et al.

(10) Patent No.: US 9,666,604 B2
(45) Date of Patent: May 30, 2017

(54) DISPLAY DEVICE

(71) Applicant: Semiconductor Energy Laboratory Co., Ltd., Atsugi-shi, Kanagawa-ken (JP)

(72) Inventors: Hajime Kimura, Kanagawa (JP); Daisuke Kubota, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/180,316

(22) Filed: Jun. 13, 2016

(65) Prior Publication Data

US 2016/0365367 A1    Dec. 15, 2016

(30) Foreign Application Priority Data

Jun. 15, 2015  (JP) .................................. 2015-120272
May 20, 2016  (JP) .................................. 2016-101794

(51) Int. Cl.
| | |
|---|---|
| *H01L 29/10* | (2006.01) |
| *H01L 29/12* | (2006.01) |
| *H01L 27/12* | (2006.01) |
| *G06F 3/041* | (2006.01) |
| *G06F 3/047* | (2006.01) |
| *G06F 3/044* | (2006.01) |

(52) U.S. Cl.
CPC .......... *H01L 27/1225* (2013.01); *G06F 3/044* (2013.01); *G06F 3/047* (2013.01); *G06F 3/0412* (2013.01)

(58) Field of Classification Search
CPC ............... H01L 27/1225; H01L 29/242; H01L 29/7869; H01L 2924/1067; H01L 27/1214; H01L 27/28; G02F 2001/13606
See application file for complete search history.

(56) References Cited

U.S. PATENT DOCUMENTS

| | | |
|---|---|---|
| 7,674,650 B2 | 3/2010 | Akimoto et al. |
| 7,859,521 B2 | 12/2010 | Hotelling et al. |
| 7,920,129 B2 | 4/2011 | Hotelling et al. |
| 9,317,166 B2 | 4/2016 | Miyazaki et al. |

(Continued)

FOREIGN PATENT DOCUMENTS

| | | |
|---|---|---|
| JP | 2007-096055 A | 4/2007 |
| JP | 2007-123861 A | 5/2007 |

(Continued)

*Primary Examiner* — Sonya D McCall Shepard
(74) *Attorney, Agent, or Firm* — Fish & Richardson P.C.

(57) ABSTRACT

A display device includes a first pixel, a second pixel, a first substrate, and a second substrate. The first pixel includes a first pixel electrode, a first conductive film, and a first transistor. The first pixel electrode is electrically connected to the first transistor. The first conductive film includes a region functioning as a common electrode. The second pixel includes a second pixel electrode, a second conductive film, and a second transistor. The second pixel electrode is electrically connected to the second transistor. The second conductive film includes a region functioning as a common electrode. The first conductive film and the second pixel electrode are provided on the same plane. A first insulating film is provided over the first conductive film and the second pixel electrode. The first pixel electrode and the second conductive film are provided over the first insulating film.

16 Claims, 86 Drawing Sheets

(56) References Cited

U.S. PATENT DOCUMENTS

| | | |
|---|---|---|
| 9,372,569 B2 | 6/2016 | Teramoto |
| 2013/0328812 A1 | 12/2013 | Kim et al. |
| 2014/0168150 A1 | 6/2014 | Kim et al. |
| 2014/0285732 A1 | 9/2014 | Tanabe et al. |
| 2015/0310793 A1 | 10/2015 | Kawashima et al. |
| 2015/0346776 A1 | 12/2015 | Miyake |
| 2015/0372026 A1 | 12/2015 | Sato |
| 2016/0154263 A1 | 6/2016 | Hatsumi et al. |
| 2016/0274398 A1 | 9/2016 | Hirakata et al. |
| 2016/0274699 A1 | 9/2016 | Shishido et al. |
| 2016/0282989 A1 | 9/2016 | Hirakata et al. |
| 2016/0282990 A1 | 9/2016 | Kimura et al. |
| 2016/0299601 A1 | 10/2016 | Yamazaki et al. |

FOREIGN PATENT DOCUMENTS

| | | |
|---|---|---|
| JP | 2009-244958 A | 10/2009 |
| JP | 2011-197685 A | 10/2011 |
| JP | 2014-044537 A | 3/2014 |
| JP | 2014-178847 A | 9/2014 | writing period sensing period

FIG. 69A1
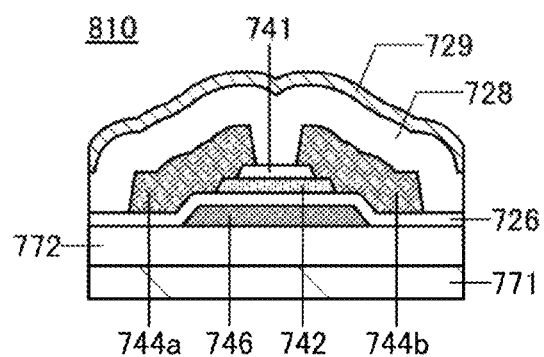
FIG. 69A2
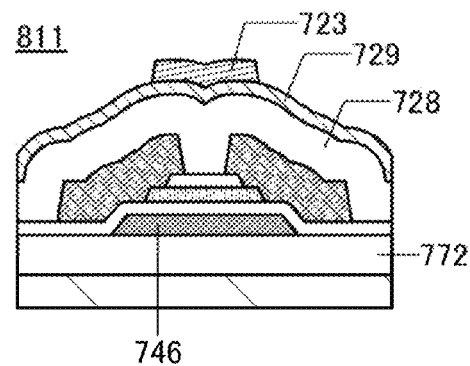
FIG. 69B1
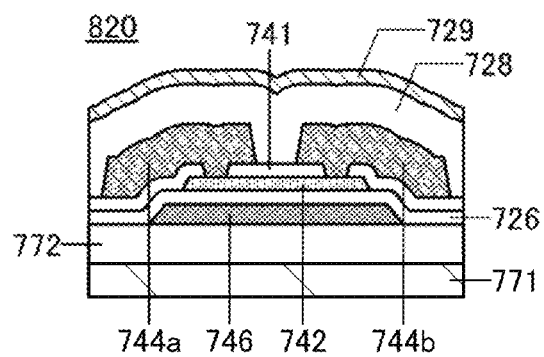
FIG. 69B2
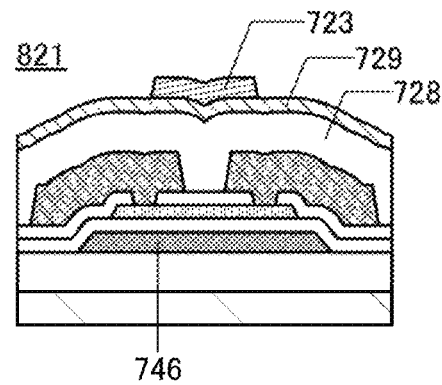
FIG. 69C1
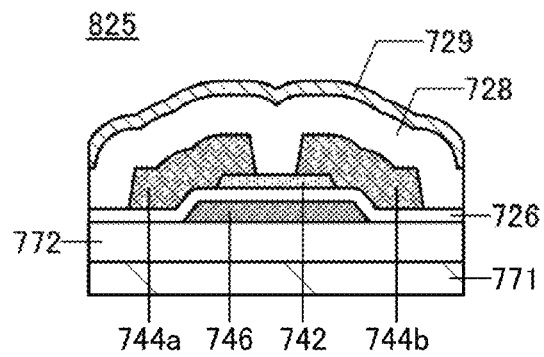
FIG. 69C2
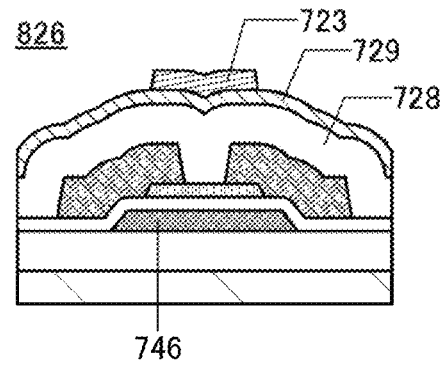

FIG. 70A1
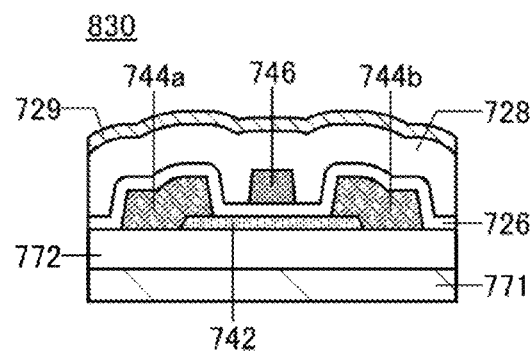
FIG. 70A2
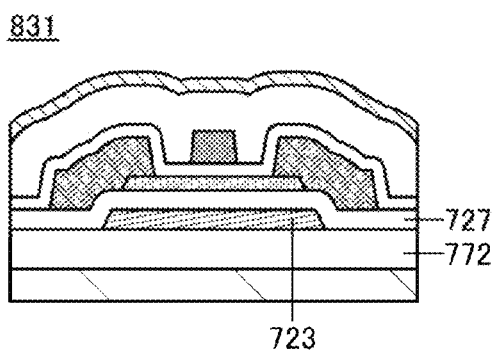
FIG. 70A3
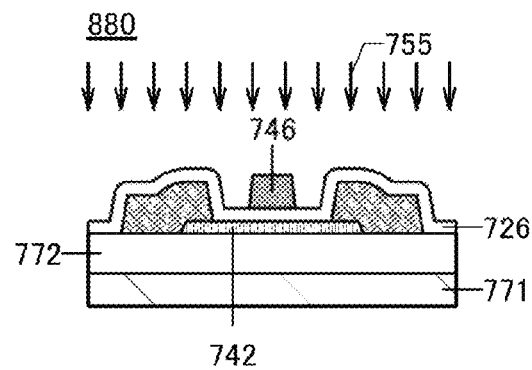
FIG. 70B1
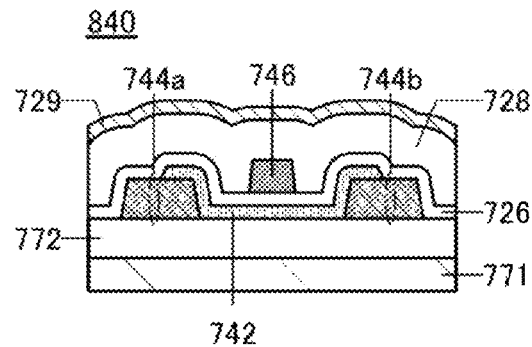
FIG. 70B2
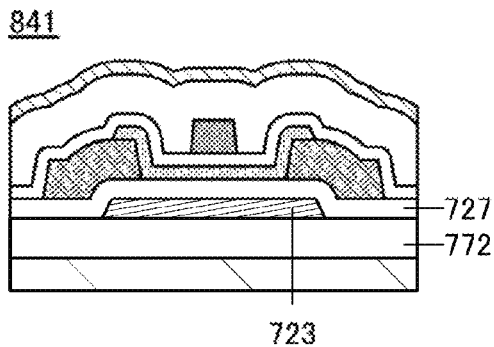

FIG. 71A1
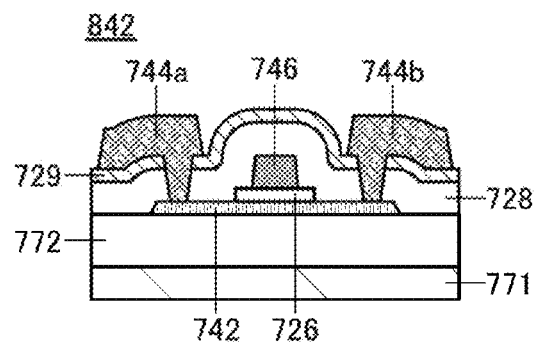
FIG. 71A2
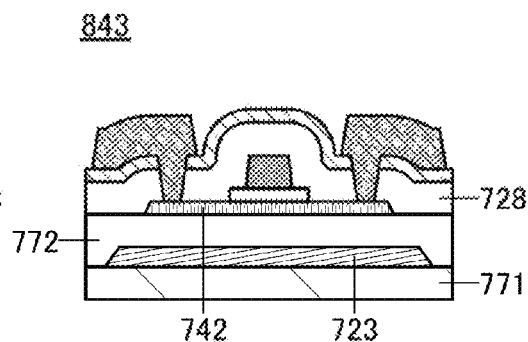
FIG. 71A3
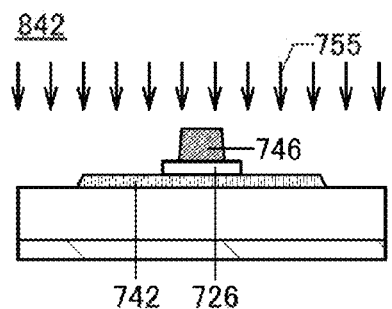
FIG. 71B1
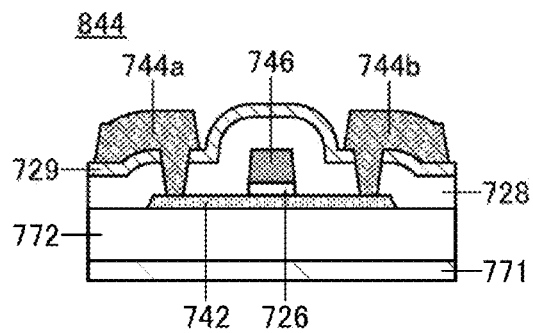
FIG. 71B2
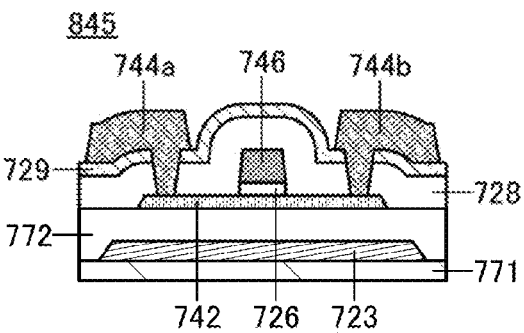
FIG. 71C1
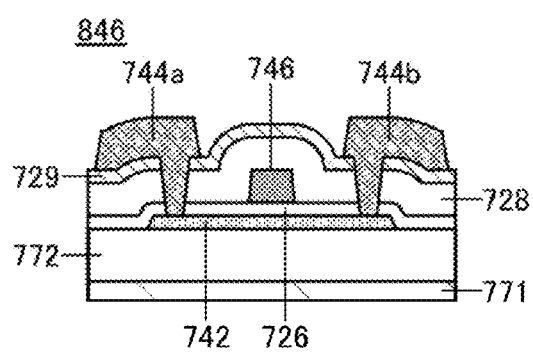
FIG. 71C2
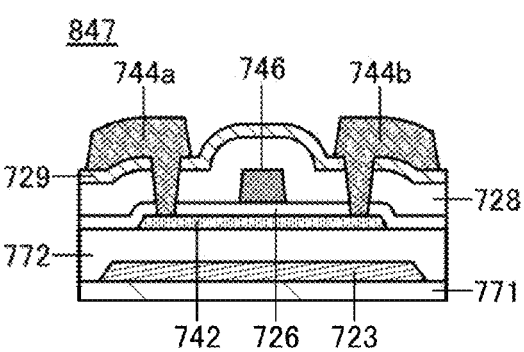

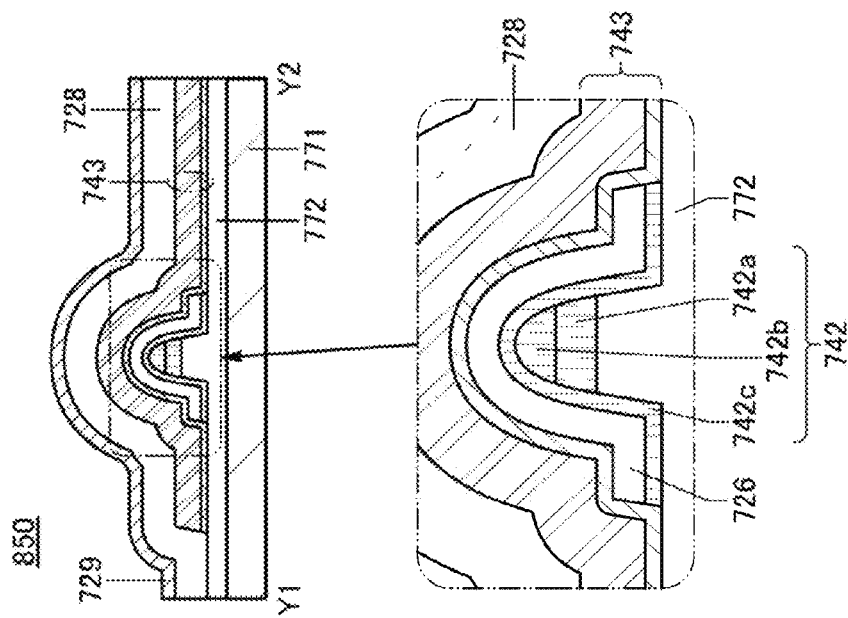
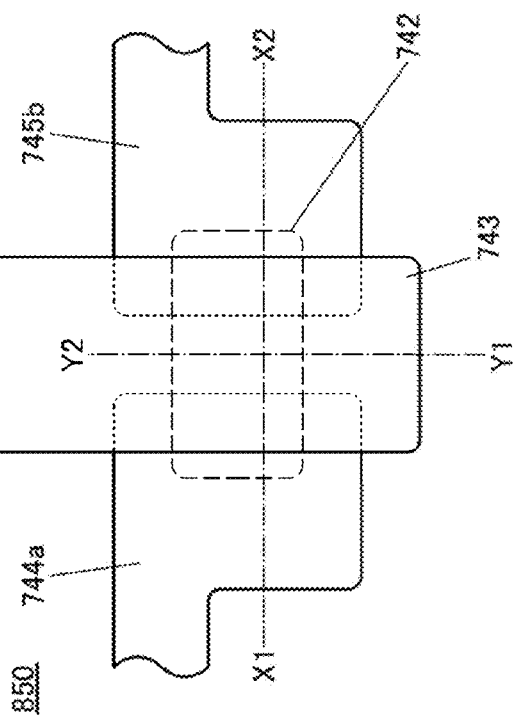
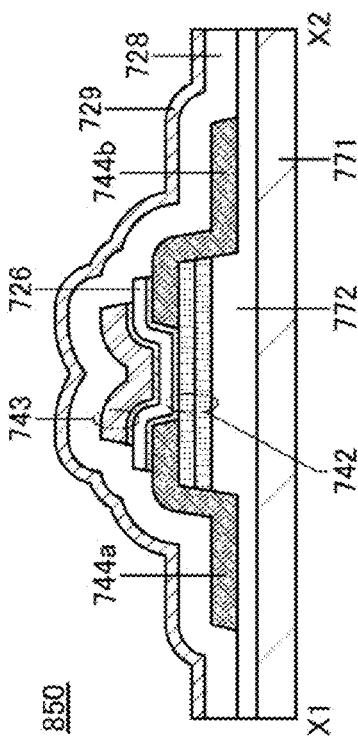

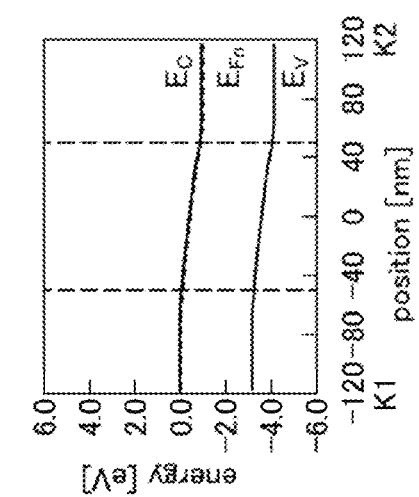
FIG. 78A
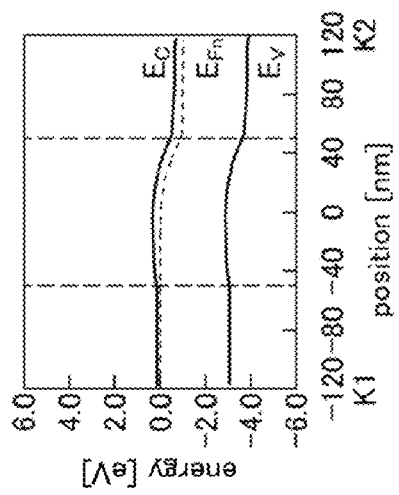
FIG. 78B
FIG. 78C
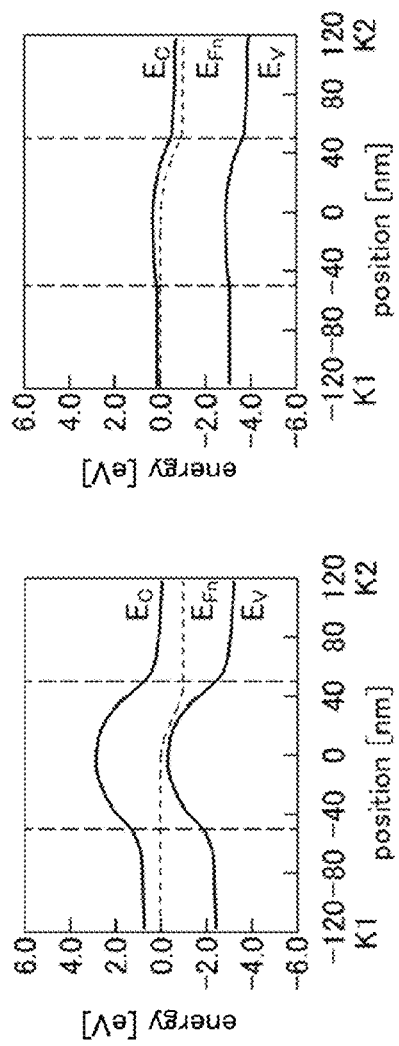
FIG. 78D
FIG. 78E
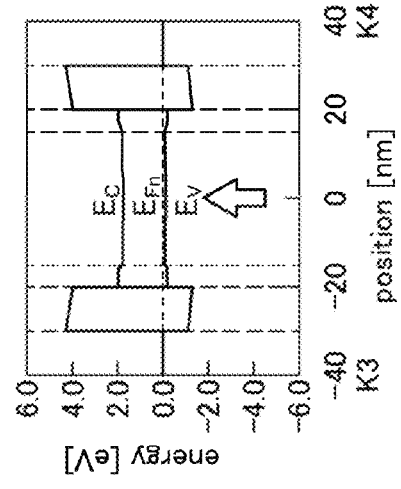
FIG. 78F FIG. 85A plan-view TEM image FIG. 85B cross-sectional TEM image

DISPLAY DEVICE

BACKGROUND OF THE INVENTION

1. Field of the Invention

One embodiment of the present invention relates to a display device. One embodiment of the present invention relates to a touch panel. One embodiment of the present invention relates to a semiconductor device. One embodiment of the present invention relates to an input/output device. One embodiment of the present invention relates to an input device. One embodiment of the present invention relates to a display device with a built-in touch sensor.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an input device, an input/output device, an electro-optical device, a power generation device (including a thin film solar cell, an organic thin film solar cell, and the like), and an electronic device may each include a semiconductor device.

2. Description of the Related Art

In recent years, a display device (or a display module) that is provided with a touch sensor as a position-input means has been put to practical use. A display device (or a display module) that is provided with a touch sensor is called a touch panel, a touch screen, or the like in some cases (hereinafter, this type of display device may be simply referred to as a touch panel). A device which does not include a display device and includes only a touch sensor is also called a touch panel in some cases. A display device that is provided with a touch sensor is also called a touch sensor equipped display device, a display device with a built-in touch sensor, a display device equipped touch panel, a display module, or the like in some cases. A display device that is provided with a touch sensor is simply called a display device in some cases. Furthermore, a display device in which a touch sensor is incorporated is called an in-cell touch sensor, an in-cell touch panel (or an in-cell touch sensor equipped display device), an on-cell touch sensor, an on-cell touch panel (or an on-cell touch sensor equipped display device), or the like in some cases. A display device in which a touch sensor is incorporated is simply called a display device in some cases. In the in-cell touch sensor, for example, an electrode used for a liquid crystal element is also used as an electrode for the touch sensor. In the on-cell touch sensor, for example, an electrode for the touch sensor is formed on the upper side (the side that is not provided with a display element) of a counter substrate. Examples of a portable information terminal provided with such a touch panel or the like include a smartphone and a tablet terminal.

As one of display devices, there is a liquid crystal display device provided with a liquid crystal element. For example, an active matrix liquid crystal display device in which pixel electrodes are arranged in a matrix and transistors are used as switching elements connected to respective pixel electrodes has attracted attention.

For example, an active matrix liquid crystal display device including transistors, in which metal oxide is used for a channel formation region, as switching elements connected to respective pixel electrodes is already known (Patent Documents 1 and 2).

Touch panels in which a liquid crystal element is used are disclosed in Patent Documents 3 to 7.

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-197685
[Patent Document 4] Japanese Published Patent Application No. 2014-044537
[Patent Document 5] Japanese Published Patent Application No. 2014-178847
[Patent Document 6] U.S. Pat. No. 7,920,129
[Patent Document 7] United States Patent Application No. 2013/0328812

SUMMARY OF THE INVENTION

What is desirable is a touch panel in which a display panel (a display device or a display module) is provided with a function of inputting data with a finger, a stylus, or the like touching a screen as a user interface.

Furthermore, it is required that an electronic device using a touch panel is reduced in thickness and weight. Therefore, a touch panel itself is required to be reduced in thickness and weight.

For example, in a touch panel, a touch sensor can be provided on the viewer side (the display surface side), that is, the side a finger or a pen (stylus) touches, of a display panel.

For example, in a touch panel (or a display module), a substrate provided with a touch sensor can be attached to the display surface side of a display panel. In other words, in a touch panel (or a display module), a display panel and a touch sensor can be separate components and can be attached to each other. However, in such a structure, a substrate for a touch sensor is needed in addition to a substrate for a display panel, resulting in that the thickness of a touch panel (or a display module) cannot be reduced and the number of components is increased.

An object of one embodiment of the present invention is to provide a thin touch panel (or a thin touch sensor equipped display device) and the like. Another object is to provide a touch panel (or a touch sensor equipped display device) with a simple structure and the like. Another object is to provide a touch panel (or a touch sensor equipped display device) which can be easily incorporated into an electronic device and the like. Another object is to provide a touch panel (or a touch sensor equipped display device)

with a small number of components and the like. Another object is to provide a lightweight touch panel (or a lightweight touch sensor equipped display device) and the like.

Another object is to provide a novel input device. Another object is to provide a novel input/output device. Another object is to provide a novel display device. Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a display device including a first pixel, a second pixel, a first substrate, and a second substrate. The first pixel and the second pixel are provided over the first substrate. The first pixel includes a first pixel electrode, a first conductive film, and a first transistor. The first pixel electrode is electrically connected to the first transistor. The first conductive film includes a region functioning as a common electrode. The second pixel includes a second pixel electrode, a second conductive film, and a second transistor. The second pixel electrode is electrically connected to the second transistor. The second conductive film includes a region functioning as a common electrode. The first conductive film and the second pixel electrode are provided on the same plane. A first insulating film is provided over the first conductive film and the second pixel electrode. The first pixel electrode and the second conductive film are provided over the first insulating film.

In the above-described display device, in each of the first transistor and the second transistor, a semiconductor layer where a channel is formed preferably includes polycrystalline silicon.

In the above-described display device, in each of the first transistor and the second transistor, a semiconductor layer where a channel is formed preferably includes an oxide semiconductor.

In the above-described display device, the first transistor and the second transistor each include a gate electrode, a gate insulating film over the gate electrode, a first oxide semiconductor film in a position overlapping with the gate electrode over the gate insulating film, a source electrode and a drain electrode electrically connected to the first oxide semiconductor film, a second insulating film over the first oxide semiconductor film, the source electrode, and the drain electrode, and a second oxide semiconductor film in a position overlapping with the first oxide semiconductor film over the second insulating film. The first insulating film is provided over the second oxide semiconductor film so that the second oxide semiconductor film is provided between the first insulating film and the second insulating film. The first conductive film and the second pixel electrode each include the second oxide semiconductor film.

In the above-described display device, the first oxide semiconductor film and the second oxide semiconductor film each preferably contain In, Zn, and oxygen, and the first oxide semiconductor film and the second oxide semiconductor film each preferably contain Al, Ti, Ga, Y, Zr, La, Ce, Nd, Sn, or Hf.

In the above-described display device, the second insulating film may contain oxygen and the first insulating film may contain hydrogen.

The first conductive film serves as a first electrode of a touch sensor, and the second conductive film serves as a second electrode of the touch sensor.

Another embodiment of the present invention is an electronic device including the above-described display device and at least one of a switch, a speaker, and a housing.

In accordance with one embodiment of the present invention, a thin display device (or a thin touch sensor equipped display device) and the like can be provided. A display device (or a touch sensor equipped display device) with a simple structure and the like can be provided. A display device (or a touch sensor equipped display device) which can be easily incorporated into an electronic device and the like can be provided. A display device (or a touch sensor equipped display device) with a small number of components and the like can be provided. A lightweight display device (or a lightweight touch sensor equipped display device) and the like can be provided.

A novel input device can be provided. A novel input/output device can be provided. A novel touch panel can be provided. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 69A1, 69A2, 69B1, 69B2, 69C1, and 69C2 are cross-sectional views each illustrating one embodiment of a transistor;

FIGS. 70A1, 70A2, 70A3, 70B1, and 70B2 are cross-sectional views each illustrating one embodiment of a transistor;

FIGS. 71A1, 71A2, 71A3, 71B1, 71B2, 71C1, and 71C2 are cross-sectional views each illustrating one embodiment of a transistor;

FIGS. 72A to 72C are a plan view and cross-sectional views illustrating one embodiment of a transistor;

FIGS. 78A to 78F each illustrate a band structure;

FIGS. 85A and 85B are TEM images of samples and FIGS. 85C to 85L are electron diffraction patterns thereof.

DETAILED DESCRIPTION OF THE INVENTION

Figure 1A:
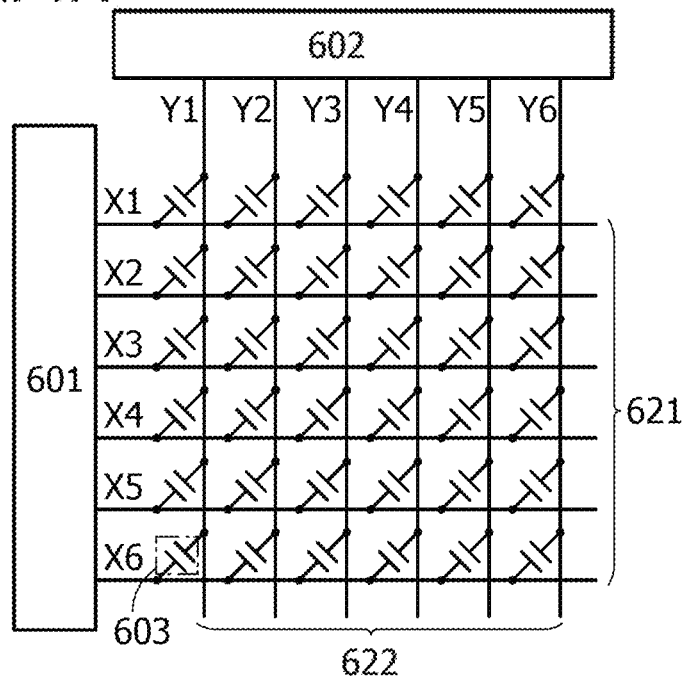
FIGS. 1A and 1B are a block diagram and a timing chart of touch sensors of one embodiment.

Embodiments will be described in detail with reference to the drawings. Note that the present invention is not limited to the description below, and it is easily understood by those skilled in the art that the mode and details can be variously changed without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and the description of such portions is not repeated. Furthermore, the same hatching pattern is applied to portions having similar functions, and the portions are not especially denoted by reference numerals in some cases.

Note that in each drawing referred to in this specification, the size, the layer thickness, or the region of each component is exaggerated for clarity in some cases. Therefore, embodiments of the present invention are not limited to such a scale.

In this specification and the like, ordinal numbers such as "first" and "second" are used in order to avoid confusion among components and do not limit the components numerically.

Note that the terms "film" and "layer" can be interchanged with each other in some cases. For example, in some cases, the term "conductive film" can be used instead of the term "conductive layer", and the term "insulating film" can be used instead of the term "insulating layer".

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification and the like can be called a "conductor" in some cases. Similarly, a "conductor" in this specification and the like can be called a "semiconductor" in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

Embodiment 1

This embodiment describes driving methods, modes, structure examples of a touch sensor or a touch panel of one embodiment of the present invention and structure examples of a semiconductor device of one embodiment of the present invention with reference to drawings.

[Example of Sensing Method of Sensor]

FIG. 1A is a block diagram illustrating structures of mutual capacitive touch sensors. FIG. 1A illustrates a pulse voltage output circuit 601 and a current sensing circuit 602. In FIG. 1A, as an example, six wirings X1 to X6 represent electrodes 621 to which a pulse voltage is applied, and six wirings Y1 to Y6 represent electrodes 622 that sense changes in current. The number of such electrodes is not limited to those illustrated in this example. FIG. 1A also illustrates capacitors 603 each of which is formed with the electrodes 621 and 622 overlapping with each other or being provided close to each other. Note that the functions of the electrodes 621 and 622 can be interchanged with each other. The locations of the pulse voltage output circuit 601 and the current sensing circuit 602 may be interchanged with each other.

The pulse voltage output circuit 601 is, for example, a circuit for sequentially applying a pulse voltage to the wirings X1 to X6. By applying a pulse voltage to the wirings X1 to X6, an electric field between the electrodes 621 and 622 of the capacitor 603 is changed. With a pulse voltage, current flows through the capacitor 603. At this time, the electric field generated between the electrodes is changed by being blocked, when a finger or a stylus exists in the vicinity. That is, for example, by touch with a finger or a stylus, the capacitance of the capacitor 603 is changed. As a result, the amount of current flowing through the capacitor 603 is changed with the pulse voltage. By utilizing the change in capacitance caused by touch with a finger or a stylus as described above, the approach or contact of an object can be sensed.

The current sensing circuit 602 is a circuit for sensing changes in current flowing through the wirings Y1 to Y6 that are caused by the changes in capacitance of the capacitors 603. No change in the current values of the wirings Y1 to Y6 is sensed when there is no approach or contact of an object, whereas a decrease in the current value is sensed when capacitance is decreased owing to the approach or contact of an object. In order to sense a change in current, the total amount of current may be sensed. In that case, an integrator circuit or the like may be used to sense the total amount of current. Alternatively, the peak value of current may be sensed. In that case, current may be converted into voltage, and the peak value of voltage may be sensed.

Figure 1B:
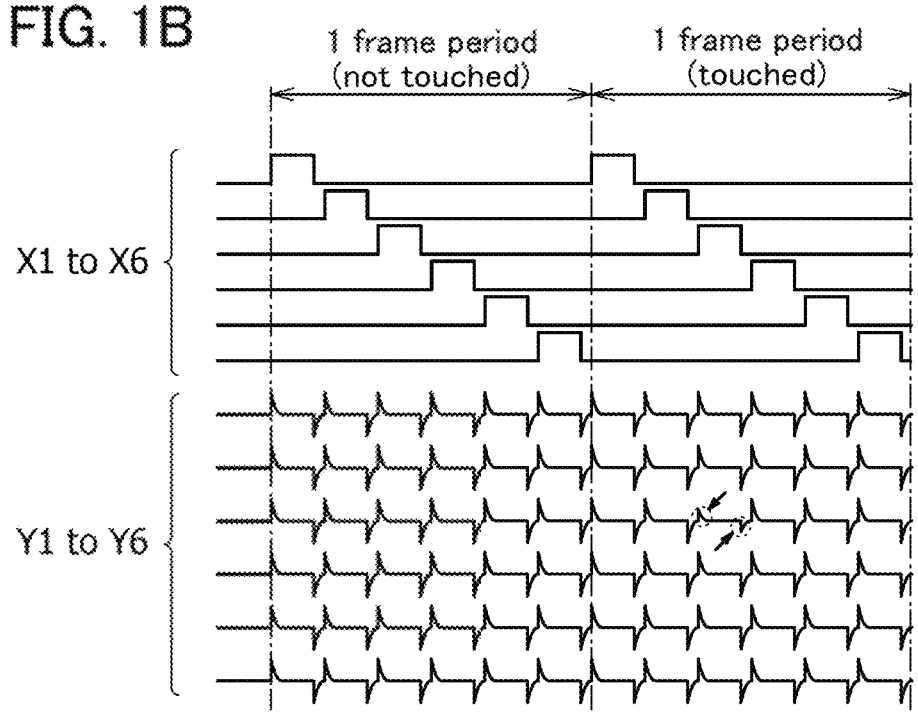

FIG. 1B is a timing chart showing input and output waveforms of the mutual capacitive touch sensor illustrated in FIG. 1A. In FIG. 1B, sensing of an object is performed in all the rows and columns in one frame period. FIG. 1B shows a period during which an object is not sensed (not touched) and a period during which an object is sensed (touched). Sensed current values of the wirings Y1 to Y6 are shown as waveforms of voltage values. Note that a display panel performs display operation. The timing of the display operation in the display panel is preferably in synchronization with the timing of the sensing operation in the touch sensor. FIG. 1B shows an example in which these timings are not in synchronization.

A pulse voltage is sequentially applied to the wirings X1 to X6, and the waveforms of the wirings Y1 to Y6 change in accordance with the pulse voltage. When there is no approach or contact of an object, the waveforms of the wirings Y1 to Y6 change uniformly in accordance with changes in the voltages of the wirings X1 to X6. In contrast, the current value is decreased at the point of approach or contact of an object; accordingly, the waveform of the voltage value also changes.

By sensing a change in capacitance in this manner, the approach or contact of an object can be sensed. Even when an object such as a finger or a stylus does not touch but only approaches a touch sensor or a touch panel, a signal may be sensed in some cases.

Although the case where the pulse voltage is sequentially applied to the wirings X1 to X6 is described with reference to FIG. 1B, one embodiment of the present invention is not limited thereto. For example, a pulse voltage may be applied to a plurality of wirings simultaneously. For example, a pulse voltage is applied to the wirings X1 to X3 first; next, a pulse voltage is applied to the wirings X2 to X4; then, a pulse voltage is applied to the wirings X3 to X5. Thus, a pulse voltage may be applied to a plurality of wirings simultaneously. The sensitivity of the sensor can be increased by arithmetic processing of a sensed signal.

It is preferable that, as an example, the pulse voltage output circuit 601 and the current sensing circuit 602 be formed in an IC. For example, the IC is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

In the case of an in-cell touch sensor, a circuit for driving a display portion is provided. Examples of such a circuit include a gate line driver circuit and a source line driver circuit. Such circuits are formed in an IC in some cases. Accordingly, at least one of the pulse voltage output circuit 601 and the current sensing circuit 602 and at least one of a gate line driver circuit and a source line driver circuit may be formed in an IC. For example, a source line driver circuit is formed in an IC in many cases because of its high driving frequency. The current sensing circuit 602 is also formed in an IC in many cases because an operational amplifier is needed in some cases. Therefore, the source line driver circuit and the current sensing circuit 602 may be formed in an IC. In this case, the gate line driver circuit and the pulse voltage output circuit 601 may be formed over a substrate provided with the pixels. Alternatively, the source line driver circuit, the current sensing circuit 602, and the pulse voltage output circuit 601 may be formed in an IC.

Although FIG. 1A illustrates, as a touch sensor, the structure of a passive matrix touch sensor in which only the capacitor 603 is provided at the intersection of wirings, an active matrix touch sensor including a transistor and a capacitor may also be used.

Although the driving method of a mutual capacitive touch sensor is described with reference to FIGS. 1A and 1B, one embodiment of the present invention is not limited thereto. For example, a self-capacitive touch sensor may be used. In this case, the pulse voltage output circuit 601 also has a function of sensing current. Similarly, the current sensing circuit 602 also has a function of outputting a pulse voltage. Alternatively, a touch sensor may operate in a mutual capacitive manner and in a self-capacitive manner depending on the situation.

[Structure Example of In-Cell Touch Panel]

An example in which at least one of a pair of electrodes included in a touch sensor is formed over a substrate provided with a display element, a transistor, and the like (hereinafter also referred to as an element substrate) is described below.

A structure example of a touch panel incorporating a touch sensor into a display portion including a plurality of pixels (i.e., an in-cell touch panel) is described below. An example in which a liquid crystal element is used as a display element provided in the pixel is described. However, one embodiment of the present invention is not limited thereto, and any of various display elements can be used.

Figure 2:
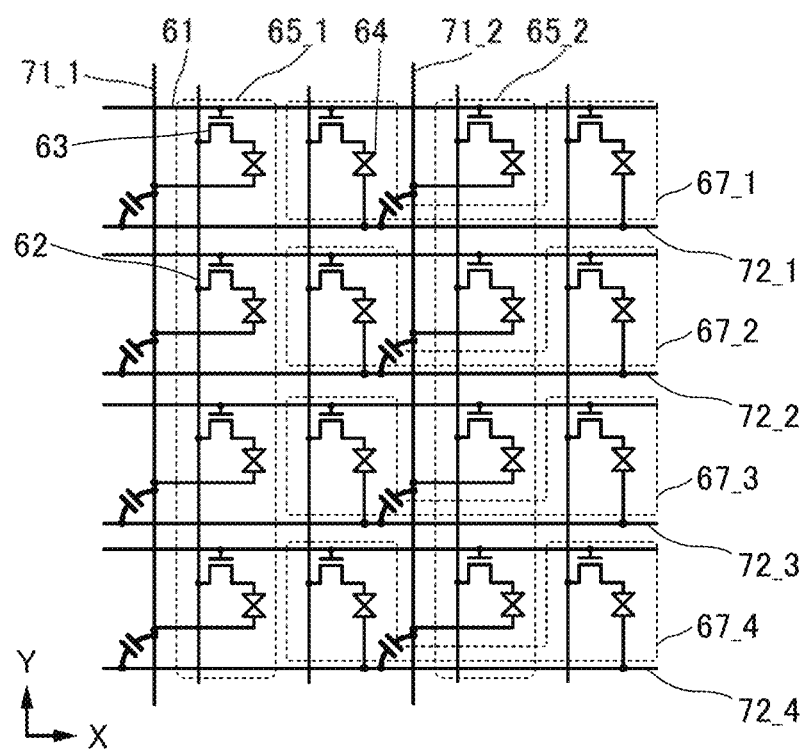
FIG. 2 illustrates pixels provided with touch sensors of one embodiment.

FIG. 2 is an equivalent circuit diagram of part of a pixel circuit provided in a display portion of a touch panel in this structure example.

Each pixel includes at least a transistor 63 and a liquid crystal element 64. Each pixel further includes a storage capacitor in some cases. A gate of the transistor 63 is electrically connected to a wiring 61, and one of a source and a drain of the transistor 63 is electrically connected to a wiring 62.

Common electrodes of the liquid crystal elements 64 included in a plurality of pixels adjacent to each other in the Y direction are electrically connected to each other, and the plurality of pixels forms one block. Electrodes 71_1 and 71_2 in FIG. 2 extend in the Y direction and function as common electrodes in regions where the liquid crystal elements 64 are formed (in regions where electric fields generated by pixel electrodes and common electrodes control alignment of liquid crystals). Blocks including a plurality of pixels which include the electrodes 71_1 and 71_2 in common as the common electrodes are referred to as blocks 65_1 and 65_2, respectively.

Common electrodes of the liquid crystal elements 64 included in a plurality of pixels adjacent to each other in the X direction across the blocks 65_1 and 65_2 are electrically connected to each other, and the plurality of pixels forms one block. Electrodes 72_1 to 72_4 in FIG. 2 extend in the X direction and function as common electrodes in regions where the liquid crystal elements 64 are formed. Blocks including a plurality of pixels which include the electrodes 72_1, 72_2, 72_3, and 72_4 in common as the common electrodes are referred to as blocks 67_1, 67_2, 67_3, and 67_4, respectively. Note that only part of the pixel circuit is illustrated in FIG. 2, and actually, these two kinds of blocks are repeatedly arranged in the X direction and the Y direction.

With the above structure, the common electrodes of the liquid crystal elements in the pixel circuit can also serve as a pair of electrodes included in the touch sensor. In other words, in FIG. 2, the electrodes 71_1 and 712 each serve as the common electrode of the liquid crystal elements 64 and one electrode of the touch sensor. The electrodes 72_1 to 72_4 each serve as the common electrode of the liquid crystal elements 64 and the other electrode of the touch sensor. In this manner, the structure of the touch panel can be simplified.

Note that a common electrode of the liquid crystal element 64 included in a pixel can serve as one electrode of a touch sensor. In other words, a display portion includes a pixel whose common electrode also serves as one electrode of a touch sensor (also referred to as a first pixel) and a pixel whose common electrode also serves as the other electrode of the touch sensor (also referred to as a second pixel). Therefore, in the display portion of the touch panel described in this structure example, top surface shapes of the electrodes of the touch sensor can be determined freely in accordance with positions of the first and second pixels.

Figure 3A:
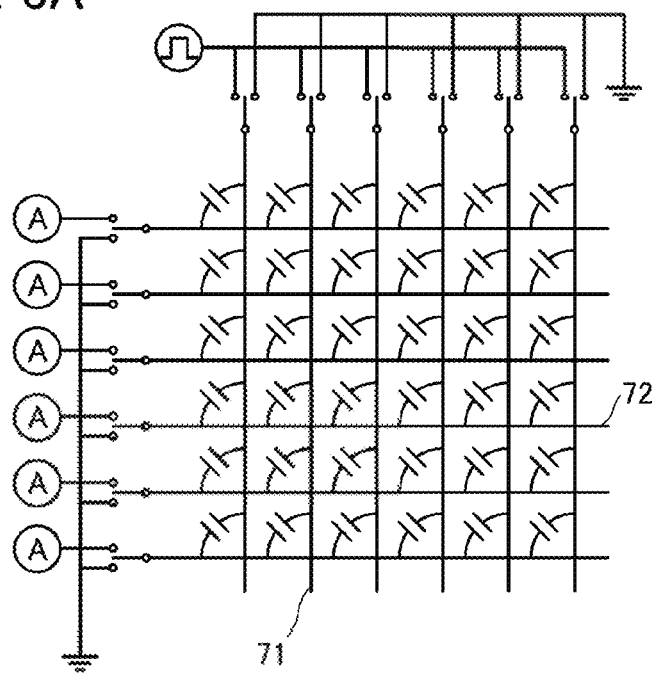
FIGS. 3A to 3C illustrate operation of touch sensors and pixels of one embodiment.

FIG. 3A is an equivalent circuit diagram illustrating the connection between a plurality of electrodes 72 extending in the X direction and a plurality of electrodes 71 extending in the Y direction. In the circuit diagram, the touch sensor is a projected mutual capacitive touch sensor as an example. An input voltage (or a selection voltage) or a common potential (or a ground potential or a reference potential) can be input to each of the electrodes 71 extending in the Y direction. A ground potential (or a reference potential) can be input to each of the electrodes 72 extending in the X direction, or the electrodes 72 can be electrically connected to a sensing circuit. Note that the electrodes 71 and the electrodes 72 can be interchanged with each other. That is, the electrodes 71 may be connected to the sensing circuit.

Operation of the above-described touch panel is described below with reference to FIGS. 3B and 3C.

For example, one frame period is divided into a writing period and a sensing period. The writing period is a period during which image data is written to a pixel and the electrodes 72 (also referred to as gate lines or scan lines) are sequentially selected. The sensing period is a period during which sensing is performed by the touch sensor and the electrodes 71 extending in the Y direction are sequentially selected and an input voltage is input.

Figure 3B:
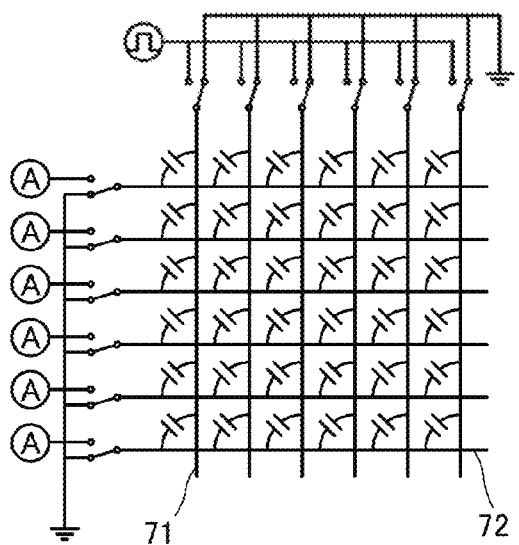

FIG. 3B is an equivalent circuit diagram in the writing period. In the wiring period, a common potential is input to both the electrodes 72 extending in the X direction and the electrodes 71 extending in the Y direction.

Figure 3C:
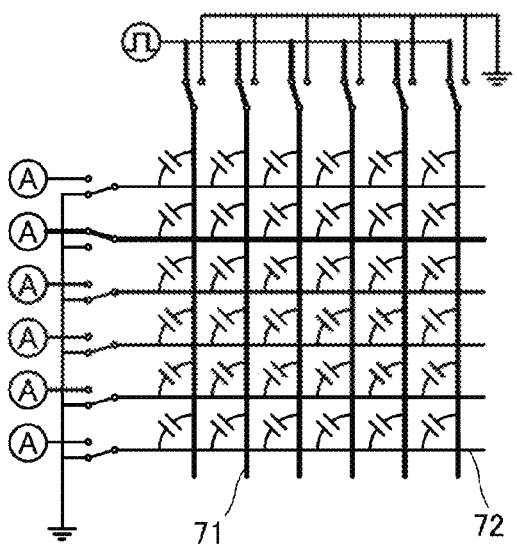

FIG. 3C is an equivalent circuit diagram at some point in time in the sensing period. In the sensing period, the electrode 72 extending in the X direction that is selected is electrically connected to the sensing circuit, and a common potential is input to the electrodes 72 extending in the X direction that are not selected. An input voltage is input to each of the electrodes 71 extending in the Y direction.

It is preferable that the period during which an image is written and the period during which sensing is performed by the touch sensor be separately provided as described above. For example, sensing is preferably performed in a blanking period. In this manner, a decrease in sensitivity of the touch sensor caused by noise generated when an image is written to a pixel can be suppressed.

Although one frame period is divided into a writing period and a sensing period here, one embodiment of the present invention is not limited thereto. For example, operation may be performed in such a manner that one horizontal period (also referred to as one gate selection period) is divided into a writing period and a sensing period.

A pulse voltage is sequentially applied to the electrodes 71 in this example; however, one embodiment of the present invention is not limited thereto. For example, a pulse voltage may be applied to a plurality of electrodes 71 simultaneously. For example, a pulse voltage is applied to the first to third electrodes 71 first; next, a pulse voltage is applied to the second to fourth electrodes 71; then, a pulse voltage is applied to the third to fifth electrodes 71. Thus, a pulse voltage may be applied to a plurality of electrodes 71 simultaneously. The sensitivity of the sensor can be increased by arithmetic processing of a sensed signal.

Although the driving method of a mutual capacitive touch sensor is described with reference to FIGS. 3A to 3C, one embodiment of the present invention is not limited thereto. For example, a self-capacitive touch sensor may be used. In this case, the circuit for outputting a pulse voltage also has a function of sensing current.

Similarly, the sensing circuit also has a function of outputting a pulse voltage. Alternatively, a touch sensor may operate in a mutual capacitive manner and in a self-capacitive manner depending on the situation.

[Examples of Touch Panel]

Examples of a touch panel of one embodiment of the present invention are described below.

Note that in this specification and the like, a touch panel has a function of displaying or outputting an image or the like on or to a display surface and a function of a touch sensor capable of sensing the approach or contact of an object such as a finger or a stylus to the display surface. Therefore, the touch panel is one embodiment of an input/output device. Therefore, the touch panel can also be called as a display device with a built-in touch sensor.

In this specification and the like, a structure in which a connector such as a flexible printed circuit (FPC) or a tape carrier package (TCP) is attached to a substrate of a touch panel, or a structure in which an integrated circuit (IC) is mounted on a substrate by a chip on glass (COG) method is referred to as a touch panel module or a display module, or simply referred to as a touch panel in some cases.

A capacitive touch sensor that can be used for one embodiment of the present invention includes a pair of conductive films. Capacitance is formed between the pair of conductive films. The capacitance between the pair of conductive films changes when an object touches or approaches the pair of conductive films. Utilizing this change, sensing can be performed.

Examples of the capacitive touch sensor include a surface capacitive touch sensor and a projected capacitive touch sensor. Examples of the projected capacitive touch sensor include a self-capacitive touch sensor and a mutual capacitive touch sensor, which differ mainly in the driving method. The use of a mutual capacitive touch sensor is preferable because multiple points can be sensed simultaneously. Note that one embodiment of the present invention is not limited thereto.

As a display element in a touch panel of one embodiment of the present invention, a variety of display elements, for example, a liquid crystal element (using a vertical electric field mode or a horizontal electric field mode), an optical element utilizing micro electro mechanical systems (MEMS), a light-emitting element such as an organic electroluminescence (EL) element or a light-emitting diode (LED), and an electrophoretic element can be used.

Here, a liquid crystal element using a horizontal electric field mode is preferably used as a display element of a display device. In the case where a pixel electrode and a common electrode are each formed using a transparent conductive film, the display device can be a transmissive display device. In the case where a pixel electrode or a common electrode is a reflective electrode, the display device can be a reflective display device. In this case, both the pixel electrode and the common electrode may be reflective electrodes. A reflective display device can also be obtained by providing a reflective electrode in addition to the pixel electrode and the common electrode. Note that a transflective display device may be provided by providing a region where light from a backlight can pass in a reflective display device. For example, part of a pixel electrode or a common electrode may be a transparent electrode and the other part thereof may be a reflective electrode. Note that even in the case where a pixel electrode or a common electrode is a reflective electrode, a display device is used as a transmissive display device in some cases depending on the operation modes of liquid crystals.

In the display device of one embodiment of the present invention, at least one of a pair of electrodes (also referred to as conductive films or wirings) in a touch sensor is provided for one of a pair of substrates, whereby the display device has a structure in which a display panel and the touch sensor are combined. Therefore, the thickness of the display device can be reduced, leading to a lightweight display device.

Figure 4A:
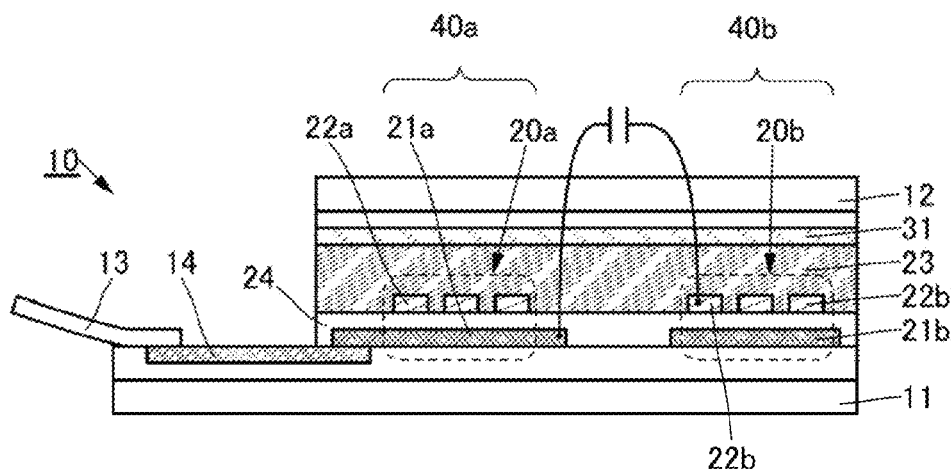
FIGS. 4A to 4C are schematic cross-sectional views illustrating modes of a touch panel of one embodiment.
Figure 4B:
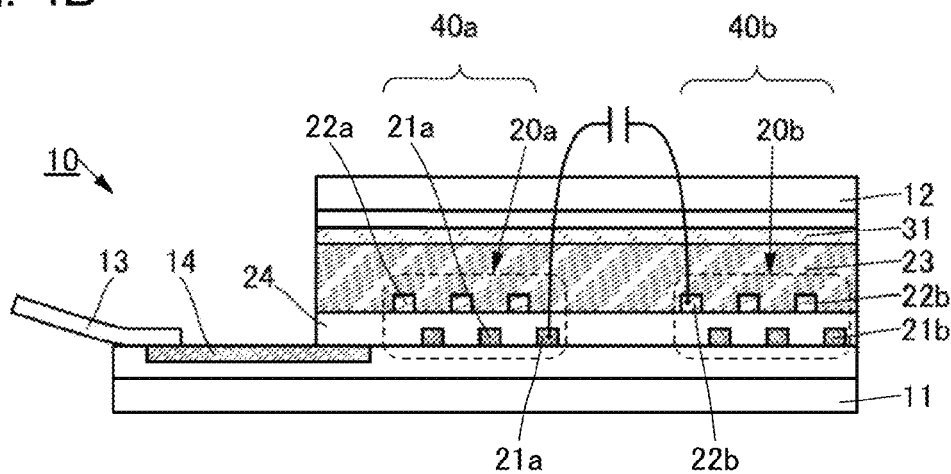
Figure 4C:
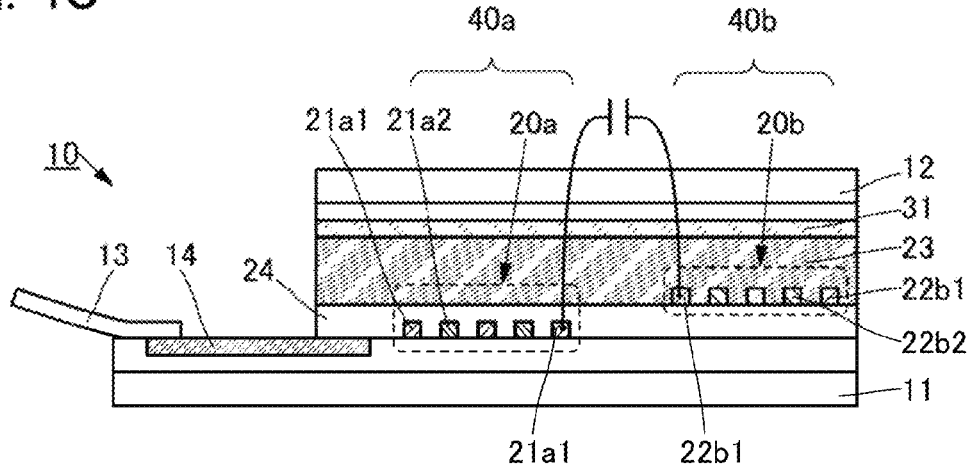

FIGS. 4A to 4C are each a schematic cross-sectional view illustrating a mode of a display device 10 of one embodiment of the present invention.

The display device 10 includes a substrate 11, a substrate 12, an FPC 13, a conductive film 14, a pixel 40a, a pixel 40b, liquid crystal elements 20a and 20b, a coloring film 31, and the like.

The pixel 40a includes the liquid crystal element 20a and the pixel 40b includes the liquid crystal element 20b. The liquid crystal element 20a includes a common electrode 21a, a pixel electrode 22a, and a liquid crystal 23. The liquid crystal element 20b includes a pixel electrode 21b, a common electrode 22b, and the liquid crystal 23. In FIG. 4A, liquid crystal elements using a fringe field switching (FFS) mode are used as the liquid crystal elements 20a and 20b.

The common electrode 21a and the pixel electrode 21b are formed on the same plane. Alternatively, the common electrode 21a and the pixel electrode 21b are formed concurrently. Alternatively, the common electrode 21a and the pixel electrode 21b are formed by etching of one film. Alternatively, the common electrode 21a and the pixel electrode 21b are formed from the same conductive film. Alternatively, the common electrode 21a and the pixel electrode 21b contain the same material. An insulating film 24 is provided over the common electrode 21a and the pixel electrode 21b. The pixel electrode 22a and the common electrode 22b are formed on the same plane, specifically, over the insulating film 24. Alternatively, the pixel electrode 22a and the common electrode 22b are formed concurrently. Alternatively, the pixel electrode 22a and the common electrode 22b are formed by etching of one film. Alternatively, the pixel electrode 22a and the common electrode 22b are formed from the same conductive film. Alternatively, the pixel electrode 22a and the common electrode 22b contain the same material. For example, the pixel electrode 22a and the common electrode 22b each have a comb-like top surface shape or a top surface shape provided with at least one slit-like opening (a top surface shape is also referred to as a planar shape).

The touch sensor can sense an object by utilizing the capacitance formed between the common electrode 21a of the pixel 40a and the common electrode 22b of the pixel 40b. With such a structure, the common electrodes (21a, 22b) included in the liquid crystal elements can also serve as a pair of electrodes functioning as a touch sensor. Thus, the manufacturing process can be simplified, leading to an improvement in yield and a reduction in manufacturing cost. Note that through the conductive film 14, the common electrode 21a and the common electrode 22b are electrically connected to the FPC 13 provided for the substrate 11. Alternatively, at least one of the common electrode 21a and the common electrode 22b is connected to a circuit having a function of outputting a pulse voltage. The pixel electrodes 22a and 21b are electrically connected to transistors (not illustrated). The transistors are electrically connected to a driver circuit (a gate line driver circuit or a source line driver circuit) or the FPC 13.

In FIG. 4A, part of the common electrode 21a overlaps with the pixel electrode 22a and part of the pixel electrode 21b overlaps with the common electrode 22b. The overlapping regions can function as capacitors. In other words, the regions can function as storage capacitors for holding the potentials of the pixel electrodes. Note that one embodiment of the present invention is not limited thereto. For example, the pixel electrode 22a and the common electrode 21a (or the pixel electrode 21b and the common electrode 22b) do not necessarily overlap with each other in a region contributing to display (i.e., in an aperture portion). Alternatively, end portions of upper and lower electrodes may be aligned in a region contributing to display (i.e., in an aperture portion).

For example, as in the display device 10 in FIG. 4B, not only the pixel electrode 22a and the common electrode 22b but also the common electrode 21a and the pixel electrode 21b may each have a comb-like top surface shape or a top surface shape provided with at least one slit-like opening. Note that the driving mode of the liquid crystal elements 20a and 20b in FIG. 4B is an in-plane-switching (IPS) mode. With this structure, the size of a storage capacitor can be reduced.

Alternatively, a structure may be employed where a pixel electrode of the pixel 40a and a common electrode of the pixel 40a are formed on the same plane and a pixel electrode of the pixel 40b and a common electrode of the pixel 40b are formed on the same plane. In the display device 10 in FIG. 4C, a pixel electrode 21a2 and a common electrode 21a1 are formed on the same plane. Alternatively, the pixel electrode 21a2 and the common electrode 21a1 are formed concurrently. Alternatively, the pixel electrode 21a2 and the common electrode 21a1 are formed by etching of one film. Alternatively, the pixel electrode 21a2 and the common electrode 21a1 are formed from the same conductive film. Alternatively, the pixel electrode 21a2 and the common electrode 21a1 contain the same material. Similarly, a pixel electrode 22b2 and a common electrode 22b1 are formed on the same plane, specifically, over the insulating film 24. Alternatively, the pixel electrode 22b2 and the common electrode 22b1 are formed concurrently. Alternatively, the pixel electrode 22b2 and the common electrode 22b1 are formed by etching of one film. Alternatively, the pixel electrode 22b2 and the common electrode 22b1 are formed from the same conductive film. Alternatively, the pixel electrode 22b2 and the common electrode 22b1 contain the same material. The common electrode 21a1, the pixel electrode 21a2, the common electrode 22b1, and the pixel electrode 22b2 each have a comb-like top surface shape, enabling the above structure. The touch sensor can function by utilizing the capacitance formed between the common electrode 21a1 and the common electrode 22b1 in FIG. 4C. Note that the driving mode of the liquid crystal elements 20a and 20b in FIG. 4C is an IPS mode.

In each of FIGS. 4B and 4C, the common electrodes and the pixel electrodes may be opaque electrodes, for example. A conductive material similar to a conductive material used for a gate electrode or source and drain electrodes may be used, for example. This is because an electric field is difficult to apply to the liquid crystal 23 over the electrodes in an IPS mode, which means that the alignment of the liquid crystal 23 is difficult to control. Thus, these regions are less likely to contribute to display. Therefore, the electrodes do not necessarily transmit light from a backlight. Accordingly, even in a transmissive display device, the common electrodes and the pixel electrodes may be formed using aluminum, molybdenum, titanium, tungsten, copper, silver, or the like. Note that these electrodes may be formed in a mesh form or in a nano-wire form. The common electrodes function as electrodes of the touch sensor. Therefore, the resistance of the common electrodes is preferably as low as possible. An opaque electrode is preferred to a transparent electrode of indium tin oxide (ITO) or the like because of its lower resistance.

Note that in each of FIGS. 4A to 4C, a transparent conductive film of ITO or the like may be used for the common electrodes and the pixel electrodes. A conductive film having resistance lower than that of the transparent conductive film may be provided as an auxiliary wiring over or under the transparent conductive film. As the auxiliary wiring, for example, a conductive material similar to a material used for a gate electrode or source and drain electrodes may be used. Specifically, aluminum, molybdenum, titanium, tungsten, copper, silver, or the like may be used.

In the case where the auxiliary wiring is provided over the transparent conductive film, the transparent conductive film and the auxiliary wiring may be formed using one mask called a half-tone mask (also referred to as a gray-tone mask, a phase-shift mask). In this case, the transparent conductive film is necessarily provided under the auxiliary wiring. Note that one embodiment of the present invention is not limited thereto. The transparent conductive film and the auxiliary wiring may be formed using different masks in different steps.

In each of FIGS. 4A to 4C, the common electrodes may each be connected to an auxiliary wiring having low resistance. For example, the common electrode and the auxiliary wiring are connected to each other through an opening portion provided in the insulating film provided therebetween. For example, the auxiliary wiring and a gate electrode (or a gate signal line) may be formed concurrently. Alternatively, the auxiliary wiring and the gate electrode (or the gate signal line) may be formed by etching of one film. Alternatively, the auxiliary wiring and the gate electrode (or the gate signal line) may be formed from the same conductive film. Alternatively, the auxiliary wiring and the gate electrode (or the gate signal line) may contain the same material. Similarly, the auxiliary wiring and source and drain electrodes (or a source signal line) may be formed concurrently, for example. Alternatively, the auxiliary wiring and the source and drain electrodes (or the source signal line) may be formed by etching of one film. Alternatively, the auxiliary wiring and the source and drain electrodes (or the source signal line) may be formed from the same conductive film. Alternatively, the auxiliary wiring and the source and drain electrodes (or the source signal line) may contain the same material.

As described above, in each of FIGS. 4A to 4C, the pixel 40a and the pixel 40b each include a common electrode, which can also function as an electrode of a touch sensor. Since the common electrode of the pixel 40a and the common electrode of the pixel 40b are not formed on the same plane, a short circuit does not occur even when the common electrode of the pixel 40a and the common electrode of the pixel 40b overlap with each other. In other words, the common electrode of the pixel 40a and the common electrode of the pixel 40b can be provided to intersect with each other. Accordingly, one of the common electrode of the pixel 40a and the common electrode of the pixel 40b can be provided to extend in the Y direction as the electrode 71_1 in FIG. 2 and the other thereof can be provided to extend in the X direction as the electrode 72_1 in FIG. 2. With such a structure, a cross-sectional structure is not complicated, leading to easy manufacture and high manufacturing yield. In addition, manufacturing cost can be low with no increase in the number of manufacturing steps.

Figure 5A:
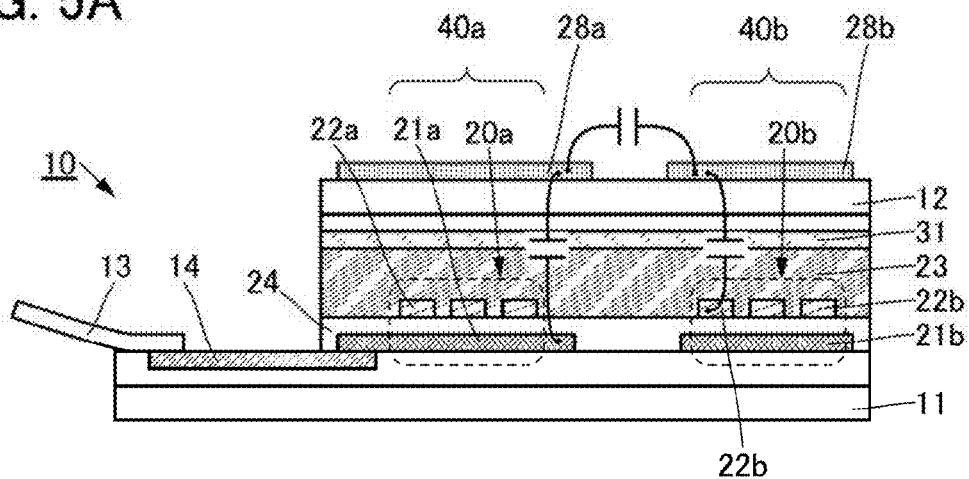
FIGS. 5A to 5C are schematic cross-sectional views illustrating modes of a touch panel of one embodiment.
Figure 5B:
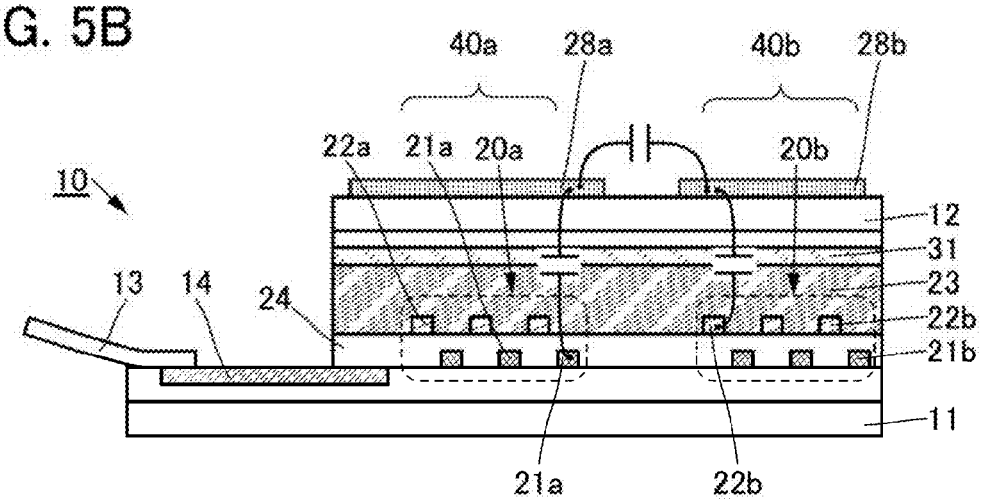
Figure 5C:
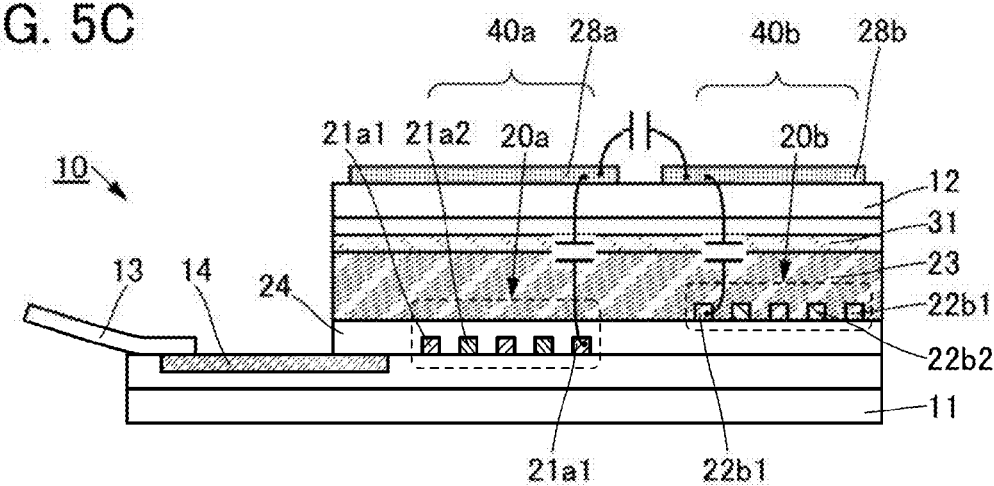

A conductive film in a floating state may be provided on an upper side of the substrate 12, for example. Examples in this case are illustrated in FIGS. 5A to 5C. As illustrated in each of FIGS. 5A to 5C, a conductive film 28a is provided to overlap with the common electrode of the pixel 40a and a conductive film 28b is provided to overlap with the common electrode of the pixel 40b. Thus, capacitors are provided in series. In addition, electric fields are evenly distributed, so that the sensitivity of the touch sensor can be increased. When an object approaches or is in contact with the substrate 12, the object is electrostatically charged in some cases. In that case, adverse effects of static electricity can be reduced with the conductive film 28a, the conductive film 28b, and the like provided on the upper side of the substrate 12.

FIGS. 6A and 6B, FIGS. 7A and 7B, FIG. 8, FIGS. 9A and 9B, FIGS. 10A and 10B, FIGS. 11A and 11B, FIG. 12, FIG. 13, FIG. 14, FIG. 15, FIG. 16, FIG. 17, FIG. 18, FIGS. 19A and 19B, FIGS. 20A and 20B, and FIGS. 21A and 21B each illustrate a conceptual diagram of a display device or a touch panel of one embodiment of the present invention seen from the above. Therefore, most components other than those included in a touch sensor are not illustrated.

Figure 6A:
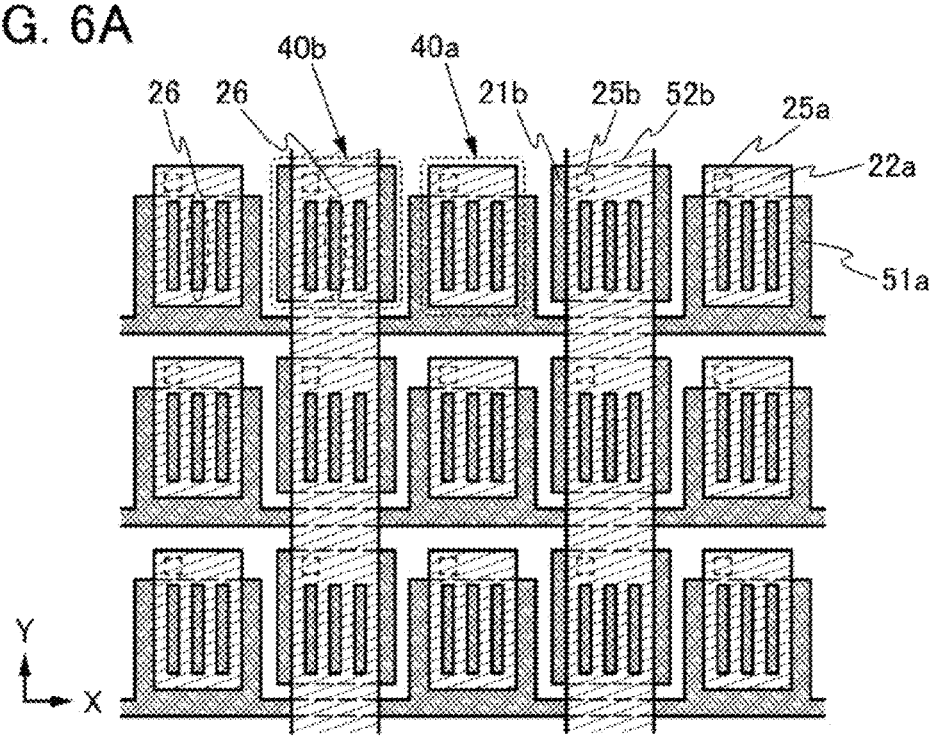
FIGS. 6A and 6B are each a top view illustrating positions of electrodes of touch sensors and the like of one embodiment.

FIG. 6A corresponds to FIG. 4A. In the structure illustrated in FIG. 6A, the touch sensor includes a sensor electrode 51a and a sensor electrode 52b. The sensor electrode 51a functions as a common electrode in the pixel 40a and is formed using the same conductive film as the pixel electrode 21b of the pixel 40b. The sensor electrode 52b functions as a common electrode in the pixel 40b and is formed using the same conductive film as the pixel electrode 22a of the pixel 40a. The sensor electrode 52b includes at least one slit-like opening 26 in the pixel 40b. The pixel electrode 22a includes at least one slit-like opening 26 in the pixel 40a.

The sensor electrode 51a extends in one direction (e.g., the X direction), and the sensor electrode 52b extends in another direction (e.g., the Y direction) intersecting with the one direction. An insulating film (not illustrated) is provided between the sensor electrode 51a and the sensor electrode 52b. With such a structure, a conductive film (also referred to as a bridge electrode) which electrically connects the sensor electrodes or the other sensor electrodes through an opening in the insulating film or the like is not necessarily provided in a region where one sensor electrode intersects with the other sensor electrode, whereby a high-definition display device can be provided. Openings 25a and 25b are illustrated in FIG. 6A. The pixel electrode 22a is electrically connected to a transistor (not illustrated) included in the pixel 40a through the opening 25a provided in the insulating film under the pixel electrode 22a. The pixel electrode 21b is electrically connected to a transistor (not illustrated) included in the pixel 40b through the opening 25b provided in the insulating film under the pixel electrode 21b. Note that the opening 25b is not needed when an insulating film is not provided between the pixel electrode 21b and the transistor.

Although the sensor electrode 51a extends in the X direction and the sensor electrode 52b extends in the Y direction in FIG. 6A, one embodiment of the present invention is not limited thereto. The sensor electrode 51a may extend in the Y direction and the sensor electrode 52b may extend in the X direction, which can be obtained by rotating the structure of FIG. 6A 90 degrees. In not only FIG. 6A but also other figures, the directions in which the sensor electrodes extend may be rotated 90 degrees.

Figure 6B:
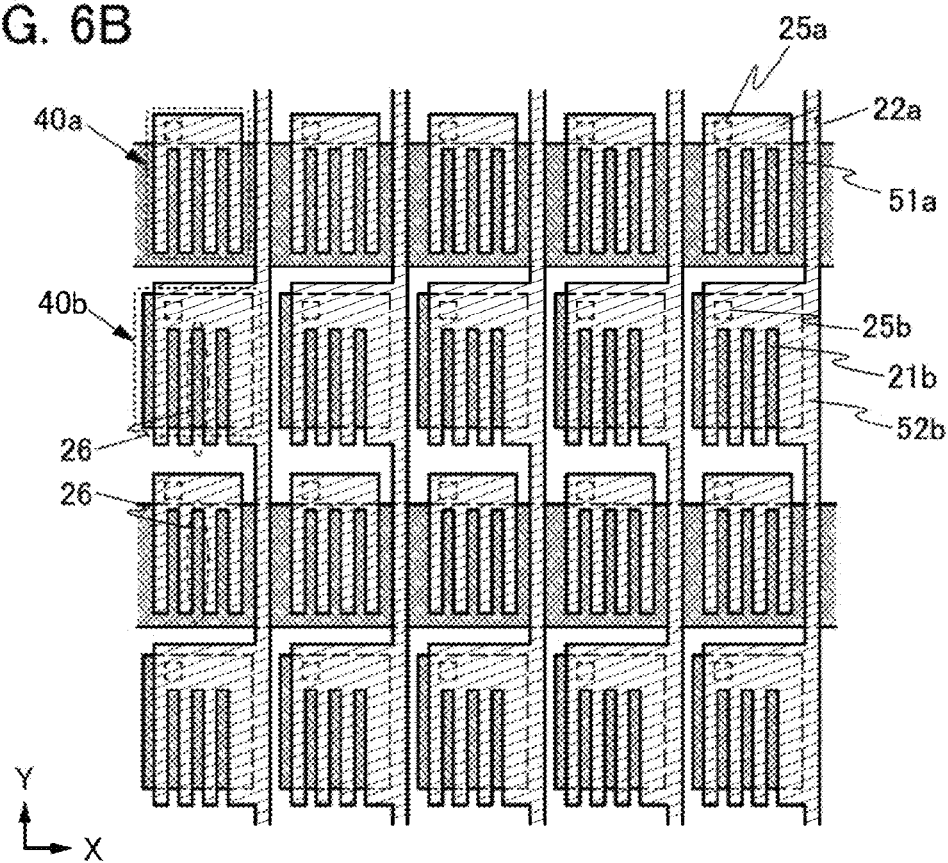

In FIG. 6A, the sensor electrode 52b extending in the Y direction also serves as the common electrode of a plurality of pixels 40b provided adjacent to each other in the Y direction. In other words, the sensor electrode 51a extending in the X direction also serves as the common electrode of a plurality of pixels 40a which are arranged in the X direction and alternated with the pixels 40b. However, one embodiment of the present invention is not limited to this structure. As illustrated in FIG. 6B, the sensor electrode 51a extending in the X direction may also serve as the common electrode of the plurality of pixels 40a provided adjacent to each other in the X direction. In other words, the sensor electrode 52b extending in the Y direction may also serve as the common electrode of the plurality of pixels 40b which are arranged in the Y direction and alternated with the pixels 40a.

Although the sensor electrode 51a extends in the X direction and the sensor electrode 52b extends in the Y direction in FIG. 6B, one embodiment of the present invention is not limited thereto. The sensor electrode 51a may extend in the Y direction and the sensor electrode 52b may extend in the X direction, which can be obtained by rotating the structure of FIG. 6B 90 degrees. In not only FIG. 6B but also other figures, the directions in which the sensor electrodes extend may be rotated 90 degrees.

Note that the opening 26 may be inside an electrode in a top view or the opening 26 may reach an end portion of the electrode. In FIG. 6A, one or more openings 26 formed in the pixel electrode 22a and the sensor electrode 52b are inside each electrode. In FIG. 6B, one or more openings 26 formed in the pixel electrode 22a and the sensor electrode 52b reach bottom ends of the electrodes in the top view. The shapes of the pixel electrodes 22a and the sensor electrode 52b in FIG. 6B can each be referred to as a comb-like shape.

The slit-like opening and the comb-like electrode are vertically long and narrow; however, one embodiment of the present invention is not limited thereto. The slit-like opening and the comb-like electrode may be horizontally long and narrow. Alternatively, the slit-like opening and the comb-like electrode may each have a wide V shape (a boomerang shape) in order to improve viewing angle characteristics.

Figure 7A:
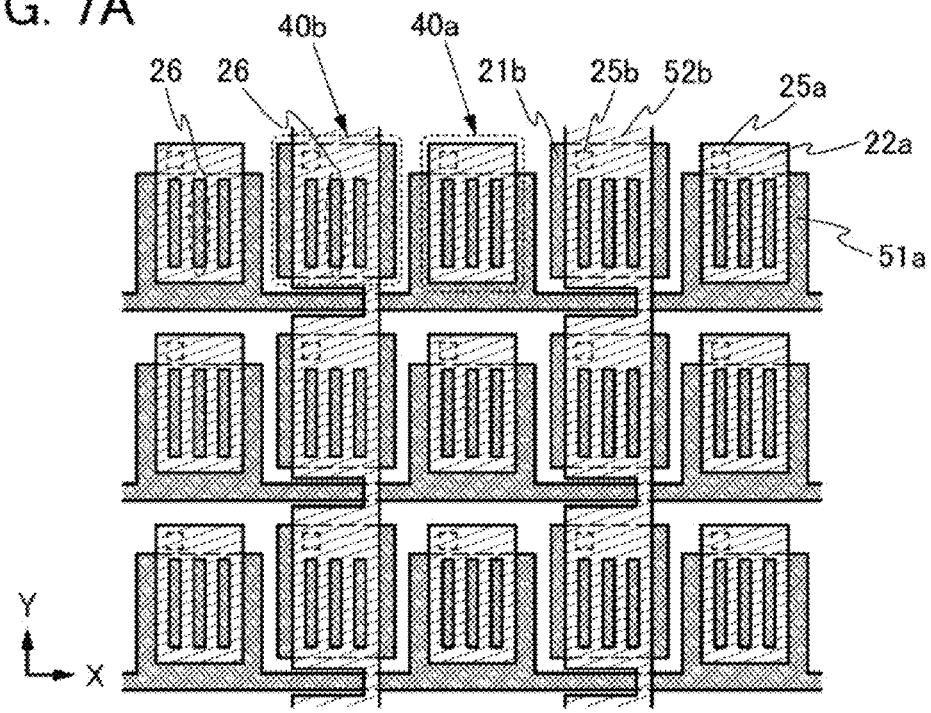
FIGS. 7A and 7B are each a top view illustrating positions of electrodes of touch sensors and the like of one embodiment.
Figure 7B:
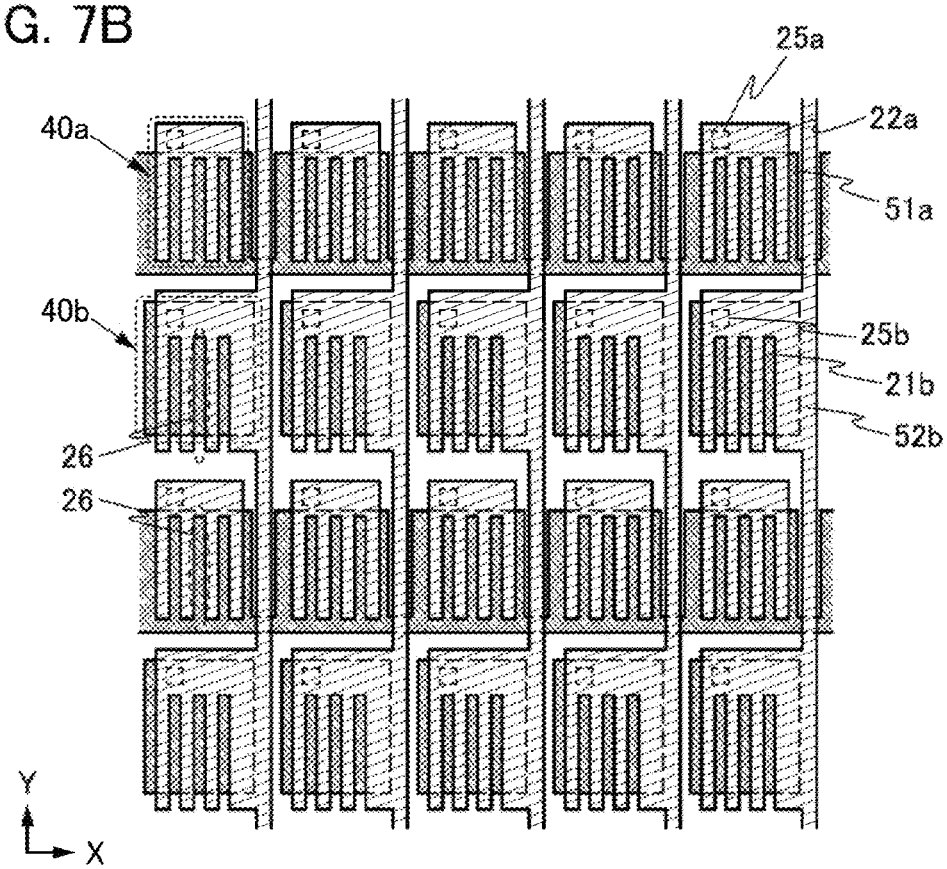

Parasitic capacitance is formed in a region where the sensor electrode 51a and the sensor electrode 52b overlap (intersect) with each other. The parasitic capacitance might cause small reading signal of the sensor and easy generation of noise. Therefore, a width of one of the sensor electrode 51a and the sensor electrode 52b may be reduced in the region where the sensor electrode 51a and the sensor electrode 52b overlap (intersect) with each other. FIG. 7A illustrates the case where the width of the sensor electrode 52b is reduced. FIG. 7B illustrates the case where the width of the sensor electrode 51a is reduced.

Figure 8:
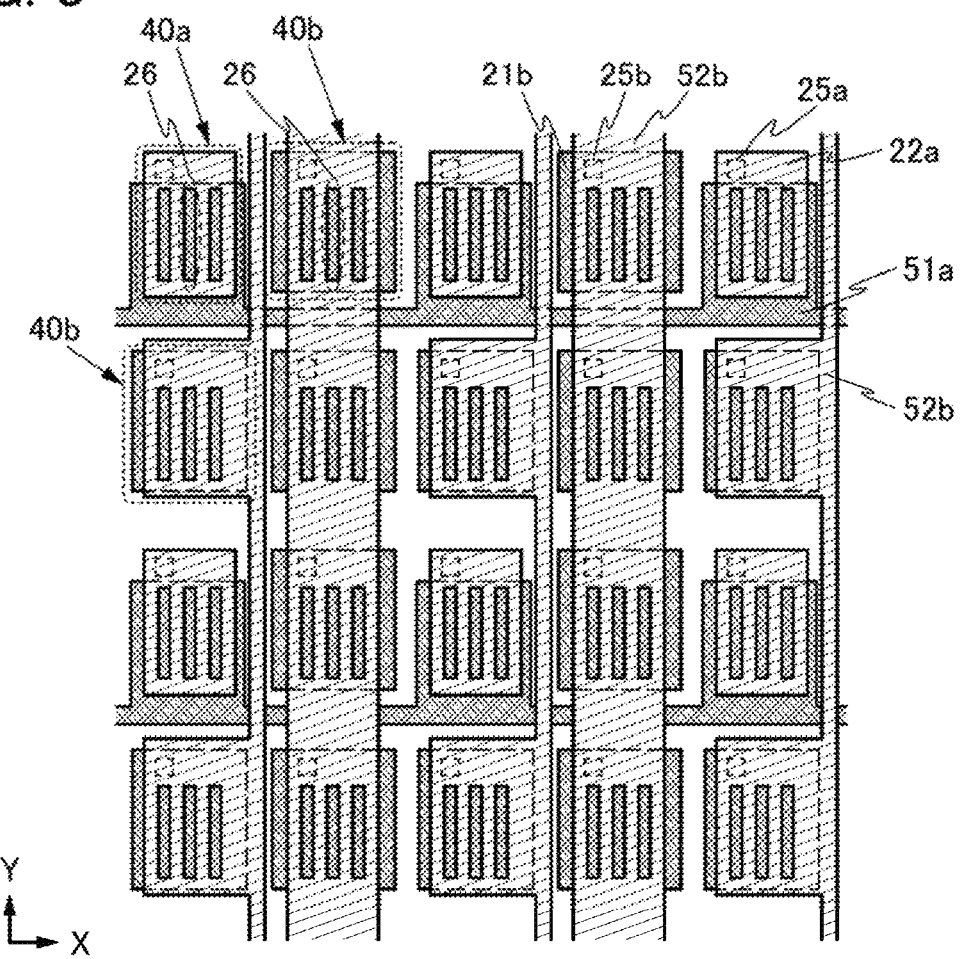
FIG. 8 is a top view illustrating positions of electrodes of touch sensors and the like of one embodiment.
Figure 9A:
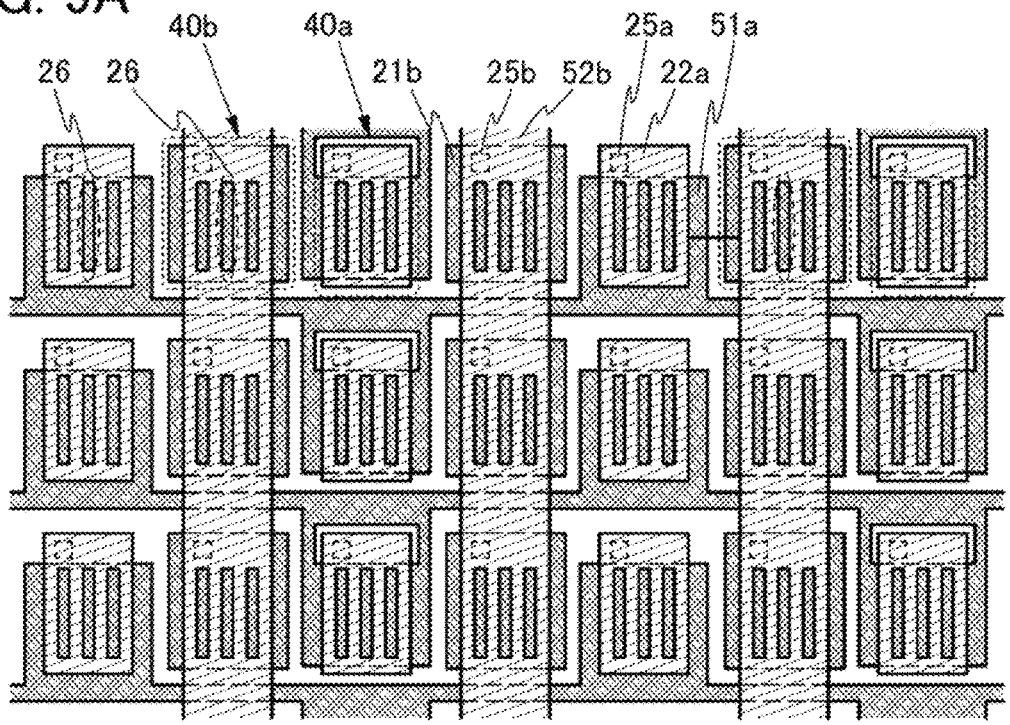
FIGS. 9A and 9B are each a top view illustrating positions of electrodes of touch sensors and the like of one embodiment.
Figure 9B:
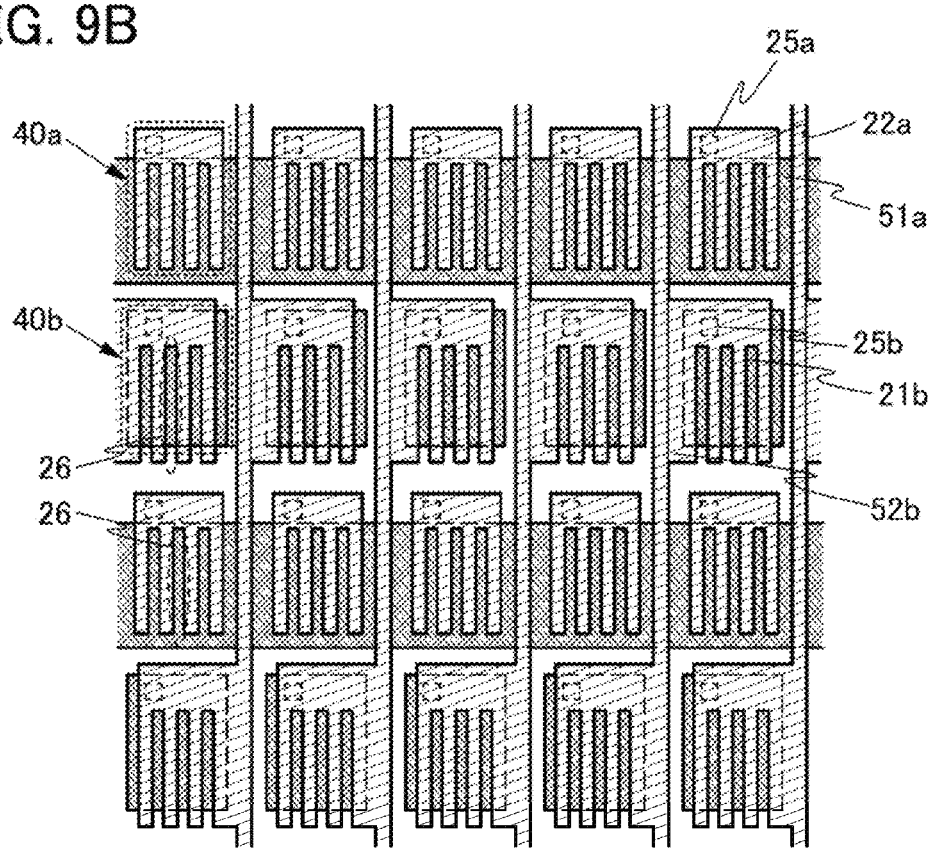

The layout of the electrodes in FIG. 6A and the layout of the electrodes in FIG. 6B may be combined, which is illustrated in FIG. 8. In FIG. 8, the pixel electrode 22a in the pixel 40a and the sensor electrode 52b in the pixel 40b each include one or more slit-like openings 26.

The sensor electrode 51a is connected to the pixel in the same row in FIG. 6A; however, one embodiment of the present invention is not limited thereto. For example, the sensor electrode 51a may be connected to a pixel in a different row depending on the position. When the sensor electrode 51a is connected to a pixel in a different row, the following effects are expected in some cases owing to, for example, averaging of noise: displaying a higher quality image and realizing a sensor with higher sensitivity. In this case, the layout of the sensor electrodes in FIG. 6A may be changed into the layout in FIG. 9A, for example. Although the sensor electrode 52b is connected to the pixel in the same column in FIG. 6B, one embodiment of the present invention is not limited thereto. The sensor electrode 52b may be connected to a pixel in a different column depending on the position. For example, the layout of electrodes in FIG. 9B may be employed.

Figure 10A:
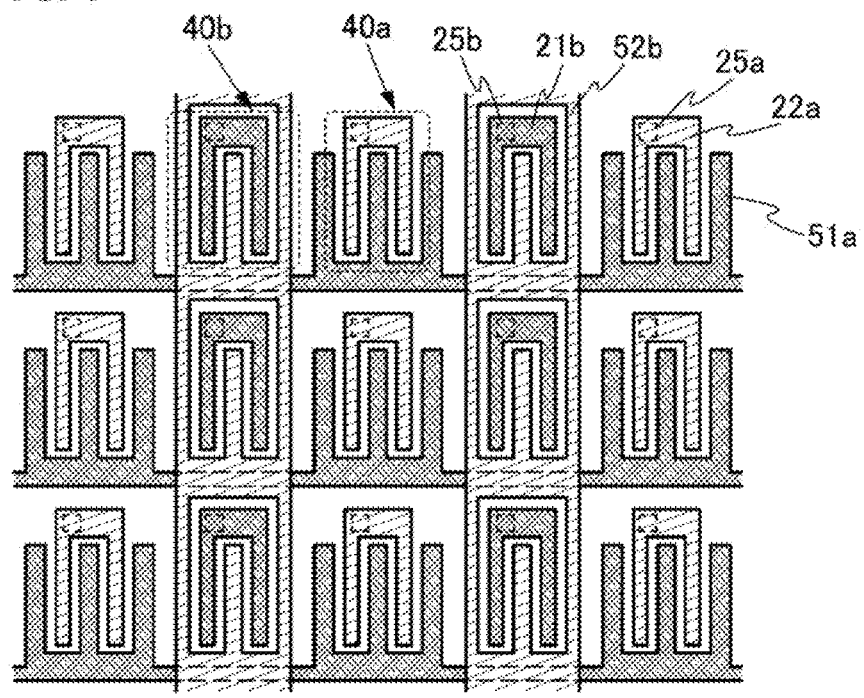
FIGS. 10A and 10B are each a top view illustrating positions of electrodes of touch sensors and the like of one embodiment.
Figure 10B:
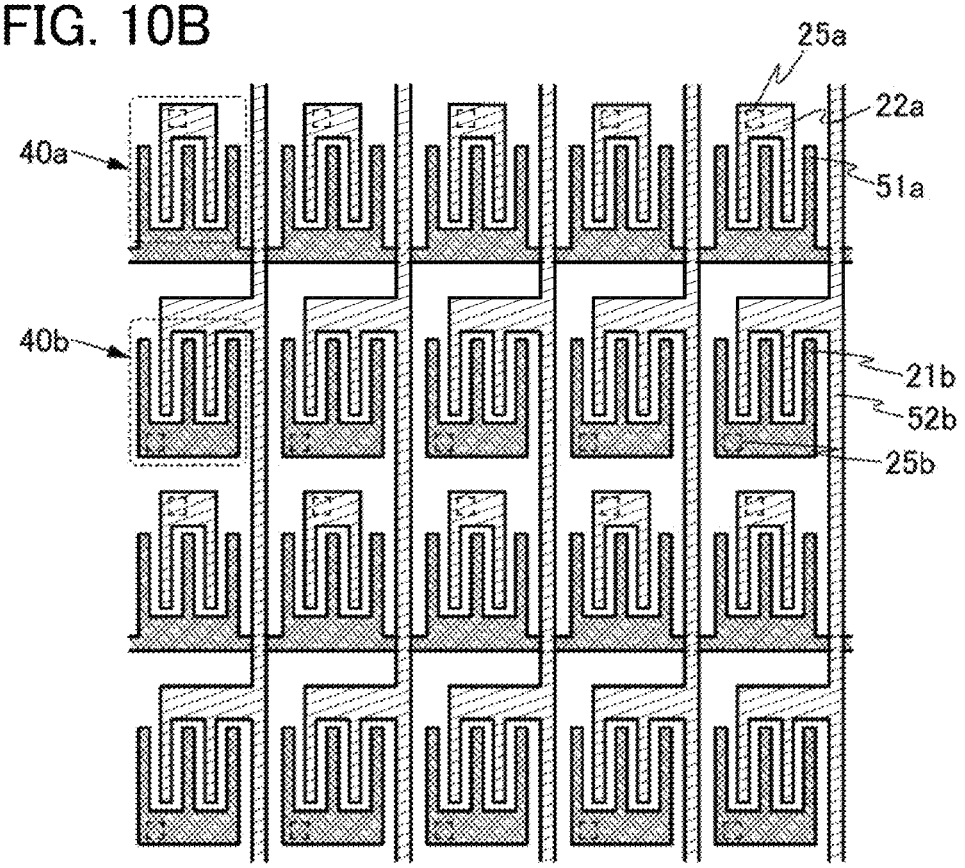

The sensor electrode 51a and the pixel electrode 21b do not include the openings 26 in the pixel 40a and the pixel 40b in FIG. 6A; however, one embodiment of the present invention is not limited thereto. The sensor electrode 51a and the pixel electrode 21b may each have a comb-like top surface shape or a top surface shape including one or more slit-like openings. FIGS. 10A and 10B illustrate top views of display devices which are different from those of FIGS. 6A and 6B in that the sensor electrode 52b and the pixel electrode 22a each have a comb-like shape and in addition, the sensor electrode 51a and the pixel electrode 21b each have a comb-like shape. FIG. 10A corresponds to FIG. 6A. FIG. 10B corresponds to FIG. 6B. Note that FIGS. 10A and 10B correspond to FIG. 4B.

Figure 11A:
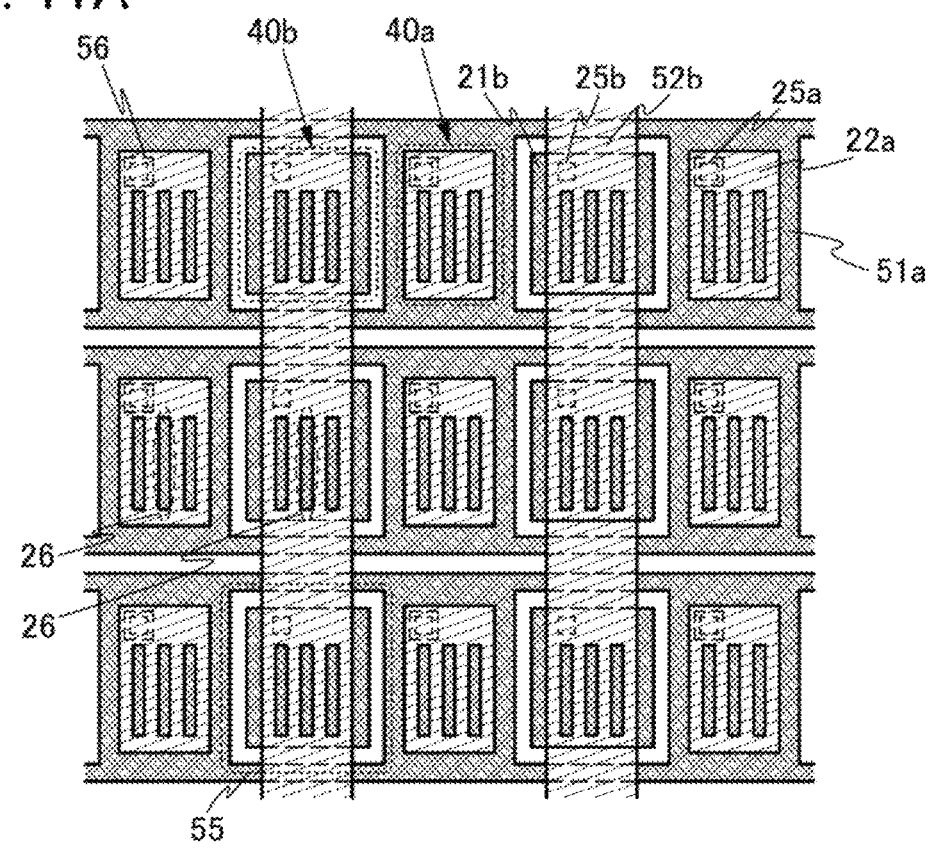
FIGS. 11A and 11B are top views illustrating positions of electrodes of touch sensors and the like of one embodiment.
Figure 11B:
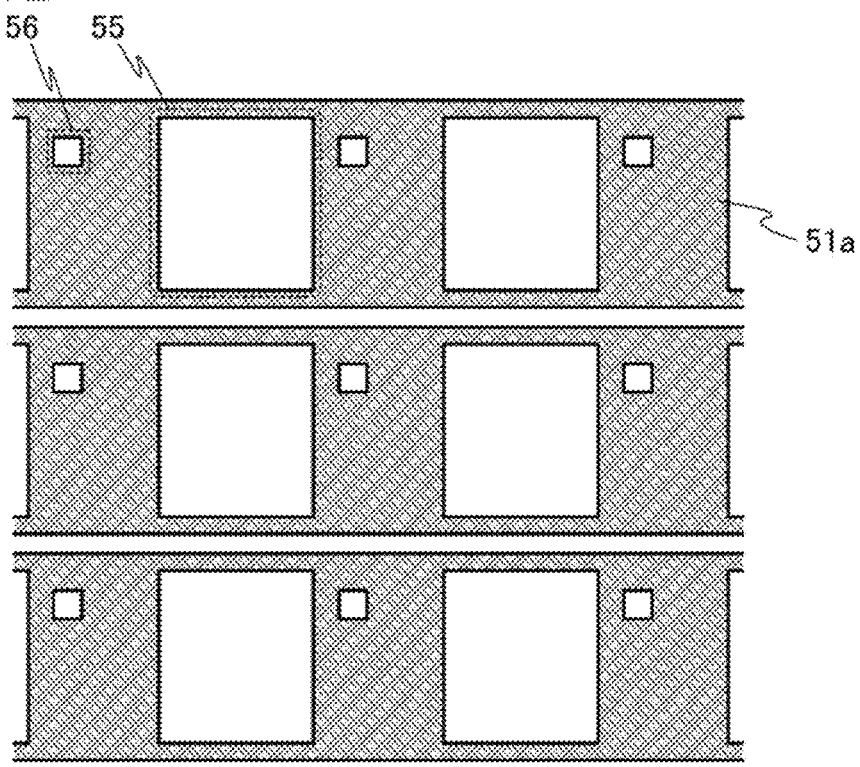

The sensor electrode and the pixel electrode formed using the same conductive film are provided apart from each other in order not to be electrically connected to each other. For example, an island-shaped pixel electrode may be provided in an opening provided in the sensor electrode. FIG. 11A illustrates a structure where the pixel electrode 21b is provided in an opening 55 in the sensor electrode 51a. Since the sensor electrode 51a is provided under the pixel electrode 22a, the sensor electrode 51a includes an opening 56 larger than the opening 25a in the top view of FIG. 11A. FIG. 11B illustrates a top view of only the sensor electrode 51a. Thus, with an opening provided in the sensor electrode, the area of the sensor electrode can be increased. As a result, wiring resistance of the sensor electrode can be reduced. Thus, the sensitivity of the sensor can be increased.

Figure 12:
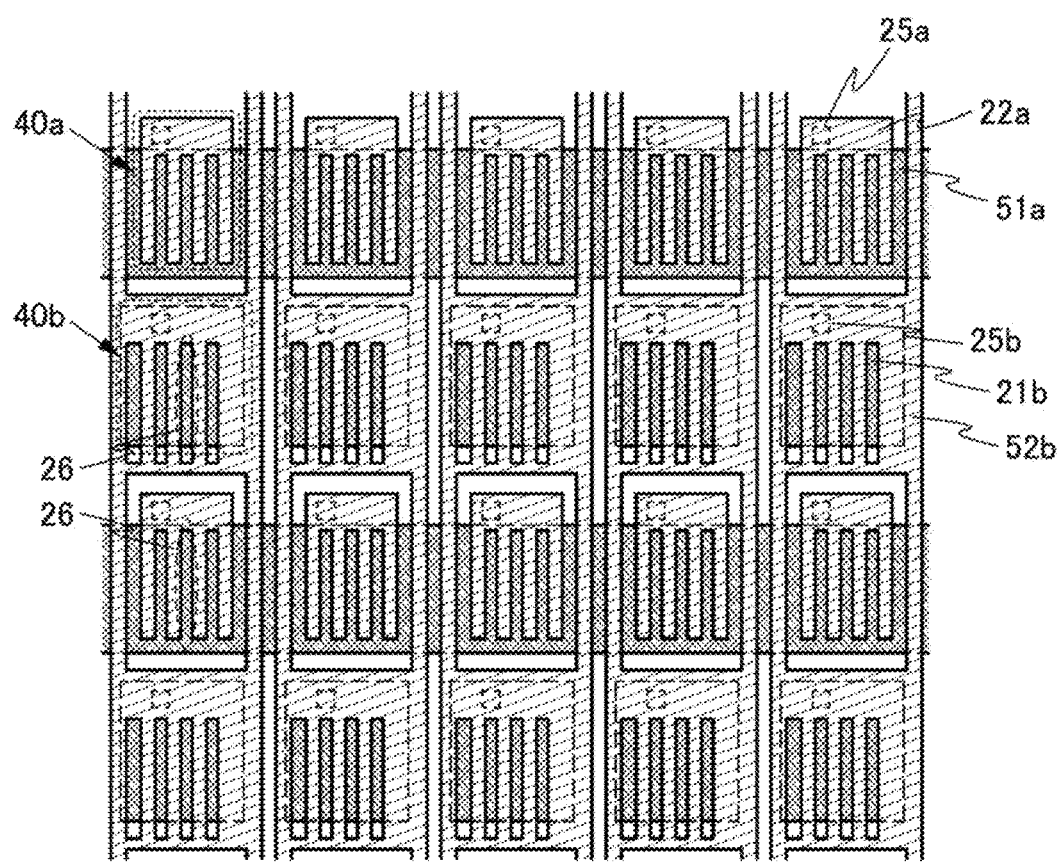
FIG. 12 is a top view illustrating positions of electrodes of touch sensors and the like of one embodiment.

FIGS. 11A and 11B illustrate an example obtained by modifying part of the structure in FIG. 6A, and the structure in FIG. 6B can also be modified. FIG. 12 illustrates an example of such a case.

Figure 13:
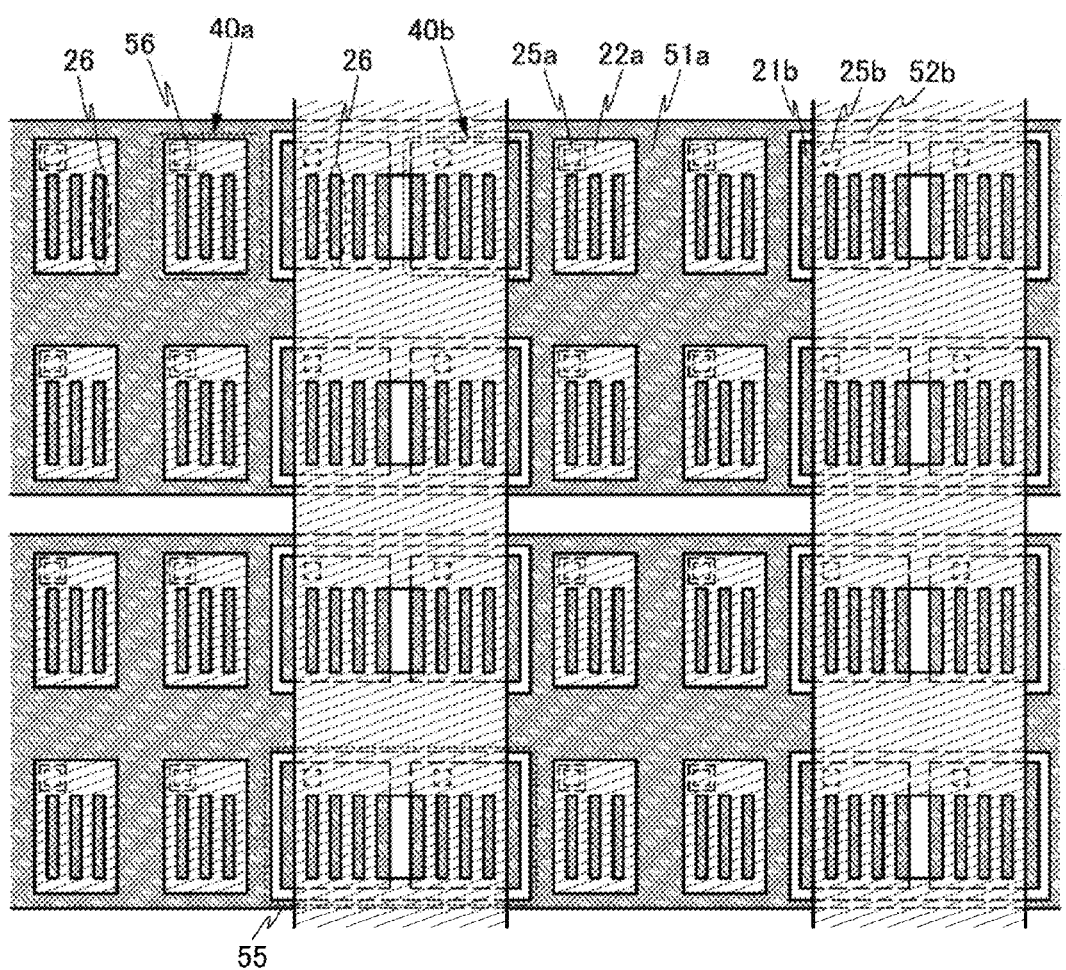
FIG. 13 is a top view illustrating positions of electrodes of touch sensors and the like of one embodiment.
Figure 14:
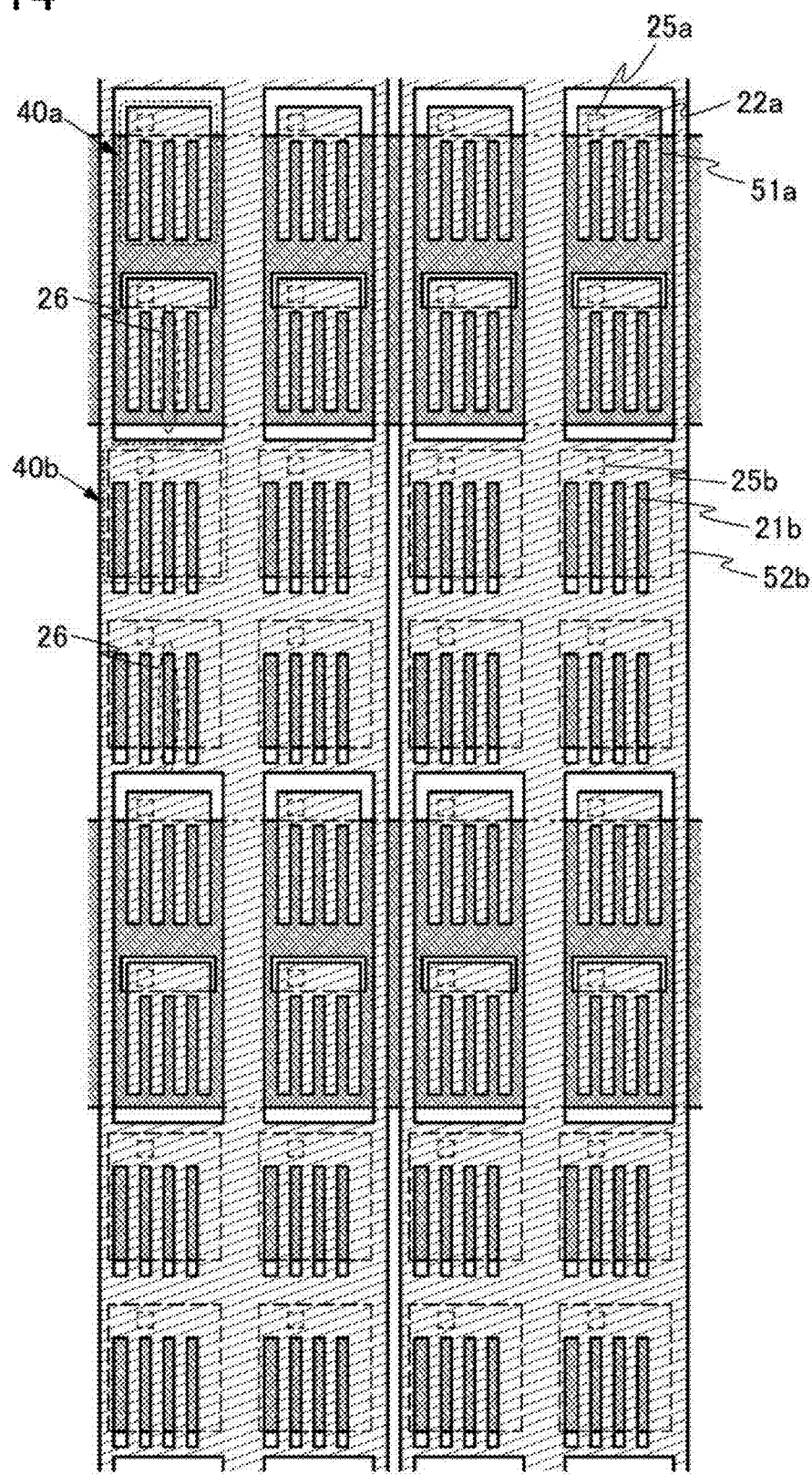
FIG. 14 is a top view illustrating positions of electrodes of touch sensors and the like of one embodiment.

Although the cases where a sensor electrode is provided per row or per column are illustrated in FIGS. 6A and 6B, FIGS. 7A and 7B, FIG. 8, FIGS. 9A and 9B, FIGS. 10A and 10B, and FIGS. 11A and 11B, one embodiment of the present invention is not limited thereto. A sensor electrode may be provided for a plurality of rows or columns. For example, FIG. 13 illustrates the case where the sensor electrodes are provided across two columns and two rows in the layout in FIG. 11A. FIG. 14 illustrates the case where sensor electrodes are provided across two columns and two rows in the layout in FIG. 12.

Figure 15:
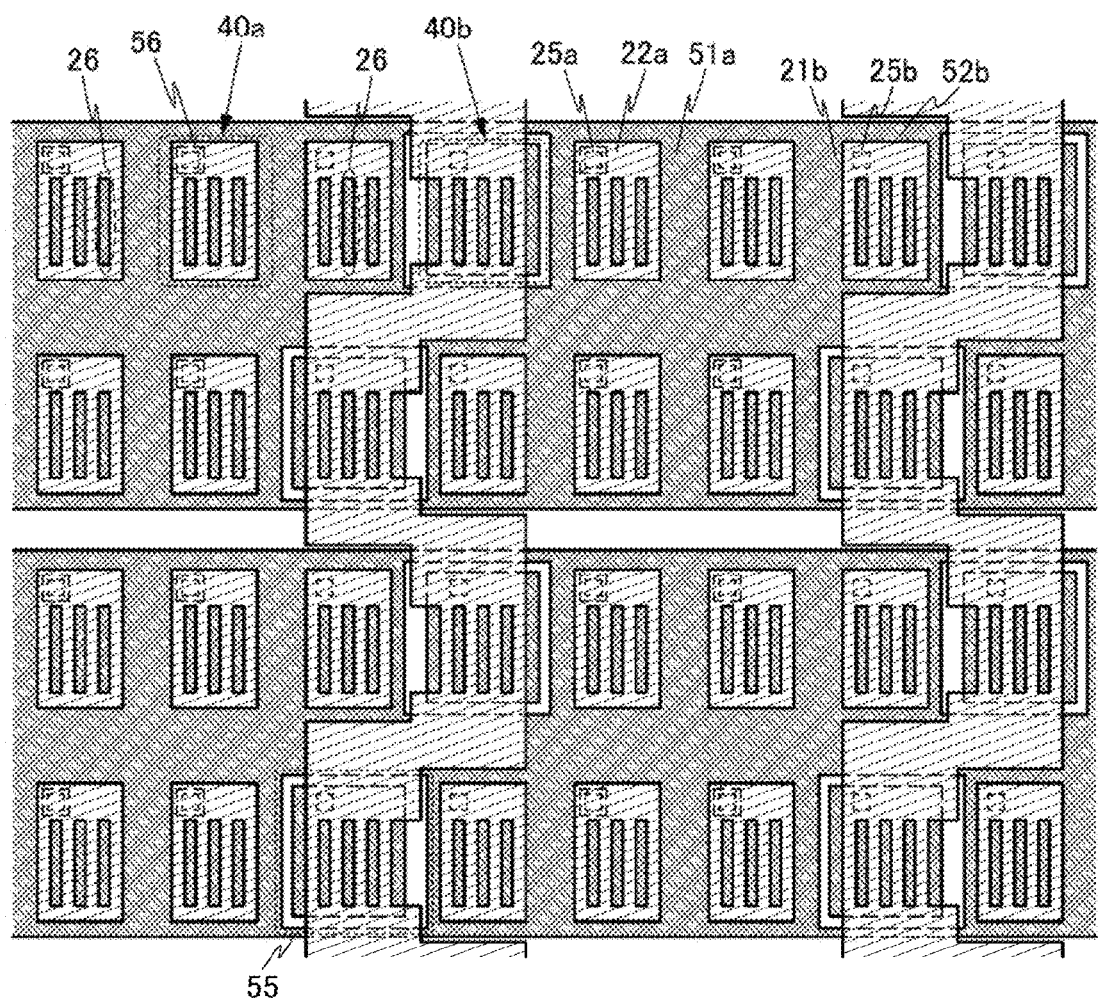
FIG. 15 is a top view illustrating positions of electrodes of touch sensors and the like of one embodiment.
Figure 16:
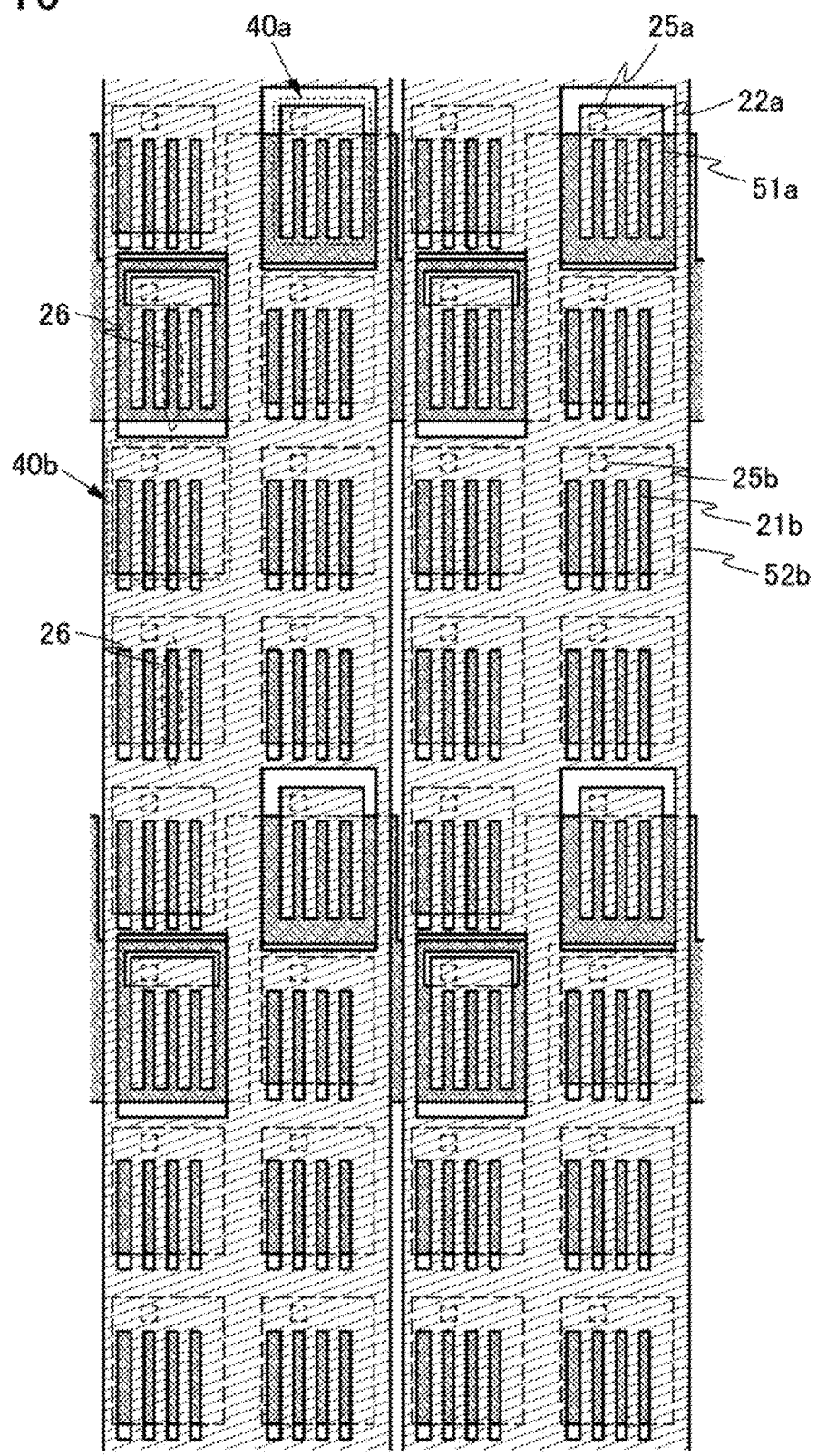
FIG. 16 is a top view illustrating positions of electrodes of touch sensors and the like of one embodiment.

In the case where a sensor electrode is provided across two columns or two rows, the positions of the common electrode and the pixel electrode may be changed in a portion where the electrodes intersect with each other. FIG. 15 corresponds to FIG. 13 and FIG. 16 corresponds to FIG. 14.

Figure 17:
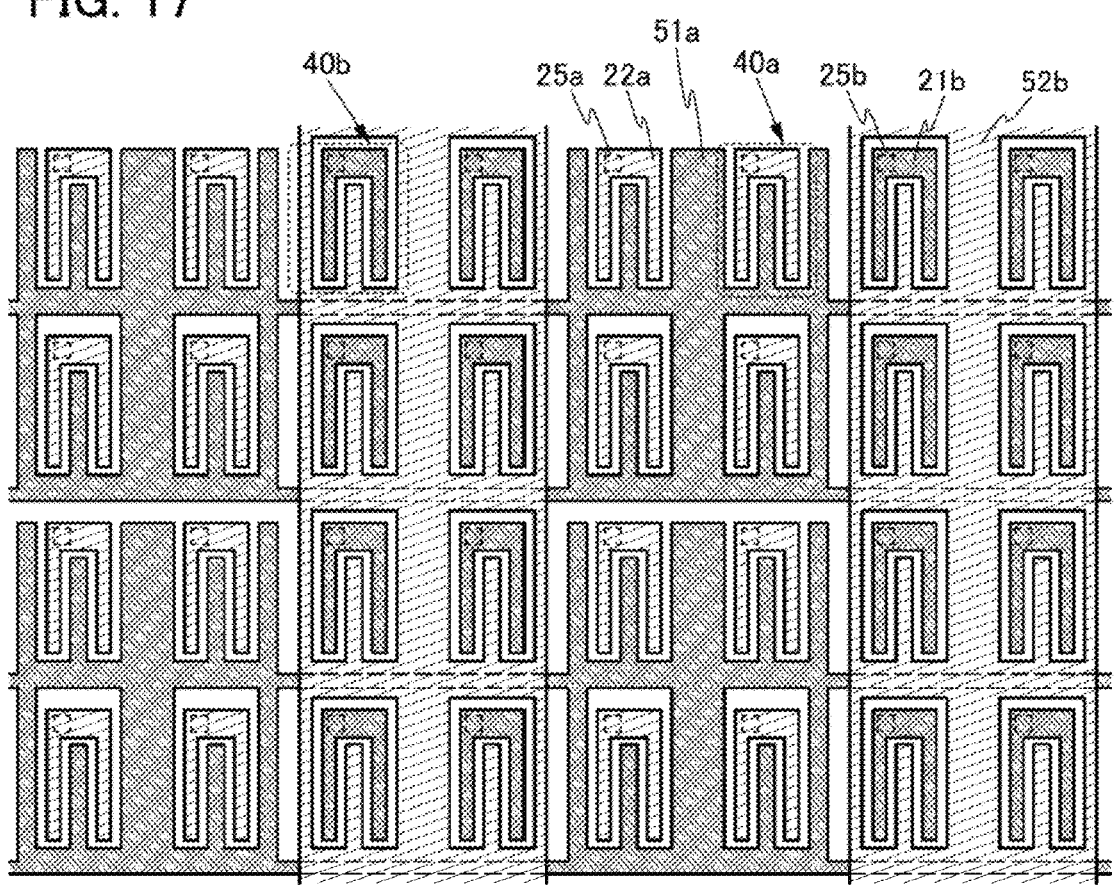
FIG. 17 is a top view illustrating positions of electrodes of touch sensors and the like of one embodiment.
Figure 18:
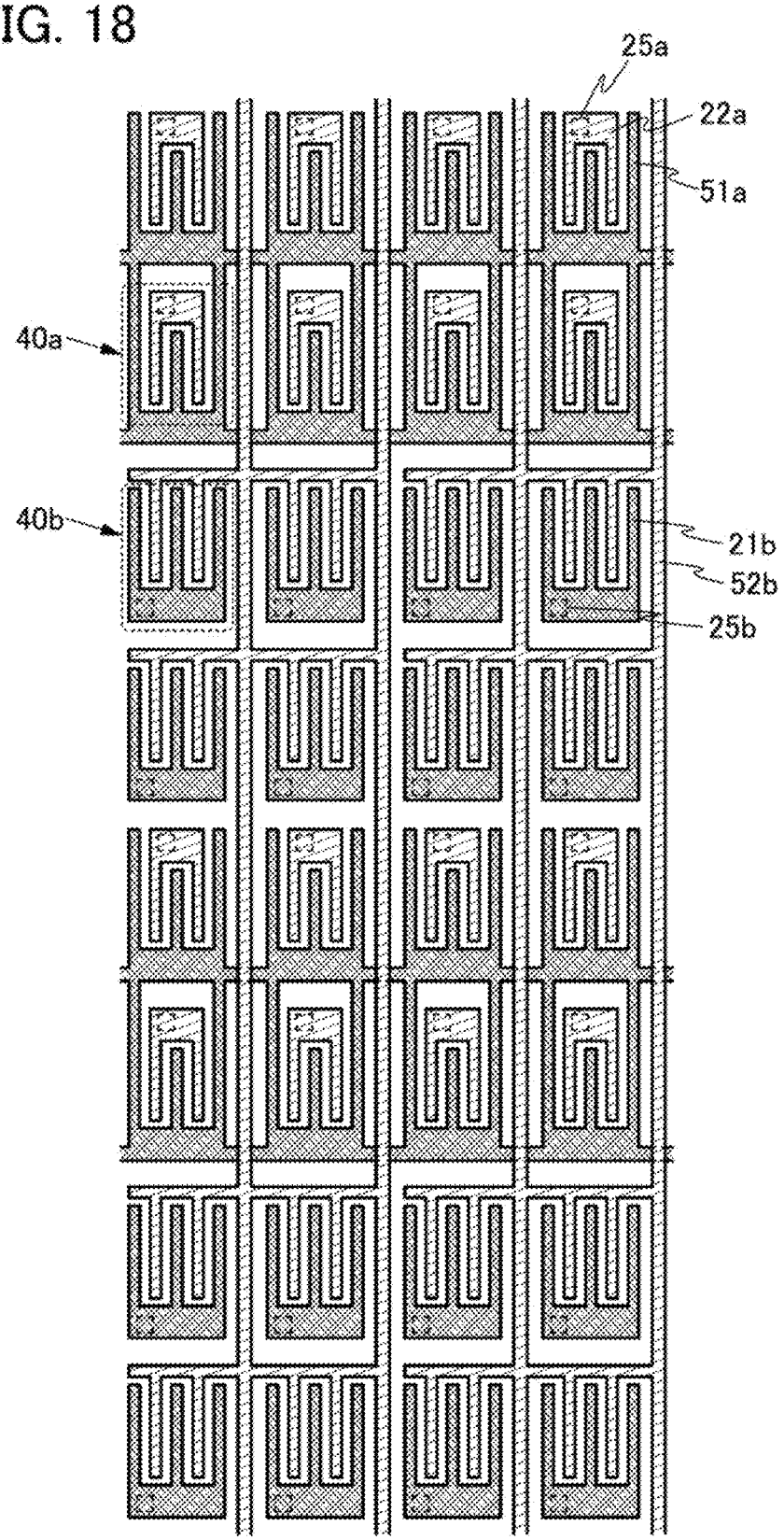
FIG. 18 is a top view illustrating positions of electrodes of touch sensors and the like of one embodiment.

FIG. 17 illustrates the case where the sensor electrodes are provided across two columns and two rows in the layout in FIG. 10A. FIG. 18 illustrates the case where the sensor electrodes are provided across two columns and two rows in the layout in FIG. 10B.

Figure 19A:
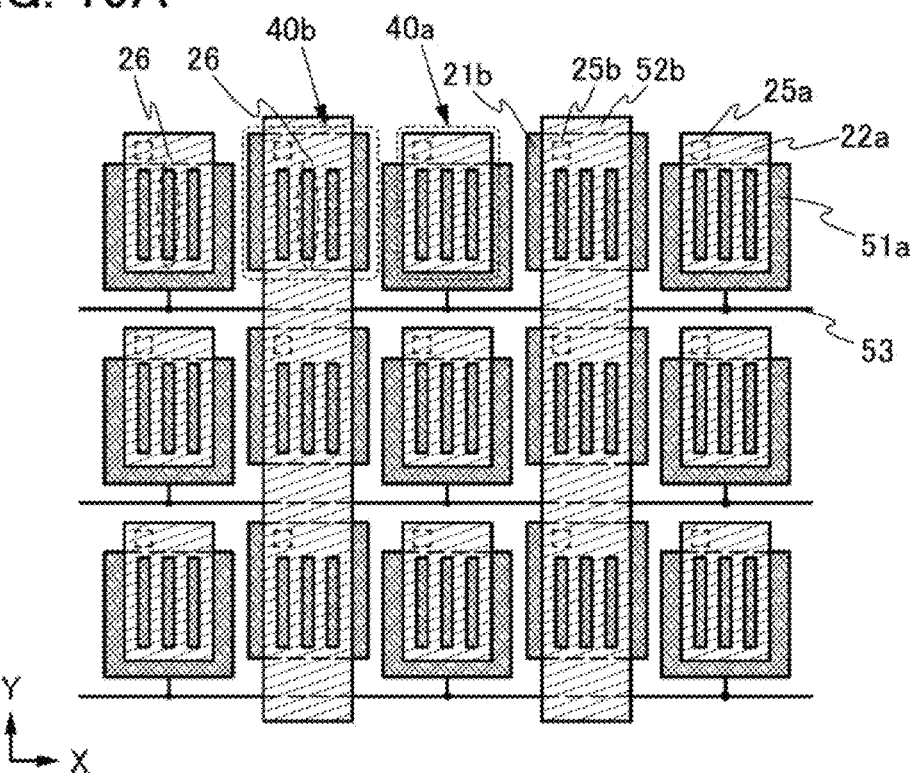
FIGS. 19A and 19B are each a top view illustrating positions of electrodes of touch sensors and the like of one embodiment.
Figure 19B:
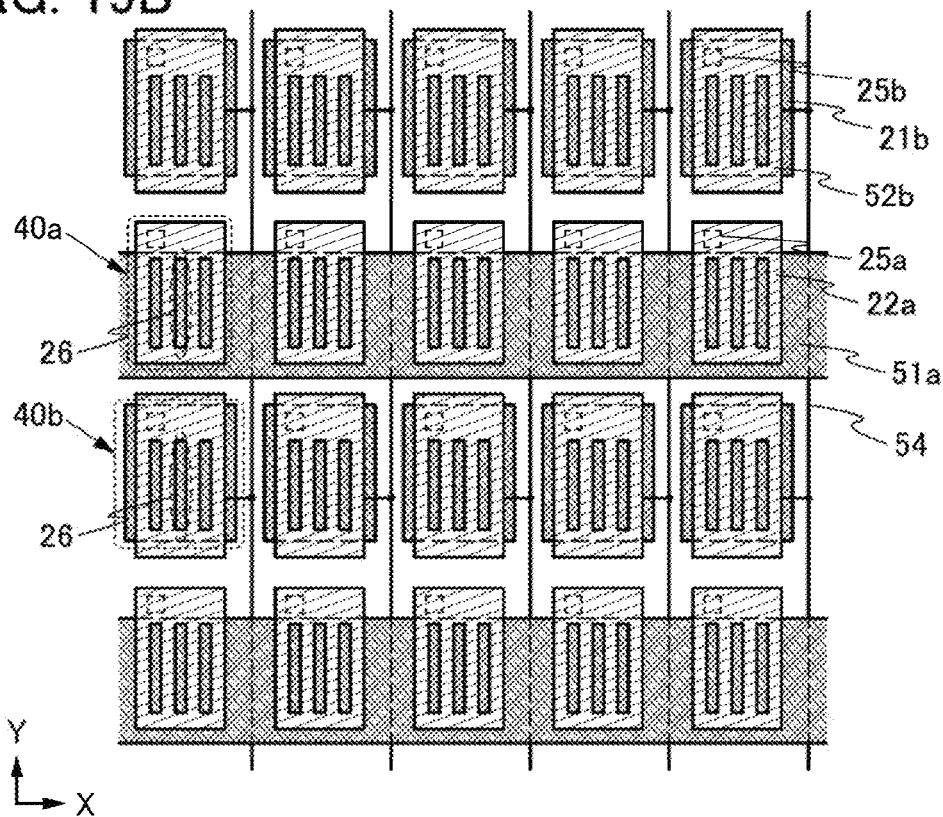

The sensor electrodes may each be electrically connected to another wiring (e.g., a wiring formed using the same conductive film as a gate signal line, or a wiring formed using the same conductive film as a source signal line). Alternatively, one or both of sensor electrodes may be formed into an island shape, and the island-shaped sensor electrodes may be electrically connected to each other through another wiring (e.g., a wiring formed using the same conductive film as a gate signal line, or a wiring formed using the same conductive film as a source signal line). In FIG. 19A, the sensor electrode 51a having an island shape is provided for each pixel to be large enough to function as the common electrode of the pixel 40a, and a wiring 53 extending in the X direction is electrically connected to a plurality of sensor electrodes 51a. In FIG. 19B, the sensor electrode 52b having an island shape is provided for each pixel to be large enough to function as the common electrode of the pixel 40b, and a wiring 54 extending in the Y direction is electrically connected to a plurality of sensor electrodes 52b. An island-shaped sensor electrode may function as a common electrode for not one pixel but a plurality of pixels.

For example, when the wiring 53 is provided parallel to a source signal line, the wiring 53 is preferably formed using the same conductive film as the source signal line. When the wiring 53 is provided parallel to a gate signal line, the wiring 53 is preferably formed using the same conductive film as the gate signal line. Thus, the wiring 53 does not intersect with the source signal line or the gate signal line, which is preferable. The same applies to the wiring 54.

Figure 20A:
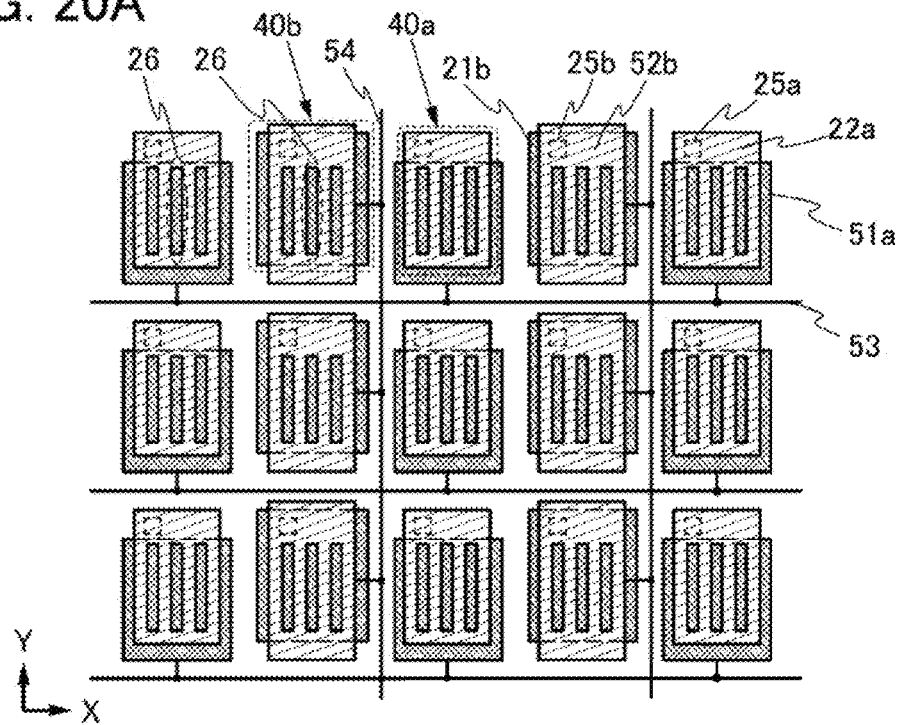
FIGS. 20A and 20B are each a top view illustrating positions of electrodes of touch sensors and the like of one embodiment.
Figure 20B:
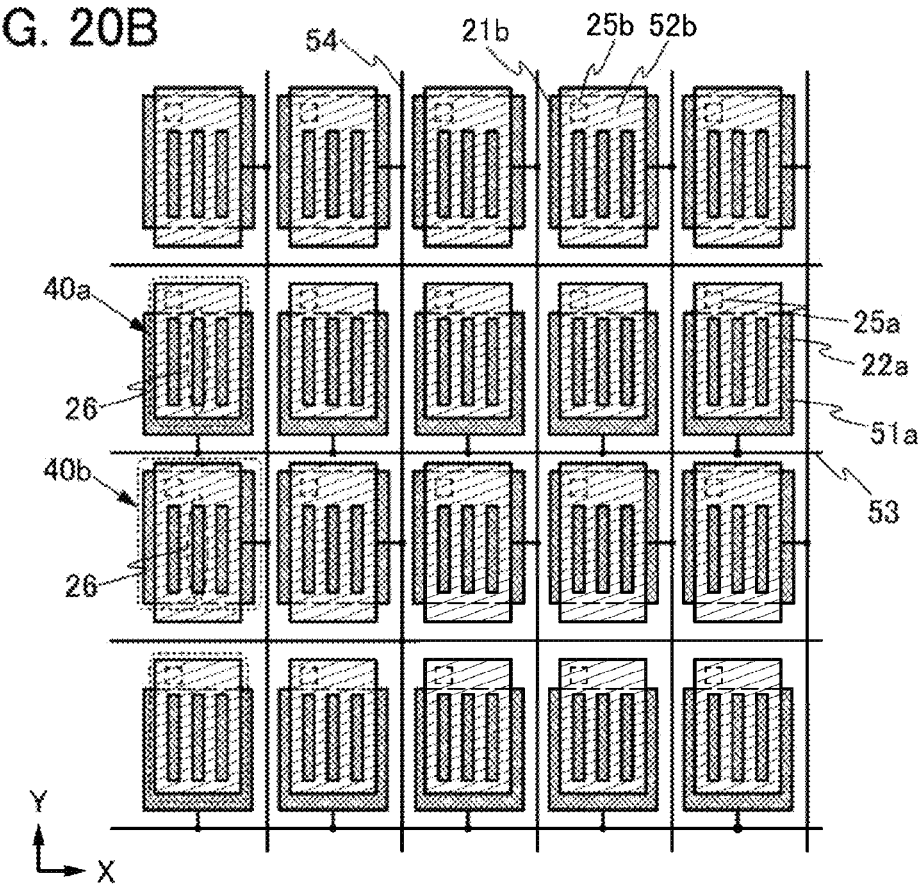

FIGS. 20A and 20B each illustrate an example in which the sensor electrodes 51a and the sensor electrodes 52b, which have island shapes, are provided for respective pixels and the sensor electrodes 51a and the sensor electrodes 52b are electrically connected to the wiring 53 and the wiring 54, respectively. The difference between FIGS. 20A and 20B is the layout of the pixels 40a and 40b. In FIG. 20A, the pixels 40a are adjacent to each other in the Y direction and the pixels 40b are adjacent to each other in the Y direction. In FIG. 20B, the pixels 40a are adjacent to each other in the X direction and the pixels 40b are adjacent to each other in the X direction.

Figure 21A:
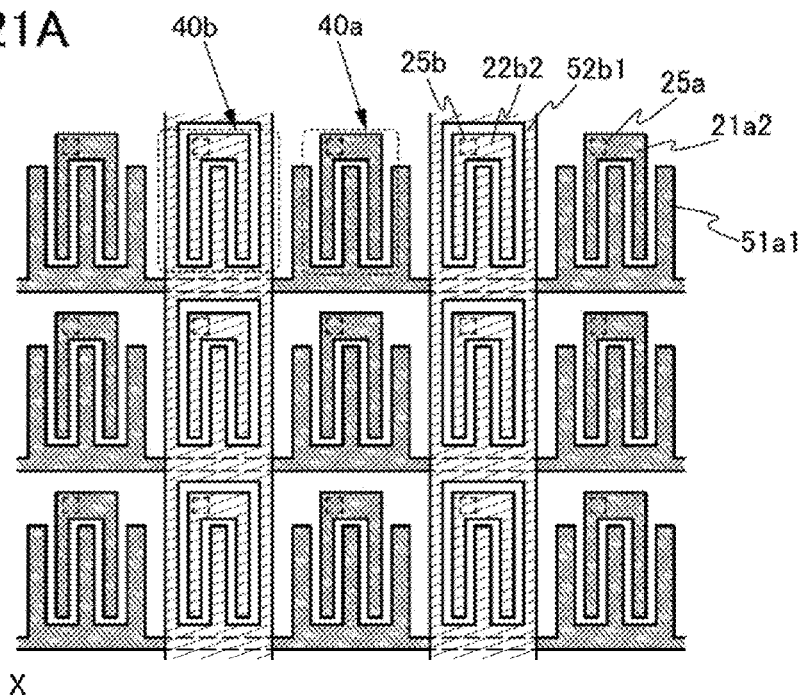
FIGS. 21A and 21B are each a top view illustrating positions of electrodes of touch sensors and the like of one embodiment.

In the structure illustrated in FIG. 21A, the touch sensor includes a sensor electrode 51a1 and a sensor electrode 52b1. FIG. 21A corresponds to FIG. 4C. The sensor electrode 51a1 functions as the common electrode in the pixel 40a and is formed using the same conductive film as the pixel electrode 21a2 of the pixel 40a. The sensor electrode 52b1 functions as the common electrode in the pixel 40b and is formed using the same conductive film as the pixel electrode 22b2 of the pixel 40b. The sensor electrode 51a1 and the pixel electrode 21a2 each have a comb-like top surface shape in the pixel 40a. The sensor electrode 52b1 and the pixel electrode 22b2 each have a comb-like top surface shape in the pixel 40b.

The sensor electrode 51a1 extends in one direction (e.g., the X direction), and the sensor electrode 52b1 extends in another direction (e.g., the Y direction) intersecting with the one direction. An insulating film (not illustrated) is provided between the sensor electrode 51a1 and the sensor electrode 52b1. With such a structure, a conductive film (also referred to as a bridge electrode) which electrically connects the sensor electrodes or the other sensor electrodes through an opening in an insulating film or the like is not necessarily provided in a region where one sensor electrode intersects with the other sensor electrode, whereby a high-definition display device can be provided.

Although the sensor electrode 51a1 extends in the X direction and the sensor electrode 52b1 extends in the Y direction in FIG. 21A, one embodiment of the present invention is not limited thereto. The sensor electrode 51a1 may extend in the Y direction and the sensor electrode 52b1 may extend in the X direction, which can be obtained by rotating the structure of FIG. 21A 90 degrees.

Figure 21B:
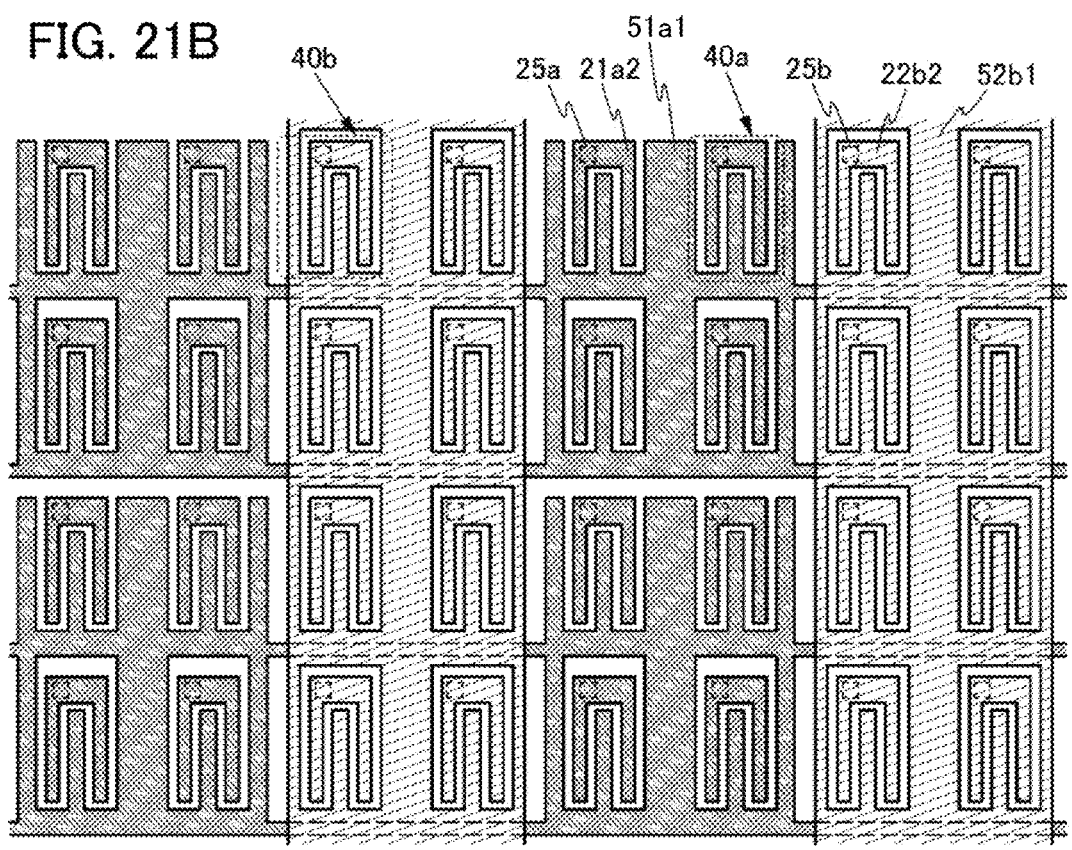

In FIG. 21A, a sensor electrode may be provided for a plurality of rows or columns. For example, FIG. 21B illustrates the case where the sensor electrodes are provided across two columns and two rows of pixels in the layout in FIG. 21A.

A variety of modification examples of the sensor electrodes and the like are described; however, one embodiment of the present invention is not limited thereto. The drawings and what is described here can be freely combined with and applied to each other. Therefore, for example, in the case where part of a drawing is modified, the same modification can be made in another drawing and further modification can be made on part of the modified drawing.

The above is the description of examples of the touch panel.

Structure Example 1

More specific structure examples of the display device or the touch panel are described below. Structure examples to be described below and the structure examples described above can be combined with or applied to each other. Therefore, in a structure example to be described below, part thereof can be modified into any of the structure examples described above.

Figure 22A:
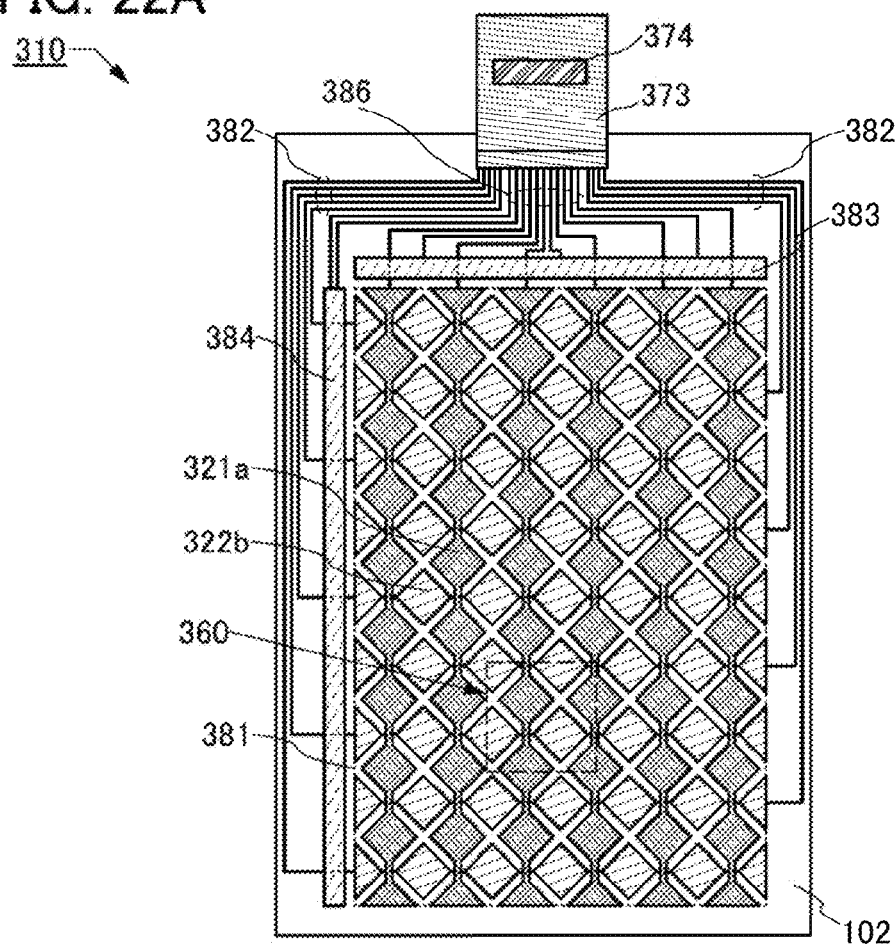
FIGS. 22A and 22B are top views illustrating an example of a display device of one embodiment.

FIG. 22A is an example of a schematic top view of a display device 310 of one embodiment of the present invention. Note that in FIG. 22A, only components provided on an element substrate side are illustrated and a counter substrate side is not illustrated. In addition, only main components are illustrated in FIG. 22A for simplicity.

The display device 310 includes a substrate 102 and a substrate 372 (not illustrated) which face each other.

A display portion 381, a wiring 382, a driver circuit 383, a driver circuit 384, a wiring 386, and the like are provided over the substrate 102 (see FIG. 22A). A conductive film 321a and a conductive film 322b are formed in the display portion 381. The substrate 102 is provided with an FPC 373 that is electrically connected to the wirings 382 and 386. In the example illustrated in FIG. 22A, an IC 374 is provided over the FPC 373.

Each of a plurality of conductive films 321a is electrically connected to one of a plurality of wirings 386. Each of a plurality of conductive films 322b is electrically connected to one of a plurality of wirings 382.

The display portion 381 includes at least a plurality of pixels. Each of the pixels includes at least one display element. It is preferable that each of the pixels include a transistor and a display element. As the display element, typically, a light-emitting element such as an organic EL element, a liquid crystal element, or the like can be used. In this structure example, a liquid crystal element is used as the display element.

The driver circuit 383 and the driver circuit 384 are each electrically connected to some of the plurality of wirings 386. A signal line driver circuit and a scan line driver circuit can be used for the driver circuit 383 and the driver circuit 384, respectively. In other words, the driver circuit 383 and the driver circuit 384 can each be used as a circuit having a function of driving scan lines (gate signal lines), signal lines (source signal lines), or the like in pixels for display. Alternatively, the driver circuit 383 and the driver circuit 384 may be used as a scan line driver circuit and a signal line driver circuit, respectively.

Note that at least one of the driver circuits 383 and 384 is not provided over the substrate 102 in some cases.

The wirings 382 and 386 have a function of supplying a signal or electric power to the display portion 381 and the driver circuits 383 and 384. The signal or the electric power is input from the outside or the IC 374 to the wirings 382 and 386 through the FPC 373.

The driver circuit 383 or the driver circuit 384 may have a function of driving not a gate signal line or a source signal line of a pixel but a common electrode (i.e., a sensor electrode) of a pixel. Alternatively, the driver circuit 383 or the driver circuit 384 may have both a function of driving a gate signal line or a source signal line of a pixel and a function of driving a common electrode (i.e., a sensor electrode) of a pixel. Further alternatively, a circuit having a function of driving a gate signal line or a source signal line of a pixel and a circuit having a function of driving a common electrode (i.e., a sensor electrode) of a pixel may be separately provided.

A circuit for display, such as a gate line driver circuit or a source line driver circuit is formed in an IC in some cases. Accordingly, at least one of a pulse voltage output circuit and a current sensing circuit for a sensor and at least one of a gate line driver circuit and a source line driver circuit may be formed in an IC. For example, a source line driver circuit is formed in an IC in many cases because of its high driving frequency. A current sensing circuit is also formed in an IC in many cases because an operational amplifier is sometimes needed. Therefore, a source line driver circuit and a current sensing circuit may be formed in an IC. In this case, a gate line driver circuit and a pulse voltage output circuit may be formed over a substrate provided with the pixels. Alternatively, a source line driver circuit, a current sensing circuit, and a pulse voltage output circuit may be formed in an IC.

The driver circuit 384 has, for example, a function of sequentially selecting the conductive films 322b. When the touch sensor is driven by sequentially selecting not the conductive films 322b but the conductive films 321a, the driver circuit 384 has a function of switching a fixed potential and a sensing signal and supplying it to the conductive films 322b. In the case where a signal for driving the touch sensor is supplied from the IC 374 or the outside, the driver circuit 384 does not necessarily have the above functions.

In the example illustrated in FIG. 22A, the IC 374 is mounted on the FPC 373 by a chip-on-film (COF) method. As the IC 374, an IC which has a function of driving a touch sensor, specifically, a function of switching a fixed potential and a sensing signal and supplying it to the conductive films 321a can be used. In the case where the display device 310 does not include the driver circuit 383 and/or the driver circuit 384, the IC 374 may include a circuit(s) functioning as a signal line driver circuit and/or a scan line driver circuit. In the case where the driver circuit 383 has a function of switching a fixed potential and a sensing signal and supplying it to the conductive films 321a, the IC 374 is not necessarily provided. The IC 374 may also be directly mounted on the substrate 102 by a chip-on-glass (COG) method or the like.

The touch sensor includes the conductive film 321a and the conductive film 322b which are provided over the substrate 102. With the use of capacitance formed between the conductive film 321a and the conductive film 322b, the approach or contact of an object can be sensed.

Figure 22B:
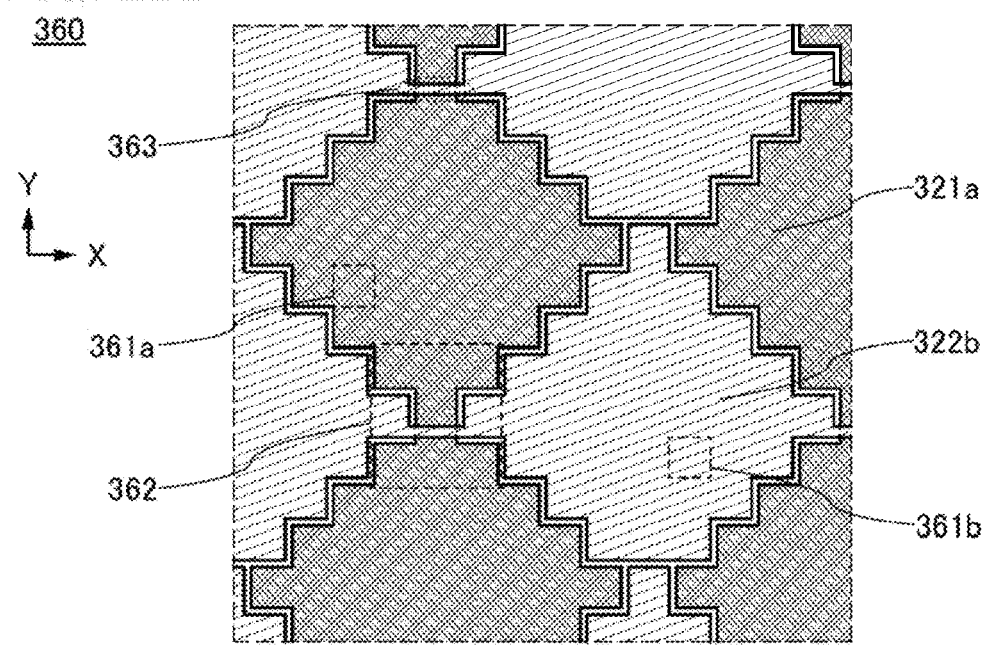

FIG. 22B is an enlarged schematic top view of a region 360 in FIG. 22A. In FIG. 22B, only the conductive film 321a and the conductive film 322b included in the touch sensor are schematically illustrated.

The conductive film 321a and the conductive film 322b each have a function as a common electrode included in the liquid crystal elements in the display device 310. In FIG. 22B, the conductive film 321a functions as the common electrode in a region 361a including one pixel, and the conductive film 322b functions as the common electrode in a region 361b including another pixel.

The conductive film 321a functions as both one electrode of the touch sensor and a common electrode of a liquid crystal element. The conductive film 322b functions as both the other electrode of the touch sensor and the common electrode of a liquid crystal element. In other words, the conductive film 321a includes a region functioning as one electrode of the touch sensor and a region functioning as the common electrode of a liquid crystal element, and the conductive film 322b includes a region functioning as the other electrode of the touch sensor and a region functioning as the common electrode of a liquid crystal element. That is, the conductive film 321a includes one electrode of the touch sensor and the common electrode of a liquid crystal element, and the conductive film 322b includes the other electrode of the touch sensor and the common electrode of a liquid crystal element.

The conductive film 321a extends in the direction (the Y direction in FIG. 22B) perpendicular to the direction in which the driver circuit 383 extends, and the conductive film 322b extends in the direction (the X direction) perpendicular to the conductive film 321a. The conductive film 322b is provided over the conductive film 321a with an insulating film (not illustrated) provided therebetween, so that the conductive film 321a and the conductive film 322b can intersect with each other with the insulating film provided therebetween. An intersection 363 is a region where the conductive film 321a and the conductive film 322b intersect with each other. Since a bridge electrode is not necessarily formed in the intersection 363, a wiring contact portion for a bridge electrode can be omitted in a pixel. Therefore, the display device of one embodiment of the present invention can have high definition.

Figure 23:
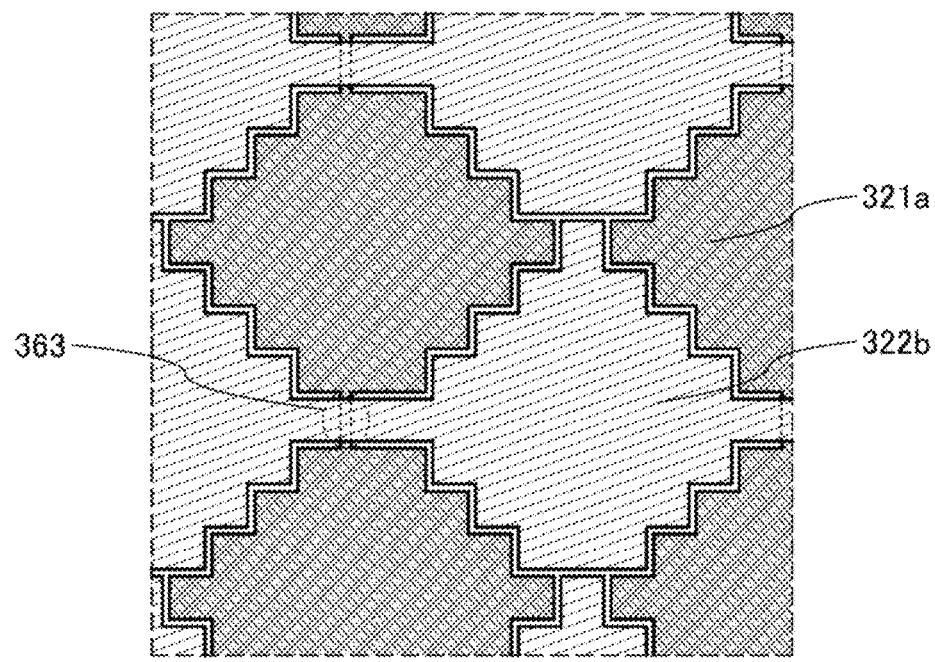
FIG. 23 is a top view illustrating an example of a display device of one embodiment.

In the intersection 363 in FIG. 22B, the conductive film 322b narrows and thus does not function as a common electrode, while the conductive film 321a keeps its width and thus functions as a common electrode. Note that one embodiment of the present invention is not limited thereto. For example, as illustrated in FIG. 23, in the intersection 363, the conductive film 322b may keep its width and function as a common electrode, while the conductive film 321a may narrow and thus does not function as a common electrode.

Figure 24A:
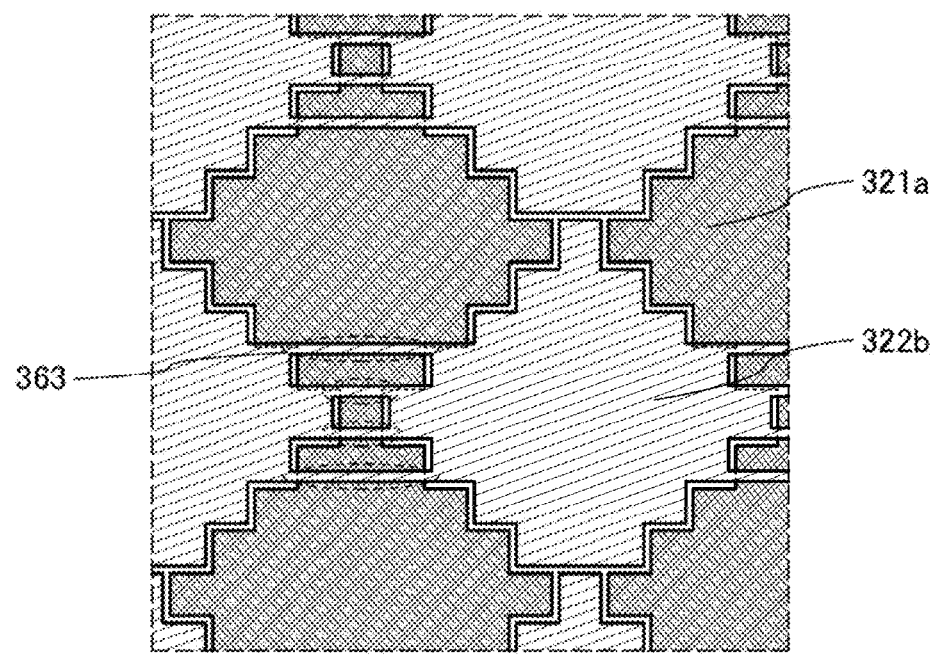
FIGS. 24A and 24B are each a top view illustrating an example of a display device of one embodiment.
Figure 24B:
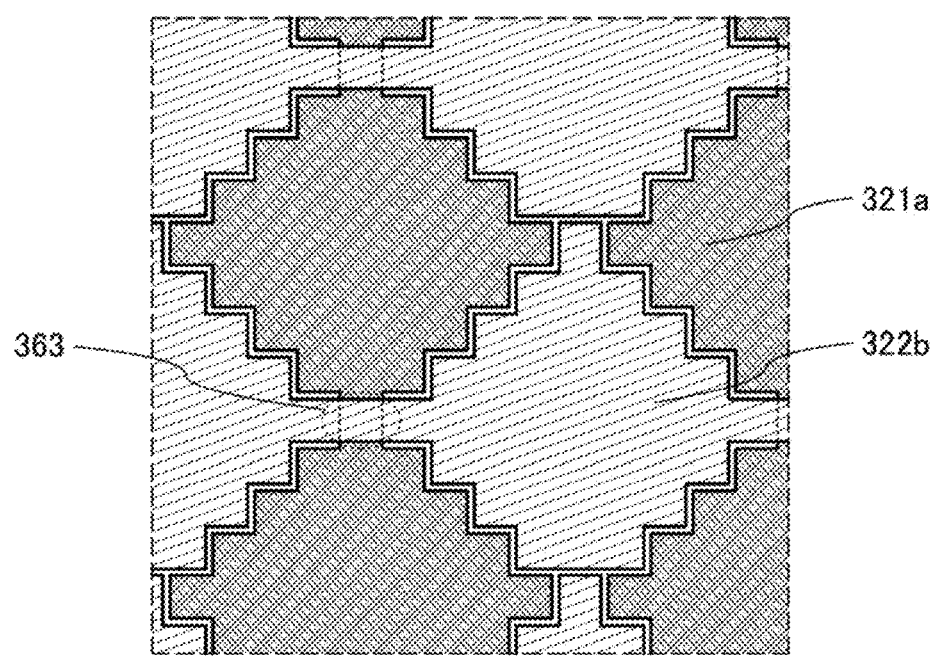
Figure 25A:
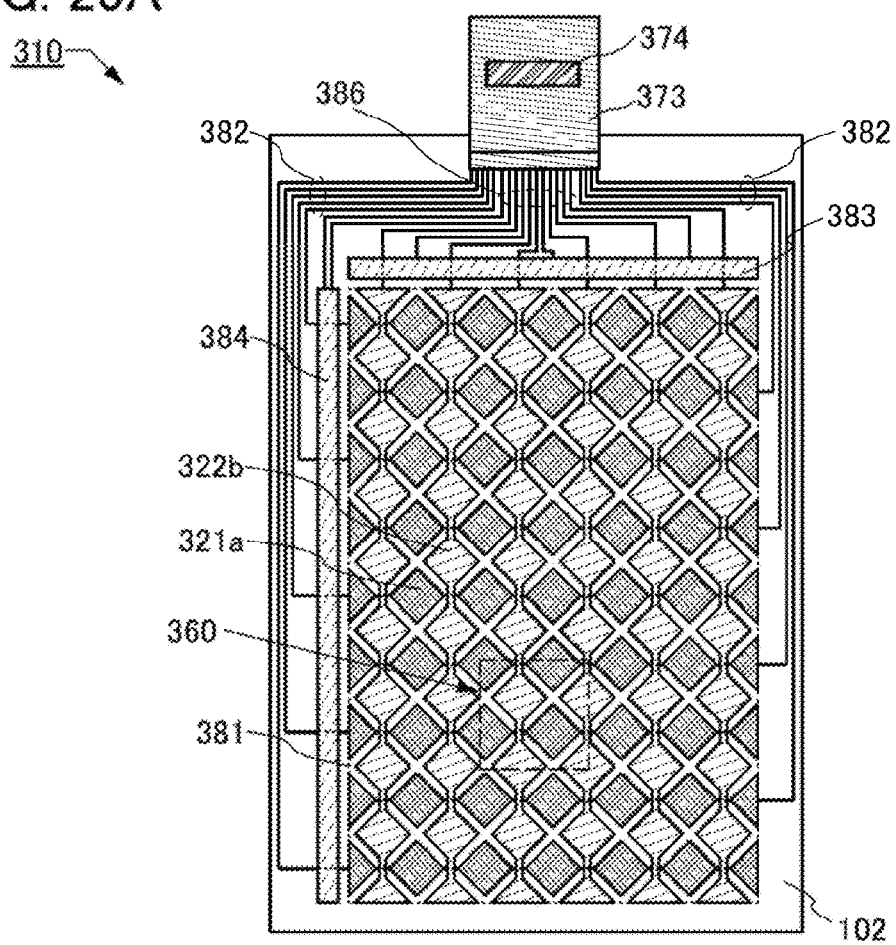
FIGS. 25A and 25B are top views illustrating an example of a display device of one embodiment.
Figure 25B:
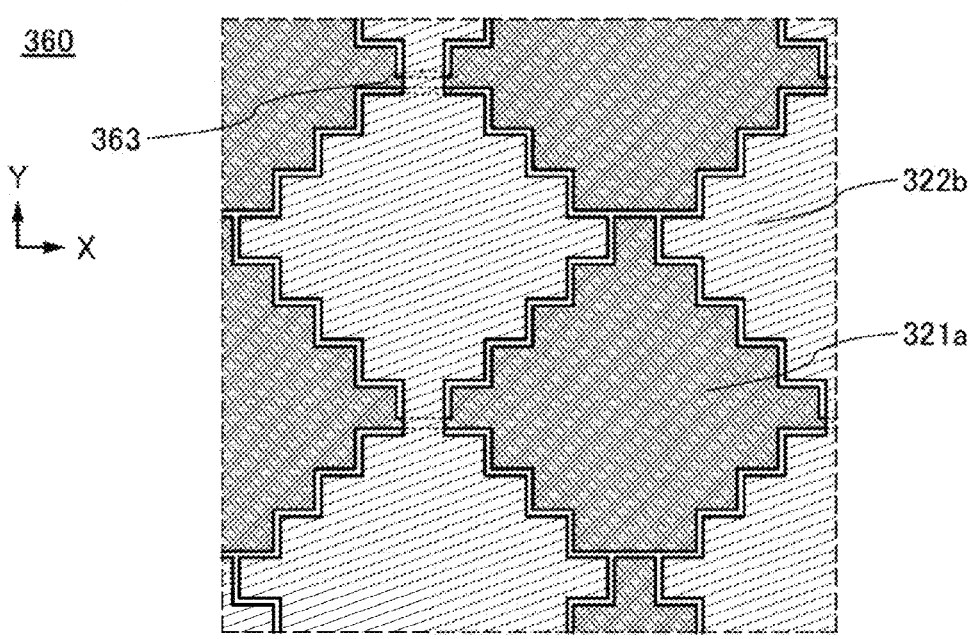
Figure 26:
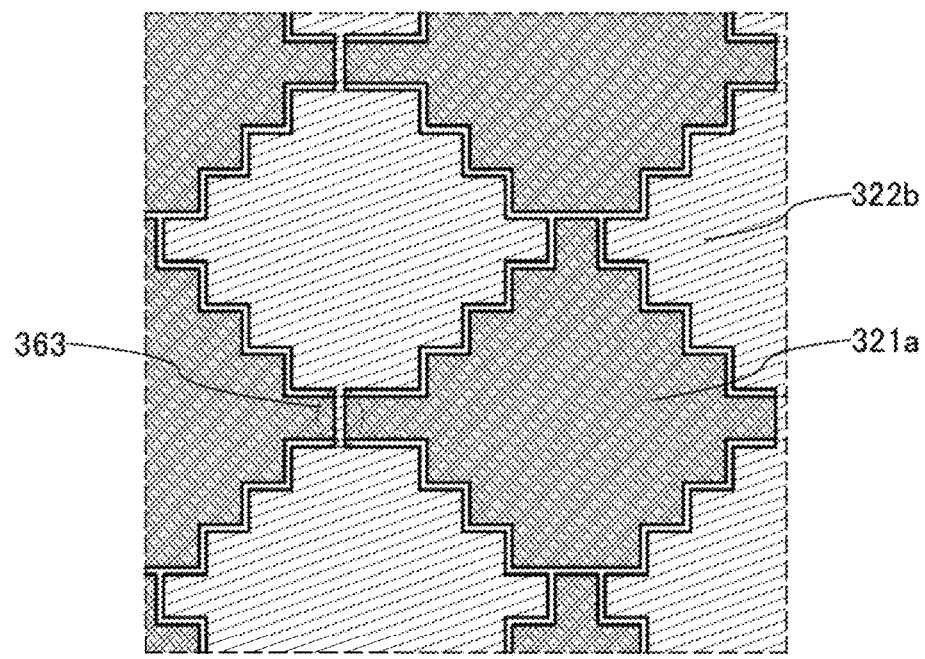
FIG. 26 is a top view illustrating an example of a display device of one embodiment.
Figure 27:
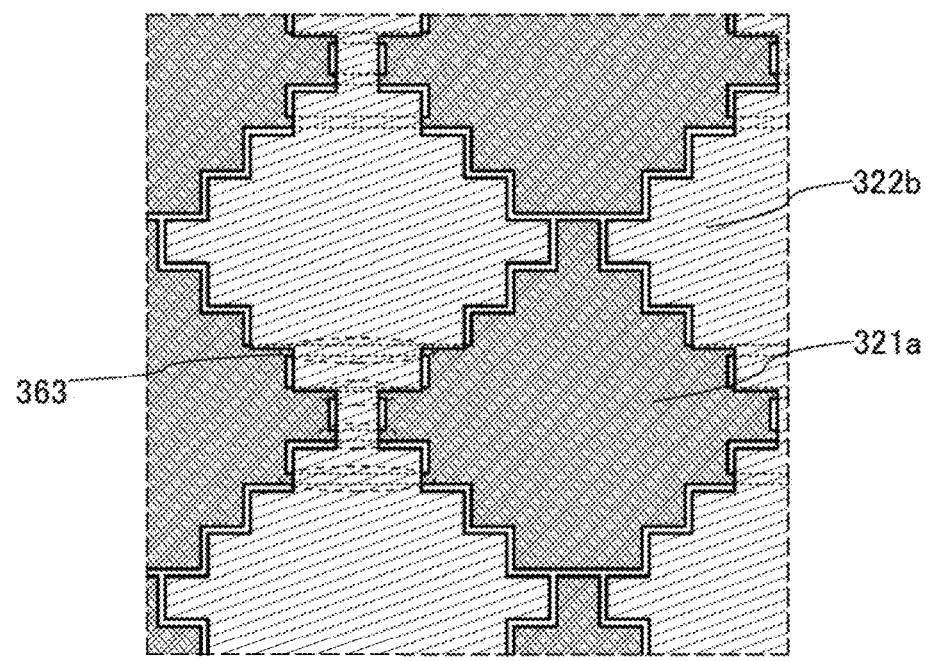
FIG. 27 is a top view illustrating an example of a display device of one embodiment.

In FIG. 22B, although one conductive film 321a intersects with one conductive film 322b at one intersection 363, a plurality of intersections 363 may be provided. In an example in FIG. 24A, one conductive film 321a intersects with one conductive film 322b at four intersections 363. Alternatively, the conductive film 322b may be provided for the entire region of one pixel including the intersection 363 as illustrated in FIG. 24B. In this case, the pixel cannot perform display. However, this is not a major issue because such a pixel does not have a huge adverse effect on the whole display. With any of the above structures, an increase of resistance of the conductive film 322b in the intersection 363 can be suppressed and signal delay in driving a touch sensor or the like can be suppressed.

Although in FIGS. 22A and 22B, FIG. 23, and FIGS. 24A and 24B, the conductive film 321a extends in the Y direction indicated in FIG. 22B and the conductive film 322b extends in the X direction, one embodiment of the present invention is not limited thereto. By rotating the structure 90 degrees, the conductive film 321a may extend in the X direction and the conductive film 322b may extend in the Y direction. FIGS. 25A and 25B, FIG. 26, and FIG. 27 illustrate such cases.

Structure Example 1 of Pixel

Figure 28:
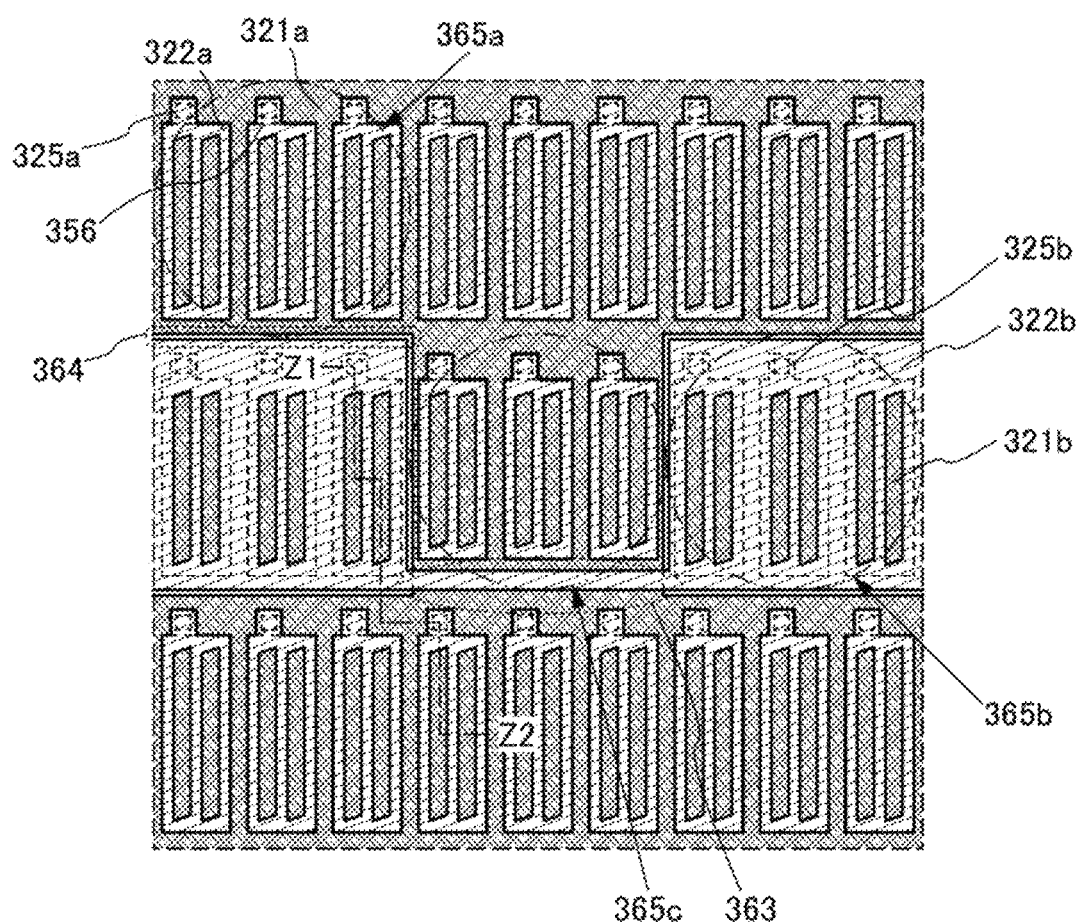
FIG. 28 is a top view illustrating an example of a display device of one embodiment.
Figure 29A:
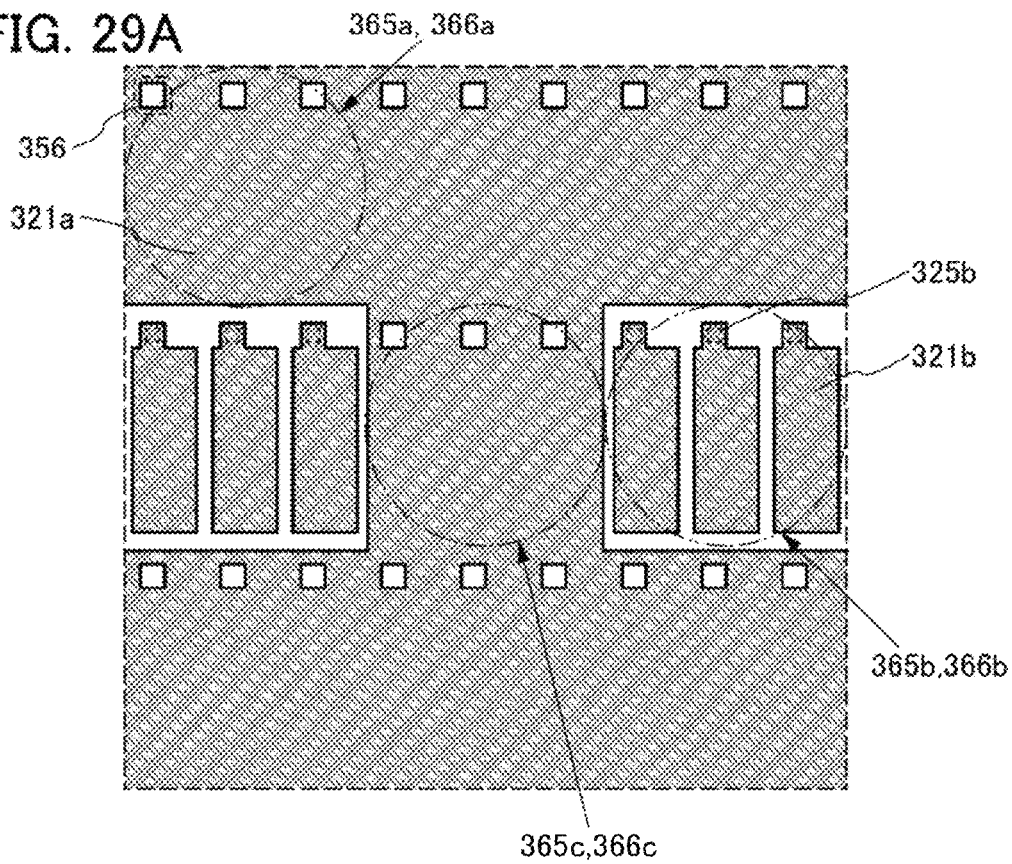
FIGS. 29A and 29B are top views illustrating an example of a display device of one embodiment.
Figure 29B:
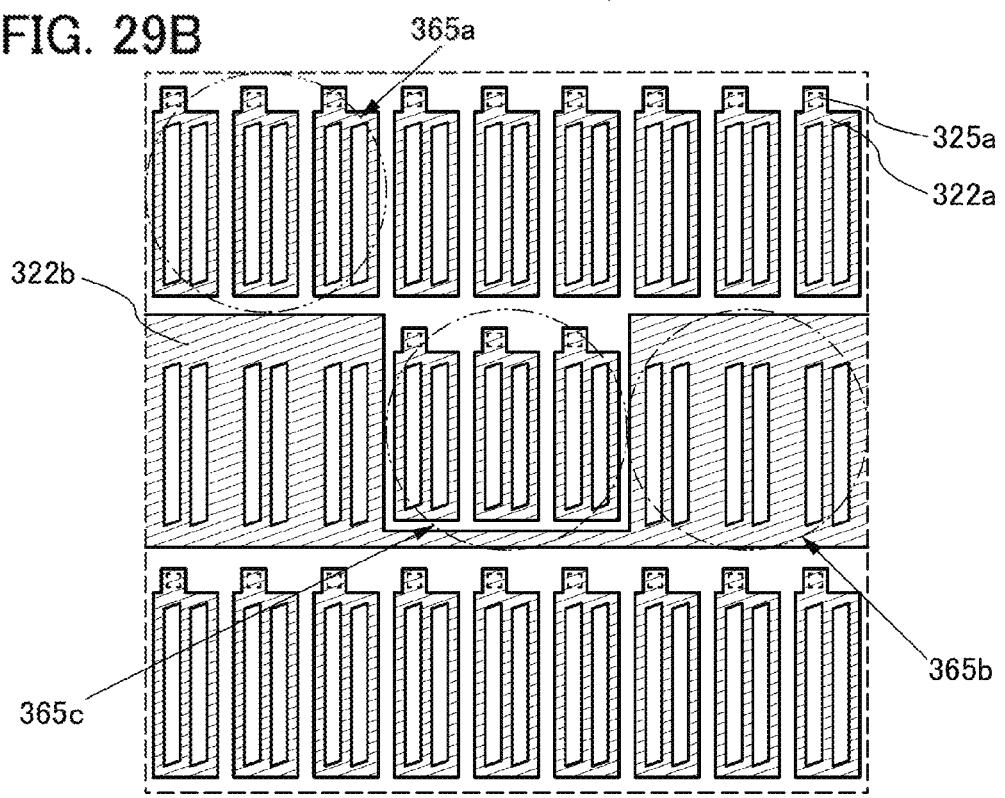

FIG. 28 illustrates a structure example of pixels included in the display device 310. FIG. 28 is an example of a more detailed schematic top view of a region 362 including nine pixels in FIG. 22B. In FIG. 28, a layer formed using a material similar to and concurrently with the conductive film 321a and a layer formed using a material similar to and concurrently with the conductive film 322b are illustrated. A conductive film 321b, which is formed on the same plane as the conductive film 321a, can be formed concurrently with the conductive film 321a. A conductive film 322a, which is formed on the same plane as the conductive film 322b, can be formed concurrently with the conductive film 322b. FIG. 29A is a top view illustrating only the conductive films 321a and 321b in the region 362, and FIG. 29B is a top view illustrating only the conductive films 322a and 322b in the region 362.

In a first pixel 365a, the conductive film 321a functions as a common electrode and the conductive film 322a functions as a pixel electrode. The conductive film 322a is electrically connected to a transistor (not illustrated) through an opening 325a provided in an insulating film under the conductive film 322a and an opening 356 provided in the conductive film 321a (see FIG. 28 and FIG. 29A). Pixels are arranged such that at least two of four adjacent pixels function as the first pixels 365a. When a plurality of first pixels 365a is provided adjacent to each other in the Y direction indicated in FIG. 22B, the conductive film 321a functioning as one electrode of the touch sensor can extend in the Y direction.

In a second pixel 365b, the conductive film 321b functions as a pixel electrode and the conductive film 322b functions as a common electrode. The conductive film 321b is electrically connected to a transistor (not illustrated) through an opening 325b provided in an insulating film under the conductive film 321b. Pixels are arranged such that at least one of four adjacent pixels functions as the second pixel 365b.

Similarly to the first pixel 365a, in a third pixel 365c, the conductive film 321a functions as the common electrode and the conductive film 322a functions as the pixel electrode. In the third pixel 365c, the intersection 363 where the conductive film 322b and the conductive film 321a intersect with each other is provided. When the plurality of second pixels 365b is arranged in the X direction indicated in FIG. 22B and the third pixel 365c is provided between the two second pixels 365b in the X direction, the conductive film 322b functioning as the other electrode of the touch sensor can extend in the X direction. The display device 310 includes the first pixel 365a, the second pixel 365b, and the third pixel 365c, whereby a pair of electrodes of the touch sensor can be formed using the common electrodes (i.e., the conductive film 321a and the conductive film 322b) included in the display portion 381. Since the third pixel 365c includes the conductive film 322b included in the intersection 363, the conductive film 322a of the third pixel 365c is smaller than the conductive film 322a of the first pixel 365a in a top view.

Figure 30A:
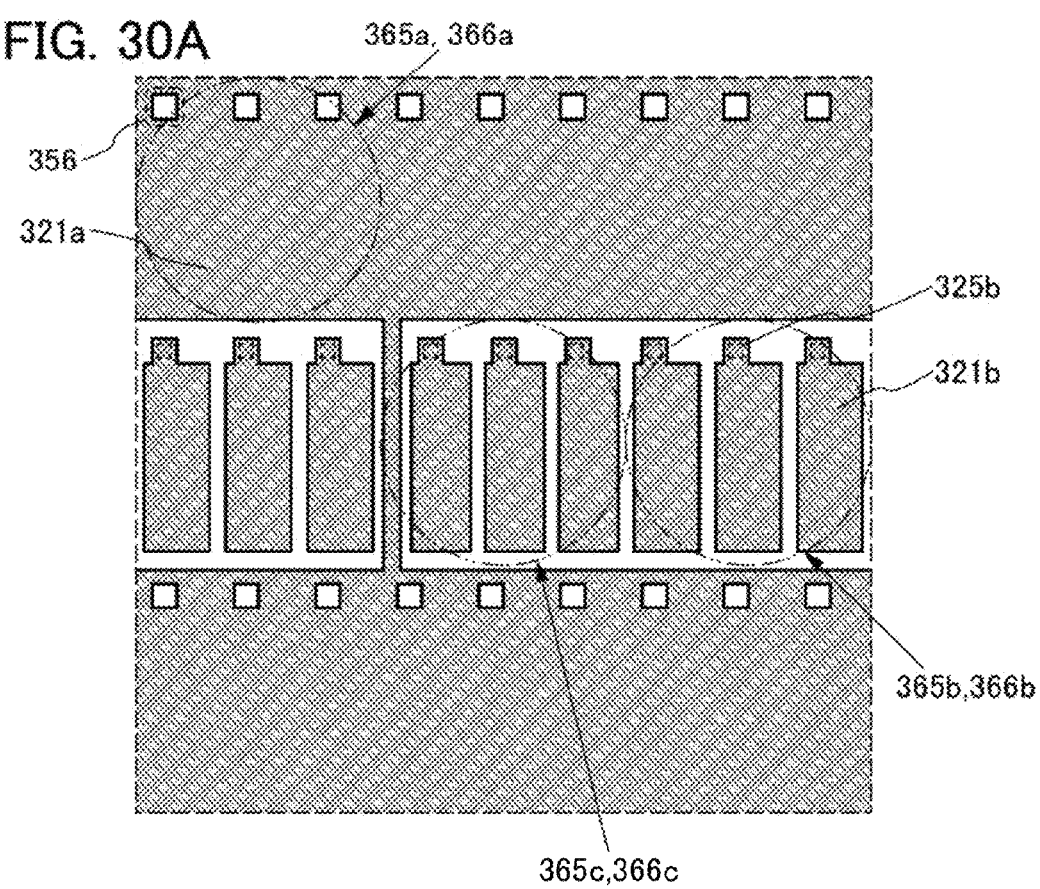
FIGS. 30A and 30B are top views illustrating an example of a display device of one embodiment.
Figure 30B:
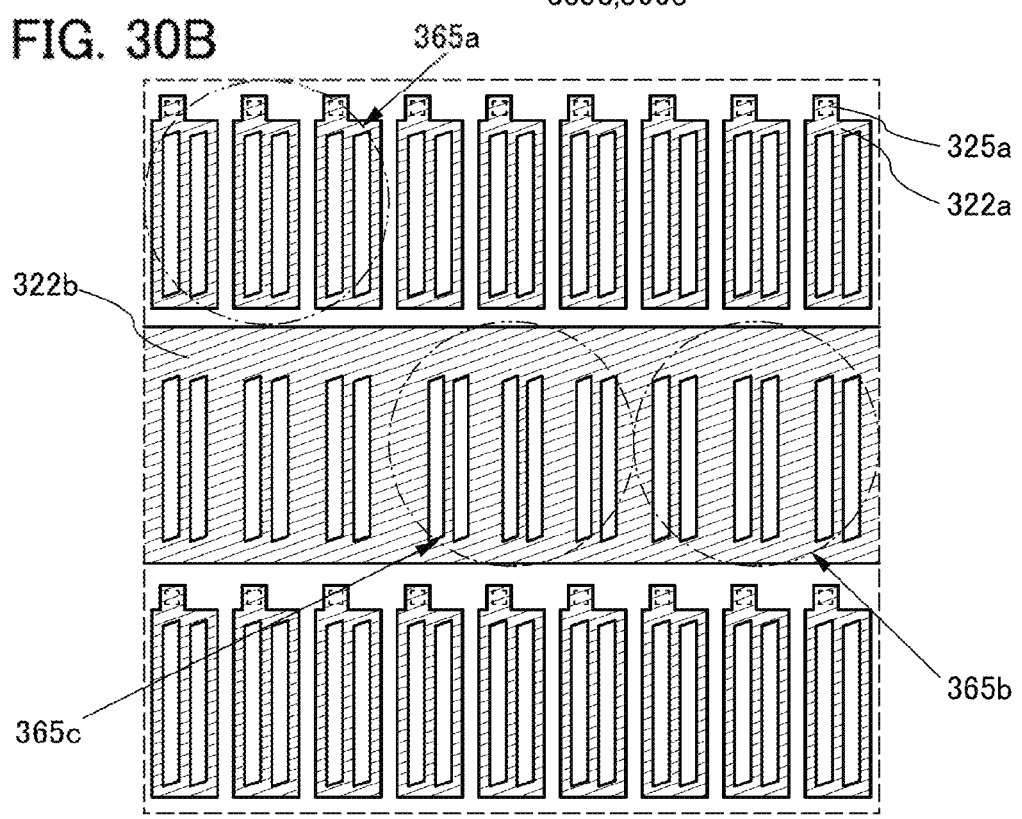

In the intersection in FIGS. 29A and 29B, the conductive film 322b narrows and does not function as a common electrode. In contrast, in the intersection, the conductive film 321a keeps its width and functions as a common electrode. However, one embodiment of the present invention is not limited thereto. For example, as illustrated in FIGS. 30A and 30B, the conductive film 322b keeps its width in the intersection and functions as a common electrode. In the intersection, the conductive film 321a may narrow and does not function as a common electrode. FIG. 30A is a modification example of FIG. 29A. FIG. 30B is a modification example of FIG. 29B.

Figure 31A:
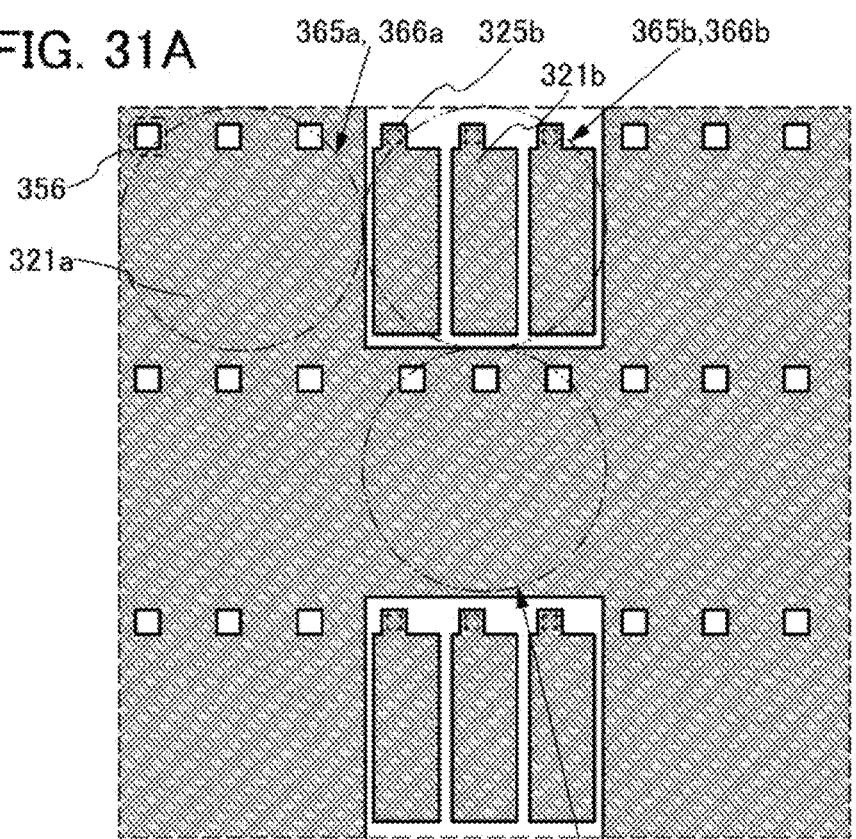
FIGS. 31A and 31B are top views illustrating an example of a display device of one embodiment.
Figure 31B:
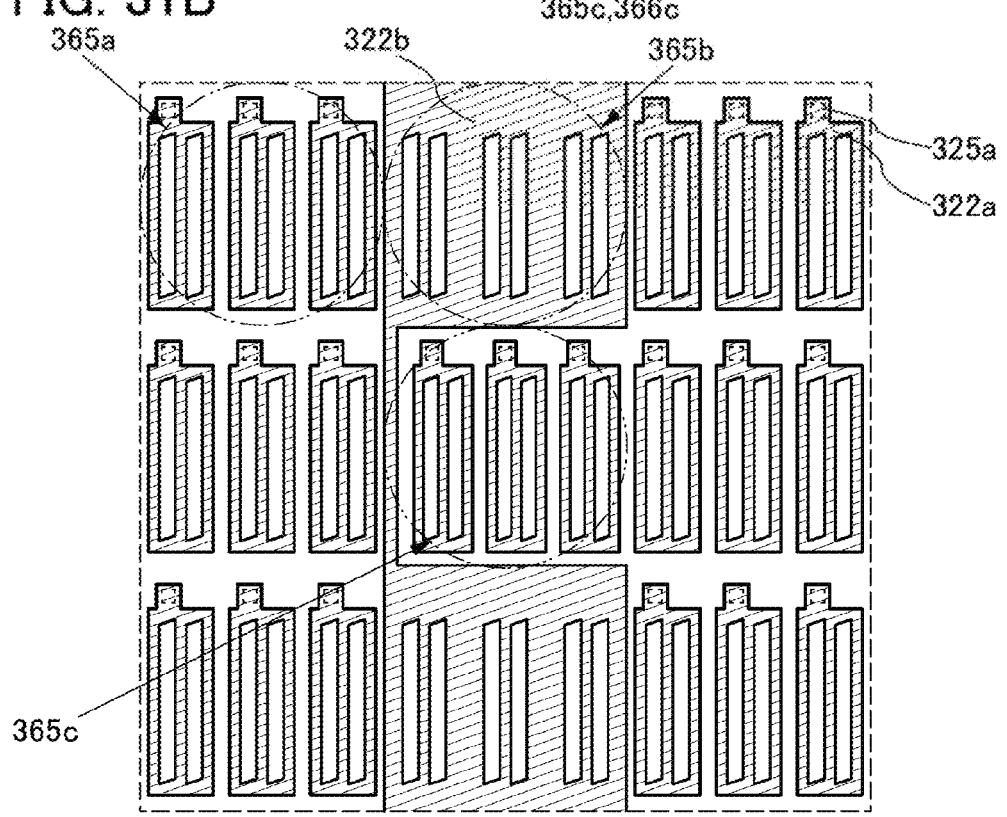
Figure 32A:
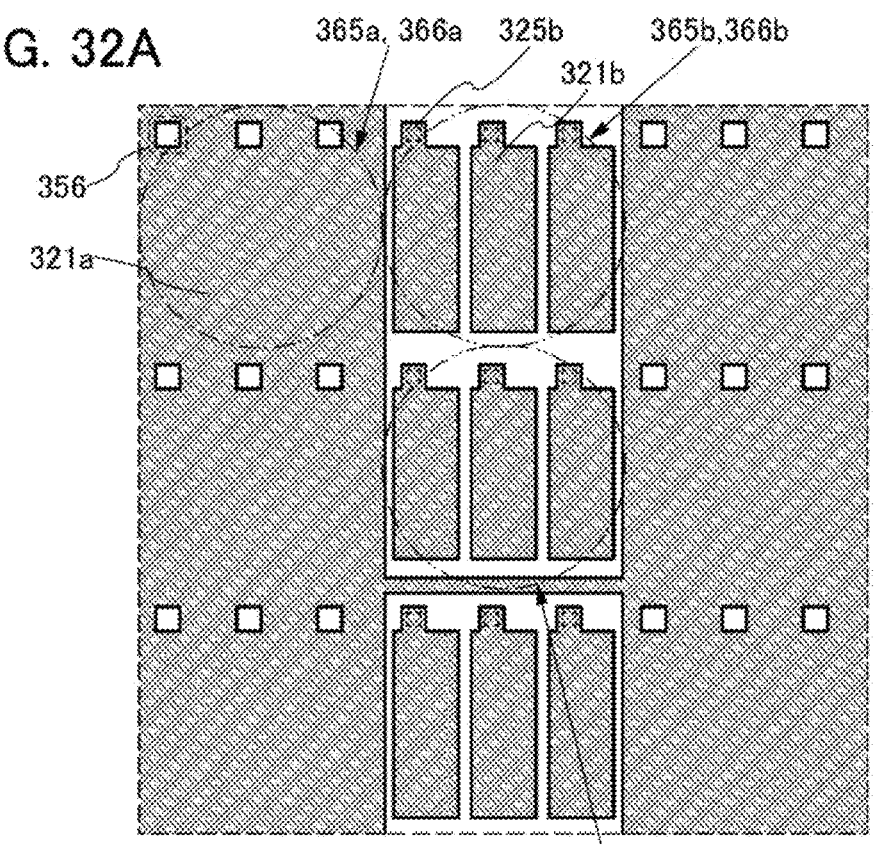
FIGS. 32A and 32B are top views illustrating an example of a display device of one embodiment.
Figure 32B:
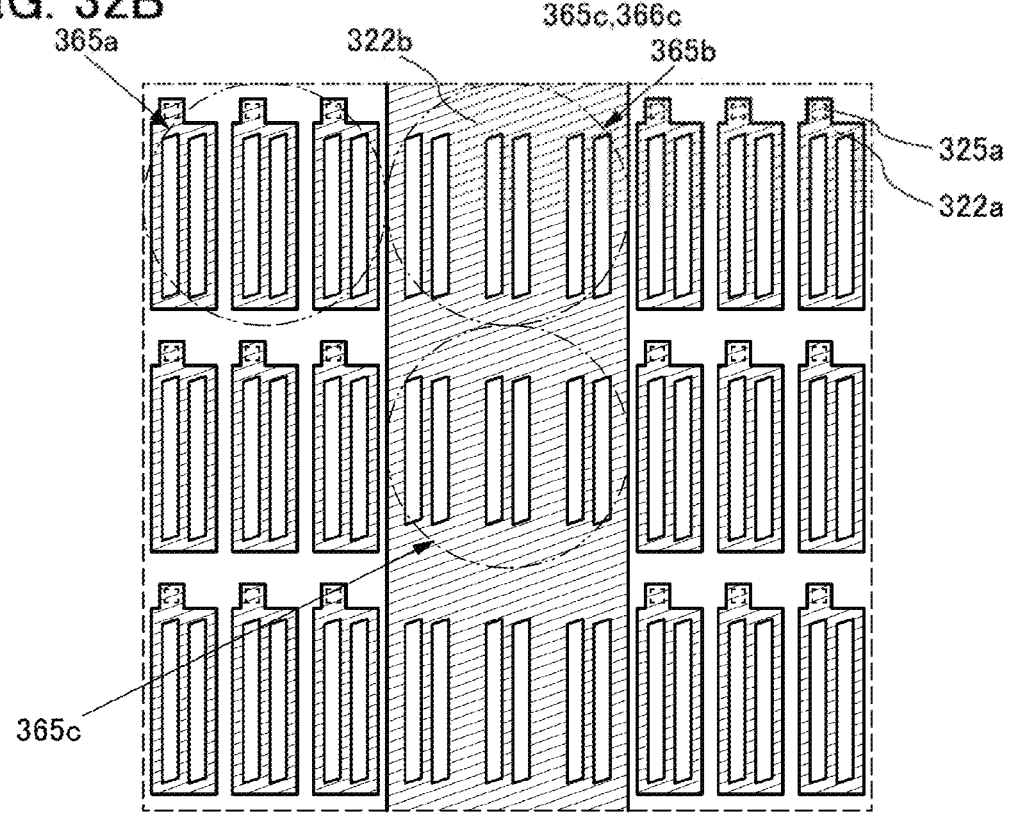

In FIGS. 29A and 29B and FIGS. 30A and 30B, the conductive film 321a extends in the Y direction indicated in FIG. 22B and the conductive film 322b extends in the X direction; however, one embodiment of the present invention is not limited thereto. The directions in which the conductive film 321a and the conductive film 322b extend may rotate 90 degrees; the conductive film 321a may extend in the Y direction and the conductive film 322b may extend in the X direction. An example in that case is illustrated in FIGS. 31A and 31B and FIGS. 32A and 32B. FIG. 31A and FIG. 32A are examples in which the direction in which the conductive film 321a extends in FIG. 29A and FIG. 30A is rotated 90 degrees. FIG. 31B and FIG. 32B are examples in which the direction in which the conductive film 322b extends in FIG. 29B and FIG. 30B is rotated 90 degrees.

In FIG. 28, in the vicinity of a boundary between the first pixel 365a and the second pixel 365b, the conductive film 321a faces the conductive film 322b with a space 364 provided therebetween. In other words, the conductive film 321a included in the first pixel 365a and the conductive film 322b included in the second pixel 365b do not overlap in the top view. With such a structure, the capacitance formed between the conductive films 321a and 322b can be easily changed by approach of an object.

The conductive film 322a is preferably provided inner side of the conductive film 321a in the top view. The conductive film 321b is also preferably provided inner side of the conductive film 322b. With this structure, an adverse effect of an electric field generated by wirings provided under the conductive films 321a and 321b on alignment of liquid crystals can be suppressed and thus alignment defects of the liquid crystals can be reduced.

In the display device of one embodiment of the present invention, the display portion includes a plurality of pixels having different structures of pixel electrodes and common electrodes. Specifically, the first pixel 365a, the second pixel 365b, and the third pixel 365c have different structures. In the case where the display device 310 is a transmissive liquid crystal display device, it is particularly preferable to reduce a difference in voltage-transmittance characteristics of a liquid crystal element between the first pixel 365a and the second pixel 365b, which are major pixels included in the display portion 381. If the voltage-transmittance characteristics of the first pixel 365a and those of the second pixel 365b are different, patterns of the conductive film 321a and the conductive film 322b as in FIG. 22B might appear in an image displayed on the display device 310.

Figure 33A:
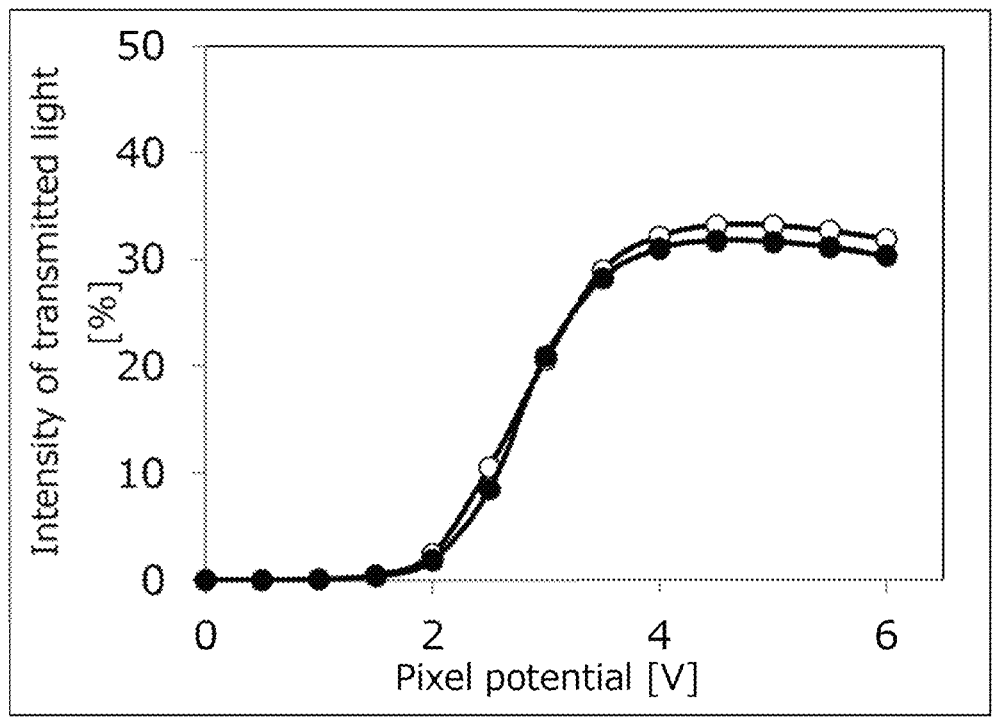
FIGS. 33A and 33B show calculation results of pixel structures of display devices of one embodiment.

FIG. 33A shows calculation results of the voltage-transmittance characteristics of the first pixel 365a and the second pixel 365b. In FIG. 33A, black circles indicate the voltage-transmittance characteristics of the first pixel 365a and white circles indicate the voltage-transmittance characteristics of the second pixel 365b.

Figure 34A:
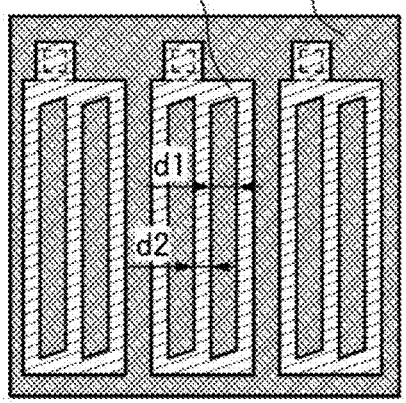
FIGS. 34A to 34D are top views illustrating examples of display devices of one embodiment.
Figure 34B:
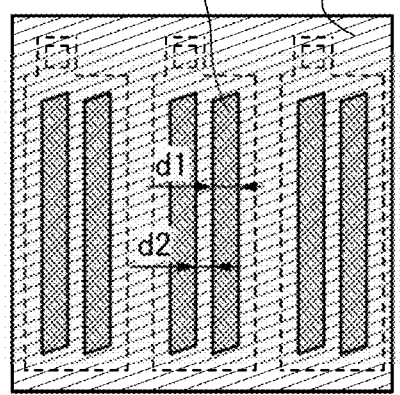

In FIG. 33A, the horizontal axis represents a potential difference between a pixel electrode and a common electrode when the common electrode is at 0 V. In the first pixel 365a, the conductive film 321a is fixed to 0 V and a voltage is applied to the conductive film 322a from 0 V to 6 V, inclusive, at intervals of 0.5 V. In the second pixel 365b, the conductive film 322b is fixed to 0 V and a voltage is applied to the conductive film 321b from 0 V to 6 V, inclusive, at intervals of 0.5 V. The vertical axis in FIG. 33A represents the proportion of intensity of transmitted light when the luminance of a light source is 100%. In other words, the vertical axis represents the proportion of light from a light source which transmits liquid crystal elements included in the first pixel 365a or the second pixel 365b. The calculation is made on the assumption that a display device has the following specifications: the pixel density is 564 ppi, the aperture ratio is 50%, and the aperture transmittance is 79%. The aperture transmittance is a transmittance under consideration of physical properties of liquid crystals and transmittance of an insulating film when the parallel Nicols transmittance in the aperture is 100%, and a coloring film is not used. The pixel size of each of the first pixel 365a and the second pixel 365b is 45 µm×45 µm. The slits in the conductive films 322a and 322b have the same shape; the width d1 of the slit is 3 µm and the width d2 of the electrode in a tooth of a comb-like portion is 2 µm (see FIGS. 34A and 34B).

According to the results in FIG. 33A, there is a difference in the voltage-transmittance characteristics between the first pixel 365a and the second pixel 365b. In response to this, pixel structures are examined in order to reduce a difference in characteristics between the first pixel 365a and the second pixel 365b. Specifically, in consideration of the distribution of a line of electric force generated by the pixel electrode and the common electrode, the shape of the slit, the width of the slit, the thickness of the insulating film between the pixel electrode and the common electrode, and the like are adjusted.

Figure 33B:
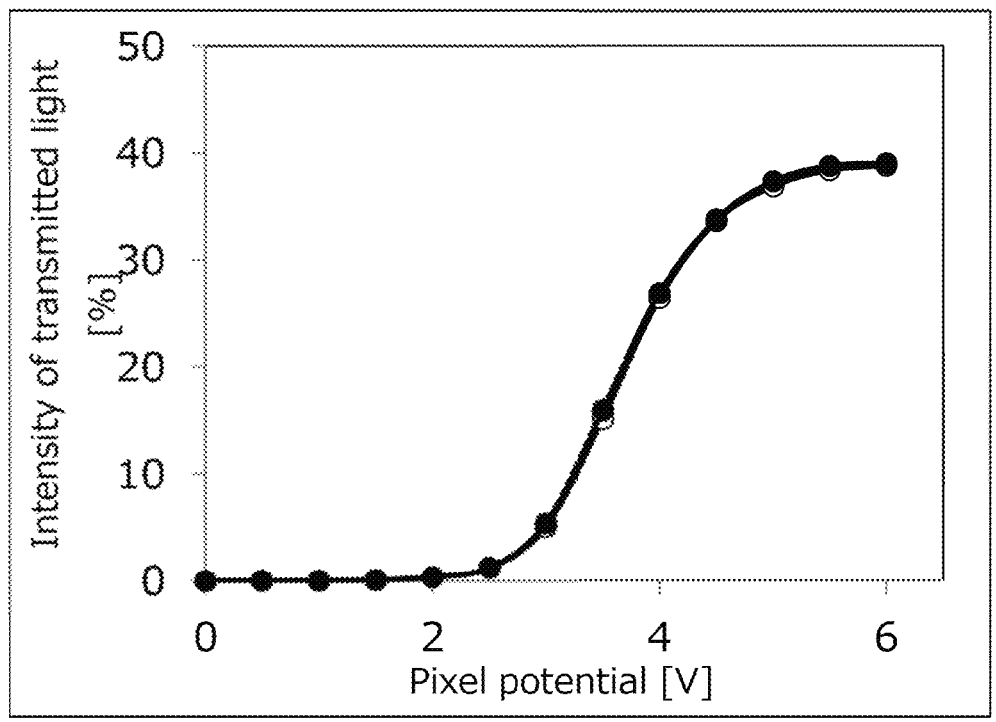
Figure 34C:
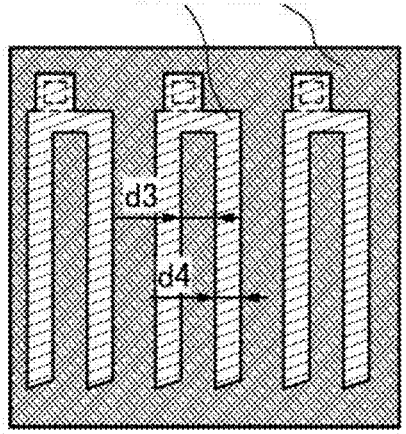
Figure 34D:
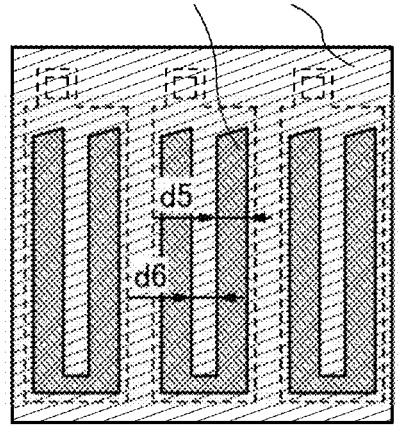

FIG. 33B shows calculation results of the voltage-transmittance characteristics of a first pixel 366a and a second pixel 366b having optimized pixel structures. FIGS. 34C and 34D illustrate top surface layouts of the first pixel 366a and the second pixel 366b. The conductive film 322a has a comb-like shape in which an opening reaches an end portion of the conductive film 322a in a subpixel. The width d3 of the opening is 4 µm and the width d4 of the pixel electrode in a tooth of a comb-like portion is 3 µm. The conductive film 322b includes a C-shaped opening in which two slit-like openings connect to each other in their end portions in a subpixel. The width d5 of the opening is 4 µm and the width d6 of the common electrode in a tooth of a comb-like portion is 3 µm.

Figure 35:
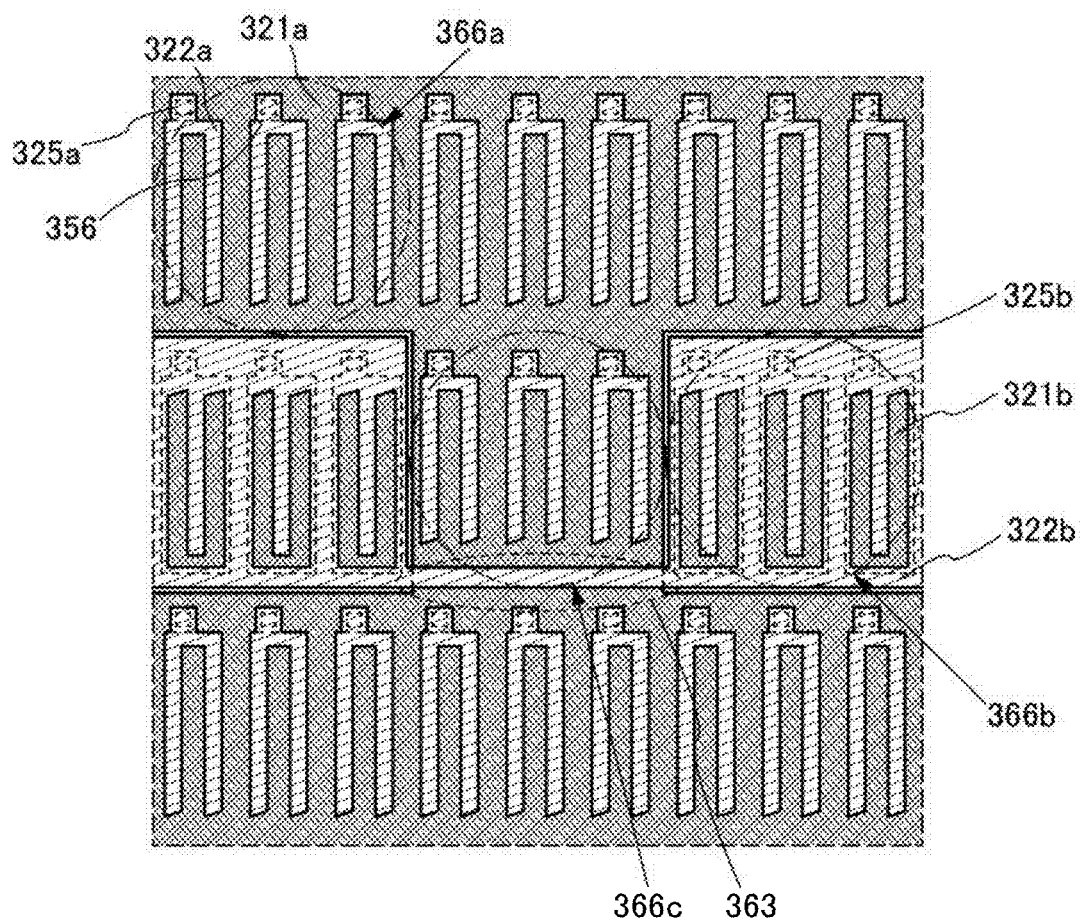
FIG. 35 is a top view illustrating an example of a display device of one embodiment.
Figure 36:
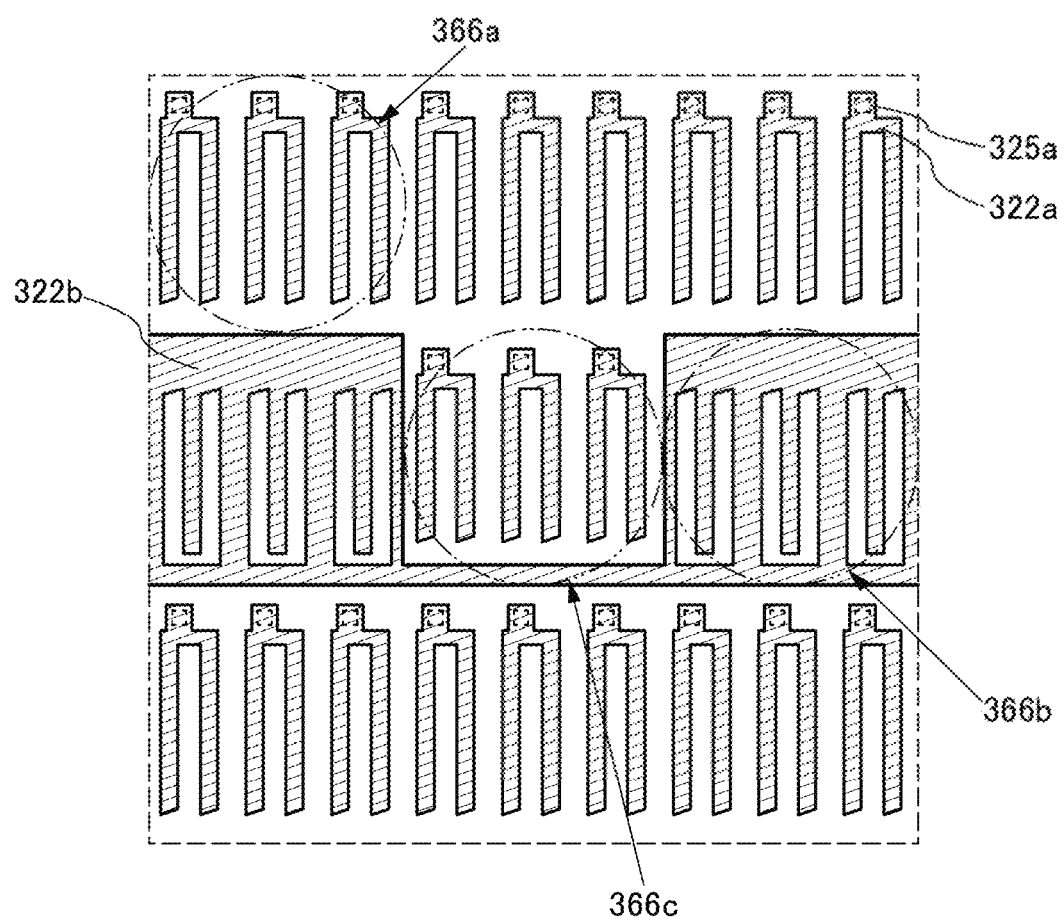
FIG. 36 is a top view illustrating an example of a display device of one embodiment.

Owing to the optimization of the pixel structures, the voltage-transmittance characteristics of the first pixel 366a and the second pixel 366b are substantially the same (see FIG. 33B). FIG. 35 illustrates an example where the first pixel 366a and the second pixel 366b are used in the region 362. FIG. 36 is a top view illustrating only the conductive films 322a and 322b in FIG. 35. The layout of the conductive films 321a and 321b is the same as that in FIG. 29A. When the pixel electrode and the common electrode provided in the display device have the structures illustrated in FIG. 35, appearance of patterns of the conductive film 321a and the conductive film 322b as in FIG. 22B in a displayed image is suppressed, leading to an improvement in the display quality of the display device 310. Since a third pixel 366c includes the conductive film 322b included in the intersection 363, the conductive film 322a of the third pixel 366c is smaller than the conductive film 322a of the first pixel 366a in a top view.

In the first pixel 365a and the third pixel 365c, the conductive film 322a which functions as the pixel electrode provided over the common electrode includes a plurality of slit-like openings (see FIG. 28 and FIG. 29B). In the second pixel 365b, the conductive film 322b which functions as the common electrode provided over the pixel electrode includes a plurality of slit-like openings. Accordingly, the driving mode of the liquid crystal elements included in the plurality of pixels in FIG. 28 is an FFS mode. Note that one embodiment of the present invention is not limited thereto. An IPS mode may be utilized when both the pixel electrode and the common electrode have slit-like openings or have comb-like shapes. That is, not only the electrode structure illustrated in FIG. 4A but also the electrode structures illustrated in FIGS. 4B and 4C can be utilized. Therefore, the structures corresponding to FIGS. 4B and 4C can also be applied.

Structure Example 2 of Pixel

Figure 37:
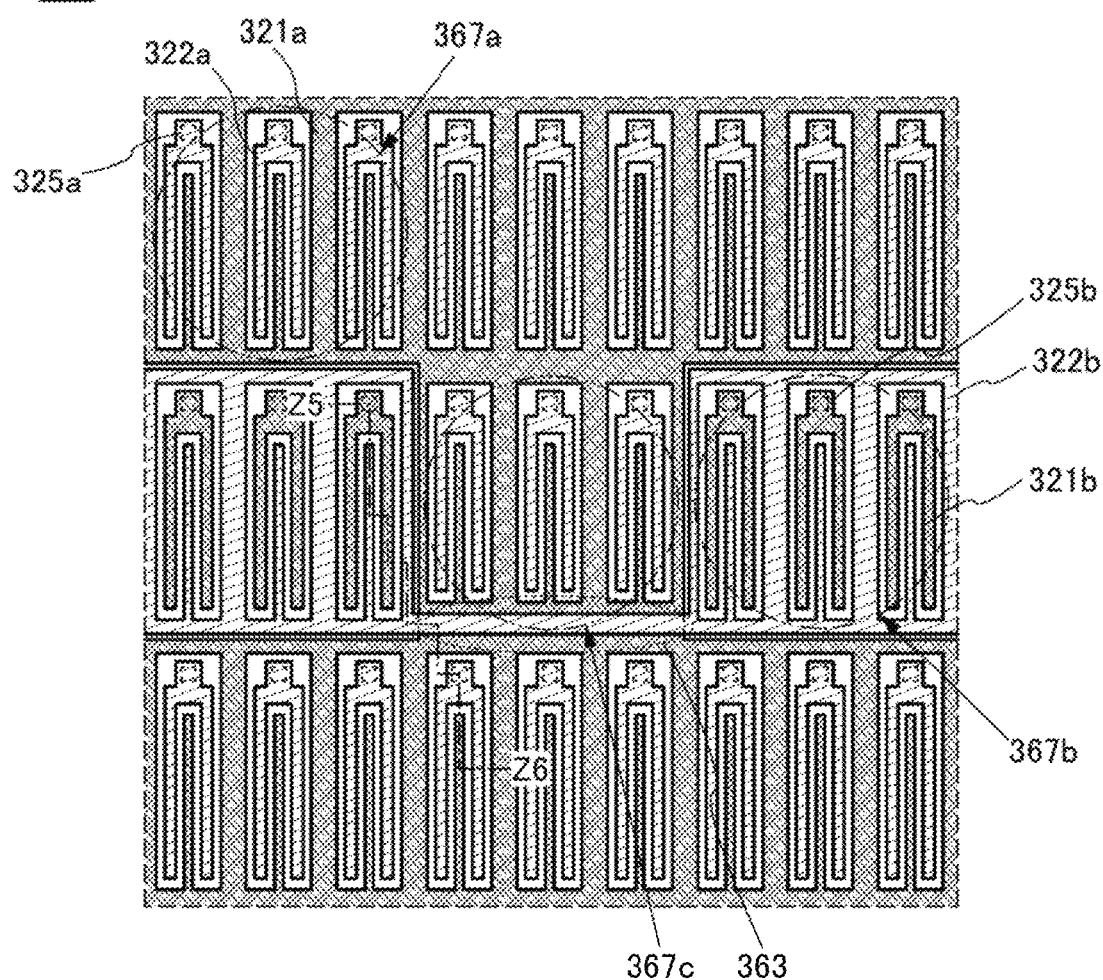
FIG. 37 is a top view illustrating an example of a display device of one embodiment.

FIG. 37 illustrates a structure example of pixels different from that in FIG. 28. Here, the description of FIG. 28 is referred to for the similar structures in FIG. 37, and structures different from those in FIG. 28 will be mainly described. FIG. 37 is an example of a more detailed schematic top view of the region 362 including nine pixels in FIG. 22B.

In each of a first pixel 367a and a third pixel 367c, the conductive film 321a functioning as a common electrode and the conductive film 322a functioning as a pixel electrode each have a comb-like top surface shape. In a second pixel 367b, the conductive film 321b functioning as a pixel electrode and the conductive film 322b functioning as a common electrode each have a comb-like top surface shape.

Structure Example 3 of Pixel

Figure 38:
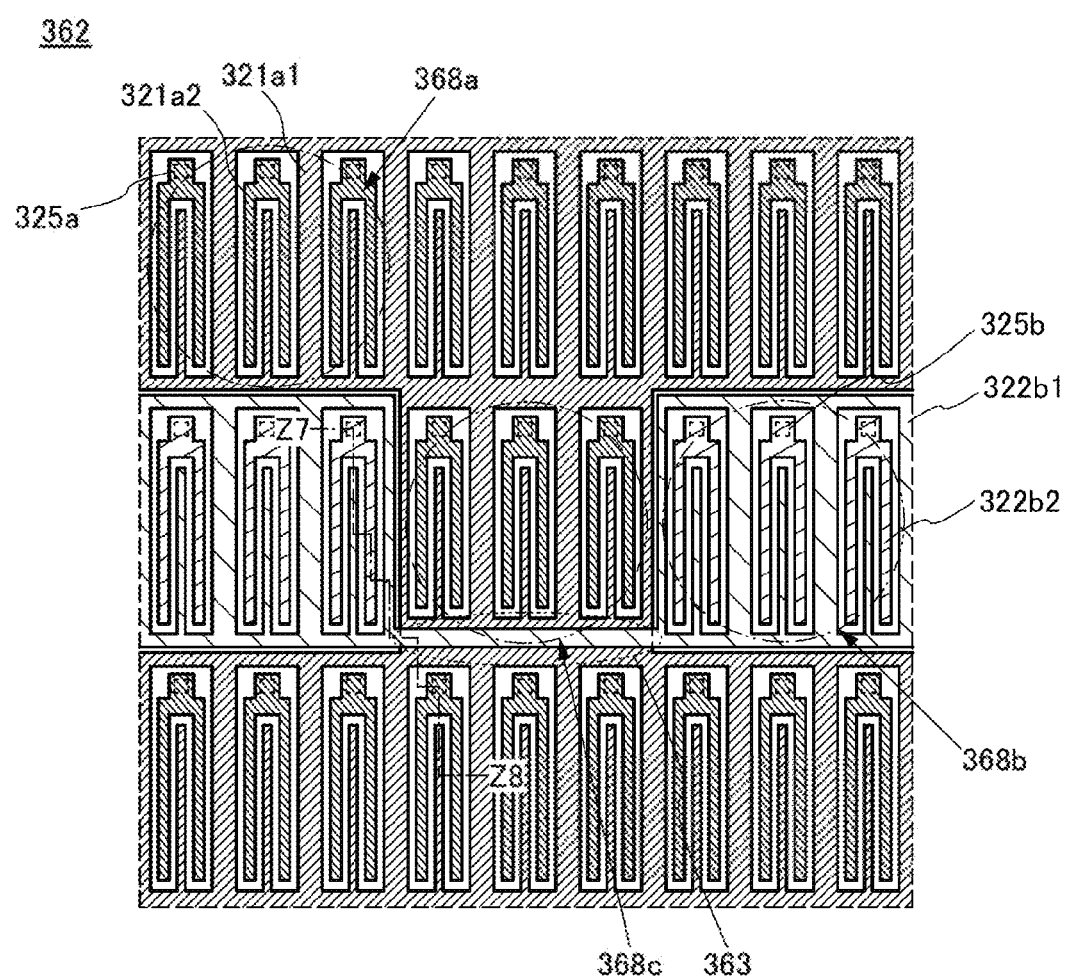
FIG. 38 is a top view illustrating an example of a display device of one embodiment.

FIG. 38 illustrates a structure example of pixels different from that in FIG. 28. Here, the description of FIG. 28 is referred to for the similar structures in FIG. 38, and structures different from those in FIG. 28 will be mainly described.

FIG. 38 is an example of a more detailed schematic top view of the region 362 including nine pixels in FIG. 22B. In FIG. 38, a layer formed using a material similar to and concurrently with a conductive film 321a1 and a layer formed using a material similar to and concurrently with a conductive film 322b1 are illustrated. A conductive film 321a2, which is formed on the same plane as the conductive film 321a1, can be formed concurrently with the conductive film 321a1. A conductive film 322b2, which is formed on the same plane as the conductive film 322b1, can be formed concurrently with the conductive film 322b1. In FIG. 38, the conductive film 321a1 and the conductive film 321a2 are indicated by different hatching patterns and the conductive film 322b1 and the conductive film 322b2 are indicated by different hatching patterns for clarity.

In each of a first pixel 368a and a third pixel 368c, the conductive film 321a1 functioning as a common electrode and the conductive film 321a2 functioning as a pixel electrode each have a comb-like top surface shape. In a second pixel 368b, the conductive film 322b2 functioning as a pixel electrode and the conductive film 322b1 functioning as a common electrode each have a comb-like top surface shape. Accordingly, the driving mode of the liquid crystal elements included in a plurality of pixels in FIG. 38 is an IPS mode. Note that in the example illustrated in FIG. 38, the first pixel 368a and the second pixel 368b have the same top surface layout.

In the plurality of pixels in FIG. 38, each common electrode surrounds some of the pixel electrodes in the top view. The common electrodes can also function as the pair of electrodes of the touch sensor by utilizing capacitance formed between the conductive film 321a1 and the conductive film 322b1 in the vicinity of a boundary between the second pixel 368b and either the first pixel 368a or the third pixel 368c. In other words, the common electrode surrounding a plurality of subpixels (three subpixels in this structure example) in a pixel can also function as the touch sensor electrode. Specifically, the conductive film 321a1 functions as the common electrode and one electrode of the touch sensor, and the conductive film 322b1 functions as the common electrode and the other electrode of the touch sensor.

Figure 39A:
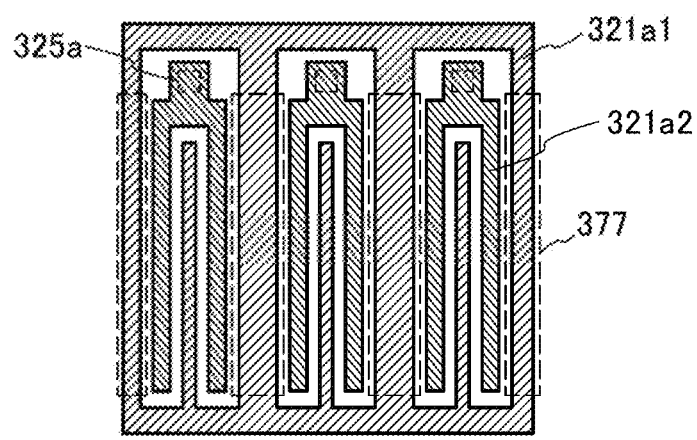
FIGS. 39A to 39C are each a top view illustrating an example of a pixel layout of one embodiment.

FIG. 39A illustrates a top surface layout of one first pixel 368a. A region functioning as the common electrode in the conductive film 321a1 is a region 377 facing a long side of an extending portion (a tooth portion) of the conductive film 321a2. A region actually functioning as the touch sensor electrode in the conductive film 321a1 surrounding three conductive films 321a2 is a region facing the conductive film 322b1 included in the second pixel 368b adjacent to the first pixel 368a. Therefore, in the first pixel 368a, a region of the conductive film 321a1, which functions as neither the common electrode nor the touch sensor electrode, is made to function as the conductive film 321a2 functioning as the pixel electrode, whereby the area of the conductive film 321a2 can be increased. Thus, the aperture ratio of the pixel can be increased.

Figure 39B:
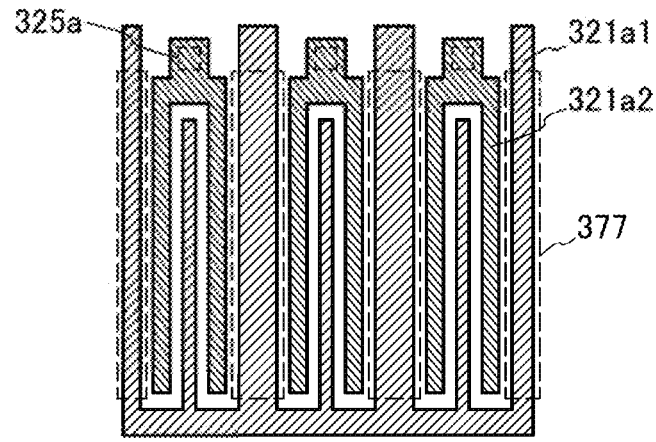
Figure 39C:
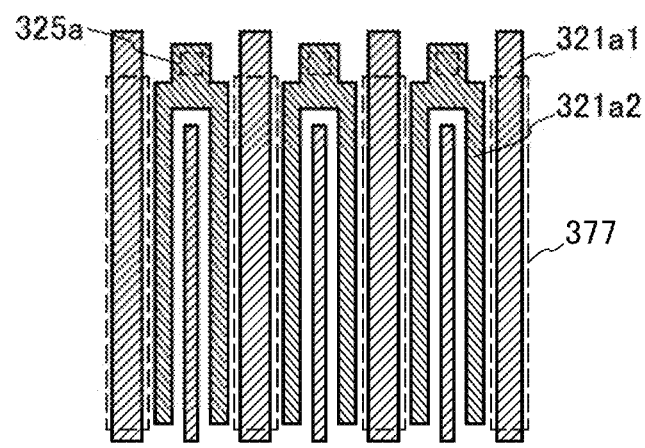

FIGS. 39B and 39C each illustrate an example of a pixel layout achieving the above effect. In a first pixel 369a in FIG. 39B, the conductive film 321a1 surrounds three sides of each of the conductive films 321a2 except the upper side. When the conductive film 321a1 is not provided in a region facing the upper sides of the conductive films 321a2 in one pixel, the extending portions of the conductive films 321a2 can be provided longer and the aperture ratio of the pixel can be improved. Furthermore, in a first pixel 370a in FIG. 39C, the conductive film 321a1 is not provided in regions facing the upper and lower sides of the conductive films 321a2, so that the aperture ratio can be improved more than the case in FIG. 39B. The same can also apply to the second pixel 368b and the third pixel 368c.

Figure 40:
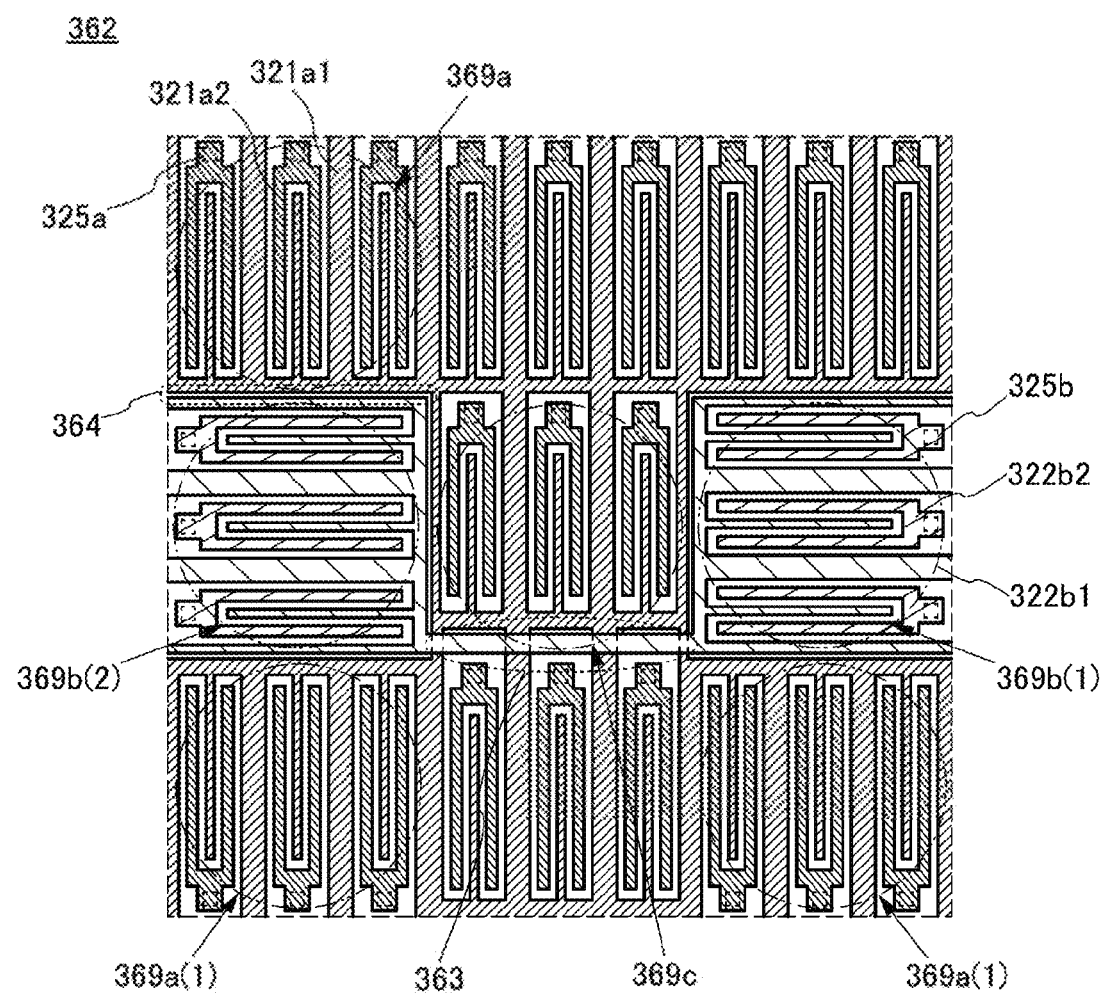
FIG. 40 is a top view illustrating an example of a display device of one embodiment.

Next, FIG. 40 illustrates an example in which the pixels in FIG. 39B are arranged in the display portion 381 of the display device 310. FIG. 40 illustrates an example of a more detailed schematic top view of the region 362 in FIG. 22B.

In FIG. 40, in the vicinity of a boundary between a second pixel 369b and either the first pixel 369a or a third pixel 369c, pixels are rotated such that the area of a region where the conductive film 321a1 and the conductive film 322b1 face each other is maximized. Specifically, using the direction of the first pixel 369a in FIG. 39B as a base, a first pixel 369a(1) is obtained by 180-degree rotation. A second pixel 369b(1) is obtained by 90-degree clockwise rotation and a second pixel 369b(2) is obtained by 90-degree counterclockwise rotation. Note that alignment treatment for an alignment film provided in contact with a liquid crystal layer included in liquid crystal elements of a plurality of pixels in FIG. 40 is preferably performed by a photo-alignment technique such that the alignment direction is changed in accordance with the rotation of the pixels.

With such a structure, the aperture ratio of the pixels can be improved while the capacitance formed between the touch sensor electrodes is kept at substantially the same level as that in FIG. 38. The capacitance formed between the touch sensor electrodes is proportional to the area of a region where the conductive film 321a1 and the conductive film 322b1 face each other with the space 364 provided therebetween. Note that in the display portion 381, pixels can be provided without being rotated in a region other than the region where the second pixel 369b is adjacent to the first pixel 369a or the third pixel 369c.

Figure 41:
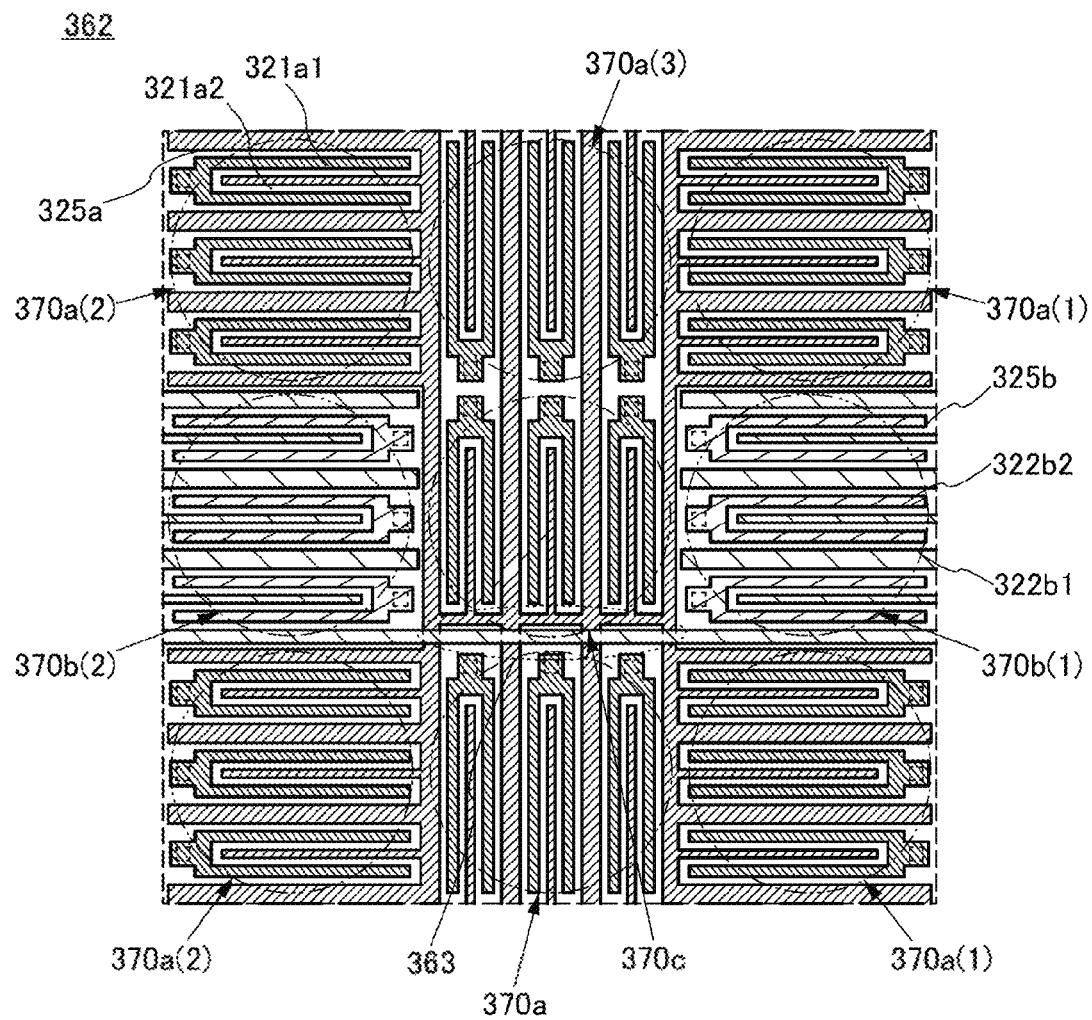
FIG. 41 is a top view illustrating an example of a display device of one embodiment.

Next, FIG. 41 illustrates an example in which the pixels in FIG. 39C are arranged in the display portion 381 of the display device 310. FIG. 41 illustrates an example of a more detailed schematic top view of the region 362 in FIG. 22B In FIG. 41, in the vicinity of a boundary between a second pixel 370b and either the first pixel 370a or a third pixel 370c, pixels are rotated such that the area of a region where the conductive film 321a1 and the conductive film 322b1 face each other is maximized. Specifically, using the direction of the first pixel 370a in FIG. 39C as a base, a first pixel 370a(1) is obtained by 90-degree clockwise rotation, a first pixel 370a(2) is obtained by 90-degree counterclockwise rotation, and a first pixel 370a(3) is obtained by 180-degree rotation. A second pixel 370b(1) is obtained by 90-degree counterclockwise rotation and a second pixel 370b(2) is obtained by 90-degree clockwise rotation.

Although the capacitance formed between the touch sensor electrodes is reduced in such a structure as compared to the structure in FIG. 38, the aperture ratio of the pixels can be further improved. Note that in a region other than the region where the second pixel 370b is adjacent to the first pixel 370a or the third pixel 370c in the display portion 381, a pixel can be rotated 90 degrees with respect to the adjacent pixel to be arranged. Note that alignment treatment for an alignment film provided in contact with a liquid crystal layer included in liquid crystal elements of a plurality of pixels in FIG. 41 is preferably performed by a photo-alignment technique such that the alignment direction is changed in accordance with the rotation of the pixels.

Cross-Sectional Structure Example 1

Examples of the cross-sectional structure of the display device of one embodiment of the present invention are described below with reference to drawings.

Figure 42:
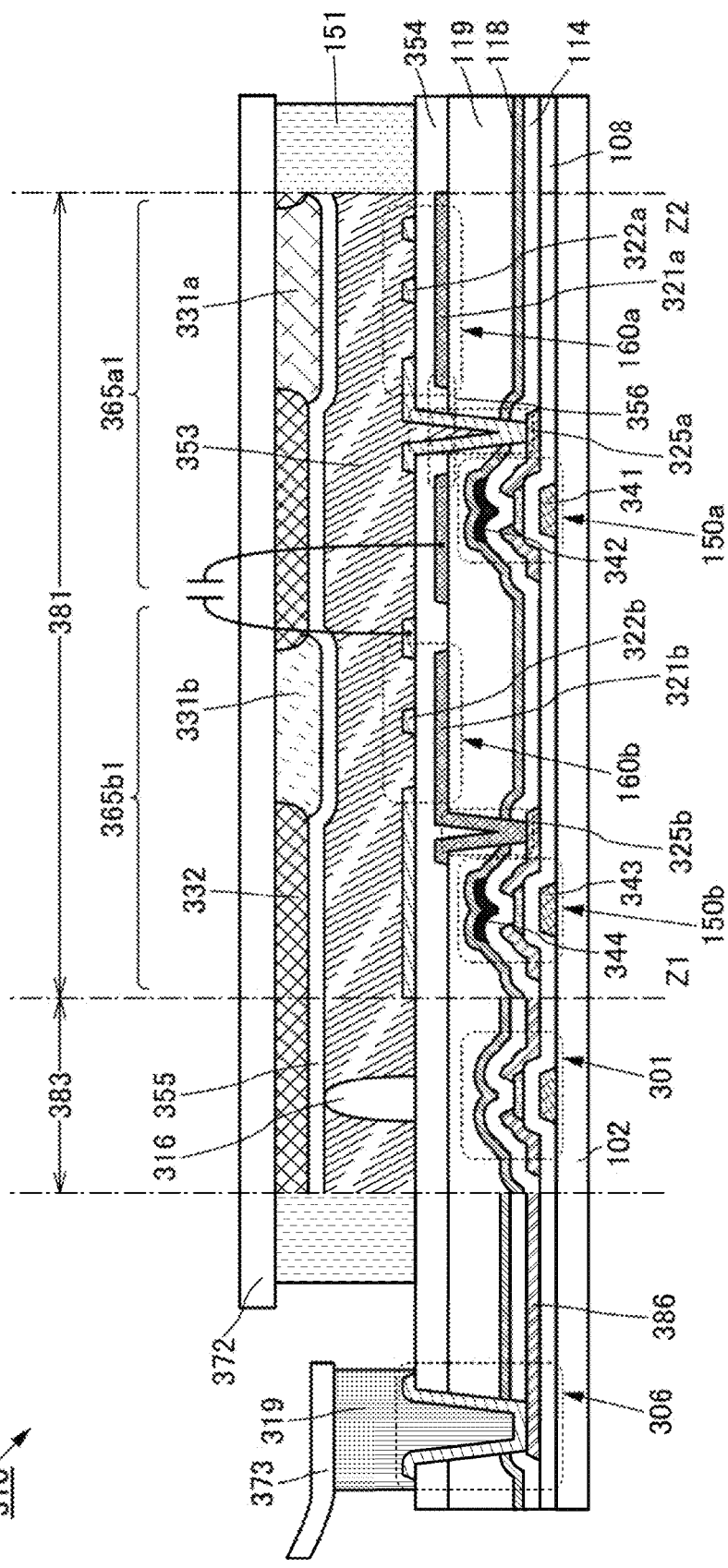
FIG. 42 is a cross-sectional view illustrating an example of a display device of one embodiment.

FIG. 42 is a schematic cross-sectional view of the display device 310. FIG. 42 illustrates the cross sections of a region including the FPC 373, a region including the driver circuit 383, and a region including the display portion 381 in FIG. 22A.

The substrate 102 and the substrate 372 are attached to each other with a sealant 151. A region surrounded by the substrate 102, the substrate 372, and the sealant 151 is filled with liquid crystal 353.

A transistor 301, a transistor 150a, a transistor 150b, the wiring 386, the conductive films 321a, 321b, 322a, and 322b included in liquid crystal elements 160a and 160b, and the like are provided over the substrate 102.

An insulating film 108, an insulating film 114, an insulating film 118, an insulating film 119, an insulating film 354, a spacer 316, and the like are provided over the substrate 102. Part of each of the insulating film 108 and the insulating film 114 functions as a gate insulating layer of each transistor. The insulating film 118 is provided to cover each transistor and the like. The insulating film 119 functions as a planarization layer. The insulating film 354 is provided to cover the conductive films 321a and 321b. The insulating film 354 has a function of electrically isolating the conductive films 321a and 321b from the conductive films 322a and 322b. The insulating film 119 functioning as a planarization layer is not necessarily provided when it is not needed.

FIG. 42 illustrates the cross section of two subpixels 365a1 and 365b1 as an example of the display portion 381. The subpixel 365a1 and the subpixel 365b1 are included in the first pixel 365a and the second pixel 365b, respectively. For example, each of the two subpixels is a subpixel exhibiting a red color, a subpixel exhibiting a green color, or a subpixel exhibiting a blue color; thus, full-color display can be performed. For example, the subpixel 365a1 illustrated in FIG. 42 includes the transistor 150a, the liquid crystal element 160a, and a coloring film 331a. The subpixel 365b1 includes the transistor 150b, the liquid crystal element 160b, and a coloring film 331b.

FIG. 42 illustrates, as an example of the driver circuit 383, an example in which the transistor 301 is provided.

For example, in the example illustrated in FIG. 42, the transistor 150a has a structure in which a semiconductor layer where a channel is formed is provided between gate electrodes 341 and 342, and the transistor 150b has a structure in which a semiconductor layer where a channel is formed is provided between gate electrodes 343 and 344. In the case where the gate electrodes 341 and 342 are electrically connected to each other and the gate electrodes 343 and 344 are electrically connected to each other, such transistors can have a higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display device in which the number of wirings is increased because of increase in size or resolution. Note that the gate electrode 342 and the gate electrode 344 can be referred to as a second gate electrode of the transistor 150a and a second gate electrode of the transistor 150b, respectively.

Note that the transistor included in the driver circuit 383 and the transistor included in the display portion 381 may have the same structure. The plurality of transistors included in the driver circuit 383 may have the same structure or different structures. The plurality of transistors included in the display portion 381 may have the same structure or different structures. Although not illustrated in FIG. 42, the same can apply to the transistors included in the driver circuit 384.

For example, a material through which impurities such as water or hydrogen do not easily diffuse is preferably used for at least one of the insulating films 114 and 118 which cover the transistors. That is, the insulating film 114 or the insulating film 118 can function as a barrier film. Such a structure can effectively suppress diffusion of the impurities into the transistors from the outside, and a highly reliable display device can be achieved.

In the example illustrated in FIG. 42, a liquid crystal element using a fringe field switching (FFS) mode is used as each of the liquid crystal elements 160a and 160b. The liquid crystal element 160a includes the conductive film 321a, the liquid crystal 353, and the conductive film 322a. The liquid crystal element 160b includes the conductive film 321b, the liquid crystal 353, and the conductive film 322b. Alignment of the liquid crystal 353 can be controlled by electric fields generated between the conductive films 321a and 322a and between the conductive films 321b and 322b.

The conductive films 321a and 321b are provided over the insulating film 119. The insulating film 354 is provided to cover the conductive films 321a and 321b, and the conductive films 322a and 322b are provided over the insulating film 354. The conductive film 322a is electrically connected to one of a source and a drain of the transistor 150a through an opening 325a provided in the insulating films 354, 119, 118, and 114 and an opening 356 provided in the conductive film 321a. The conductive film 321b is electrically connected to one of a source and a drain of the transistor 150b through an opening 325b provided in the insulating films 119, 118, and 114. When a light-transmitting conductive material is used for each of the conductive films 321a, 321b, 322a, and 322b, the display device 310 can be a transmissive liquid crystal display device.

The conductive films 322a and 322b each have a comb-like top surface shape or a top surface shape provided with one or more slit-like openings (a top surface shape is also referred to as a planar shape). The conductive film 322a is provided to overlap with the conductive film 321a and the conductive film 322b is provided to overlap with the conductive film 321b. In a region where the coloring film 331a and the conductive film 321a overlap with each other, the conductive film 322a is not provided over part of the conductive film 321a. In a region where the coloring film 331b and the conductive film 321b overlap with each other, the conductive film 322b is not provided over part of the conductive film 321b.

In the subpixel 365a1, the conductive film 322a functions as a pixel electrode and the conductive film 321a functions as a common electrode. In the subpixel 365b1, the conductive film 321b functions as a pixel electrode and the conductive film 322b functions as a common electrode. Being provided on the same plane, i.e., over the insulating film 119 in FIG. 42, the conductive film 321a and the conductive film 321b can be concurrently formed using the same material. Being provided on the same plane, i.e., over the insulating film 354 in FIG. 42, the conductive film 322a and the conductive film 322b can be concurrently formed using the same material.

In the display device of one embodiment of the present invention, the conductive film 321a and the conductive film 322b can be used as a pair of touch sensor electrodes. The capacitance is formed between the conductive film 321a and the conductive film 322b. When an object approaches the conductive film 321a and/or the conductive film 322b, the capacitance changes. Utilizing this change, sensing can be performed. Note that during a period when the display device 310 performs display, a common potential in accordance with the drive of the liquid crystal elements 160a and 160b is supplied to the conductive film 321a and the conductive film 322b; during a period when the display device 310 performs sensing of an object, a fixed potential or a sensing signal is supplied to the conductive film 321a and the conductive film 322b.

A connection portion 306 is provided in a region near an end portion of the substrate 102. The connection portion 306 is electrically connected to the FPC 373 through a connection layer 319. In the example illustrated in FIG. 42, the connection portion 306 is formed by stacking part of the wiring 386 and a conductive layer which is formed by processing the same conductive film as the conductive film 322a.

The coloring film 331a, the coloring film 331b, and a light-blocking film 332 are provided on a surface of the substrate 372 that is on the substrate 102 side. An insulating film 355 is provided so as to cover the coloring films 331a and 331b and the light-blocking film 332.

Note that the light-blocking film 332 is not necessarily provided.

The insulating film 355 has a function of an overcoat preventing impurities contained in the coloring film 331a, the light-blocking film 332, and the like from diffusing into the liquid crystal 353.

The spacer 316 is provided over the insulating film 354 and has a function of keeping a certain distance between the substrate 102 and the substrate 372. Although FIG. 42 illustrates the example in which the spacer 316 is in contact with components (e.g., the insulating film 355) on the substrate 372 side, the spacer 316 is not necessarily in contact with them. Moreover, FIG. 42 illustrates the example in which the spacer 316 is provided on the substrate 102 side; however, the spacer 316 may be provided on the substrate 372 side. For example, the spacer 316 may be provided between adjacent two subpixels. A particulate spacer may be used as the spacer 316. Although a material such as silica can be used for the particulate spacer, an elastic material such as an organic resin or rubber is preferably used. In some cases, the particulate spacer may be vertically crushed.

Surfaces of the conductive films 322a and 322b, the insulating films 354 and 355, and the like that are in contact with the liquid crystal 353 may be provided with alignment films for controlling the alignment of the liquid crystal 353.

In the case where the display device 310 is a transmissive liquid crystal display device, two polarizing plates which are not illustrated are provided such that the display portion is located therebetween, for example. Light from a backlight provided on an outer side than the polarizing plate enters through the polarizing plate. At this time, the alignment of the liquid crystal 353 is controlled by voltages supplied between the conductive film 321a and the conductive film 322a and between the conductive film 321b and the conductive film 322b. In other words, the intensity of light emitted through the polarizing plate can be controlled. Light entering from the backlight, excluding light in a particular wavelength range, is absorbed by the coloring films 331a and 331b and the like, so that red, blue, or green light is emitted, for example.

In addition to the polarizing plate, a circularly polarizing plate can be used, for example. As the circularly polarizing plate, for example, a stack including a linear polarizing plate and a quarter-wave retardation plate can be used. With the circularly polarizing plate, the viewing angle dependency can be reduced.

In the example illustrated here, the liquid crystal elements 160a and 160b are liquid crystal elements using an FFS mode. However, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Furthermore, the display device 310 may be a normally black liquid crystal display device, for example, a transmissive liquid crystal display device using a vertical alignment (VA) mode. As a vertical alignment mode, a multi-domain vertical alignment (MVA) mode, a patterned vertical alignment (PVA) mode, or an ASV mode can be employed, for example.

The liquid crystal element controls transmission or non-transmission of light utilizing an optical modulation action of liquid crystal. Note that optical modulation action of the liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, antiferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and has optical isotropy. In addition, the liquid crystal composition which includes liquid crystal exhibiting a blue phase and a chiral material does not need alignment treatment and has a small viewing angle dependence. In addition, since an alignment film does not need to be provided and rubbing treatment is unnecessary, electrostatic breakdown caused by rubbing treatment can be prevented and defects and damage of the display device can be reduced in the manufacturing process.

In this structure example, touch operation and the like can be sensed by utilizing the capacitance formed between the conductive film 321a and the conductive film 322b. That is, the conductive film 321a serves as one of a pair of electrodes of the liquid crystal element 160a as well as one of a pair of electrodes of the touch sensor. The conductive film 322b serves as one of a pair of electrodes of the liquid crystal element 160b as well as the other of the pair of electrodes of the touch sensor.

A conductive material transmitting visible light is preferably used for each of the conductive films 321a and 321b. The conductive films 321a and 321b are formed using, for example, a conductive material containing a metal oxide. For example, a metal oxide can be used among light-transmitting conductive materials described later.

The conductive films 321a and 321b are each preferably formed using a metal oxide containing the same metal element as another conductive layer or a semiconductor layer, for example. In particular, in the case where an oxide semiconductor is used for the semiconductor layer of the transistor in the display device 310, a conductive oxide containing a metal element contained in the oxide semiconductor is preferably used. In particular, the insulating film 354 may be formed using a silicon nitride film containing hydrogen. In that case, the conductivity of the conductive films 321a and 321b which are formed using an oxide semiconductor can be improved by hydrogen supplied from the insulating film 354. That is, the oxide semiconductor can be of an $n^+$-type.

A substrate with which an object to be sensed, such as a finger or a stylus, is to be in contact may be provided above the substrate 372. In that case, a polarizing plate or a circularly polarizing plate is preferably provided between the substrate 372 and the above substrate. In that case, a protective layer (such as a ceramic coat) is preferably provided over the substrate. The protective layer can be formed using an inorganic insulating material such as silicon oxide, aluminum oxide, yttrium oxide, or yttria-stabilized zirconia (YSZ). Alternatively, tempered glass may be used for the substrate. The tempered glass which is preferably used here is one that has been subjected to physical or chemical treatment by an ion exchange method, a thermal tempering method, or the like and has a surface to which compressive stress has been added.

[Components]

The above-mentioned components are described below.

{Substrate}

A substrate having a flat surface can be used as the substrate included in the display device. The substrate through which light emitted from the display element is extracted is formed using a material that transmits the light. For example, a material such as glass, quartz, ceramics, sapphire, or an organic resin can be used. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate.

In the case where a glass substrate is used as the substrate, a large glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured. Alternatively, a flexible substrate may be used as the substrate, and a transistor, a capacitor, or the like may be provided directly over the flexible substrate.

The weight and thickness of the display device can be decreased by using a thin substrate. Furthermore, a flexible display device can be obtained by using a substrate that is thin enough to have flexibility.

As the glass, for example, non-alkali glass, barium borosilicate glass, aluminoborosilicate glass, or the like can be used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a display device using this substrate can also be lightweight.

Since the substrate through which light is not extracted does not need to have a light-transmitting property, a metal substrate using a metal material or an alloy material, a ceramic substrate, a semiconductor substrate, or the like can be used as well as the above-described substrates. A metal material and an alloy material, which have high thermal conductivity, are preferable because they can easily conduct heat to the whole sealing substrate and accordingly can prevent a local temperature rise in the display device. To obtain flexibility and bendability, the thickness of a metal substrate is preferably greater than or equal to 10 µm and less than or equal to 200 µm, more preferably greater than or equal to 20 µm and less than or equal to 50 µm.

There is no particular limitation on a material of the metal substrate, but it is preferable to use, for example, aluminum, copper, nickel, or an alloy such as an aluminum alloy or stainless steel.

It is preferable to use a substrate subjected to insulation treatment in such a manner that a surface of a conductive substrate is oxidized or an insulating film is formed on a surface. An insulating film may be formed by, for example, a coating method such as a spin-coating method or a dipping method, an electrodeposition method, an evaporation method, or a sputtering method. An oxide film may be formed on the substrate surface by an anodic oxidation method, exposing to or heating in an oxygen atmosphere, or the like.

The flexible substrate may have a stacked structure of a layer of any of the above-mentioned materials and a hard coat layer (e.g., a silicon nitride layer) which protects a surface of the display device from damage or the like, a layer (e.g., an aramid resin layer) which can disperse pressure, or the like. Furthermore, to suppress a decrease in the lifetime of the display element due to moisture and the like, an insulating film with low water permeability may be provided. For example, a film containing nitrogen and silicon (e.g., a silicon nitride film or a silicon oxynitride film) or a film containing nitrogen and aluminum (e.g., an aluminum nitride film) may be provided.

The substrate may be formed by stacking a plurality of layers. In particular, when a glass layer is used, a barrier property against water and oxygen can be improved, and thus, a highly reliable display device can be provided.

A substrate in which a glass layer, an adhesive layer, and an organic resin layer are stacked from the side closer to the display element can be used, for example. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and a high flexibility. The thickness of the organic resin layer is greater than or equal to 10 µm and less than or equal to 200 µm, preferably greater than or equal to 20 µm and less than or equal to 50 µm. By providing such an organic resin layer, occurrence of a break or a crack in the glass layer can be inhibited, and the mechanical strength can be improved. With the substrate that includes such a composite material of a glass material and an organic resin, a highly reliable flexible display device can be provided. For the adhesive layer, a curable resin such as a heat curable resin, a photocurable resin, or a two-component type curable resin can be used. For example, an acrylic resin, a urethane resin, an epoxy resin, or a resin having a siloxane bond such as silicone can be used.

{Transistor}

The transistor includes a conductive layer functioning as the gate electrode, the semiconductor layer, a conductive layer functioning as the source electrode, a conductive layer functioning as the drain electrode, and the insulating layer functioning as the gate insulating layer. In the above example, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material for the semiconductor layer of the transistor, an element of Group 14, a compound semiconductor, or an oxide semiconductor can be used, for example. Typically, a semiconductor containing silicon, a semiconductor containing gallium arsenide, an oxide semiconductor containing indium, or the like can be used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

For example, the oxide semiconductor preferably contains at least indium (In) or zinc (Zn). Further preferably, the oxide semiconductor contains a metal such as Al, Ti, Ga, Y, Zr, La, Ce, Nd, Sn, or Hf in addition to indium or zinc.

As the semiconductor layer, it is particularly preferable to use an oxide semiconductor film including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display device which is used in a bent state, or the like.

Moreover, the use of such an oxide semiconductor for the semiconductor layer makes it possible to provide a highly reliable transistor in which a variation in electrical characteristics is suppressed.

Charge accumulated in a capacitor through a transistor can be held for a long time because of the low off-state current of the transistor. When such a transistor is used for a pixel, operation of a driver circuit can be stopped while a gray scale of an image displayed in each display region is maintained. As a result, a display device with an extremely low power consumption can be obtained.

The semiconductor layer preferably contains at least indium (In), zinc (Zn), and M (a metal such as Al, Ti, Ga, Y, Zr, La, Ce, Sn, or Hf), for example. Alternatively, the semiconductor layer preferably includes a film represented by an In—M—Zn oxide that contains at least indium (In), zinc (Zn), and M (a metal such as Al, Ti, Ga, Y, Zr, La, Ce, Sn, or Hf). In order to reduce variations in electrical characteristics of the transistor including the oxide semiconductor, the oxide semiconductor preferably contains a stabilizer in addition to the above elements.

Examples of the stabilizer, including metals that can be used as M, are gallium (Ga), tin (Sn), hafnium (Hf), aluminum (Al), and zirconium (Zr). Other examples of the stabilizer are lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As an oxide semiconductor included in the semiconductor layer, any of the following oxides can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In:Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

Note that in the case where the semiconductor layer includes an In—M—Zn oxide, when the summation of In and M is assumed to be 100 atomic %, the atomic proportions of In and M, not taking Zn and O into consideration, are preferably higher than 25 atomic % and lower than 75 atomic %, respectively, more preferably higher than 34 atomic % and lower than 66 atomic %, respectively.

The energy gap of the semiconductor layer is 2 eV or more, preferably 2.5 eV or more, more preferably 3 eV or more. In this manner, the off-state current of the transistor can be reduced by using an oxide semiconductor having a wide energy gap.

The thickness of the semiconductor layer is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer includes an In—M—Zn oxide (M represents Al, Ti, Ga, Y, Zr, La, Ce, Nd, Sn, or Hf), it is preferable that the atomic ratio of metal elements of a sputtering target used for forming a film of the In—M—Zn oxide satisfy In≥M and Zn≥M As the atomic ratio of the metal elements of such a sputtering target, In:M:Zn=1:1:1, InM:Zn=1:1:1.2, In:M:Zn=3:1:2, and In:M:Zn=4:2:3 are preferable. Note that the atomic ratio of metal elements in the formed semiconductor layer varies from the above atomic ratio of metal elements of the sputtering target within a range of ±40% as an error.

An oxide semiconductor film with a low carrier density is used as the semiconductor layer. For example, an oxide semiconductor film whose carrier density is lower than or equal to $1\times10^{17}$/cm$^3$, preferably lower than or equal to $1\times10^{15}$/cm$^3$, more preferably lower than or equal to $1\times10^{13}$/cm$^3$, more preferably lower than or equal to $1\times10^{11}$/cm$^3$ is used as the semiconductor layer.

Note that, without limitation to the compositions and materials described above, a material with an appropriate composition may be used depending on required semiconductor characteristics and electrical characteristics (e.g., field-effect mobility and threshold voltage) of the transistor. Furthermore, to obtain required semiconductor characteristics of the transistor, it is preferable that the carrier density, the impurity concentration, the defect density, the atomic ratio of a metal element to oxygen, the interatomic distance, the density, and the like of the semiconductor layer be set to be appropriate.

When silicon or carbon which is one of elements belonging to Group 14 is contained in the semiconductor layer, oxygen vacancies are increased, and the semiconductor layer has n-type conductivity. Thus, the concentration of silicon or carbon (measured by secondary ion mass spectrometry (SIMS)) of the semiconductor layer is lower than or equal to $2\times10^{18}$ atoms/cm$^3$, preferably lower than or equal to $2\times10^{17}$ atoms/cm$^3$.

Furthermore, the concentration of alkali metal or alkaline earth metal in the semiconductor layer, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the semiconductor layer.

When nitrogen is contained in the semiconductor layer, electrons serving as carriers are generated to increase the carrier density, so that the semiconductor layer easily has n-type conductivity. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5\times10^{18}$ atoms/cm$^3$.

The semiconductor layer may have a non-single-crystal structure, for example.

The non-single-crystal structure includes a c-axis aligned crystalline oxide semiconductor (CAAC-OS) which is described later, a polycrystalline structure, a microcrystalline structure which is described later, or an amorphous structure, for example. Among the non-single-crystal structures, an amorphous structure has the highest density of defect states, whereas CAAC-OS has the lowest density of defect states.

The semiconductor layer may have an amorphous structure, for example. An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. Furthermore, the mixed film has a stacked-layer structure of two or more of the following in some cases: the region having an amorphous structure, the region having a microcrystalline structure, the region having a polycrystalline structure, the region of CAAC-OS, and the region having a single-crystal structure.

Alternatively, silicon is preferably used as a semiconductor in which a channel of the transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has a higher field-effect mobility and a higher reliability than amorphous silicon. When such a polycrystalline semiconductor is used for a pixel, the aperture ratio of the pixel can be improved. Even in the case where pixels are provided at extremely high density, a selection line driver circuit and a scan line driver circuit can be formed over a substrate over which the pixels are formed, and the number of components of an electronic device can be reduced.

{Conductive Layer}

As conductive layers such as a gate electrode, a source electrode, and a drain electrode of the transistor and a wiring and an electrode in the display device, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may also be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. These materials can also be used for conductive layers forming a variety of wirings and electrodes included in the display device and electrodes (a pixel electrode, a common electrode, and the like) included in the display element.

Alternatively, for the conductive layer, an oxide semiconductor similar to that of the semiconductor layer is preferably used. In that case, it is preferable that the conductive layer be formed to have a lower electric resistance than a region in the semiconductor layer where a channel is formed.

For example, such a conductive layer can be used as the conductive layer functioning as the second gate electrode of the transistor. Alternatively, it can be used as another light-transmitting conductive layer.

{Method for Controlling Resistivity of Oxide Semiconductor}

An oxide semiconductor film that can be used as each of the semiconductor layer and the conductive layer includes a semiconductor material whose resistivity can be controlled by oxygen vacancies in the film and/or the concentration of impurities such as hydrogen or water in the film. Thus, treatment to be performed on the semiconductor layer and the conductive layer is selected from the following to control the resistivity of each of the oxide semiconductor films: treatment for increasing oxygen vacancies and/or the impurity concentration and treatment for reducing oxygen vacancies and/or the impurity concentration.

Specifically, plasma treatment is performed on the oxide semiconductor film used as the conductive layer to increase oxygen vacancies and/or impurities such as hydrogen or water in the oxide semiconductor film, so that the oxide semiconductor film can have a high carrier density and a low resistivity. Furthermore, an insulating film containing hydrogen is formed in contact with the oxide semiconductor film to diffuse hydrogen from the insulating film containing hydrogen to the oxide semiconductor film, so that the oxide semiconductor film can have a high carrier density and a low resistivity.

The semiconductor layer that functions as the channel region of the transistor is not in contact with the insulating films containing hydrogen. With the use of an insulating film containing oxygen, in other words, an insulating film capable of releasing oxygen, for at least one of the insulating films in contact with the semiconductor layer, oxygen can be supplied to the semiconductor layer. The semiconductor layer to which oxygen is supplied is an oxide semiconductor film having a high resistivity because oxygen vacancies in the film or at the interface are compensated. Note that as the insulating film capable of releasing oxygen, a silicon oxide film or a silicon oxynitride film can be used, for example.

To reduce the resistivity of the oxide semiconductor film, an ion implantation method, an ion doping method, a plasma immersion ion implantation method, or the like can be employed to inject hydrogen, boron, phosphorus, or nitrogen into the oxide semiconductor film.

To reduce the resistivity of the oxide semiconductor film, plasma treatment may be performed on the oxide semiconductor film. For the plasma treatment, for example, a gas containing at least one of a rare gas (He, Ne, Ar, Kr, or Xe), hydrogen, and nitrogen is typically used. Specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be employed.

In the oxide semiconductor film subjected to the plasma treatment, an oxygen vacancy is formed in a lattice from which oxygen is released (or in a portion from which oxygen is released). This oxygen vacancy can generate a carrier. When hydrogen is supplied from an insulating film that is in the vicinity of the oxide semiconductor film, specifically, that is in contact with the lower surface or the upper surface of the oxide semiconductor film, and hydrogen is bonded to the oxygen vacancy, an electron serving as a carrier might be generated.

The oxide semiconductor film in which oxygen vacancies are filled with oxygen and the hydrogen concentration is reduced can be referred to as a highly purified intrinsic or substantially highly purified intrinsic oxide semiconductor film. The term "substantially intrinsic" refers to the state where the oxide semiconductor film has a carrier density of lower than $8\times10^{11}/cm^3$, preferably lower than $1\times10^{11}/cm^3$, more preferably lower than $1\times10^{10}/cm^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

The highly purified intrinsic or substantially highly purified intrinsic oxide semiconductor film has an extremely low off-state current; even when an element has a channel width of $1\times10^6$ μm and a channel length of 10 μm, the off-state current can be lower than or equal to the measurement limit of a semiconductor parameter analyzer, i.e., lower than or equal to $1\times10^{-13}$ A, at a voltage (drain voltage) between a source electrode and a drain electrode of from 1 V to 10 V. Accordingly, the transistor in which the channel region is formed in the semiconductor layer that is a highly purified intrinsic or substantially highly purified intrinsic oxide semiconductor film can have a small variation in electrical characteristics and high reliability.

For example, an insulating film containing hydrogen, in other words, an insulating film capable of releasing hydrogen, typically, a silicon nitride film, is used as the insulating film in contact with the oxide semiconductor film used as the conductive layer, whereby hydrogen can be supplied to the conductive layer. The hydrogen concentration in the insulating film capable of releasing hydrogen is preferably higher than or equal to $1\times10^{22}$ atoms/$cm^3$. Such an insulating film is formed in contact with the conductive layer, whereby hydrogen can be effectively contained in the conductive layer. In this manner, the resistivity of the oxide semiconductor film can be controlled by changing the structures of the insulating films in contact with the semiconductor layer and the conductive layer.

Hydrogen contained in the oxide semiconductor film reacts with oxygen bonded to a metal atom to be water and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Accordingly, the conductive layer formed in contact with the insulating film containing hydrogen is an oxide semiconductor film that has a higher carrier density than the semiconductor layer.

Hydrogen in the semiconductor layer of the transistor in which a channel region is formed is preferably reduced as much as possible. Specifically, in the semiconductor layer, the concentration of hydrogen which is measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$.

The conductive layer is an oxide semiconductor film that has a higher hydrogen concentration and/or a larger number of oxygen vacancies (i.e., a lower resistivity) than the semiconductor layer. The hydrogen concentration in the conductive layer is higher than or equal to $8\times10^{19}$ atoms/cm$^3$, preferably higher than or equal to $1\times10^{20}$ atoms/cm$^3$, more preferably higher than or equal to $5\times10^{20}$ atoms/cm$^3$. The hydrogen concentration in the conductive layer is greater than or equal to 2 times, preferably greater than or equal to 10 times the hydrogen concentration in the semiconductor layer. The resistivity of the conductive layer is preferably greater than or equal to $1\times10^{-8}$ times and less than $1\times10^{-1}$ times the resistivity of the semiconductor layer. The resistivity of the conductive layer is typically higher than or equal to $1\times10^{-3}$ Ωcm and lower than $1\times10^{4}$ Ωcm, preferably higher than or equal to $1\times10^{-3}$ Ωcm and lower than $1\times10^{-1}$ Ωcm.

{Insulating Film}

As the insulating film 108 functioning as gate insulating films of the transistors 150a and 150b, an insulating film including at least one of the following films formed by a plasma chemical vapor deposition (CVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 108 does not necessarily have a single-layer structure, and a stack of films selected from the above films may be used.

The insulating film 108 may function as a blocking film which inhibits penetration of oxygen. For example, in the case where oxide semiconductor layers are used for the semiconductor layers of the transistors 150a and 150b in FIG. 42, the insulating film 108 can inhibit penetration of oxygen when excess oxygen is supplied to the insulating film 114 and/or the oxide semiconductor layers.

Note that the insulating film 108 is preferably an oxide insulating film and preferably includes a region containing oxygen in excess of that in the stoichiometric composition (oxygen-excess region). In other words, the insulating film 108 is an insulating film capable of releasing oxygen. In order to provide the oxygen-excess region in the insulating film 108, the insulating film 108 may be formed in an oxygen atmosphere, for example. Alternatively, the oxygen-excess region may be formed by introduction of oxygen into the insulating film 108 after the deposition. Oxygen can be introduced by an ion implantation method, an ion doping method, a plasma immersion ion implantation method, plasma treatment, or the like.

In the case where hafnium oxide is used for the insulating film 108, the following effect is attained. Hafnium oxide has a higher dielectric constant than silicon oxide and silicon oxynitride. Therefore, the thickness of the insulating film 108 can be made large as compared with the case where silicon oxide is used; as a result, a leakage current due to a tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

{Protective Insulating Film}

As each of the insulating films 114 and 118 functioning as a protective insulating film of the transistors 150a and 150b, an insulating film including at least one of the following films formed by a plasma CVD method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

In the case where oxide semiconductor layers are used for the semiconductor layers of the transistors 150a and 150b in FIG. 42, the insulating film 114 is preferably an oxide insulating film capable of releasing oxygen. In other words, the insulating film includes a region containing oxygen in excess of that in the stoichiometric composition (oxygen-excess region). In order to provide the oxygen-excess region in the insulating film 114, the insulating film 114 may be formed in an oxygen atmosphere, for example. Alternatively, oxygen may be introduced into the insulating film 114 after the deposition to provide the oxygen-excess region therein. As a method for introducing oxygen, an ion implantation method, an ion doping method, a plasma immersion ion implantation method, plasma treatment, or the like may be employed.

The use of the insulating film capable of releasing oxygen as the insulating film 114 can reduce the number of oxygen vacancies in the oxide semiconductor films by transferring oxygen to the oxide semiconductor films serving as the channel regions of the transistor 150a and 150b. For example, the number of oxygen vacancies in the oxide semiconductor films can be reduced by using an insulating film having the following feature: the number of oxygen molecules released from the insulating film by heat treatment at a temperature higher than or equal to 100° C. and lower than or equal to 700° C., or higher than or equal to 100° C. and lower than or equal to 500° C. is greater than or equal to $1.0\times10^{18}$ molecules/cm$^3$ when measured by thermal desorption spectroscopy (hereinafter referred to as TDS).

It is preferable that the number of defects in the insulating film 114 be small, typically the spin density corresponding to a signal that appears at g=2.001 due to a dangling bond of silicon be lower than or equal to $3\times10^{17}$ spins/cm$^3$ by ESR measurement. This is because if the density of defects in the insulating film 114 is high, oxygen is bonded to the defects and the amount of oxygen that permeates the insulating film 114 is decreased. Furthermore, it is preferable that the amount of defects at the interface between the insulating film 114 and the oxide semiconductor film be small and typically, the spin density of a signal that appears at g=1.89 or more and 1.96 or less due to the defect in the oxide semiconductor film be lower than or equal to $1 \times 10^{17}$ spins/cm$^3$, more preferably lower than or equal to the lower limit of detection by ESR measurement.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film.

The insulating film 118 is preferably a nitride insulating film. In the case where oxide semiconductor films are used for the gate electrodes 342 and 344, the insulating film 118 also has a function of decreasing the resistivity of the oxide semiconductor films.

The insulating film 118 has a function of blocking oxygen, hydrogen, water, an alkali metal, an alkaline earth metal, and the like. In the case where oxide semiconductor films are used for the semiconductor layers of the transistors 150a and 150b, the insulating film 118 can prevent outward diffusion of oxygen from the oxide semiconductor films, outward diffusion of oxygen contained in the insulating film 114, and entry of hydrogen, water, and the like into the oxide semiconductor films from the outside. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Examples of an insulating material that can be used for a planarization film, an overcoat, a spacer, and the like include a resin such as an acrylic resin or an epoxy resin, a resin having a siloxane bond such as silicone, and an inorganic insulating material such as silicon oxide, silicon oxynitride, silicon nitride oxide, silicon nitride, or aluminum oxide.

{Sealant}

The sealant has at least a function of preventing or suppressing entry of substances (such as water) from the outside which are impurities for the display element or the transistor. Note that the sealant may have another function. For example, the sealant may have functions of reinforcing the structure, enhancing the adhesiveness, enhancing impact resistance, and the like.

As the sealant, it is preferable to use a material which does not dissolve in the liquid crystal layer even when being in contact with the liquid crystal layer before being hardened. As the sealant, an epoxy resin, an acrylic resin, or the like can be used, for example. Note that the above resin material may be either thermosetting or photocurable. A mixture of an acrylic-based resin and an epoxy-based resin may be used as the sealant. In that case, a UV initiator, a thermosetting agent, a coupling agent, or the like may be mixed. Furthermore, a filler may be contained.

Alternatively, a material similar to that of the adhesive layer may be used for the sealant.

{Connection Layer}

For the connection layer, an anisotropic conductive film (ACF), an anisotropic conductive paste (ACP), or the like can be used.

{Coloring Film}

Examples of a material that can be used for the coloring film include a metal material, a resin material, and a resin material containing a pigment or dye.

The above is the description of the components.

An example of a cross-sectional structure of a display device whose structure is partly different from the above structure example is described below. Note that description of the portions already described is omitted and different portions are described.

Cross-Sectional Structure Example 2

Figure 43:
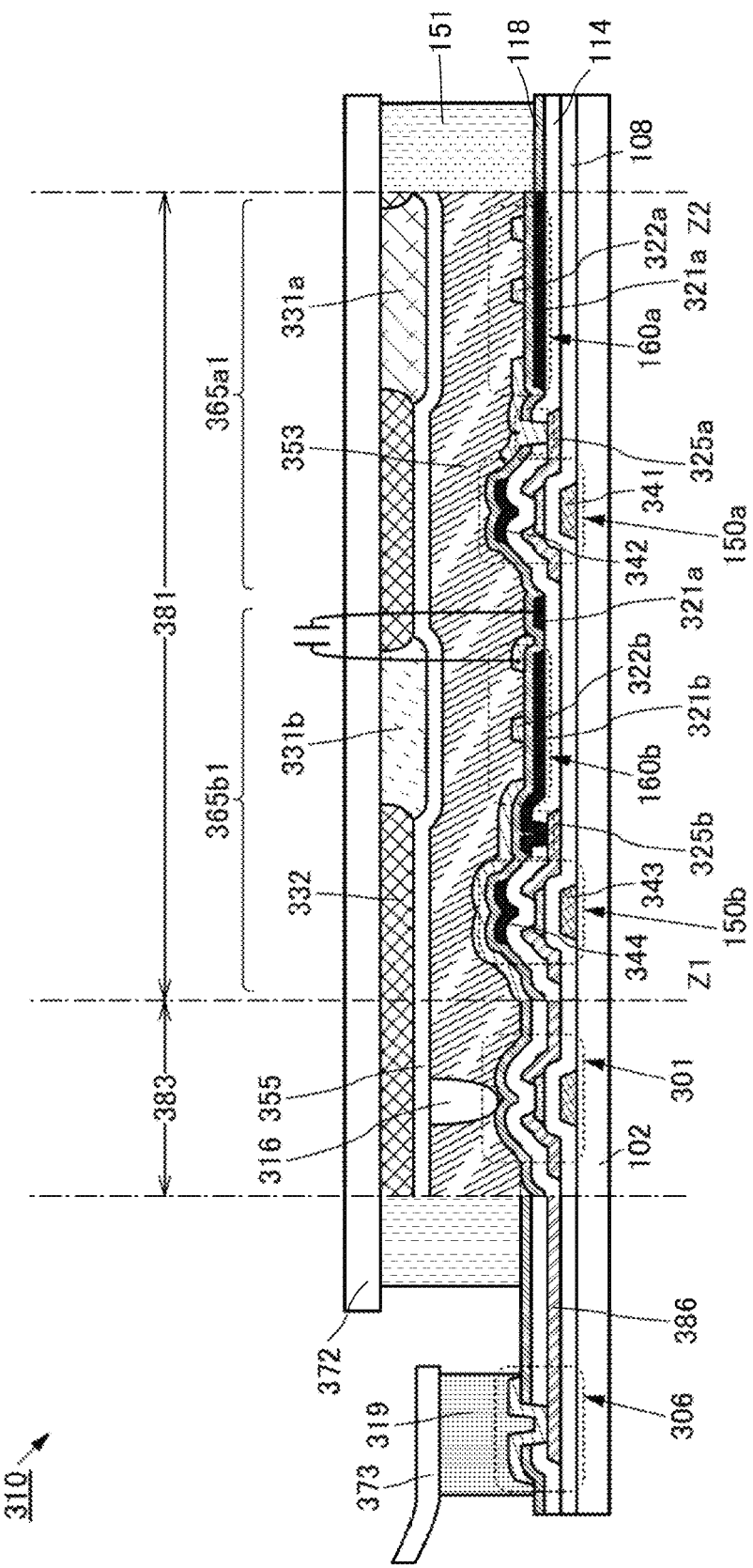
FIG. 43 is a cross-sectional view illustrating an example of a display device of one embodiment.

In a structure illustrated in FIG. 43, the conductive films 321a and 321b are formed using the same material as the second gate electrodes (gate electrodes 342 and 344) which are included in the transistors and provided over the insulating film 114. The conductive films 321a and 321b are provided over the insulating film 114. The conductive films 322a and 322b are provided over the insulating film 118 provided over the conductive films 321a and 321b. What is different from the structure in FIG. 42 is that the insulating film 119 and the insulating film 354 are not provided. In the display device 310 illustrated in FIG. 43, the spacer 316 is provided for the substrate 372 on the substrate 102 side, specifically, on the insulating film 355. With such a structure, the number of photomasks needed for manufacturing the display device 310 can be reduced and the manufacturing process can be shortened.

An oxide semiconductor is particularly preferably used for the conductive films 321a and 321b. In this case, when a silicon nitride film containing hydrogen is used as the insulating film 118, the conductivity of each of the conductive films 321a and 321b can be improved by hydrogen supplied from the insulating film 118. With the use of the oxide semiconductor films as the conductive films 321a and 321b, oxygen can be supplied to the semiconductor films of the transistors 150a and 150b during formation of conductive layers to be the conductive films 321a and 321b or during heat treatment after the film formation. In the case where the semiconductor films of the transistors 150a and 150b are oxide semiconductor films, oxygen vacancies in the semiconductor films or at the interface are compensated by the supplied oxygen, and the semiconductor films can each have high resistivity. Thus, in the transistors 150a and 150b, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of reducing power consumption.

The transistor 150a includes the gate electrode 341, the insulating film 108 provided over the gate electrode 341, the oxide semiconductor film which is provided over the insulating film 108 to overlap with the gate electrode 341 and functions as a channel layer, a source electrode and a drain electrode electrically connected to the oxide semiconductor film, the insulating film 114 provided over the oxide semiconductor film, the source electrode, and the drain electrode, and the gate electrode 342 provided over the insulating film 114 to overlap with the oxide semiconductor film. The transistor 150*b* includes the gate electrode 343, the insulating film 108 provided over the gate electrode 343, the oxide semiconductor film which is provided over the insulating film 108 to overlap with the gate electrode 343 and functions as a channel layer, a source electrode and a drain electrode electrically connected to the oxide semiconductor film, the insulating film 114 provided over the oxide semiconductor film, the source electrode, and the drain electrode, and the gate electrode 344 provided over the insulating film 114 to overlap with the oxide semiconductor film.

The insulating film 118 is provided such that the gate electrode 342, the gate electrode 344, the conductive film 321*a*, and the conductive film 321*b* are positioned between the insulating film 114 and the insulating film 118. The insulating film 114 preferably contains oxygen. In the case where an oxide semiconductor film is used for each of the gate electrode 342, the gate electrode 344, the conductive film 321*a*, and the conductive film 321*b*, the insulating film 118 preferably contains hydrogen.

Similarly to the gate electrode 342 of the transistor 150*a*, the conductive film 321*a* functioning as a common electrode of the subpixel 365*a*1 is provided over the insulating film 114. Therefore, the conductive film 321*a* provided in the subpixel 365*a*1 preferably has an opening in which the gate electrode 342 having an island shape is formed, for example.

Figure 44:
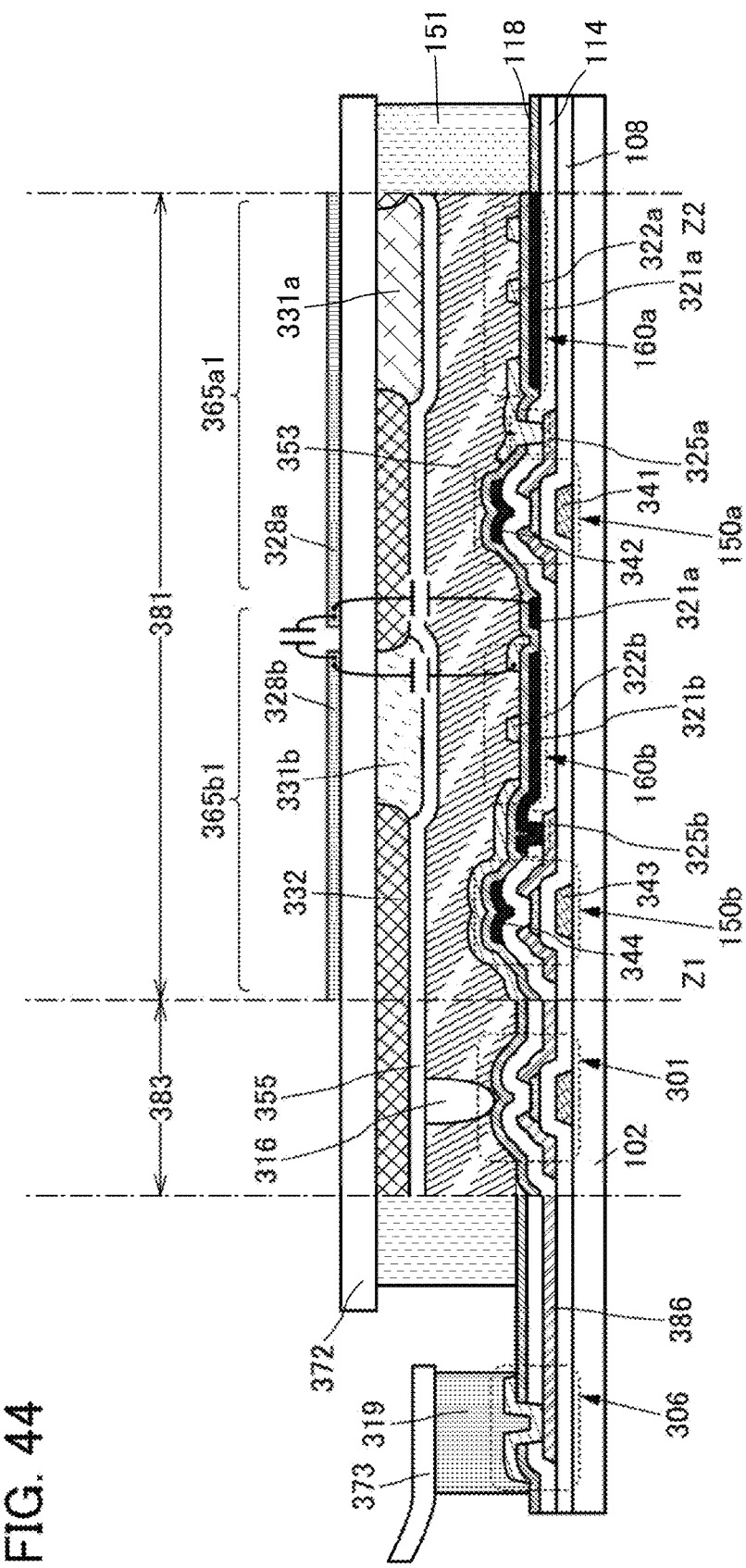
FIG. 44 is a cross-sectional view illustrating an example of a display device of one embodiment.

Similarly to FIG. 5A, a conductive film 328*a* and a conductive film 328*b* may be provided over the substrate 372. FIG. 44 illustrates such a case.

Cross-Sectional Structure Example 3

Figure 45:
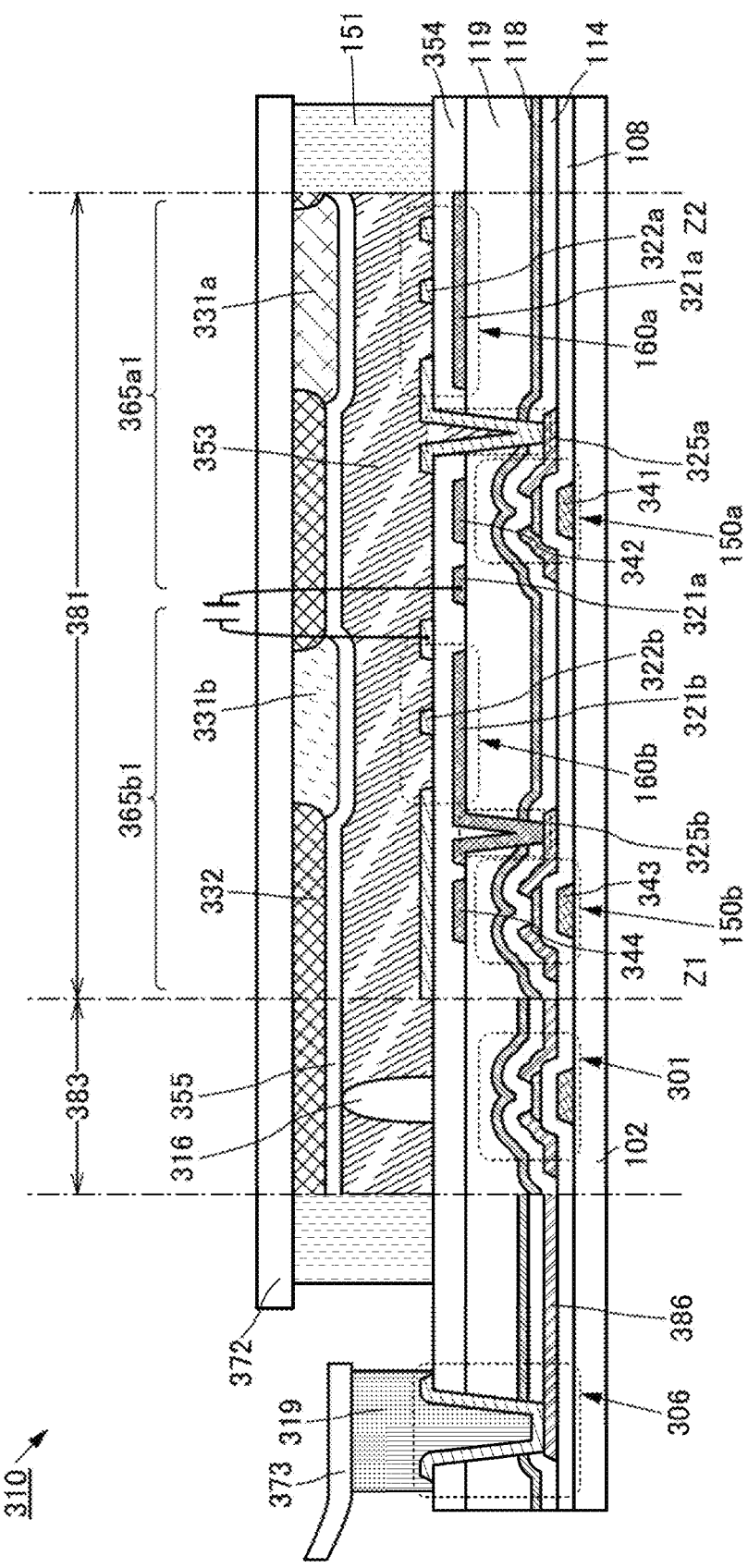
FIG. 45 is a cross-sectional view illustrating an example of a display device of one embodiment.

FIG. 45 illustrates a structure in which the gate electrodes 342 and 344 which are the second gate electrodes of the transistors 150*a* and 150*b* are formed using the same material as the conductive films 321*a* and 321*b*. The gate electrodes 342 and 344 are provided over the insulating film 119. With such a structure, the number of photomasks needed for manufacturing the display device 310 can be reduced and the manufacturing process can be shortened.

Similarly to the gate electrode 342 of the transistor 150*a*, the conductive film 321*a* functioning as the common electrode of the subpixel 365*a*1 is provided over the insulating film 119. Therefore, the conductive film 321*a* provided in the subpixel 365*a*1 preferably has an opening in which the gate electrode 342 having an island shape is formed, for example.

Figure 46:
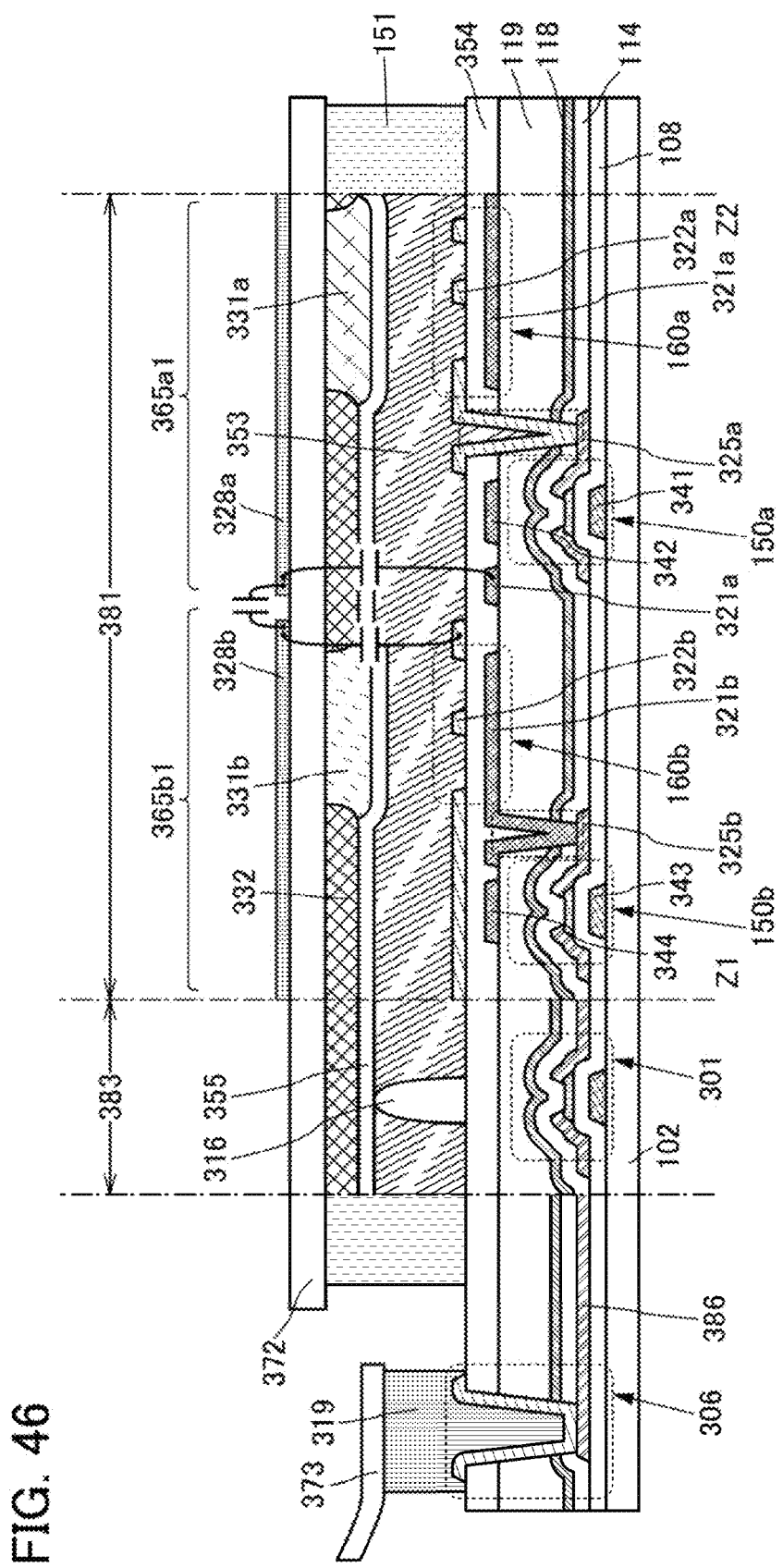
FIG. 46 is a cross-sectional view illustrating an example of a display device of one embodiment.

Similarly to FIG. 5A, the conductive film 328*a* and the conductive film 328*b* may be provided over the substrate 372. FIG. 46 illustrates such a case.

Cross-Sectional Structure Example 4

Figure 47:
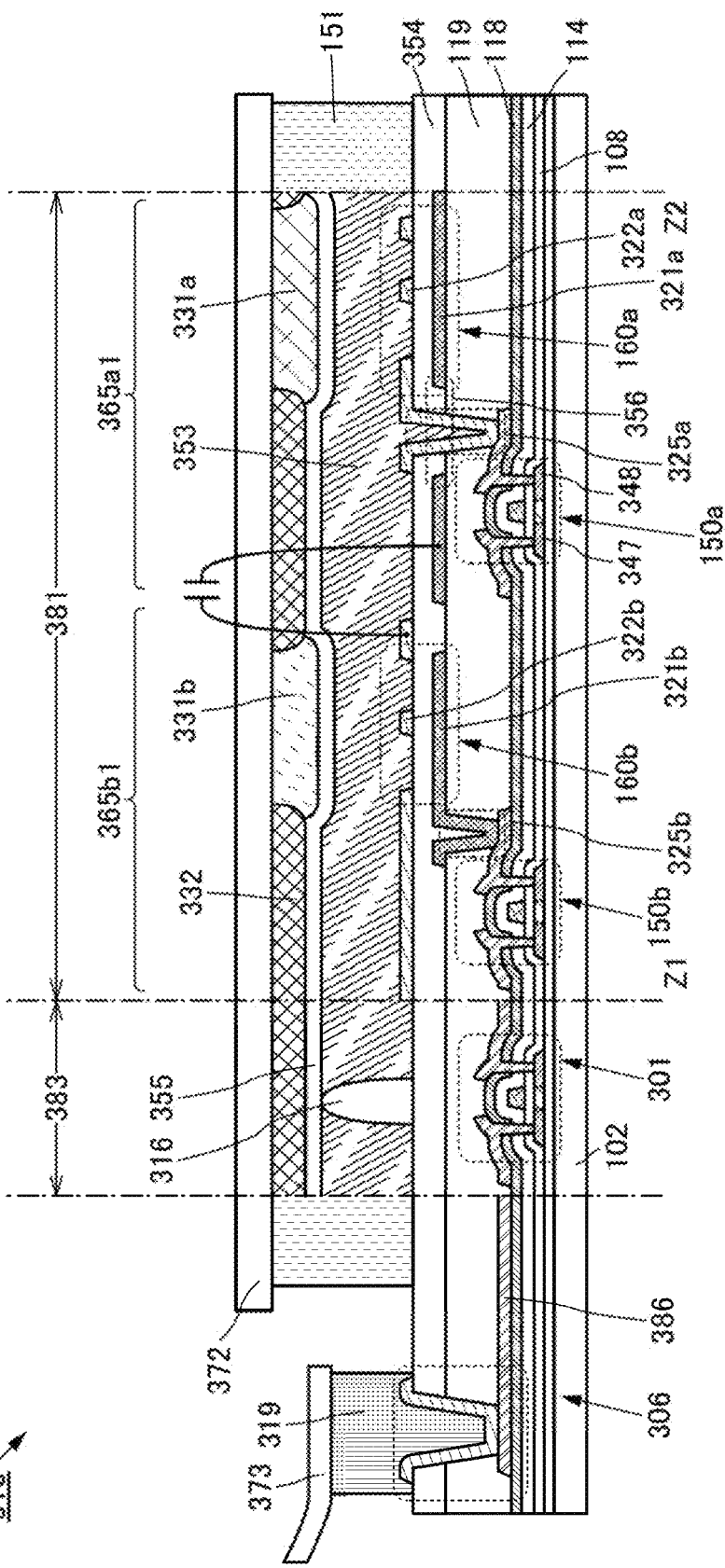
FIG. 47 is a cross-sectional view illustrating an example of a display device of one embodiment.

FIG. 47 illustrates an example in which the transistors 150*a*, 150*b*, and 301 in FIG. 42 each have a top-gate structure.

Each of the transistors includes a semiconductor layer, and a gate electrode is provided over the semiconductor layer with the insulating film 108 provided therebetween. The semiconductor layer may include a low-resistance region. The low-resistance region functions as a source or a drain.

Source electrodes and drain electrodes of the transistors are provided over the insulating film 118 and electrically connected to the low-resistance regions in the semiconductor layers through openings provided in the insulating films 118, 114, and 108.

The low-resistance regions in the semiconductor layer can be, for example, a region containing more impurities than a region where a channel of the transistor is formed, a region with a high carrier concentration, a region with low crystallinity, or the like. An impurity which can increase the conductivity depends on a semiconductor used for the semiconductor layer; typically, an element that can impart n-type conductivity, such as phosphorus, an element that can impart p-type conductivity, such as boron, a rare gas such as helium, neon, or argon, hydrogen, lithium, sodium, magnesium, aluminum, nitrogen, fluorine, potassium, calcium, or the like can be given. In addition to the above elements, titanium, iron, nickel, copper, zinc, silver, indium, tin, or the like also functions as an impurity which influences the conductivity of the semiconductor. For example, a region 347 and a region 348 in the transistor 150*a* illustrated in FIG. 47 contain the above impurity at a higher concentration than the region where a channel of the transistor is formed.

Figure 48:
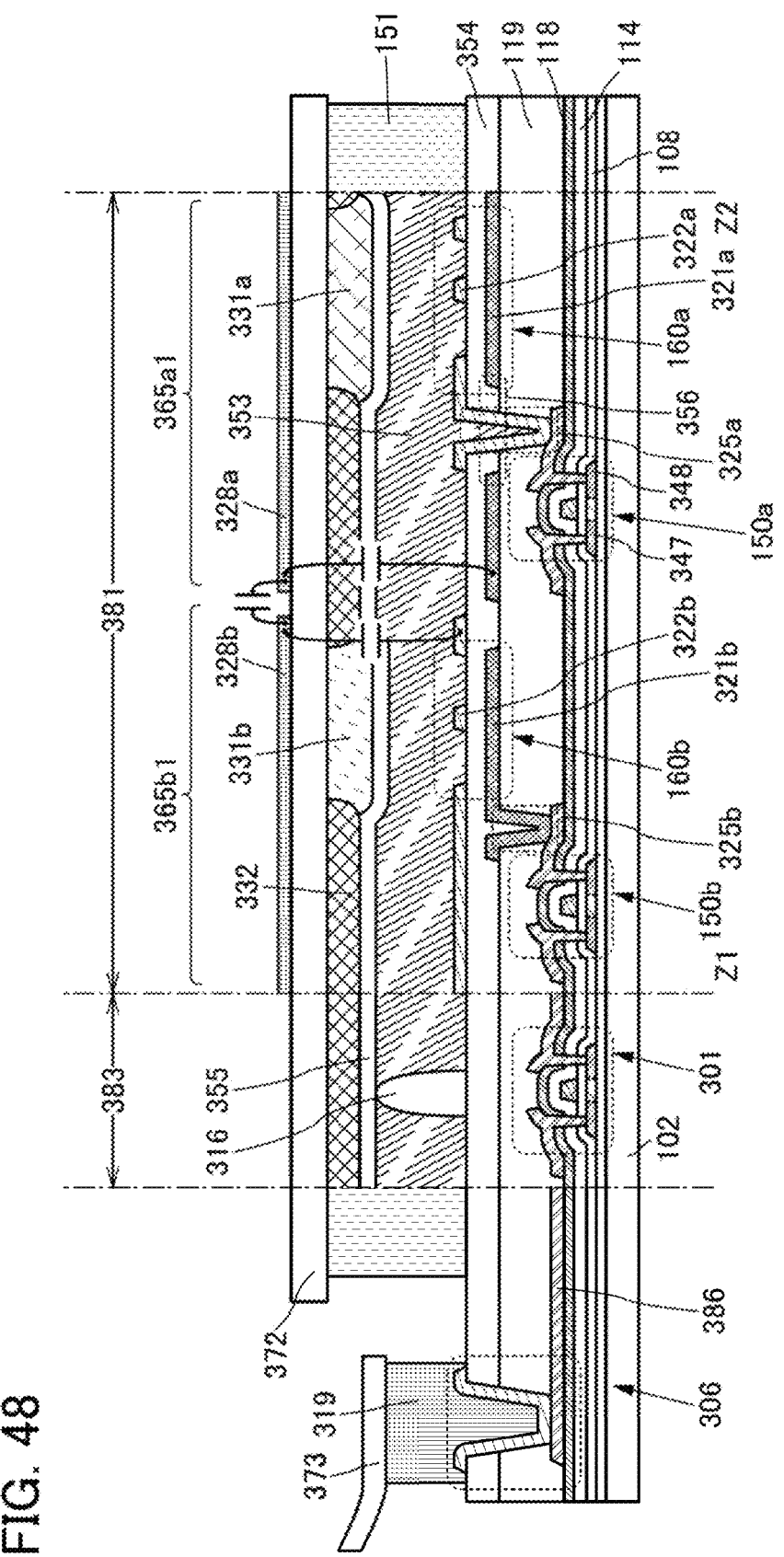
FIG. 48 is a cross-sectional view illustrating an example of a display device of one embodiment.

Similarly to FIG. 5A, the conductive film 328*a* and the conductive film 328*b* may be provided over the substrate 372. FIG. 48 illustrates such a case.

Cross-Sectional Structure Example 5

Figure 49:
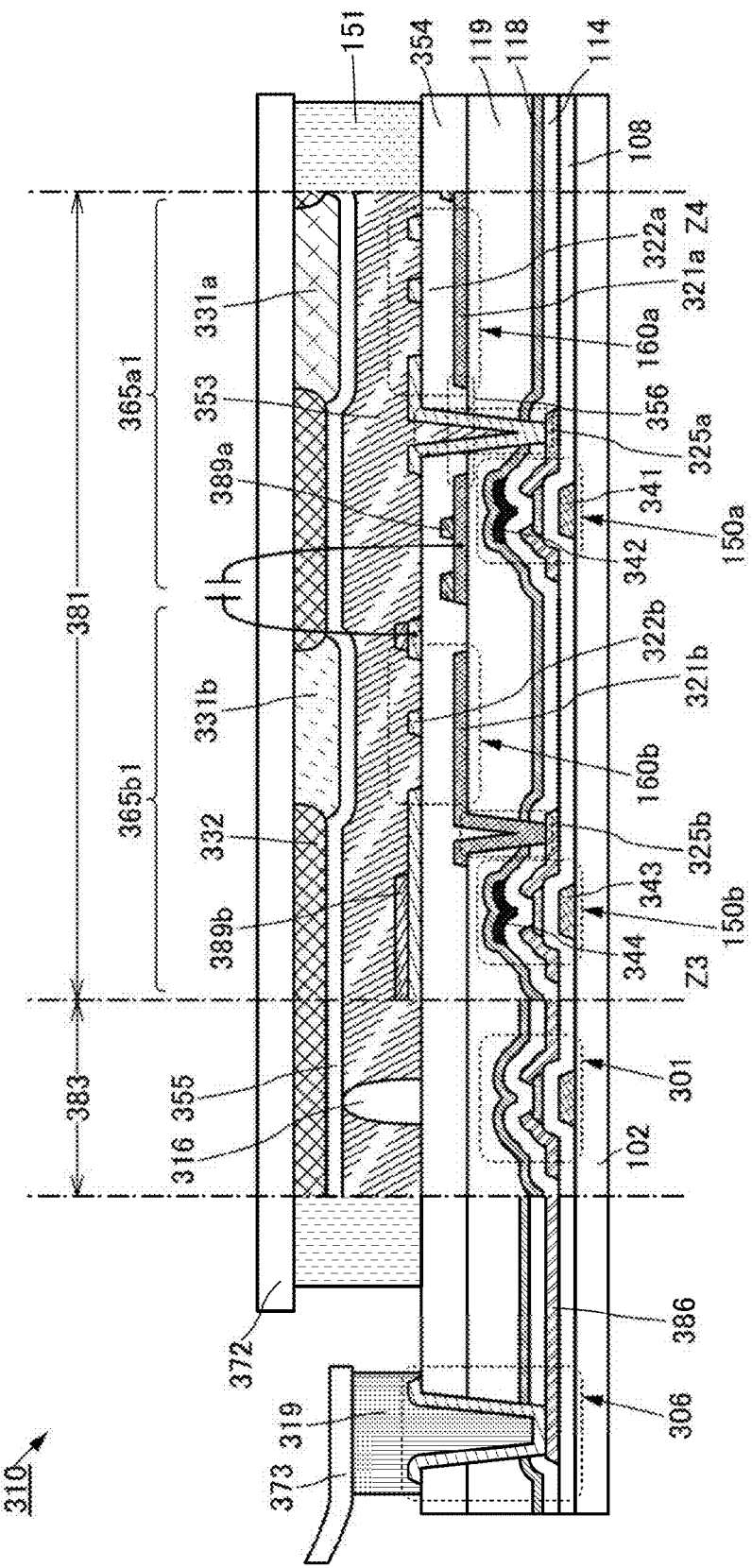
FIG. 49 is a cross-sectional view illustrating an example of a display device of one embodiment.

FIG. 49 illustrates a structure in which auxiliary electrodes are provided for the conductive films 321*a* and 322*b*. In the case where the display device 310 is a transmissive liquid crystal display device, a transparent conductive film is used as each of the conductive films 321*a* and 322*b*. When a conductive film with low resistance is provided in contact with the transparent conductive film, signal delay or the like in driving a touch sensor can be inhibited. In FIG. 49, a conductive film 389*a* and a conductive film 389*b* each functioning as an auxiliary electrode are provided over the conductive film 321*a* and the conductive film 322*b*, respectively. A material similar to the material used for the gate electrode or the source and drain electrodes of the transistor 150*a* can be used for each of the conductive films 389*a* and 389*b*, for example.

In the case where a material which does not transmit visible light is used for each of the auxiliary electrodes, the conductive films 389*a* and 389*b* are each preferably provided in a position overlapping with the light-blocking film 332 (see FIG. 49). Although the conductive film 389*a* and the conductive film 389*b* are formed using different materials in FIG. 49, the conductive films 389*a* and 389*b* may be formed using the same material.

Figure 51:
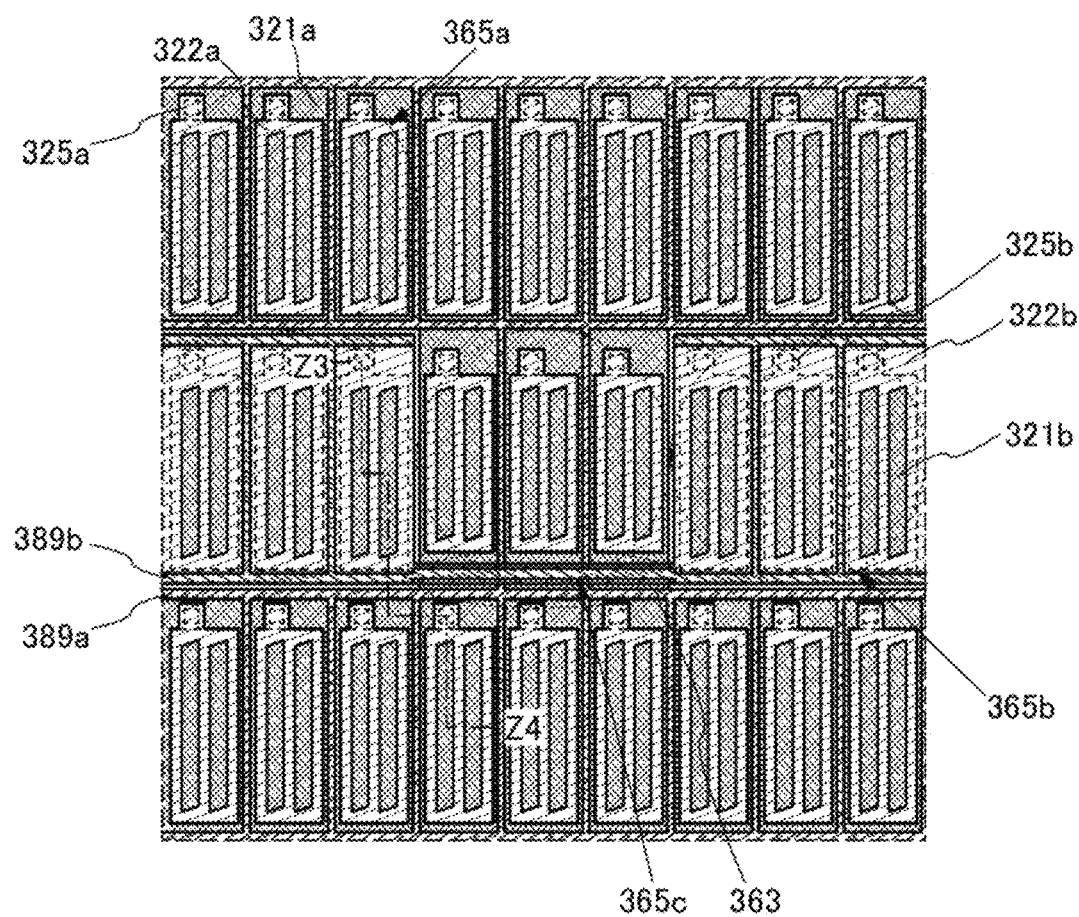
FIG. 51 is a top view illustrating an example of a display device of one embodiment.

FIG. 51 illustrates an example of a schematic top view of the region 362 in which the conductive films 389*a* and 389*b* are provided in the first pixel 365*a*, the second pixel 365*b*, and the third pixel 365*c*. The cross-sectional view of the display portion 381 in FIG. 49 is taken along dashed-dotted line Z3-Z4 in FIG. 51.

Figure 50:
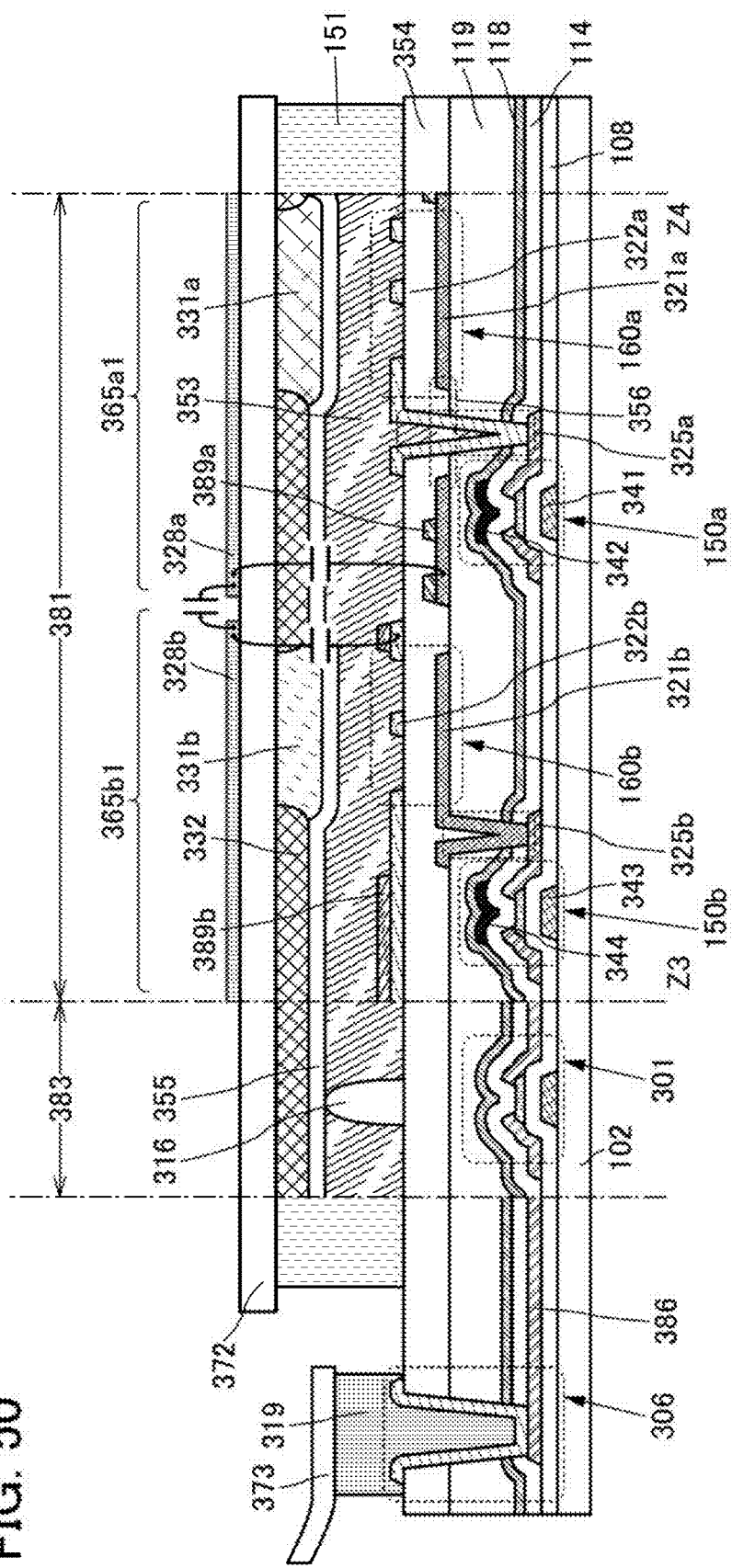
FIG. 50 is a cross-sectional view illustrating an example of a display device of one embodiment.

Similarly to FIG. 5A, the conductive film 328*a* and the conductive film 328*b* may be provided over the substrate 372. FIG. 50 illustrates such a case.

Cross-Sectional Structure Example 6

Figure 52:
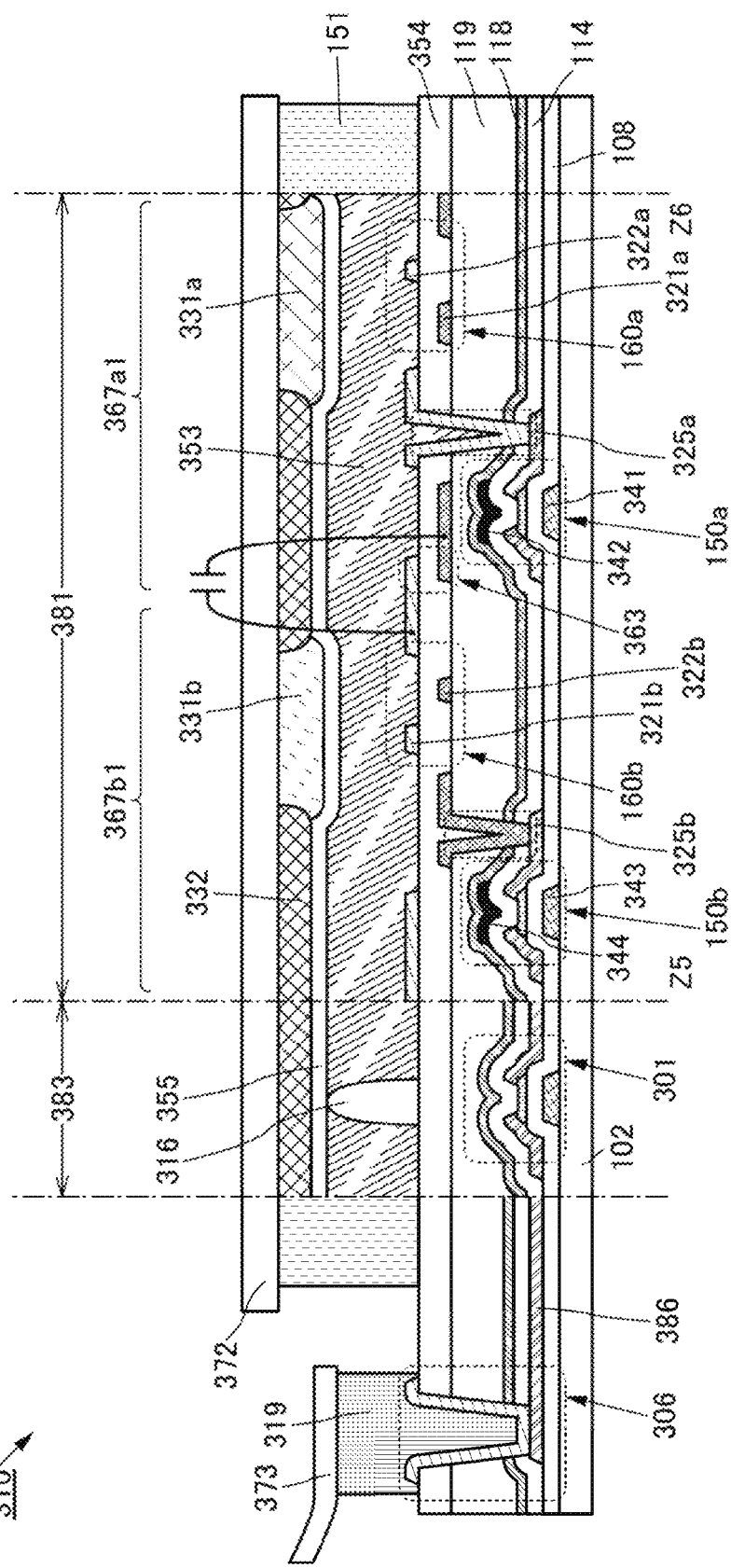
FIG. 52 is a cross-sectional view illustrating an example of a display device of one embodiment.

FIG. 52 illustrates a structure in which the conductive films 321*a*, 322*a*, 321*b*, and 322*b* each have a comb-like top surface shape. FIG. 52 illustrates the cross section including two subpixels 367*a*1 and 367*b*1 as an example of the display portion 381. The subpixel 367*a*1 is included in the first pixel 367*a* and the subpixel 367*b*1 is included in the second pixel 367*b*. The cross-sectional view of the display portion 381 in FIG. 52 is taken along dashed-dotted line Z5-Z6 in FIG. 37.

Figure 53:
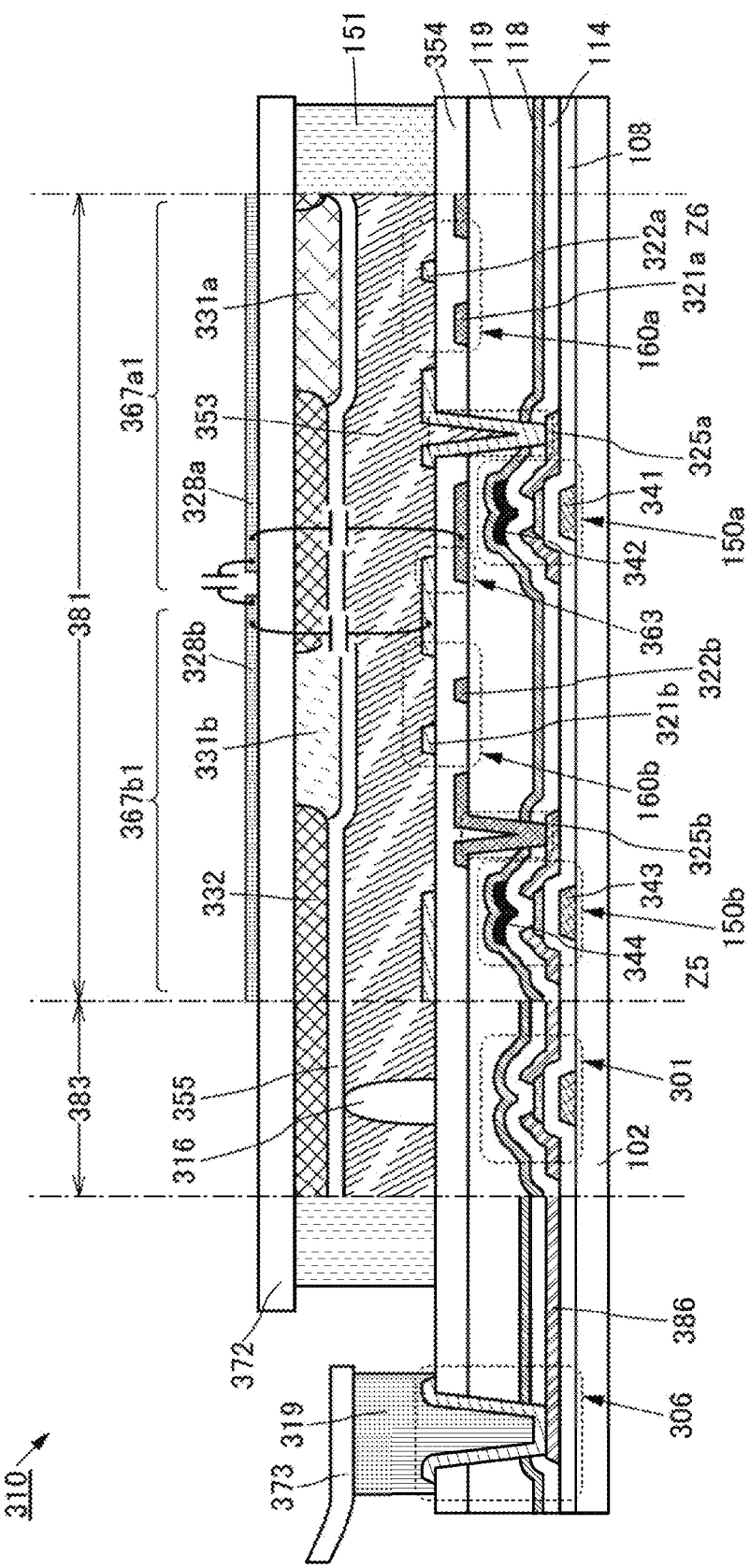
FIG. 53 is a cross-sectional view illustrating an example of a display device of one embodiment.

Similarly to FIG. 5B, the conductive film 328a and the conductive film 328b may be provided over the substrate 372. FIG. 53 illustrates such a case.

Cross-Sectional Structure Example 7

Figure 54:
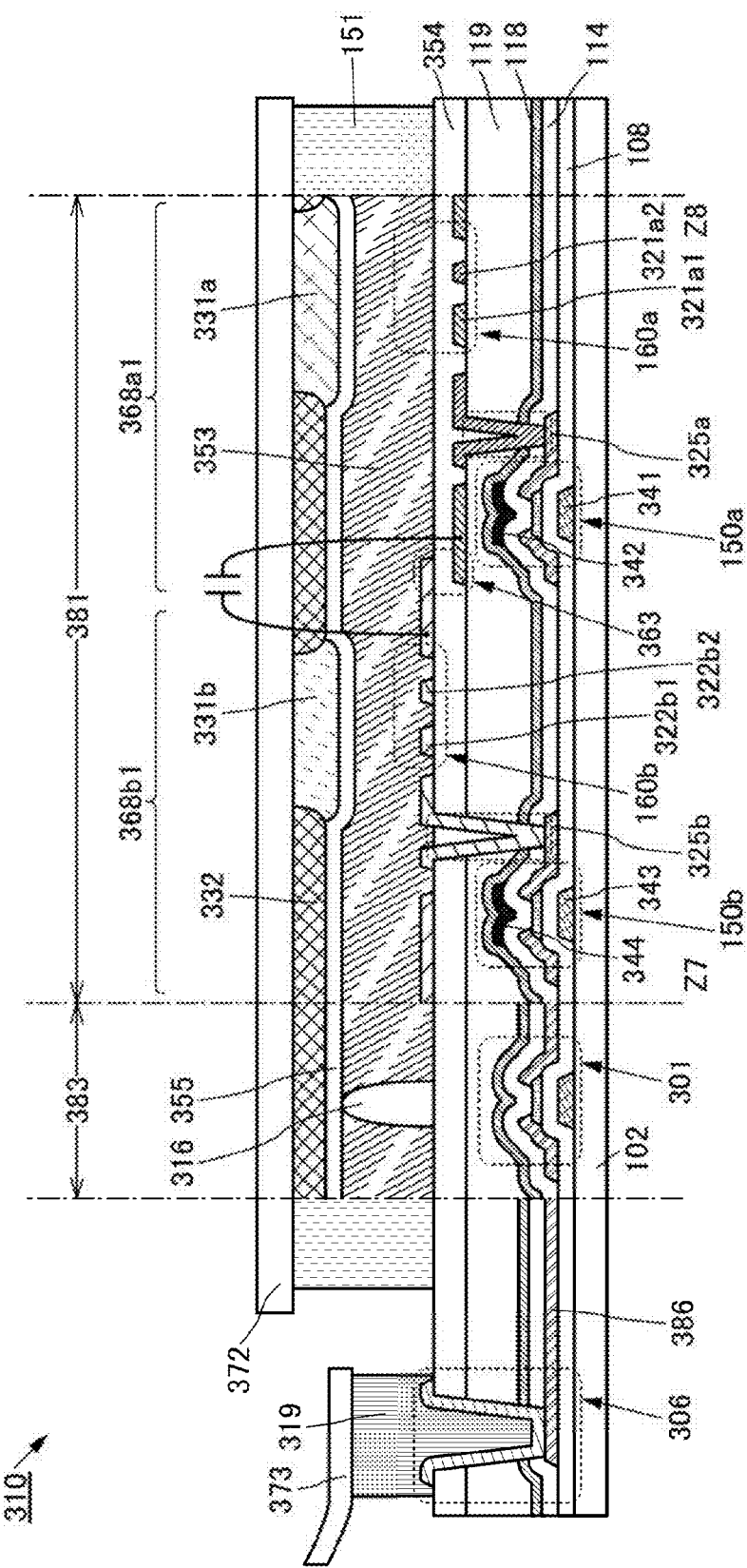
FIG. 54 is a cross-sectional view illustrating an example of a display device of one embodiment.

FIG. 54 illustrates a structure in which a pixel electrode of a first pixel and a common electrode of the first pixel are provided on the same plane and a pixel electrode of a second pixel and a common electrode of the second pixel are provided on the same plane. FIG. 54 illustrates the cross section including two subpixels 368a1 and 368b1 as an example of the display portion 381. The subpixel 368a1 is included in the first pixel 368a and the subpixel 368b1 is included in the second pixel 368b. The cross-sectional view of the display portion 381 in FIG. 54 is taken along dashed-dotted line Z7-Z8 in FIG. 38.

In the subpixel 368a1, the conductive film 321a1 functioning as the common electrode and the conductive film 321a2 functioning as the pixel electrode are provided over the insulating film 119. In the subpixel 368b1, the conductive film 322b1 functioning as the common electrode and the conductive film 322b2 functioning as the pixel electrode are provided over the insulating film 354. The conductive films 321a1 and 321a2 are preferably concurrently formed using the same material and the conductive films 322b1 and 322b2 are preferably concurrently formed using the same material.

The conductive films 321a1 and 322b1 function as one electrode of the touch sensor and the other electrode thereof, respectively. With the use of capacitance formed between the conductive films 321a1 and 322b1, the approach or contact of an object can be sensed.

Figure 56:
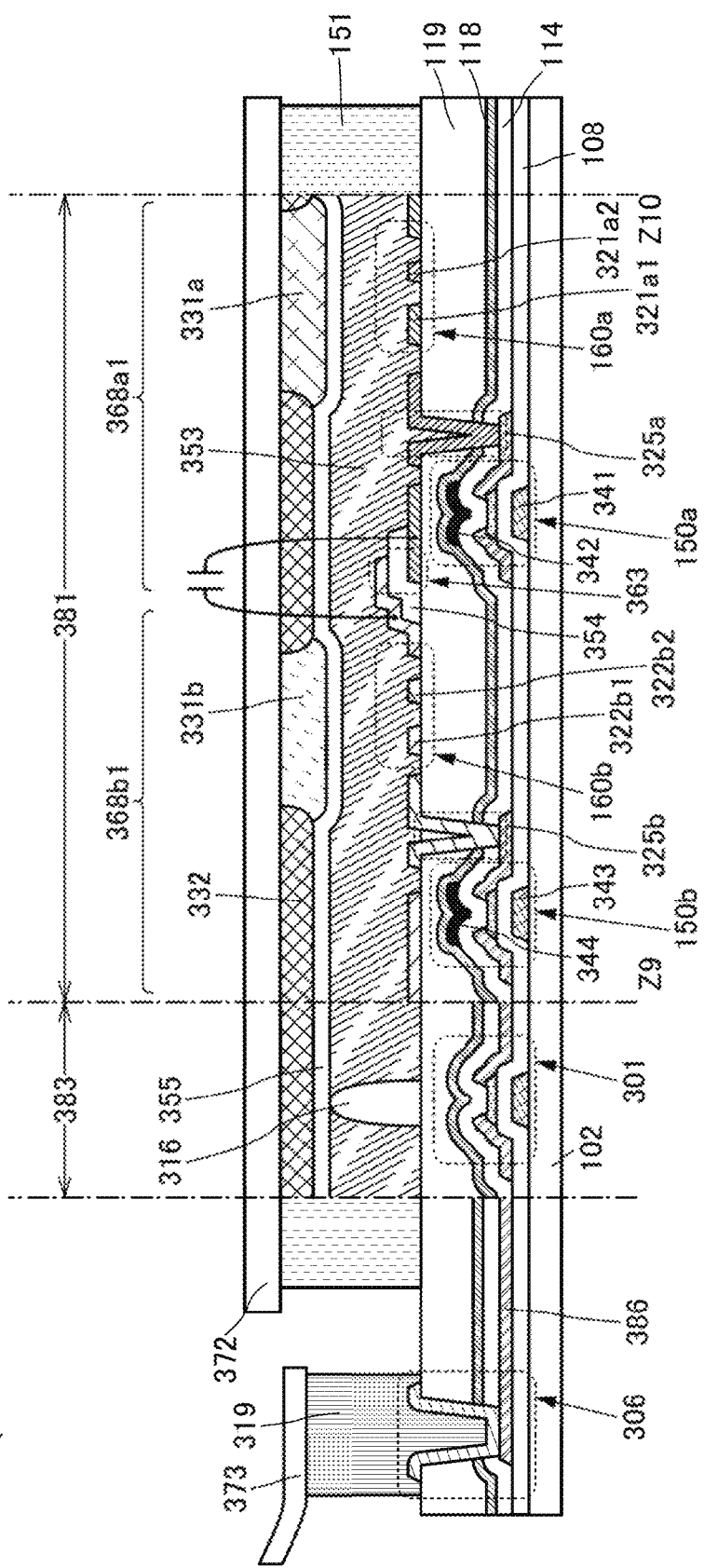
FIG. 56 is a cross-sectional view illustrating an example of a display device of one embodiment.
Figure 57:
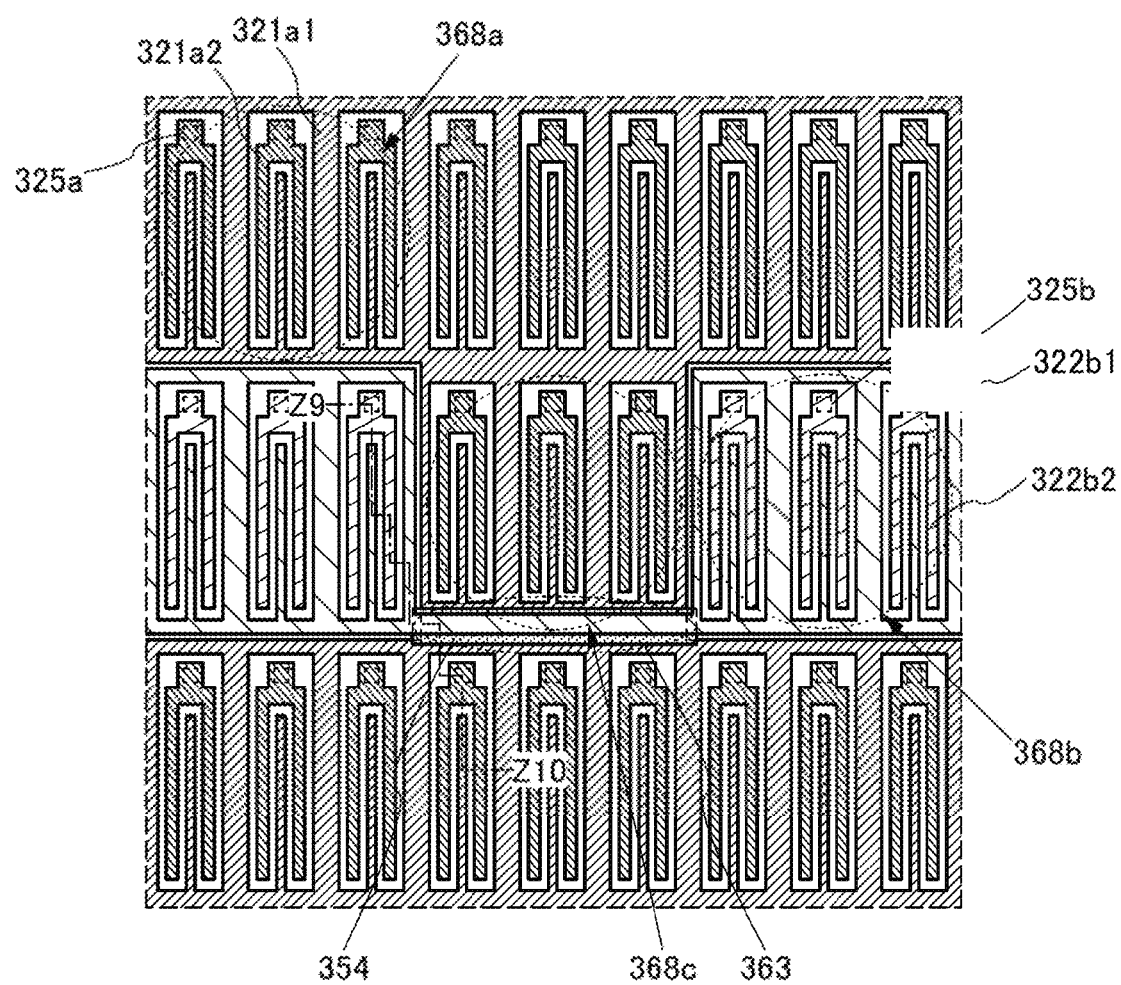
FIG. 57 is a top view illustrating an example of a display device of one embodiment.

It is preferable that the insulating film 354 not be provided in an aperture portion of a pixel, e.g., in a region overlapping with the coloring film 331a or 331b. In particular, when the insulating film 354 is not provided over the conductive films 321a1 and 321a2 included in the liquid crystal element 160a, the difference in the voltage-transmittance characteristics between the first pixel 368a and the second pixel 368b can be made small. The insulating film 354 is provided so as to separate at least the conductive film 321a1 and the conductive film 322b1. FIG. 56 illustrates an example in which the insulating film 354 is provided for at least a region where the conductive film 321a1 and the conductive film 322b1 overlap with each other. The cross-sectional view of the display portion 381 in FIG. 56 is taken along dashed-dotted line Z9-Z10 in FIG. 57. In the case illustrated in FIG. 56, any insulating film is not provided over part of the conductive films 321a1 and 321a2 at the time of pattern formation of the conductive films 322b1, 322b2, and the like. In such a case, when part of a conductive film is etched to form the conductive films 322b1, 322b2, and the like, the conductive films 321a1 and 321a2 might also be etched. Therefore, in the case illustrated in FIG. 56, for example, the conductive films 322b1 and 322b2 and the like are preferably formed using a material different from that of the conductive films 321a1 and 321a2 and the like. Thus, even when an insulating film is not provided over the conductive films 321a1 and 321a2, the conductive films 321a1 and 321a2 can be prevented from being etched in formation of the conductive films 322b1 and 322b2 and the like.

Figure 55:
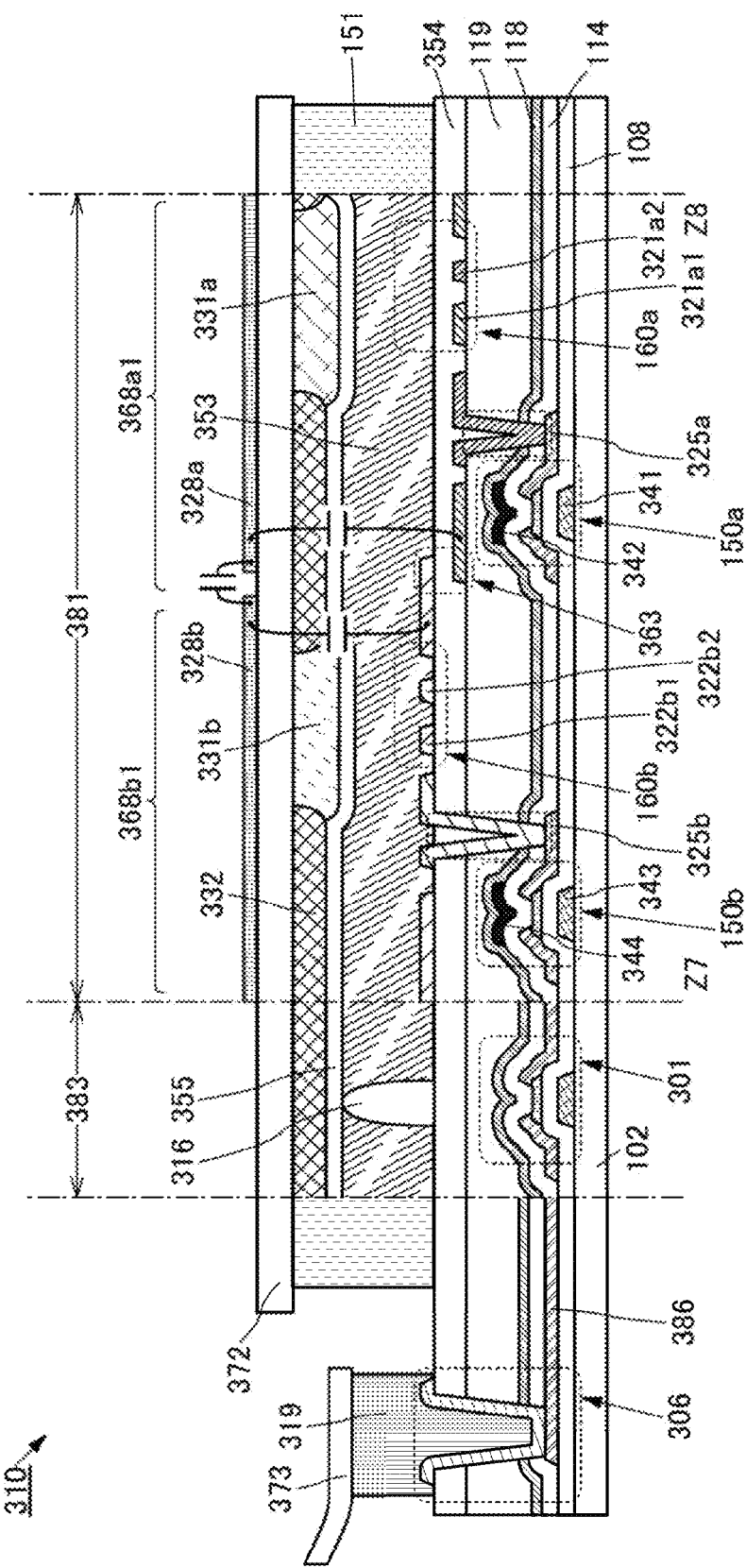
FIG. 55 is a cross-sectional view illustrating an example of a display device of one embodiment.
Figure 58:
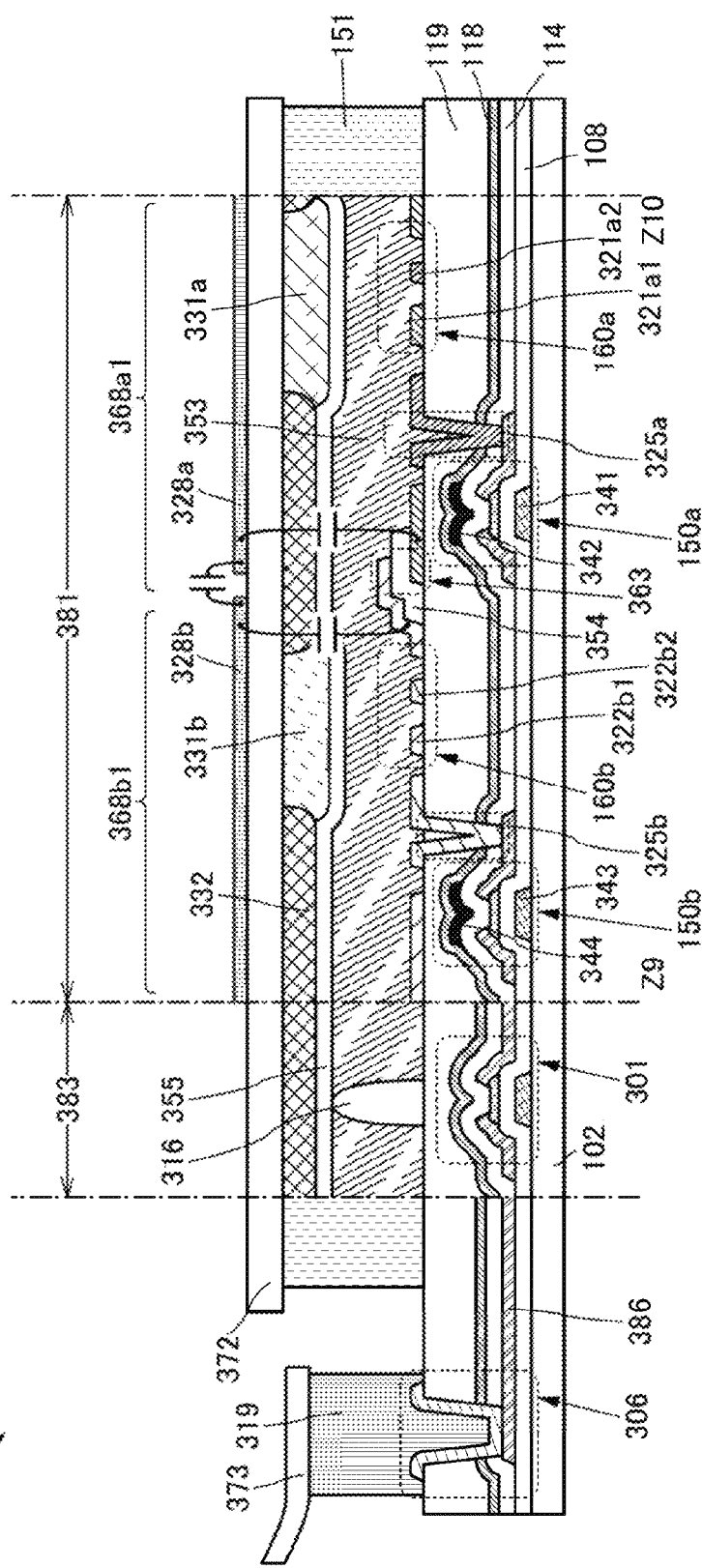
FIG. 58 is a cross-sectional view illustrating an example of a display device of one embodiment.

Similarly to FIG. 5B, the conductive film 328a and the conductive film 328b may be provided over the substrate 372 in FIG. 54 and FIG. 56. FIG. 55 and FIG. 58 each illustrate such a case.

Figure 59:
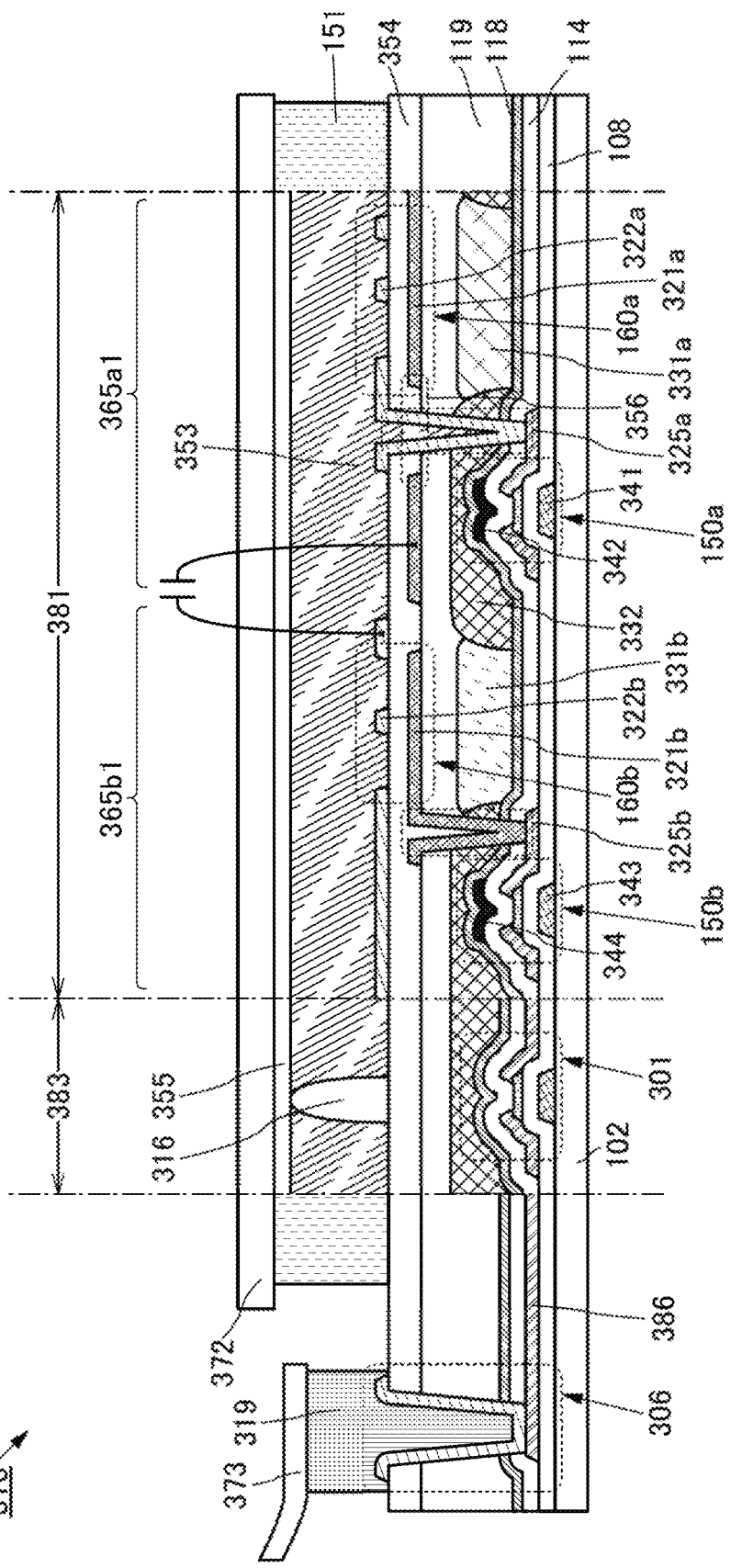
FIG. 59 is a cross-sectional view illustrating an example of a display device of one embodiment.
Figure 60:
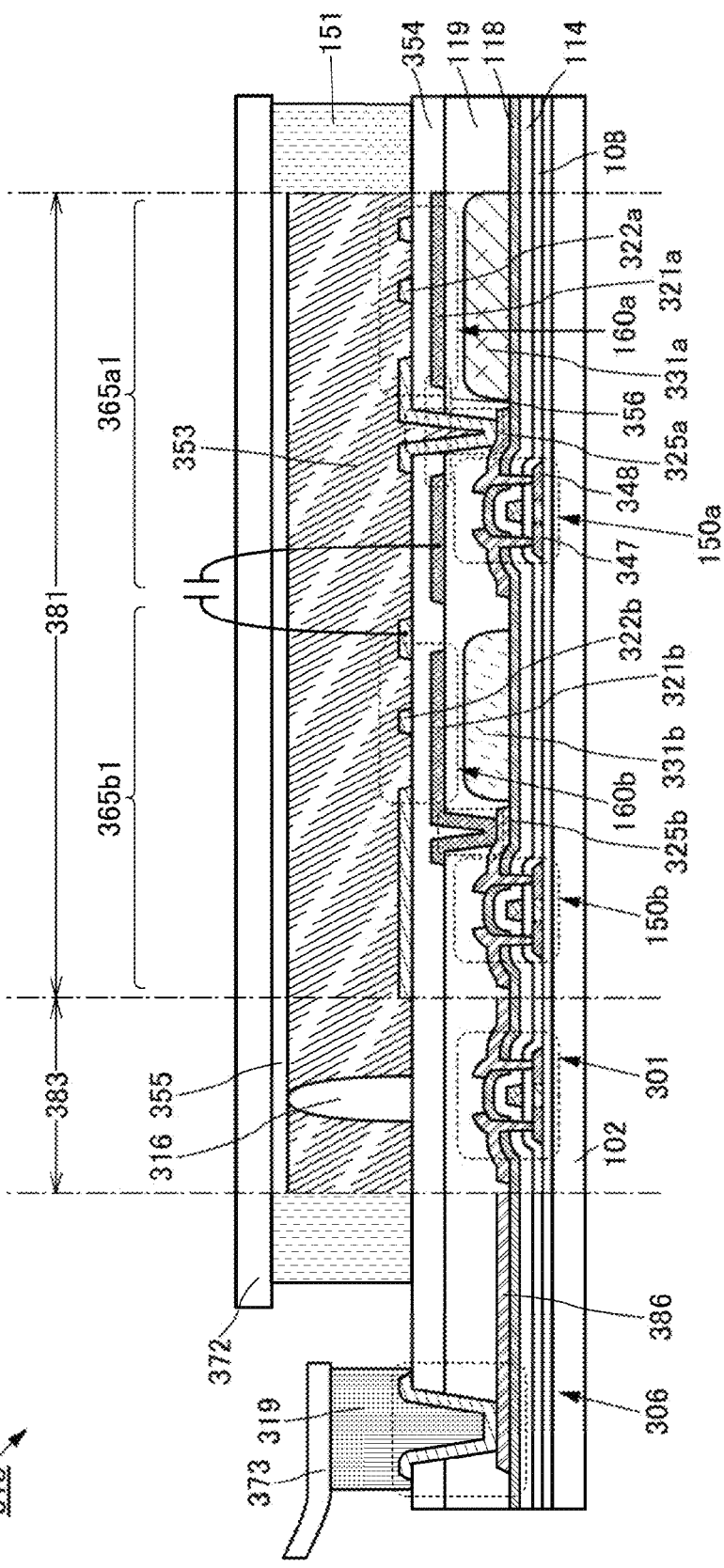
FIG. 60 is a cross-sectional view illustrating an example of a display device of one embodiment.

In any of the cross-sectional views of the display device 310 of this embodiment, at least one of the coloring film 331a, the coloring film 331b, and the light-blocking film 332 is provided on the substrate 372 side. However, one embodiment of the present invention is not limited thereto. For example, at least one of the coloring film 331a, the coloring film 331b, and the light-blocking film 332 may be provided on the substrate 102 side. FIG. 59 illustrates such a case of FIG. 42 and FIG. 60 illustrates such a case of FIG. 47. Note that other cross sections can have similar structures.

Another Structure Example

Note that one embodiment of the present invention is not limited to the above-described structures and can have various structures.
<Peripheral Circuit>
A peripheral circuit can be formed outside a substrate over which pixels are formed. That is, a circuit for driving a touch sensor and a circuit for driving a pixel can be separately formed. Note that one circuit can also have both the functions.

The circuit for driving a touch sensor may be provided on the gate driver side for driving a pixel or the source driver side.

An IC is preferably used as a circuit that has a sensing function and is one of two circuits, a circuit electrically connected to the conductive films (electrodes) in the X direction and a circuit electrically connected to the conductive films (electrodes) in the Y direction, of the touch sensor. In that case, the conductive films are preferably controlled with the IC via an FPC.
<Conductive Film (Electrode) of Touch Sensor and Conductive Film (Electrode) of Liquid Crystal Element>
A conductive film (electrode) having a slit on the upper side can be used as the pixel electrode, and a conductive film (electrode) provided across a plurality of pixels on the lower side can be used as the common electrode.

Alternatively, a conductive film (electrode) that is provided across a plurality of pixels on the upper side and has a slit can be used as the common electrode, and a conductive film (electrode) that is provided on the lower side can be used as the pixel electrode.

The conductive film in the X direction of the touch sensor can also serve as the conductive film functioning as the pixel electrode or the conductive film functioning as the common electrode. Alternatively, the conductive film in the Y direction of the touch sensor can also serve as the conductive film functioning as the pixel electrode or the conductive film functioning as the common electrode.

In addition, the conductive film in the X direction of the touch sensor may be one of a conductive film to which a pulse voltage is applied and a conductive film for sensing a current. In that case, the conductive film in the Y direction of the touch sensor may be the other of the conductive films.

The conductive film functioning as the common electrode may be provided across a plurality of pixels. For example, the conductive film functioning as the common electrode may be electrically connected to a common wiring formed using a conductive film on the same plane as the gate electrode of the transistor. In that case, one conductive film functioning as the common electrode may have an island shape.
<Driving Method>
As a method for driving the touch sensor, for example, a method in which sensing (scanning) of the corresponding row is performed in a period between horizontal periods (gate selection periods) for the driving of the pixel can be used. Alternatively, one frame period may be divided in two periods; writing to all pixels may be performed in the former period, and sensing may be performed in the latter period.

At least part of this embodiment can be implemented in combination with any of the embodiments described in this specification as appropriate.

Embodiment 2

In this embodiment, an example of an oxide semiconductor that can be used for the transistor and the capacitor of the display device of one embodiment of the present invention is described.

A structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 61A:
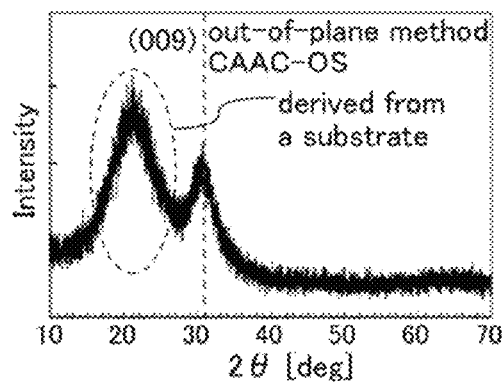
FIGS. 61A to 61E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 61A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 61B:
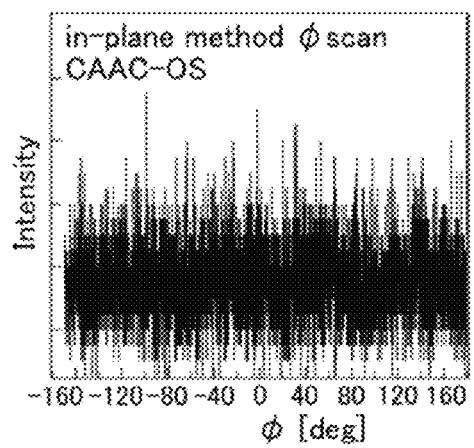
Figure 61C:
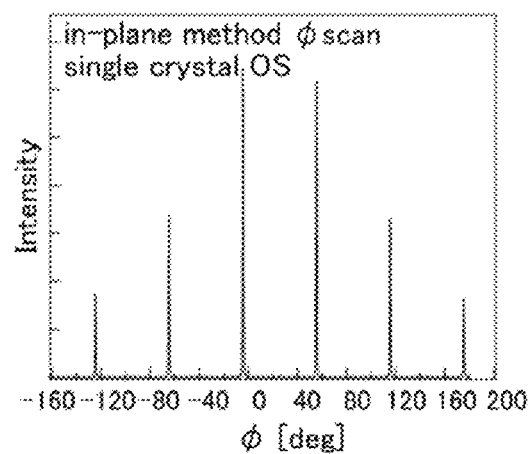

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 61B, a peak is not clearly observed. In contrast, in the case where single crystal $InGaZnO_4$ is subjected to φ scan with 2θ fixed at around 56°, as shown in FIG. 61C, six peaks that are derived from crystal planes equivalent to the (110) plane are observed. Accordingly, the structural analysis using XRD shows that the directions of a-axes and b-axes are irregularly oriented in the CAAC-OS.

Figure 61D:
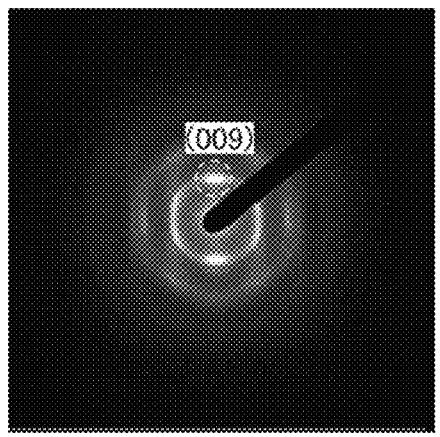
Figure 61E:
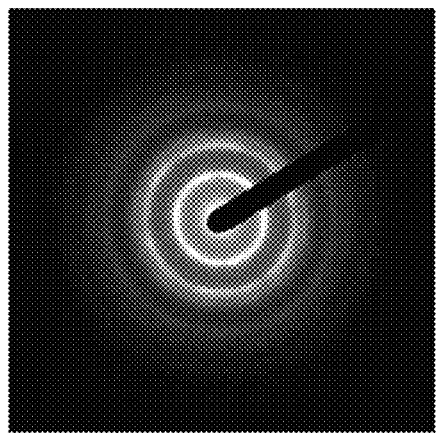

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 61D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 61E shows a diffraction pattern obtained in such a manner that an electron beam with a probe diameter of 300 nm is incident on the same sample in a direction perpendicular to the sample surface. As shown in FIG. 61E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 61E is considered to be derived from the (010) plane, the (100) plane, and the like of the $InGaZnO_4$ crystal. The second ring in FIG. 61E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 62A:
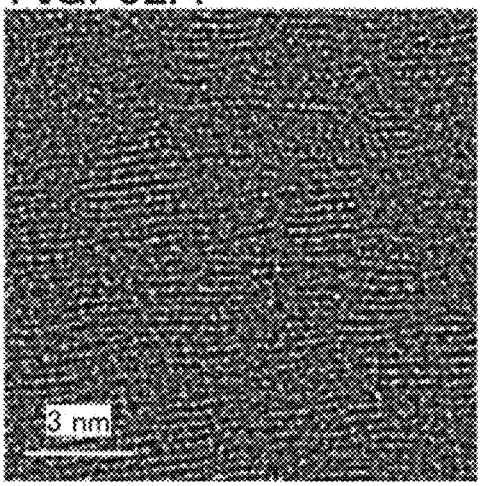
FIGS. 62A to 62E show a cross-sectional TEM image and plan-view TEM images of a CAAC-OS and images obtained through analysis thereof.

FIG. 62A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 62A shows pellets in which metal atoms are arranged in a layered manner. FIG. 62A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 62B:
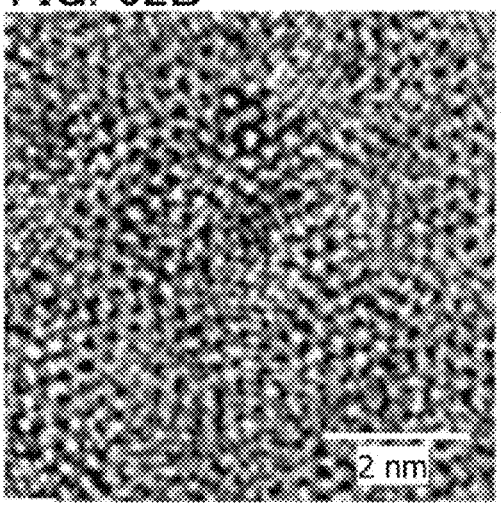
Figure 62C:
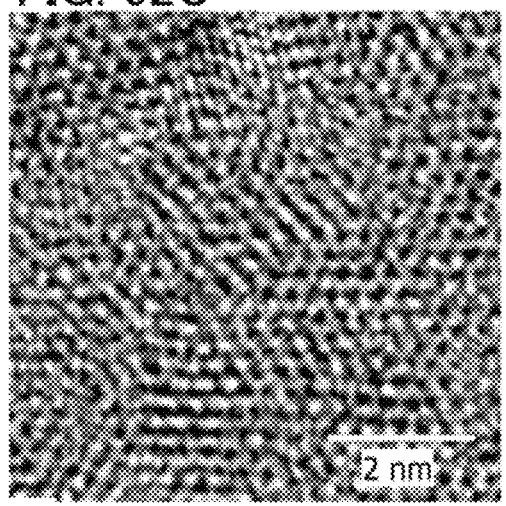
Figure 62D:
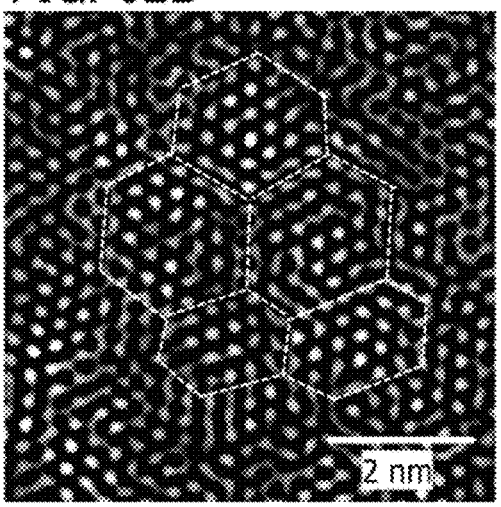
Figure 62E:
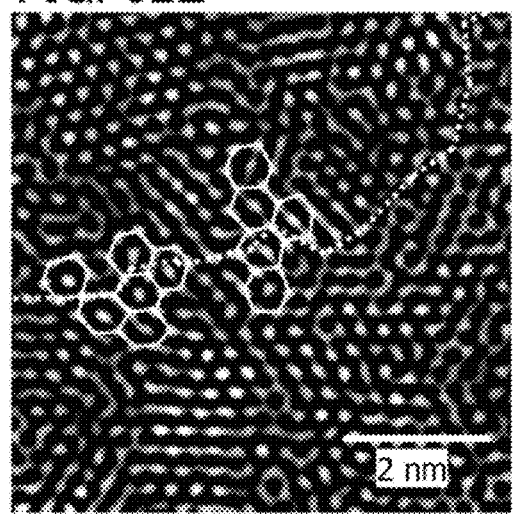

FIGS. 62B and 62C show Cs-corrected high-resolution TEM images of a plane of the CAAC-OS observed from a direction substantially perpendicular to the sample surface. FIGS. 62D and 62E are images obtained through image processing of FIGS. 62B and 62C. The method of image processing is as follows. The image in FIG. 62B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 62D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 62E, a dotted line denotes a dotted line denotes a boundary between a region with a regular lattice arrangement and another region with a regular lattice arrangement. A clear grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 63A:
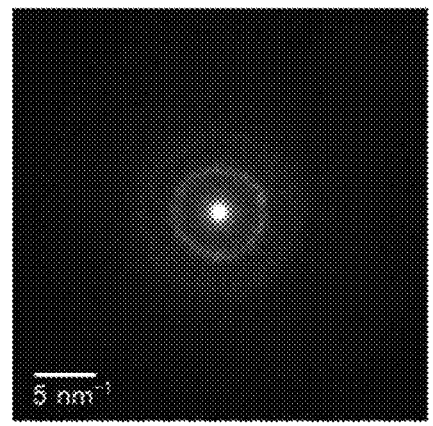
FIGS. 63A to 63D show electron diffraction patterns and a cross-sectional TEM image of an nc-OS.
Figure 63B:
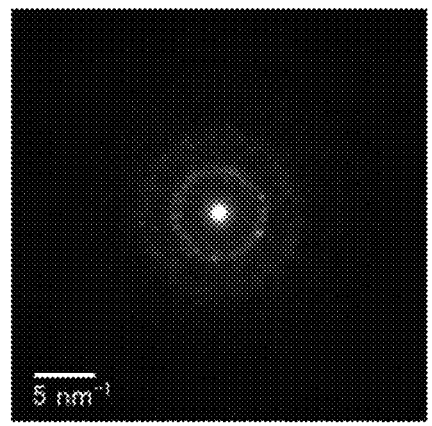

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 63A is observed. FIG. 63B shows a diffraction pattern (a nanobeam electron diffraction pattern) obtained when an electron beam with a probe diameter of 1 nm is incident on the same sample. As shown in FIG. 63B, a plurality of spots is observed in a ring-like region. In other words, ordering in an nc-OS is not observed with an electron beam with a probe diameter of 50 nm but is observed with an electron beam with a probe diameter of 1 nm.

Figure 63C:
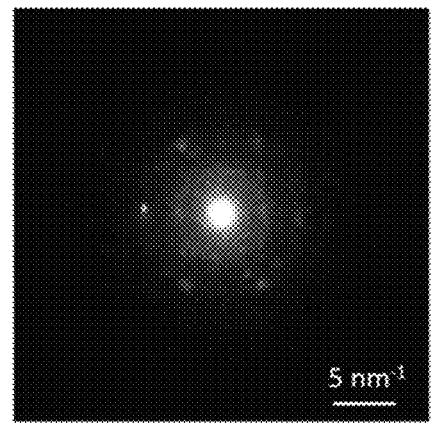

Furthermore, an electron diffraction pattern in which spots are arranged in an approximately regular hexagonal shape is observed in some cases as shown in FIG. 63C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 63D:
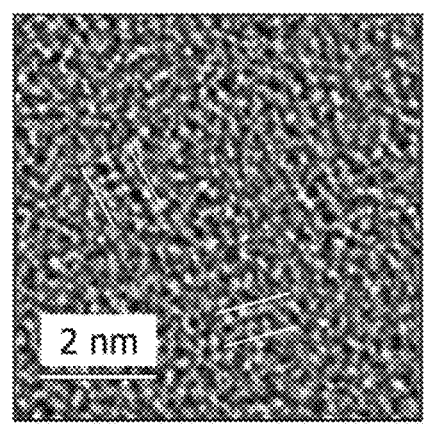

FIG. 63D shows a Cs-corrected high-resolution TEM image of a cross section of an nc-OS observed from a direction substantially parallel to the formation surface. In a high-resolution TEM image, an nc-OS has a region in which a crystal part is observed, such as the part indicated by additional lines in FIG. 64D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 64A:
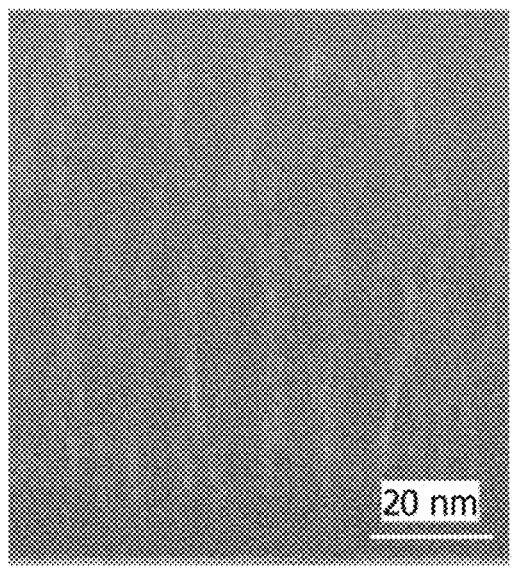
FIGS. 64A and 64B show cross-sectional TEM images of an a-like OS.
Figure 64B:
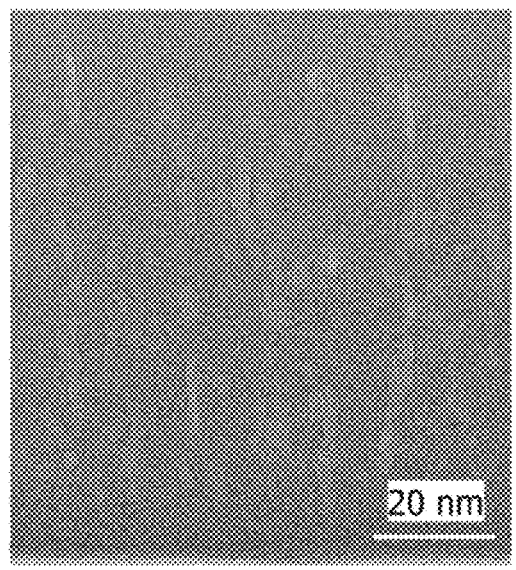

FIGS. 64A and 64B are high-resolution cross-sectional TEM images of an a-like OS. FIG. 64A is the high-resolution cross-sectional TEM image of the a-like OS at the start of the electron irradiation. FIG. 64B is the high-resolution cross-sectional TEM image of the a-like OS after the electron ($e^-$) irradiation at $4.3 \times 10^8$ $e^-/nm^2$. FIGS. 64A and 64B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 65:
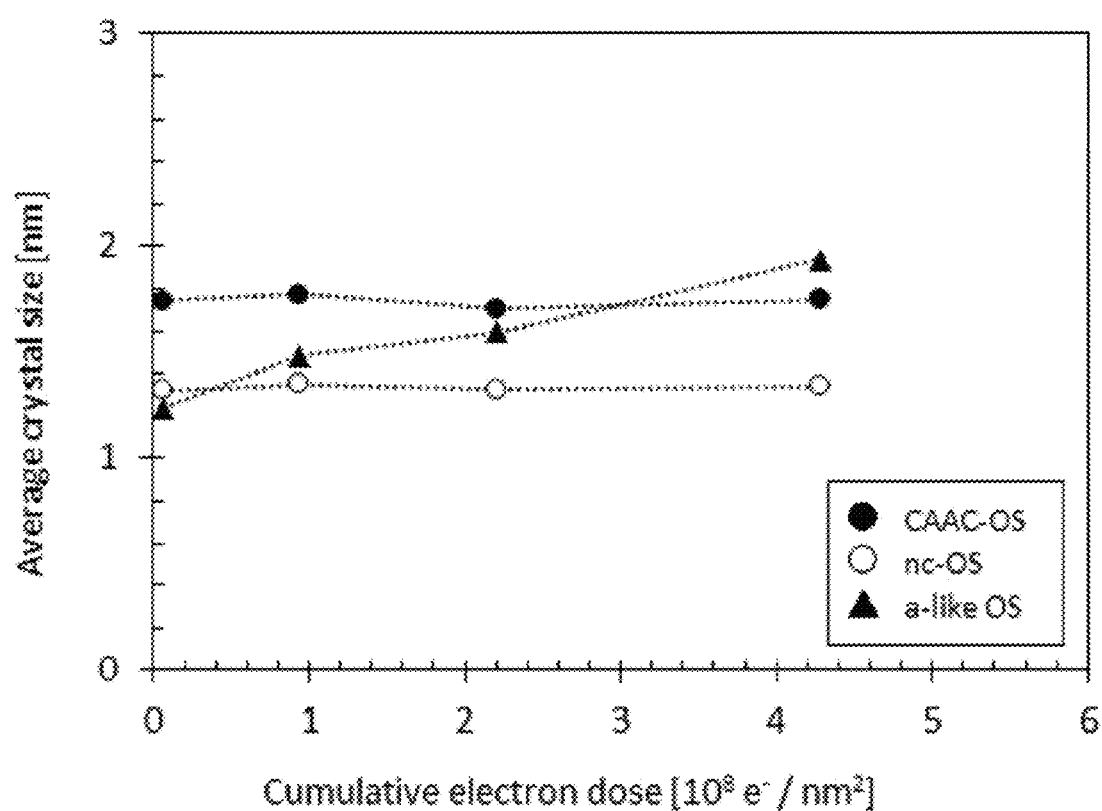
FIG. 65 shows a change in crystal parts of In—Ga—Zn oxides induced by electron irradiation.

FIG. 65 shows change in the average size of crystal parts (at 22 points to 30 points) in each sample. Note that the crystal part size corresponds to the length of a lattice fringe. FIG. 65 indicates that the crystal part size in the a-like OS increases with an increase in the cumulative electron dose in obtaining TEM images, for example. As shown in FIG. 65, a crystal part of approximately 1.2 nm (also referred to as an initial nucleus) at the start of TEM observation grows to a size of approximately 1.9 nm at a cumulative electron (e) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e/nm^2$. As shown in FIG. 65, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, an nc-OS, and a CAAC-OS, for example.

<Method for Depositing CAAC-OS>

An example of a method for depositing a CAAC-OS is described below.

Figure 66:
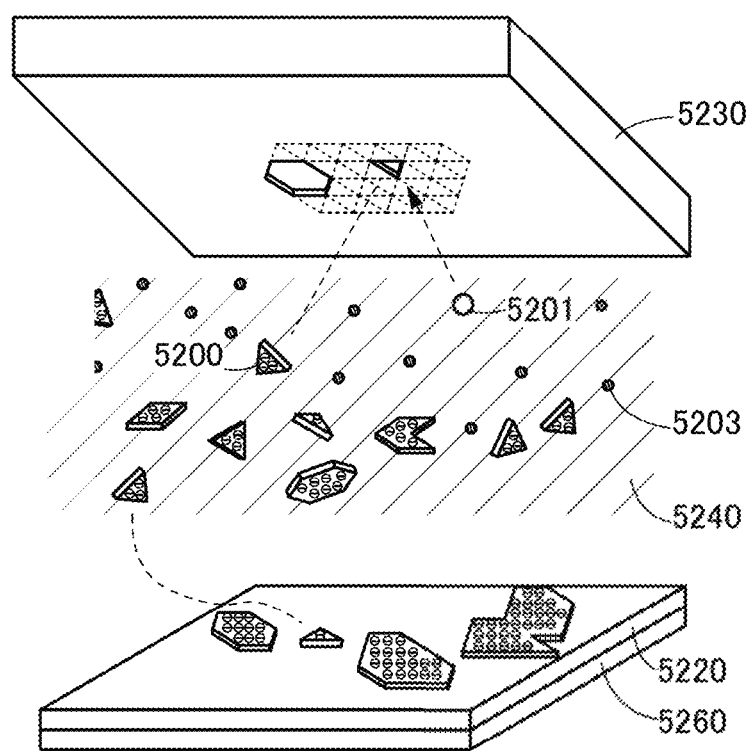
FIG. 66 illustrates a deposition method of a CAAC-OS.

FIG. 66 is a schematic view of the inside of a deposition chamber. The CAAC-OS can be deposited by a sputtering method.

As shown in FIG. 66, a substrate 5220 and a target 5230 are arranged to face each other. Plasma 5240 is generated between the substrate 5220 and the target 5230. A heating mechanism 5260 is provided under the substrate 5220. Although not illustrated, a target 5230 is attached to a backing plate. A plurality of magnets is provided to face the target 5230 with the backing plate positioned therebetween. A sputtering method in which the deposition rate is increased by utilizing a magnetic field of magnets is referred to as a magnetron sputtering method.

The distance d between the substrate 5220 and the target 5230 (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a certain voltage or higher to the target 5230, and plasma 5240 is observed. The magnetic field forms a high-density plasma region in the vicinity of the target 5230. In the high-density plasma region, the deposition gas is ionized, so that an ion 5201 is generated. Examples of the ion 5201 include an oxygen cation ($O^+$) and an argon cation ($Ar^+$).

Figure 67A:
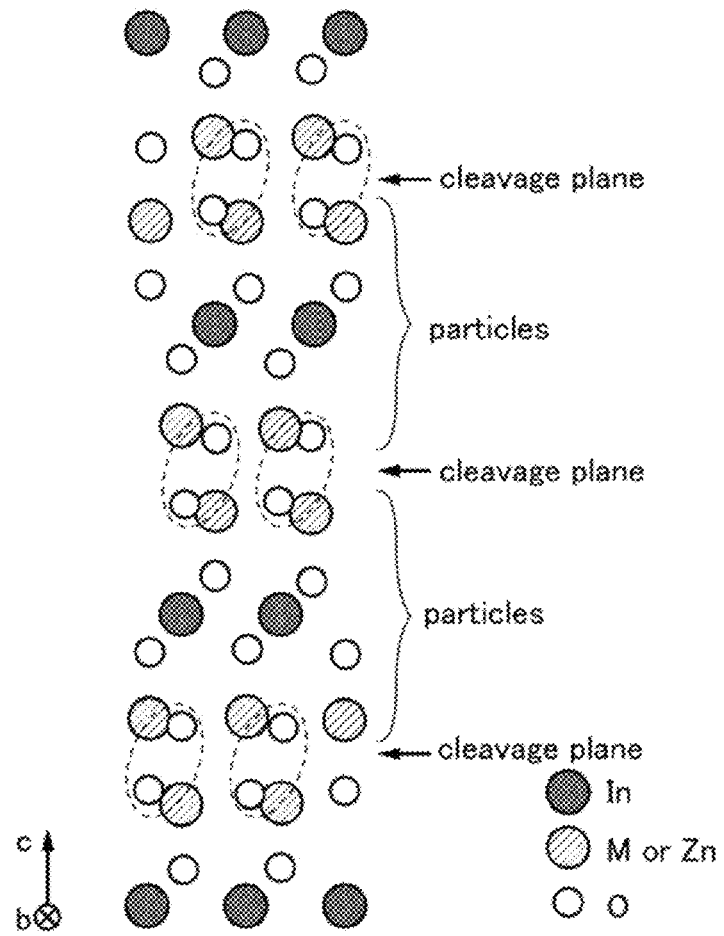
FIGS. 67A to 67C illustrate an $InMZnO_4$ crystal.
Figure 67B:
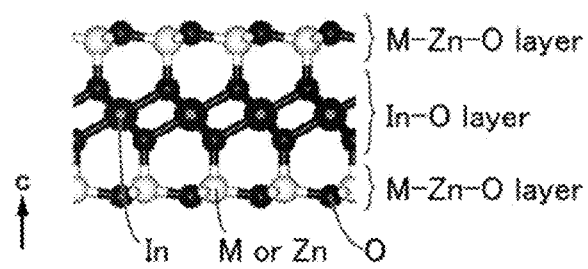
Figure 67C:
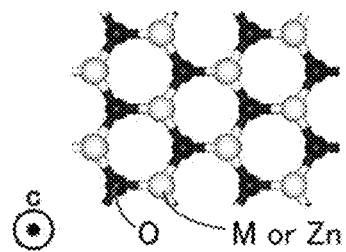

Here, the target 5230 has a polycrystalline structure with a plurality of crystal grains and in which a cleavage plane exists in any of the crystal grains. FIGS. 67A to 67C show a crystal structure of $InMZnO_4$ (the element M is Al, Ga, Y, or Sn, for example) included in the target 5230 as an example. Note that FIG. 67A illustrates the crystal structure of $InMZnO_4$ observed from the direction parallel to the b-axis. In the crystal of $InMZnO_4$, oxygen atoms are negatively charged, whereby repulsive force is generated between the two adjacent M-Zn—O layers. Thus, the $InMZnO_4$ crystal has a cleavage plane between the two adjacent M-Zn—O layers.

The ion 5201 generated in the high-density plasma region is accelerated toward the target 5230 side by an electric field, and then collides with the target 5230. At this time, a pellet 5200 that is a flat-plate-like or pellet-like sputtered particle is separated from the cleavage plane (FIG. 66). The pellet 5200 is between the two cleavage planes shown in FIG. 67A. Thus, when the pellet 5200 is observed, the cross-section thereof is as shown in FIG. 67B, and the top surface thereof is as shown in FIG. 67C. Note that the structure of the pellet 5200 may be distorted by an impact of collision of the ion 5201.

The pellet 5200 is a flat-plate-like (pellet-like) sputtered particle having a triangle plane, e.g., a regular triangle plane. Alternatively, the pellet 5200 is a flat-plate-like (pellet-like) sputtered particle having a hexagonal plane, e.g., a regular hexagonal plane. The shape of the pellet 5200 is not limited to a triangle or a hexagon. For example, the flat plane may have a shape formed by combining two or more triangles. For example, a quadrangle (e.g., rhombus) may be formed by combining two triangles (e.g., regular triangles).

The thickness of the pellet 5200 is determined depending on the kind of deposition gas and the like. For example, the thickness of the pellet 5200 is greater than or equal to 0.4 nm and less than or equal to 1 nm, preferably greater than or equal to 0.6 nm and less than or equal to 0.8 nm. In addition, for example, the width of the pellet 5200 is greater than or equal to 1 nm and less than or equal to 100 nm, preferably greater than or equal to 2 nm and less than or equal to 50 nm, more preferably greater than or equal to 3 nm and less than or equal to 30 nm. For example, the ion 5201 collides with the target 5230 including the In—M—Zn oxide. Then, the pellet 5200 including three layers of an M-Zn—O layer, an In—O layer, and an M-Zn—O layer is separated. Note that along with the separation of the pellet 5200, a particle 5203 is also sputtered from the target 5230. The particle 5203 has an atom or an aggregate of several atoms. Therefore, the particle 5203 can be referred to as an atomic particle.

The surface of the pellet 5200 may be negatively or positively charged when the pellet 5200 passes through the plasma 5240. For example, the pellet 5200 may receive a negative charge from $O^{2-}$ in the plasma 5240. As a result, oxygen atoms on the surfaces of the pellet 5200 may be negatively charged. In addition, when passing through the plasma 5240, the pellet 5200 is sometimes combined with indium, the element M, zinc, oxygen, or the like in the plasma 5240 to grow up.

The pellet 5200 and the particles 5203 that have passed through the plasma 5240 reach a surface of the substrate 5220. Note that some of the particles 5203 are discharged to the outside by a vacuum pump or the like because of their smallness in mass.

Next, deposition of the pellet 5200 and the particle 5203 on the surface of the substrate 5220 is described with reference to FIGS. 68A to 68F.

First, a first pellet 5200 is deposited on the substrate 5220. Since the pellet 5200 has a flat-plate-like shape, it is deposited so that its flat plane faces the surface of the substrate 5220. At this time, charge on a surface of the pellet 5200 on the substrate 5220 side is lost through the substrate 5220.

Next, a second pellet 5200 reaches the substrate 5220. Since a surface of the first pellet 5200 and a surface of the second pellet 5200 are charged, they repel each other. As a result, the second pellet 5200 avoids being deposited on the first pellet 5200, and is deposited with its flat plane facing the surface of the substrate 5220 so as to be a little distance away from the first pellet 5200. With repetition of this, millions of the pellets 5200 are deposited on the surface of the substrate 5220 to have a thickness of one layer. A region where no pellet 5200 is deposited is generated between adjacent pellets 5200 (see FIG. 68A).

Then, the particles 5203 that have received energy from plasma reach the surface of the substrate 5220. The particles 5203 cannot be deposited on an active region such as the surfaces of the pellets 5200. For this reason, the particles 5203 move to regions where no pellet 5200 is deposited and are attached to side surfaces of the pellets 5200. Since available bonds of the particles 5203 are activated by energy received from plasma, the particles 5203 are chemically bonded to the pellets 5200 to form lateral growth portions 5202 (see FIG. 68B).

Figure 68A:
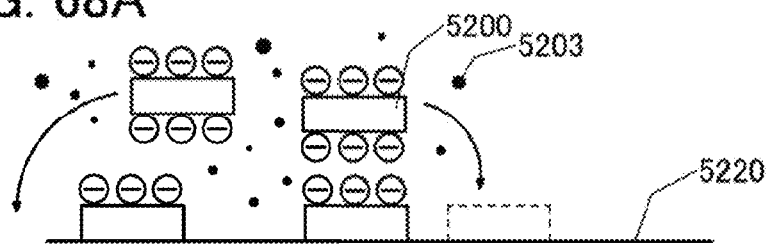
FIGS. 68A to 68F illustrate a deposition method of a CAAC-OS.
Figure 68B:
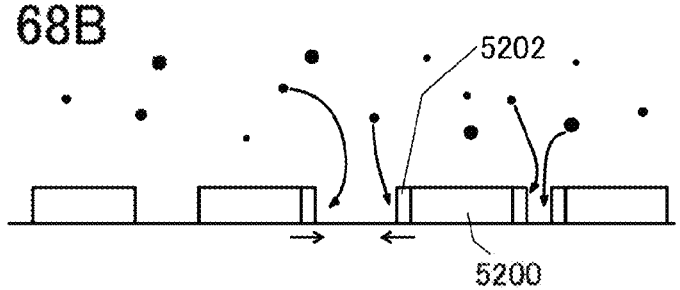
Figure 68C:
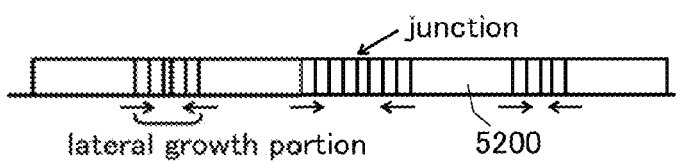

The lateral growth portions 5202 then further grow laterally so that the pellets 5200 are anchored to each other (see FIG. 68C). In this manner, the lateral growth portions 5202 are formed until they fill regions where no pellet 5200 is deposited. This mechanism is similar to a deposition mechanism for an atomic layer deposition (ALD) method.

Even when the deposited pellets 5200 are oriented in different directions, the particles 5203 cause a lateral growth to fill gaps between the pellets 5200; thus, no clear grain boundary is formed. In addition, as the particles 5203 make a smooth connection between the pellets 5200, a crystal structure different from single crystal and polycrystal structures is formed. In other words, a crystal structure including distortion between minute crystal regions (pellets 5200) is formed. Regions filling the gaps between the crystal regions are distorted crystal regions, and thus, it is probably not appropriate to say that the regions have an amorphous structure.

Figure 68D:
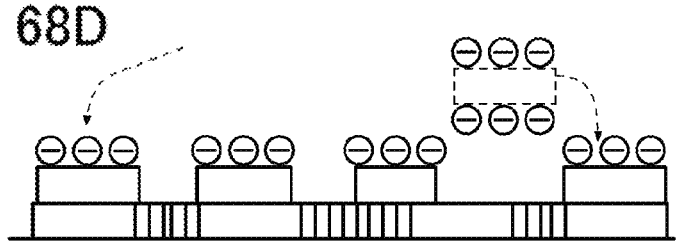
Figure 68E:
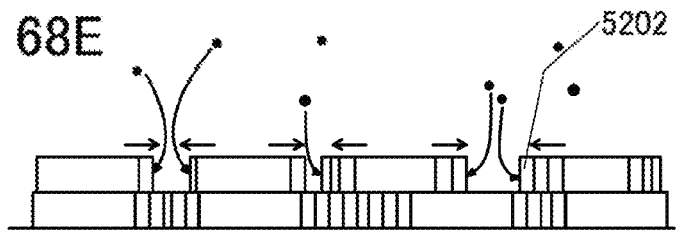
Figure 68F:
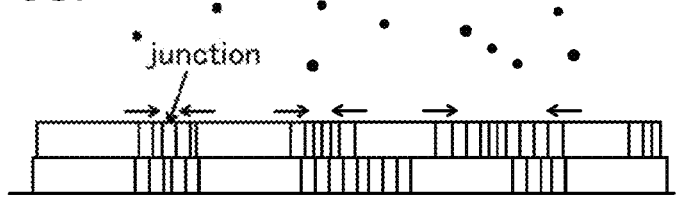

Next, new pellets 5200 are deposited with their flat planes facing the surface of the substrate 5220 (see FIG. 68D). After that, the particles 5203 are deposited so as to fill regions where no pellet 5200 is deposited, thereby forming the lateral growth portions 5202 (see FIG. 68E). In such a manner, the particles 5203 are attached to side surfaces of the pellets 5200 and the lateral growth portions 5202 cause a lateral growth so that the pellets 5200 in the second layer are anchored to each other (see FIG. 68F). Deposition continues until the m-th layer (m is an integer of two or more) is formed; as a result, a layered thin film structure is formed.

A deposition way of the pellets 5200 changes according to the surface temperature of the substrate 5220 or the like. For example, if the surface temperature of the substrate 5220 is high, migration of the pellets 5200 occurs over the surface of the substrate 5220. As a result, the proportion of the pellets 5200 that are directly connected with each other without the particles 5203 increases, whereby a CAAC-OS film with high orientation is made. The surface temperature of the substrate 5220 for deposition of the CAAC-OS is higher than or equal to room temperature and lower than 340° C., preferably higher than or equal to room temperature and lower than or equal to 300° C., more preferably higher than or equal to 100° C. and lower than or equal to 250° C., still more preferably higher than or equal to 100° C. and lower than or equal to 200° C. Therefore, even when a large-sized substrate of the 8th generation or more is used as the substrate 5220, a warp or the like due to the deposition of the CAAC-OS hardly occurs.

In contrast, if the surface temperature of the substrate 5220 is low, the migration of the pellets 5200 over the substrate 5220 does not easily occur. As a result, the pellets 5200 are stacked to form an nc-OS or the like with low orientation. In the nc-OS, the pellets 5200 are possibly deposited with certain gaps when the pellets 5200 are negatively charged. Therefore, the nc-OS has low orientation but some regularity, and thus it has a denser structure than an amorphous oxide semiconductor.

When spaces between pellets are extremely small in a CAAC-OS, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above.

The pellets are probably deposited on the surface of the substrate according to such a deposition model. A CAAC-OS can be deposited even when a formation surface does not have a crystal structure. This indicates that the above-described deposition model, which is a growth mechanism different from an epitaxial growth, has high validity. In addition, with the above-described deposition model, a uniform film of a CAAC-OS or an nc-OS can be formed even over a large-sized glass substrate or the like. Even when the surface of the substrate (formation surface) has an amorphous structure (e.g., amorphous silicon oxide), for example, a CAAC-OS can be deposited.

In addition, even when the surface of the substrate (formation surface) has an uneven shape, the pellets are aligned along the shape.

The above-described deposition model suggests that a CAAC-OS with high crystallinity can be deposited in the following manner: deposition is performed in a high vacuum to have a long mean free path, plasma energy is weakened to reduce damage around a substrate, and thermal energy is applied to a formation surface to repair damage due to plasma during deposition.

The above-described deposition model can be used not only for the case where a target has a polycrystalline structure of a composite oxide with a plurality of crystal grains, such as an In—M—Zn oxide, and any of the crystal grains have a cleavage plane; but also for the case where, for example, a target of a mixture containing indium oxide, an oxide of the element M, and zinc oxide is used.

Since there is no cleavage plane in a target of a mixture, atomic particles are separated from the target by sputtering. During deposition, a high electric field region of plasma is formed around a target. Because of the high electric field region of plasma, atomic particles separated from the target are anchored to each other to cause a lateral growth. For example, indium atoms, which are atomic particles, are anchored to each other and cause a lateral growth to be a nanocrystal formed of an In—O layer, and then M-Zn—O layers are bonded above and below the nanocrystalline In—O layer so as to complement the nanocrystalline In—O layer. In this manner, a pellet can be formed even when a target of a mixture is used. Accordingly, the above-described deposition model can also be applied to the case of using a target of a mixture.

Note that in the case where a high electric field region of plasma is not formed around a target, only atomic particles separated from the target are deposited on a substrate surface. In that case, a lateral growth of an atomic particle might occur on the substrate surface. However, since the orientations of atomic particles are not the same, the crystal orientation in the resulting thin film is not uniform. As a result, an nc-OS or the like is obtained.

At least part of this embodiment can be implemented in combination with any of the embodiments described in this specification as appropriate.

Embodiment 3

<CAC Composition>

Described below is the composition of a cloud aligned complementary oxide semiconductor (CAC-OS) applicable to one embodiment of the present invention.

The CAC refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

For example, of an In—Ga—Zn oxide (hereinafter also referred to as IGZO), CAC-IGZO has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ and $In_{X2}Zn_{Y2}O_{Z2}$ forming the mosaic pattern are evenly distributed in the film. This composition is also referred to as a cloud-like composition.

That is, the CAC-IGZO is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC relates to the material composition. In a CAC material including In, Ga, Zn, and O, regions where nanoparticles including Ga as a main component are partly observed and regions where nanoparticles including In as a main component are partly observed are randomly dispersed to form a mosaic pattern. Therefore, the crystal structure is a secondary element for the CAC composition.

Note that in the CAC composition, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

<Analysis of CAC-IGZO>

Next, measurement results of an oxide semiconductor over a substrate by a variety of methods are described.

<<Structure of Samples and Formation Method Thereof>>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed as an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<<Analysis by X-Ray Diffraction>>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 84:
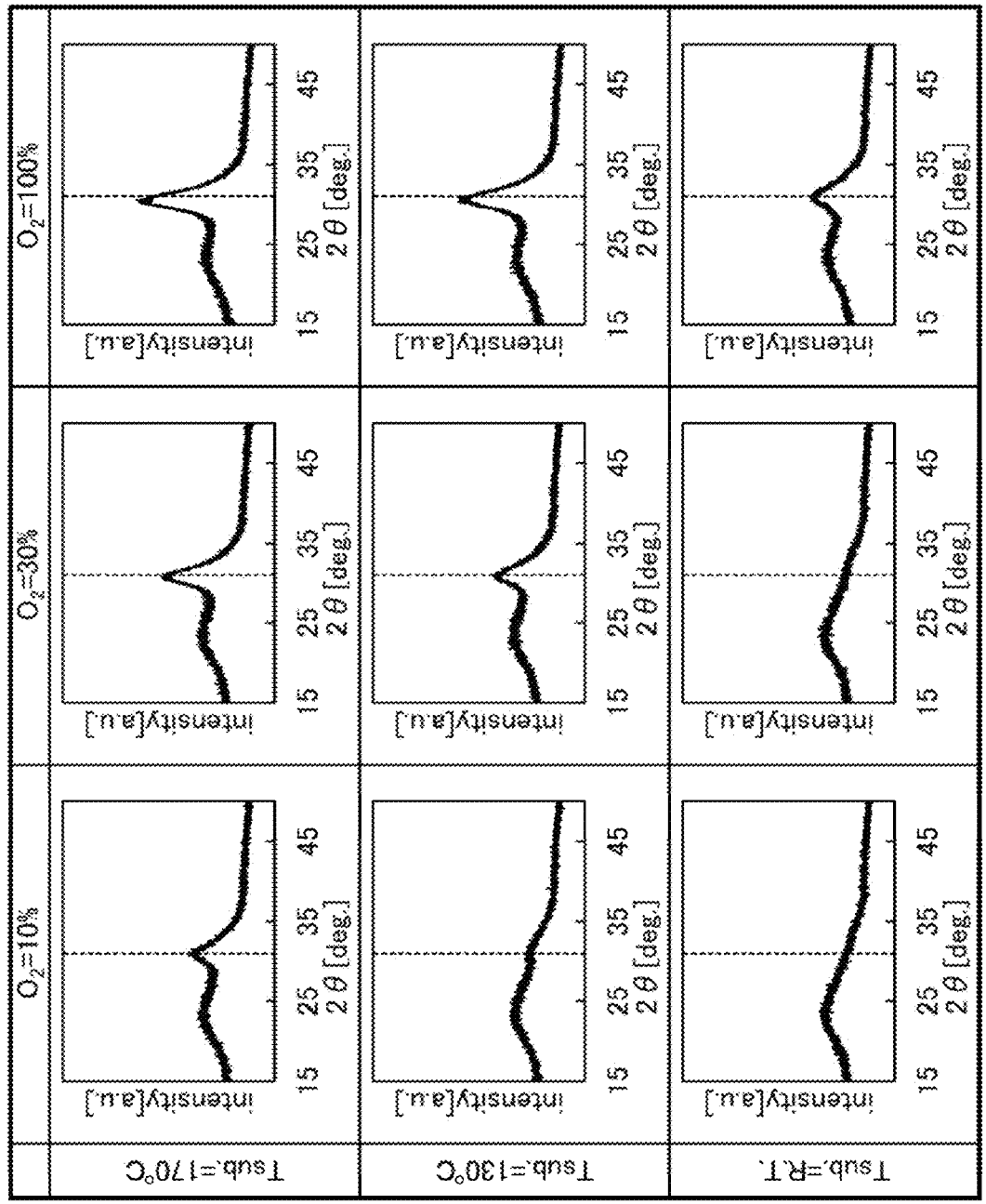
FIG. 84 shows measured XRD spectra of samples.

FIG. 84 shows XRD spectra measured by an out-of-plane method. In FIG. 84, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 84, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 84, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<<Analysis with Electron Microscope>>

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 85A is a plan-view TEM image of the sample formed at a substrate temperature of R.T. and with an oxygen gas flow rate ratio of 10%. FIG. 85B is a cross-sectional TEM image of the sample formed at a substrate temperature of R.T. and with an oxygen gas flow rate ratio of 10%.

<<Analysis of Electron Diffraction Patterns>>

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Figures 85C, 85D, 85E, 85F, 85G, 85H, 85I, 85J, 85K, 85L:
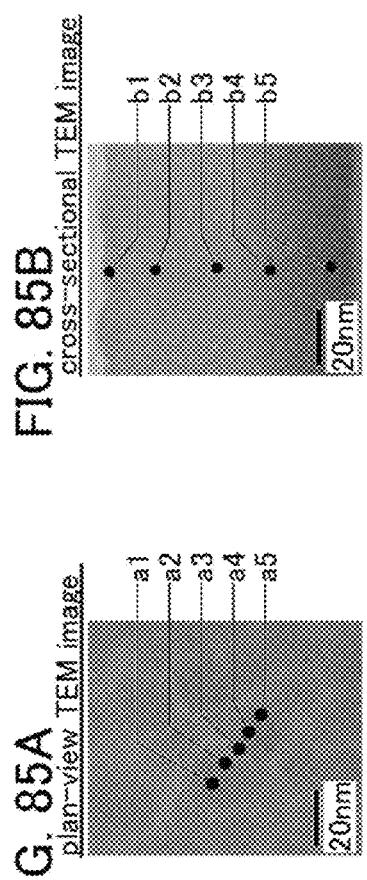

Electron diffraction patterns of points indicated by black dots a1, a2, a3, a4, and a5 in the plan-view TEM image in FIG. 85A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 85C, 85D, 85E, 85F, and 85G show the results of the points indicated by the black dots a1, a2, a3, a4, and a5, respectively.

In FIGS. 85C, 85D, 85E, 85F, and 85G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 85B of the sample formed at a substrate temperature of R.T. and an oxygen gas flow rate ratio of 10% are observed. FIGS. 85H, 85I, 85J, 85K, and 85L show the results of the points indicated by the black dots b1, b2, b3, b4, and b5, respectively.

In FIGS. 85H, 85I, 85J, 85K, and 85L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<<Elementary Analysis>>

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 86A:
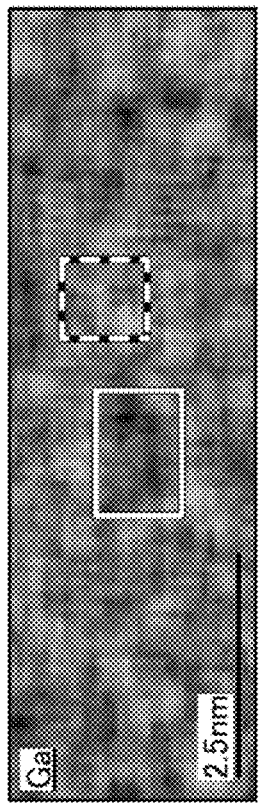
FIGS. 86A to 86C show EDX mapping images of a sample.
Figure 86B:
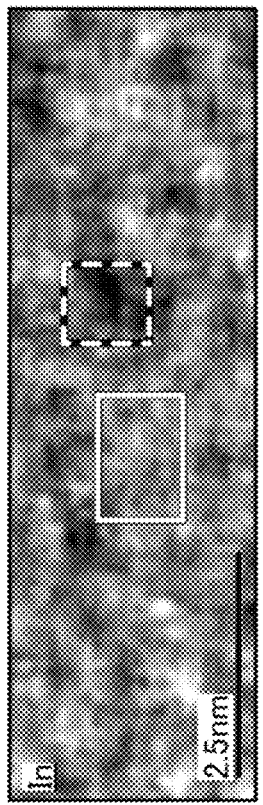
Figure 86C:
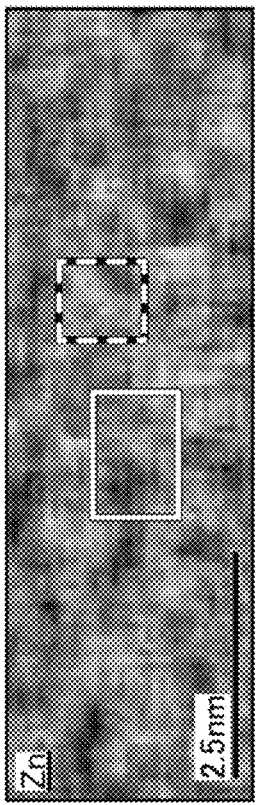

FIGS. 86A to 86C show EDX mapping images in a cross section of the sample formed at a substrate temperature of R.T. and with an oxygen gas flow rate ratio of 10%. FIG. 86A shows an EDX mapping image of Ga atoms. The proportion of the Ga atoms in all the atoms is 1.18 atomic % to 18.64 atomic %. FIG. 86B shows an EDX mapping image of In atoms. The proportion of the In atoms in all the atoms is 9.28 atomic % to 33.74 atomic %. FIG. 86C shows an EDX mapping image of Zn atoms. The proportion of the Zn atoms in all the atoms is 6.69 atomic % to 24.99 atomic %. FIGS. 86A to 86C show the same region in the cross section of the sample formed at a substrate temperature of R.T. and with an oxygen flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 86A to 86C is 7200000 times.

The EDX mapping images in FIGS. 86A to 86C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 86A to 86C are examined.

In FIG. 86A, a relatively dark region occupies a large area in the area surrounded by the solid line, while a relatively bright region occupies a large area in the area surrounded by the dashed line. In FIG. 86B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 86C, the right portion of the area surrounded by the solid line is relatively bright and the left portion thereof is relatively dark. Thus, the area surrounded by the solid line is a region including $In_{x2}Zn_{y2}O_{Z2}$, $InO_{X1}$, and the like as main components.

The area surrounded by the solid line is a region including a relatively small number of Ga atoms and the area surrounded by the dashed line is a region including a relatively large number of Ga atoms. In FIG. 86C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, and the like as main components.

Furthermore, as shown in FIGS. 86A to 86C, the In atoms are relatively more uniformly distributed than the Ga atoms, and regions including $InO_{X1}$ as a main component is seemingly joined to each other through a region including $In_{x2}Zn_{y2}O_{Z2}$ as a main component. Thus, the regions including $In_{x2}Zn_{y2}O_{Z2}$ and $InO_{X1}$ as main components extend like a cloud.

An In—Ga—Zn oxide having a composition in which the regions including $GaO_{X3}$ as a main component and the regions including $In_{x2}Zn_{y2}O_{Z2}$ or $InO_{X1}$ as a main component are unevenly distributed and mixed can be referred to as CAC-IGZO.

The crystal structure of CAC-IGZO includes an nc structure. In an electron diffraction pattern of the CAC-IGZO with the nc structure, several or more bright spots appear in addition to bright sports derived from IGZO including a single crystal, a polycrystal, or a CAAC. Alternatively, in addition to the several or more bright spots, the crystal structure is defined as having high luminance regions appearing in a ring pattern.

As shown in FIGS. 86A to 86C, each of the regions including $GaO_{X3}$ as a main component and the regions including $In_{x2}Zn_{y2}O_{Z2}$ or $InO_{X1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, CAC-IGZO has a structure different from that of an IGZO compound in which metal elements are evenly distributed, and has characteristics different from those of the IGZO compound. That is, in CAC-IGZO, regions including $GaO_{X3}$ or the like as a main component and regions including $In_{x2}Zn_{y2}O_{Z2}$ or $InO_{X1}$ as a main component are separated to form a mosaic pattern. Accordingly, when CAC-IGZO is used for a semiconductor element, the property derived from $GaO_{X3}$ or the like and the property derived from $In_{x2}Zn_{y2}O_{Z2}$ or $InO_{X1}$ complement each other, whereby high on-state current ($I_{on}$) and high field-effect mobility ($\mu$) can be achieved.

A semiconductor element including CAC-IGZO has high reliability. Thus, CAC-IGZO is suitably used in a variety of semiconductor devices typified by a display.

At least part of this embodiment can be implemented in combination with any of the other embodiments described in this specification as appropriate.

Embodiment 4

In this embodiment, an example of a transistor which can be used as the transistors 150a and 150b described in the above embodiment will be described with reference to drawings. A transistor of this embodiment can also be applied to the transistor 301 and the like.

The display device 310 of one embodiment of the present invention can be fabricated by using a transistor with any of various structures, such as a bottom-gate transistor, a top-gate transistor, or the like. Therefore, a material for a semiconductor layer or the structure of a transistor can be easily changed depending on the existing production line.

[Bottom-Gate Transistor]

FIG. 69A1 is a cross-sectional view of a transistor 810 that is a channel-protective transistor, which is a type of bottom-gate transistor. In FIG. 69A1, the transistor 810 is formed over a substrate 771. The transistor 810 includes an electrode 746 over the substrate 771 with an insulating layer 772 provided therebetween. The transistor 810 includes a semiconductor layer 742 over the electrode 746 with an insulating layer 726 provided therebetween. The electrode 746 can function as a gate electrode. The insulating layer 726 can function as a gate insulating layer.

The transistor 810 includes an insulating layer 741 over a channel formation region in the semiconductor layer 742. The transistor 810 includes an electrode 744a and an electrode 744b which are partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrodes 744a and 744b. Thus, the channel formation region in the semiconductor layer 742 can be prevented from being etched at the time of forming the electrodes 744a and 744b. Therefore, a transistor with favorable electrical characteristics can be provided.

The transistor 810 includes an insulating layer 728 over the electrode 744a, the electrode 744b, and the insulating layer 741 and further includes an insulating layer 729 over the insulating layer 728.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 742, a material capable of removing oxygen from part of the semiconductor layer 742 to generate oxygen vacancies is preferably used for regions of the electrodes 744a and 744b that are in contact with at least the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrodes 744a and 744b. Accordingly, the electric characteristics of the transistor, such as the field-effect mobility and the threshold voltage, can be favorable.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that can prevent or reduce diffusion of impurities into the transistor from the outside. The formation of the insulating layer 729 may be omitted.

When an oxide semiconductor is used for the semiconductor layer 742, heat treatment may be performed before and/or after the insulating layer 729 is formed. The heat treatment can fill oxygen vacancies in the semiconductor layer 742 by diffusing oxygen contained in the insulating layer 729 or other insulating layers into the semiconductor layer 742. Alternatively, the insulating layer 729 may be formed while the heat treatment is performed, so that oxygen vacancies in the semiconductor layer 742 can be filled.

Note that a CVD method can be generally classified into a plasma enhanced CVD (PECVD) method using plasma, a thermal CVD (TCVD) method using heat, and the like. A CVD method can further be classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In a facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 811 illustrated in FIG. 69A2 is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each function as a gate electrode. Thus, the insulating layers 726, 728, and 729 can each function as a gate insulating layer. The electrode 723 may also be provided between the insulating layers 728 and 729.

In the case where one of the electrode 746 and the electrode 723 is simply referred to as a "gate electrode", the other can be referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 is a kind of top-gate transistor. Alternatively, one of the electrode 746 and the electrode 723 may be referred to as a "first gate electrode", and the other may be referred to as a "second gate electrode".

By providing the electrode 746 and the electrode 723 with the semiconductor layer 742 provided therebetween and setting the potentials of the electrode 746 and the electrode 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has high on-state current for the area occupied thereby. That is, the area occupied by the transistor 811 can be small for required on-state current. Therefore, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 746 and the electrode 723 each have a function of blocking an electric field generated outside, electric charge of charged particles and the like generated on the insulating layer 772 side or above the electrode 723 do not influence the channel formation region in the semiconductor layer 742. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the electrodes 746 and 723 have the same potential or different potentials.

The BT stress test is one kind of acceleration test and can evaluate, in a short time, a change by long-term use (i.e., a change over time) in characteristics of a transistor. In particular, the amount of change in threshold voltage of a transistor before and after the BT stress test is an important indicator when examining the reliability of the transistor. As the change in the threshold voltage is smaller, the transistor has higher reliability.

By providing the electrodes 746 and 723 and setting the potentials of the electrodes 746 and 723 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

FIG. 69B1 is a cross-sectional view of a channel-protective transistor 820 that is a type of bottom-gate transistor. The transistor 820 has substantially the same structure as the transistor 810 but is different from the transistor 810 in that the insulating layer 741 covers the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can function as a channel protective layer.

A transistor 821 illustrated in FIG. 69B2 is different from the transistor 820 in that the electrode 723 that can function as a back gate electrode is provided over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The distance between the electrode 744a and the electrode 746 and the distance between the electrode 744b and the electrode 746 in the transistors 820 and 821 are longer than those in the transistors 810 and 811. Thus, the parasitic capacitance generated between the electrode 744a and the electrode 746 can be reduced. Moreover, the parasitic capacitance generated between the electrode 744b and the electrode 746 can be reduced. Therefore, a transistor with favorable electrical characteristics can be provided.

A transistor 825 illustrated in FIG. 69C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 69C2 is different from the transistor 825 in that the electrode 723 that can function as a back gate electrode is provided over the insulating layer 729.

[Top-Gate Transistor]

FIG. 70A1 is a cross-sectional view of a transistor 830 that is a type of top-gate transistor. The transistor 830 includes the semiconductor layer 742 over the insulating layer 772, the electrodes 744a and 744b that are over the semiconductor layer 742 and the insulating layer 772 and in contact with part of the semiconductor layer 742, the insulating layer 726 over the semiconductor layer 742 and the electrodes 744a and 744b, and the electrode 746 over the insulating layer 726.

Since the electrode 746 overlaps with neither the electrode 744a nor the electrode 744b in the transistor 830, the parasitic capacitance generated between the electrodes 746 and 744a and the parasitic capacitance generated between the electrodes 746 and 744b can be reduced. After the formation of the electrode 746, an impurity 755 is introduced into the semiconductor layer 742 using the electrode 746 as a mask, so that an impurity region can be formed in the semiconductor layer 742 in a self-aligned manner (see FIG. 70A3). Therefore, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 70A2 is different from the transistor 830 in that the electrode 723 and the insulating layer 727 are included. The transistor 831 includes the electrode 723 formed over the insulating layer 772 and the insulating layer 727 formed over the electrode 723. The electrode 723 can function as a back gate electrode. Thus, the insulating layer 727 can function as a gate insulating layer. The insulating layer 727 can be formed using a material and a method similar to those of the insulating layer 726.

Like the transistor 811, the transistor 831 has high on-state current for the area occupied thereby. That is, the area occupied by the transistor 831 can be small for required on-state current. Therefore, a semiconductor device having a high degree of integration can be provided.

A transistor 840 illustrated in FIG. 70B1 is a type of top-gate transistor. The transistor 840 is different from the transistor 830 in that the semiconductor layer 742 is formed after the formation of the electrodes 744a and 744b. A transistor 841 illustrated in FIG. 70B2 is different from the transistor 840 in that the electrode 723 and the insulating layer 727 are included. In the transistors 840 and 841, part of the semiconductor layer 742 is formed over the electrode 744a and another part of the semiconductor layer 742 is formed over the electrode 744b.

Like the transistor 811, the transistor 841 has large on-state current for the area occupied thereby. That is, the area occupied by the transistor 841 can be small for required on-state current. Therefore, a semiconductor device having a high degree of integration can be provided.

A transistor 842 illustrated in FIG. 71A1 is a type of top-gate transistor. The transistor 842 is different from the transistor 830 or 840 in that the electrodes 744a and 744b are formed after the formation of the insulating layer 729. The electrodes 744a and 744b are electrically connected to the semiconductor layer 742 through openings formed in the insulating layers 728 and 729.

Part of the insulating layer 726 that does not overlap with the electrode 746 is removed, and the impurity 755 is introduced into the semiconductor layer 742 using the electrode 746 and the insulating layer 726 that is left as a mask, so that an impurity region can be formed in the semiconductor layer 742 in a self-aligned manner (see FIG. 71A3). In the top view of the transistor 842, an end portion of the insulating layer 726 is located on the outer side of an end portion of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region adjacent to a portion of the semiconductor layer 742 which overlaps with the electrode 746.

A transistor 843 illustrated in FIG. 71A2 is different from the transistor 842 in that the electrode 723 is included. The transistor 843 includes the electrode 723 that is formed over the substrate 771 and overlaps with the semiconductor layer 742 with the insulating layer 772 provided therebetween. The electrode 723 can function as a back gate electrode.

As in a transistor 844 illustrated in FIG. 71B1 and a transistor 845 illustrated in FIG. 71B2, the insulating layer 726 in a region that does not overlap with the electrode 746 may be completely removed. Alternatively, as in a transistor 846 illustrated in FIG. 71C1 and a transistor 847 illustrated in FIG. 71C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner.

[S-Channel Transistor]

FIGS. 72A to 72C illustrate an example of the structure of a transistor using an oxide semiconductor for the semiconductor layer 742. In a transistor 850 illustrated in FIGS. 72A to 72C, a semiconductor layer 742b is formed over a semiconductor layer 742a, and a semiconductor layer 742c covers a top surface and a side surface of the semiconductor layer 742b and a side surface of the semiconductor layer 742a. FIG. 72A is a top view of the transistor 850. FIG. 72B is a cross-sectional view (in the channel length direction) taken along dashed-dotted line X1-X2 in FIG. 72A. FIG. 72C is a cross-sectional view (in the channel width direction) taken along dashed-dotted line Y1-Y2 in FIG. 72A.

The transistor 850 includes the electrode 743 functioning as a gate electrode. The electrode 743 can be formed using a material and a method similar to those of the electrode 746. The electrode 743 is formed of two conductive layers in this embodiment.

Each of the semiconductor layer 742a, the semiconductor layer 742b, and the semiconductor layer 742c is formed using a material containing either In or Ga or both of them. Typical examples are an In—Ga oxide (an oxide containing In and Ga), an In—Zn oxide (an oxide containing In and Zn), and an In—M—Zn oxide (an oxide containing In, an element M, and Zn). The element M is one or more kinds of elements selected from Al, Ti, Ga, Y, Zr, La, Ce, Nd, and Hf and has a higher strength of bonding with oxygen than that of In.

The semiconductor layer 742a and the semiconductor layer 742c are preferably formed using a material containing one or more kinds of metal elements contained in the semiconductor layer 742b. With the use of such a material, interface states are less likely to be generated at the interface between the semiconductor layer 742a and the semiconductor layer 742b and at the interface between the semiconductor layer 742c and the semiconductor layer 742b. Accordingly, carriers are not likely to be scattered or captured at the interfaces, which results in an improvement in field-effect mobility of the transistor. Furthermore, variation in threshold voltage of the transistor can be reduced. Thus, a semiconductor device having favorable electrical characteristics can be obtained.

Each of the thicknesses of the semiconductor layers 742a and 742c is greater than or equal to 3 nm and less than or equal to 100 nm, preferably greater than or equal to 3 nm and less than or equal to 50 nm. The thickness of the semiconductor layer 742b is greater than or equal to 3 nm and less than or equal to 700 nm, preferably greater than or equal to 3 nm and less than or equal to 100 nm, more preferably greater than or equal to 3 nm and less than or equal to 50 nm.

In the case where the semiconductor layer 742b includes an In—M—Zn oxide and the semiconductor layers 742a and 742c each also include an In—M—Zn oxide, the semiconductor layers 742a and 742c each have the atomic ratio where InM:Zn=$x_1$:$y_1$:$z_1$, and the semiconductor layer 742b has an atomic ratio where InM:Zn=$x_2$:$y_2$:$z_2$, for example. In that case, the compositions of the semiconductor layers 742a, 742c, and 742b can be determined so that $y_1/x_1$ is larger than $y_2/x_2$. It is preferable that the compositions of the semiconductor layers 742a, 742c, and 742b be determined so that $y_1/x_1$ is 1.5 times or more as large as $y_2/x_2$. It is more preferable that the compositions of the semiconductor layers 742a, 742c, and 742b be determined so that $y_1/x_1$ is twice or more as large as $y_2/x_2$. It is more preferable that the compositions of the semiconductor layers 742a, 742c, and 742b be determined so that $y_1/x_1$ is three times or more as large as $y_2/x_2$. It is preferable that $y_1$ be greater than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 742a and the semiconductor layer 742c have the above compositions, the semiconductor layer 742a and the semiconductor layer 742c can each be a layer in which oxygen vacancies are less likely to be generated than in the semiconductor layer 742b.

In the case where the semiconductor layer 742a and the semiconductor layer 742c each include an In—M—Zn oxide, the percentages of In and the element M when the summation of In and the element M is assumed to be 100 atomic % are preferably as follows: the percentage of In is lower than 50 atomic % and the percentage of the element M is higher than or equal to 50 atomic %. The percentages of In and the element M are more preferably as follows: the percentage of In is lower than 25 atomic % and the percentage of the element M is higher than or equal to 75 atomic %. In the case where the semiconductor layer 742b includes an In—M—Zn oxide, the percentages of In and the element M when the summation of In and the element M is assumed to be 100 atomic % are preferably as follows: the percentage of In is higher than or equal to 25 atomic % and the percentage of the element M is lower than 75 atomic %. The percentages of In and the element M are more preferably as follows: the percentage of In is higher than or equal to 34 atomic % and the percentage of the element M is lower than 66 atomic %.

For example, an In—Ga—Zn oxide that is formed using a target having an atomic ratio of In:Ga:Zn=1:3:2, 1:3:4, 1:3:6, 1:6:4, or 1:9:6, an In—Ga oxide that is formed using a target having an atomic ratio of In:Ga=1:9, or gallium oxide can be used for each of the semiconductor layers 742a and 742c containing In or Ga. Furthermore, an In—Ga—Zn oxide that is formed using a target having an atomic ratio of In:Ga:Zn=3:1:2, 1:1:1, 5:5:6, or 4:2:4.1 can be used for the semiconductor layer 742b. Note that the atomic ratio of each of the semiconductor layers 742a, 742b, and 742c may vary within a range of ±20% of any of the above-described atomic ratios as an error.

To give stable electrical characteristics to the transistor including the semiconductor layer 742b, it is preferable that impurities and oxygen vacancies in the semiconductor layer 742b be reduced to obtain a highly purified oxide semiconductor layer and accordingly the semiconductor layer 742*b* can be regarded as an intrinsic or substantially intrinsic oxide semiconductor layer. Furthermore, it is preferable that at least the channel formation region of the semiconductor layer 742*b* be regarded as an intrinsic or substantially intrinsic oxide semiconductor layer.

Note that the substantially intrinsic oxide semiconductor layer refers to an oxide semiconductor layer in which the carrier density is higher than or equal to $1 \times 10^{-9}/cm^3$ and lower than $8 \times 10^{11}/cm^3$, preferably lower than $1 \times 10^{11}/cm^3$, more preferably lower than $1 \times 10^{10}/cm^3$.

Figure 73C:
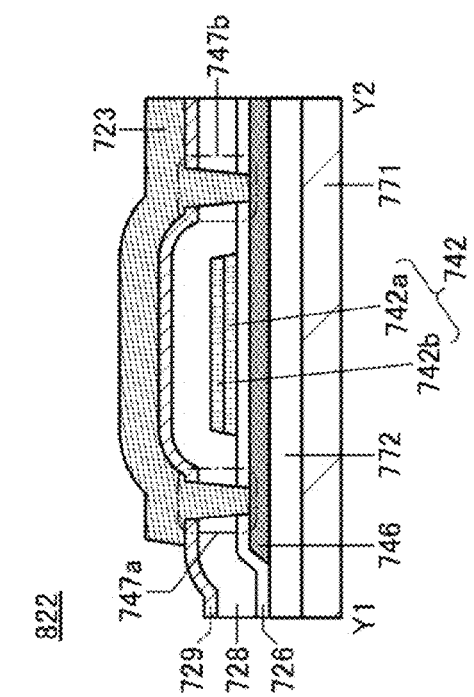
FIGS. 73A to 73C are a plan view and cross-sectional views illustrating one embodiment of a transistor.
Figure 73A:
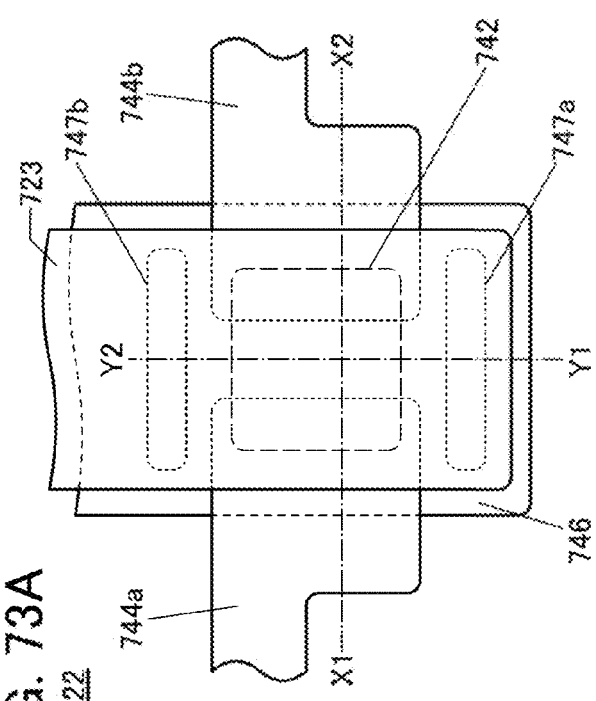
Figure 73B:
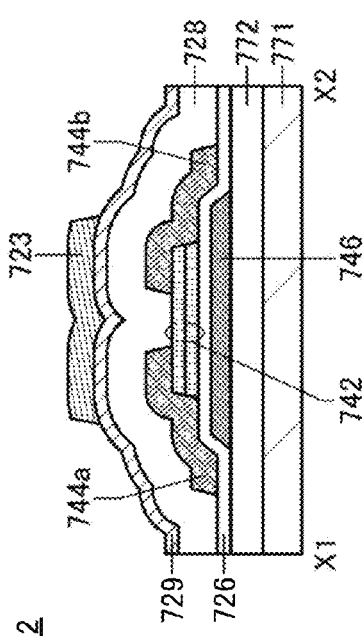

FIGS. 73A to 73C illustrate an example of the structure of a transistor using an oxide semiconductor for the semiconductor layer 742. In a transistor 822 illustrated in FIGS. 73A to 73C, the semiconductor layer 742*b* is formed over the semiconductor layer 742*a*. The transistor 822 is a kind of bottom-gate transistor including a back gate electrode. FIG. 73A is a top view of the transistor 822. FIG. 73B is a cross-sectional view (in the channel length direction) taken along dashed-dotted line X1-X2 in FIG. 73A. FIG. 73C is a cross-sectional view (in the channel width direction) taken along dashed-dotted line Y1-Y2 in FIG. 73A.

The electrode 723 provided over the insulating layer 729 is electrically connected to the electrode 746 through an opening 747*a* and an opening 747*b* provided in the insulating layers 726, 728, and 729. Thus, the same potential is supplied to the electrodes 723 and 746. Furthermore, either or both of the openings 747*a* and 747*b* may be omitted. In the case where both the openings 747*a* and 747*b* are omitted, different potentials can be supplied to the electrodes 723 and 746.

The function and effect of the semiconductor layer 742 that is a stacked layer of the semiconductor layers 742*a*, 742*b*, and 742*c* are described with a diagram of an energy band structure of the insulating layer 772, the semiconductor layer 742, and the insulating layer 726 included in the transistor 850 in FIGS. 72A to 72C.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured with a spectroscopic ellipsometer (e.g., UT-300 by HORIBA JOBIN YVON S.A.S.). The energy difference between the vacuum level and the valence band maximum can be measured with an ultraviolet photoelectron spectroscopy (UPS) device (e.g., VersaProbe by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 772 and the insulating layer 726 are each an insulator, the energy of the conduction band minimum of each of the insulating layers 772 and 726 is closer to the vacuum level (the insulating layers 772 and 726 each have a smaller electron affinity) than the energy of the conduction band minimum of each of the semiconductor layers 742*a*, 742*b*, and 742*c* is.

The energy of the conduction band minimum of the semiconductor layer 742*a* is closer to the vacuum level than the energy of the conduction band minimum of the semiconductor layer 742*b* is. Specifically, the energy of the conduction band minimum of the semiconductor layer 742*a* is preferably located closer to the vacuum level than that of the semiconductor layer 742*b* by 0.05 eV or more, 0.07 eV or more, 0.1 eV or more, or 0.15 eV or more and 2 eV or less, 1 eV or less, 0.5 eV or less, or 0.4 eV or less.

The energy of the conduction band minimum of the semiconductor layer 742*c* is closer to the vacuum level than the energy of the conduction band minimum of the semiconductor layer 742*b* is. Specifically, the energy of the conduction band minimum of the semiconductor layer 742*c* is preferably located closer to the vacuum level than that of the semiconductor layer 742*b* by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the semiconductor layer 742*a* and the semiconductor layer 742*b* and the vicinity of the interface between the semiconductor layer 742*b* and the semiconductor layer 742*c*, mixed regions are formed; thus, the energy of the conduction band minimum continuously changes. In other words, no state or few states exist at these interfaces.

Accordingly, electrons transfer mainly through the semiconductor layer 742*b* in the stacked-layer structure having the above energy band structure. Therefore, even when states exist at the interface between the semiconductor layer 742*a* and the insulating layer 772 or at the interface between the semiconductor layer 742*c* and the insulating layer 726, the states hardly influence the transfer of the electrons. In addition, the states do not exist or hardly exist at the interface between the semiconductor layer 742*a* and the semiconductor layer 742*b* and at the interface between the semiconductor layer 742*c* and the semiconductor layer 742*b*; thus, transfer of electrons is not prohibited in the regions. Consequently, a high field-effect mobility can be obtained in the transistor having the stacked-layer structure of the above oxide semiconductors.

Note that although trap states due to impurities or defects might be formed in the vicinity of the interface between the semiconductor layer 742*a* and the insulating layer 772 and in the vicinity of the interface between the semiconductor layer 742*c* and the insulating layer 726, the semiconductor layer 742*b* can be apart from the trap states owing to the existence of the semiconductor layer 742*a* and the semiconductor layer 742*c*.

In particular, in the transistor described in this embodiment, an upper surface and a side surface of the semiconductor layer 742*b* are in contact with the semiconductor layer 742c, and a lower surface of the semiconductor layer 742b is in contact with the semiconductor layer 742a. In this manner, the semiconductor layer 742b is covered by the semiconductor layers 742a and 742c, whereby the influence of the trap states can further be reduced.

However, when the energy difference between the conduction band minimum of the semiconductor layer 742a or the semiconductor layer 742c and the conduction band minimum of the semiconductor layer 742b is small, electrons in the semiconductor layer 742b might reach the trap states by passing over the energy difference. The electrons are trapped by the trap states, which generates a negative fixed charge at the interface with the insulating layer, causing the threshold voltage of the transistor to be shifted in the positive direction.

Therefore, the energy difference between the conduction band minimum of the semiconductor layer 742a or the semiconductor layer 742c and the conduction band minimum of the semiconductor layer 742b is preferably set to be greater than or equal to 0.1 eV, further preferably greater than or equal to 0.15 eV, in which case a variation in the threshold voltage of the transistor can be reduced and the transistor can have favorable electrical characteristics.

Each of the band gaps of the semiconductor layer 742a and the semiconductor layer 742c is preferably wider than that of the semiconductor layer 742b.

An oxide semiconductor has an energy gap as wide as 3.0 eV or more and a high visible-light transmissivity. In a transistor obtained by processing an oxide semiconductor under appropriate conditions, the off-state current at ambient temperature (e.g., 25° C.) can be lower than or equal to 100 zA ($1 \times 10^{-19}$ A), lower than or equal to 10 zA ($1 \times 10^{-20}$ A), and further lower than or equal to 1 zA ($1 \times 10^{-21}$ A). Therefore, a semiconductor device with low power consumption can be achieved.

The transistor 850 illustrated in FIGS. 72A to 72C is described again. When the semiconductor layer 742b is provided over the projection of the insulating layer 772, the side surface of the semiconductor layer 742b can also be covered with the electrode 743. Thus, the transistor 850 has a structure in which the semiconductor layer 742b can be electrically surrounded by an electric field of the electrode 743. Such a structure of a transistor in which a semiconductor layer in which a channel is formed is electrically surrounded by an electric field of a conductive film is called a surrounded channel (s-channel) structure. A transistor with an s-channel structure is referred to as an s-channel transistor.

In an s-channel structure, a channel can be formed in the whole (bulk) of the semiconductor layer 742b. In an s-channel structure, the drain current of the transistor can be increased, so that a larger amount of on-state current can be obtained. Furthermore, the entire channel formation region of the semiconductor layer 742b can be depleted by an electric field of the electrode 743. Accordingly, the off-state current of the transistor with an s-channel structure can further be reduced.

When the projection of the insulating layer 772 is increased in height and the channel width is shortened, the effects of an s-channel structure to increase the on-state current and reduce the off-state current can be enhanced. Part of the semiconductor layer 742a exposed at the time of forming the semiconductor layer 742b may be removed. In that case, the side surfaces of the semiconductor layer 742a and the semiconductor layer 742b may be aligned with each other.

Figure 74A:
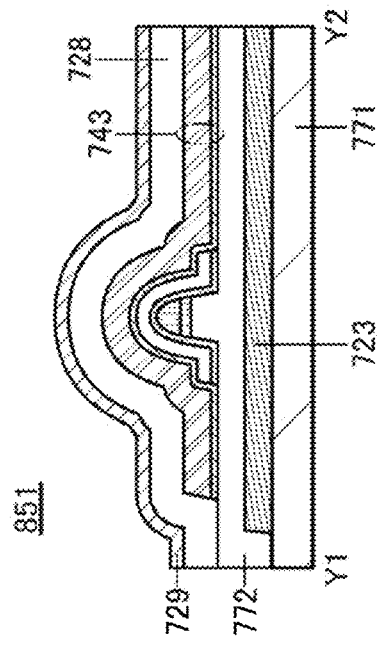
FIGS. 74A to 74C are a plan view and cross-sectional views illustrating one embodiment of a transistor.
Figure 74B:
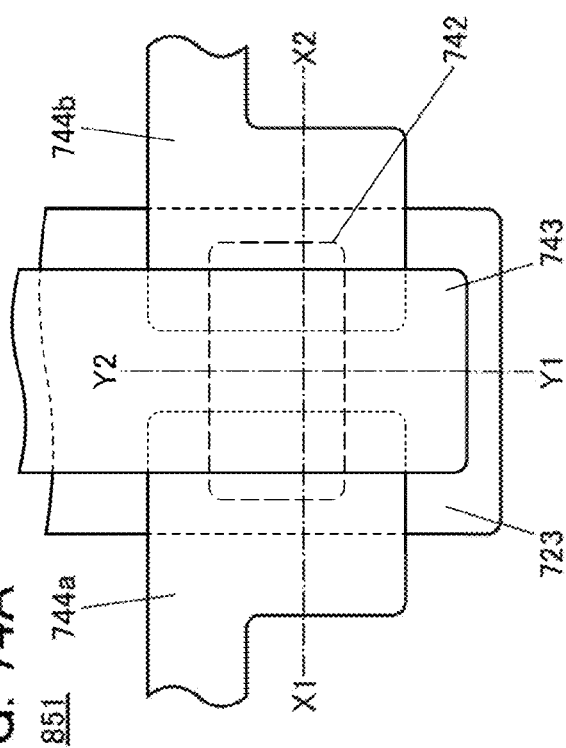
Figure 74C:
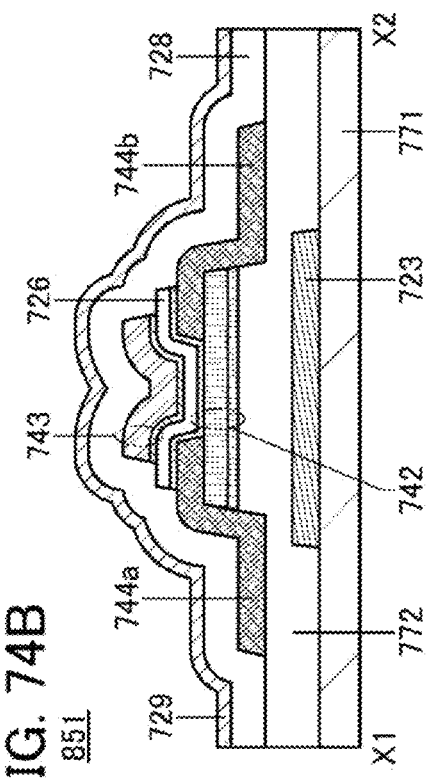

As in a transistor 851 illustrated in FIGS. 74A to 74C, the electrode 723 may be provided below the semiconductor layer 742 with an insulating layer provided therebetween. FIG. 74A is a top view of the transistor 851. FIG. 74B is a cross-sectional view taken along dashed-dotted line X1-X2 in FIG. 74A. FIG. 74C is a cross-sectional view taken along dashed-dotted line Y1-Y2 in FIG. 74A.

Figure 75A:
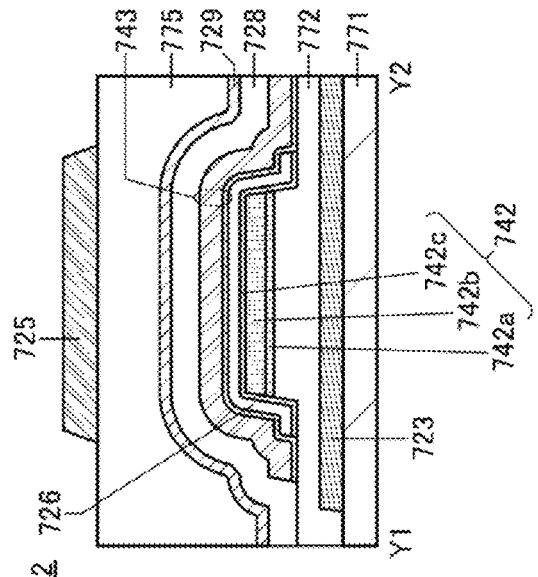
FIGS. 75A to 75C are a plan view and cross-sectional views illustrating one embodiment of a transistor.
Figure 75B:
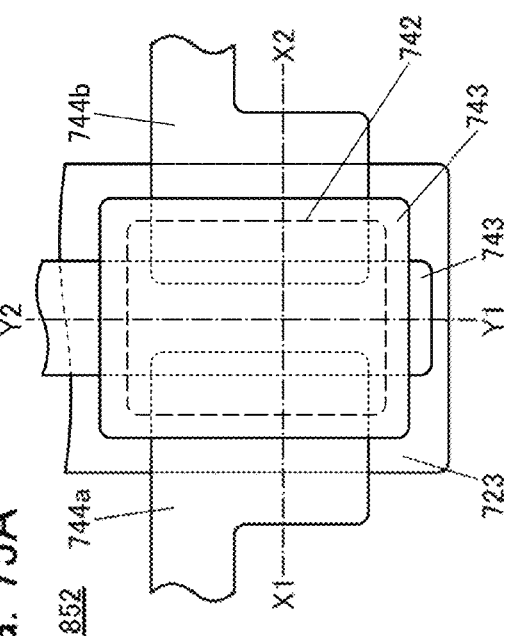
Figure 75C:
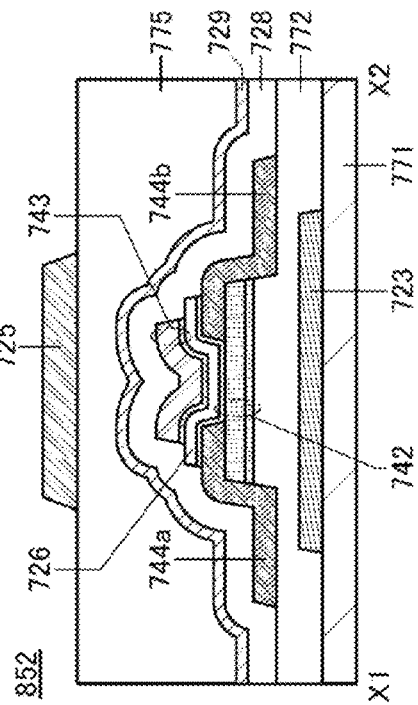

As in a transistor 852 illustrated in FIGS. 75A to 75C, an insulating layer 775 may be provided over the electrode 743, and a layer 725 may be provided over the insulating layer 775. FIG. 75A is a top view of the transistor 852. FIG. 75B is a cross-sectional view taken along dashed-dotted line X1-X2 in FIG. 75A. FIG. 75C is a cross-sectional view taken along dashed-dotted line Y1-Y2 in FIG. 75A.

Although the layer 725 is provided over the insulating layer 775 in FIGS. 75A to 75C, the layer 725 may be provided over the insulating layer 728 or 729. The layer 725 formed using a material with a light-blocking property can prevent a variation in characteristics, a decrease in reliability, or the like of the transistor caused by light irradiation. When the layer 725 is formed at least larger than the semiconductor layer 742b such that the semiconductor layer 742b is covered with the layer 725, the above effects can be improved. The layer 725 can be formed using an organic material, an inorganic material, or a metal material. In the case where the layer 725 is formed using a conductive material, voltage can be supplied to the layer 725 or the layer 725 may be brought into an electrically floating state.

Figure 76A:
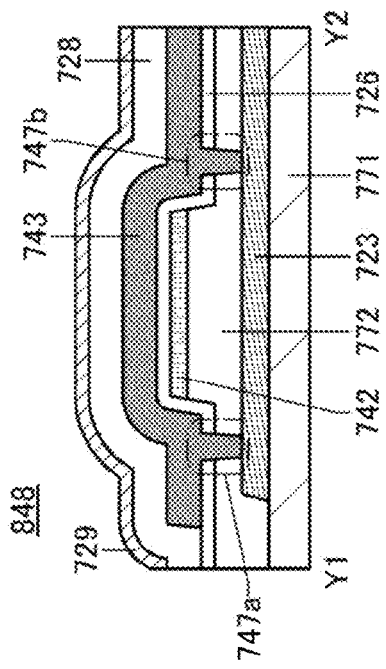
FIGS. 76A to 76C are a plan view and cross-sectional views illustrating one embodiment of a transistor.
Figure 76B:
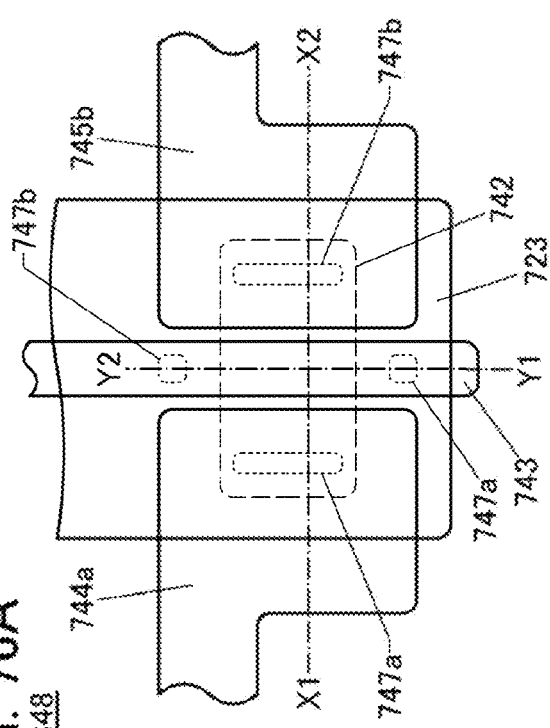
Figure 76C:
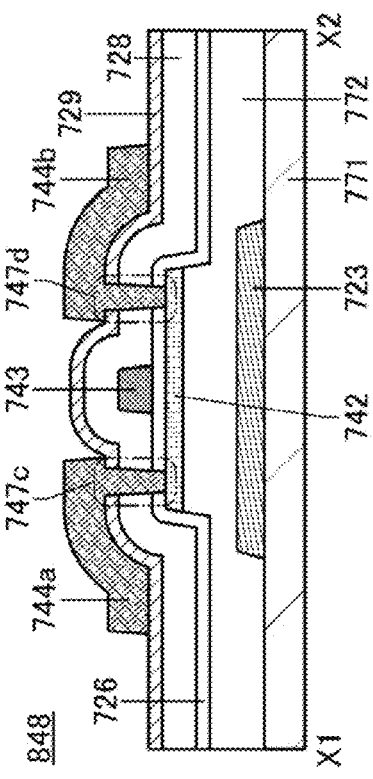

FIGS. 76A to 76C illustrate an example of a transistor with an s-channel structure. A transistor 848 illustrated in FIGS. 76A to 76C has almost the same structure as the transistor 847. In the transistor 848, the semiconductor layer 742 is formed over a projection of the insulating layer 772. The transistor 848 is a type of top-gate transistor including a back gate electrode. FIG. 76A is a top view of the transistor 848. FIG. 76B is a cross-sectional view taken along dashed-dotted line X1-X2 in FIG. 76A. FIG. 76C is a cross-sectional view taken along dashed-dotted line Y1-Y2 in FIG. 76A.

The electrode 744a provided over the insulating layer 729 is electrically connected to the semiconductor layer 742 through an opening 747c formed in the insulating layers 726, 728, and 729. The electrode 744b provided over the insulating layer 729 is electrically connected to the semiconductor layer 742 through an opening 747d formed in the insulating layers 726, 728, and 729.

The electrode 743 provided over the insulating layer 726 is electrically connected to the electrode 723 through an opening 747a and an opening 747b formed in the insulating layers 726 and 772. Accordingly, the same potential is supplied to the electrodes 743 and 723. Furthermore, either or both of the openings 747a and 747b may be omitted. In the case where both the openings 747a and 747b are omitted, different potentials can be supplied to the electrodes 723 and 743.

Note that the semiconductor layer in the transistor with an s-channel structure is not limited to an oxide semiconductor.

[Energy Band Structure of Oxide Semiconductor]

Band diagrams of a transistor including an oxide semiconductor are described below.

Figure 77A:
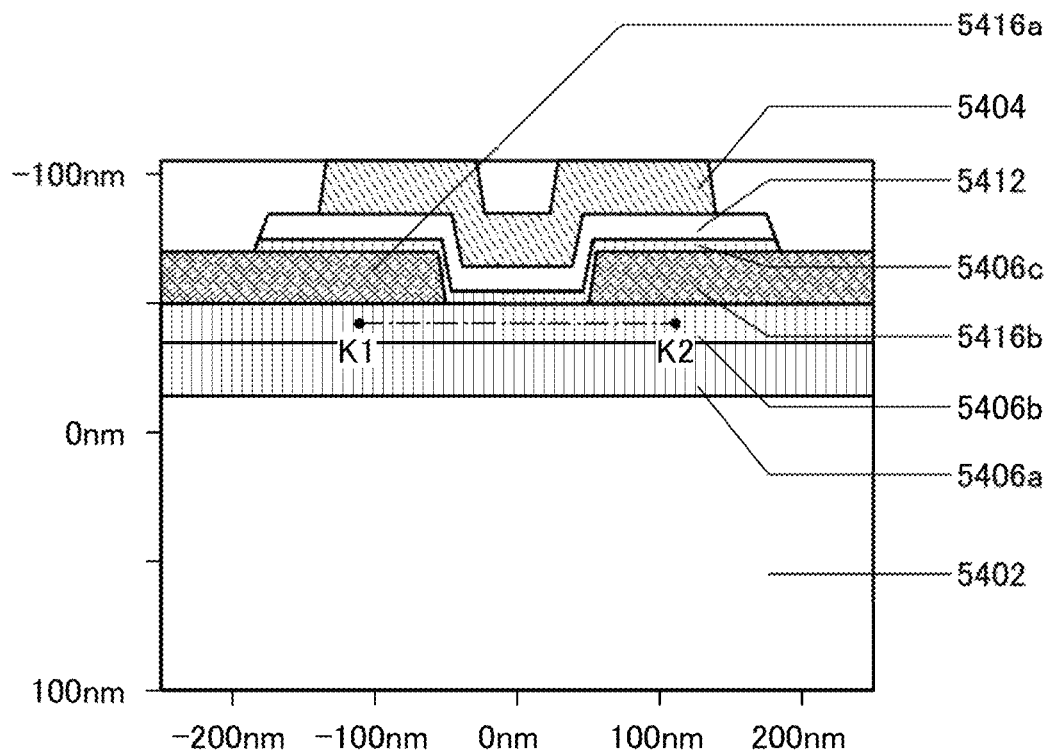
FIGS. 77A and 77B are cross-sectional views illustrating one embodiment of a transistor.
Figure 77B:
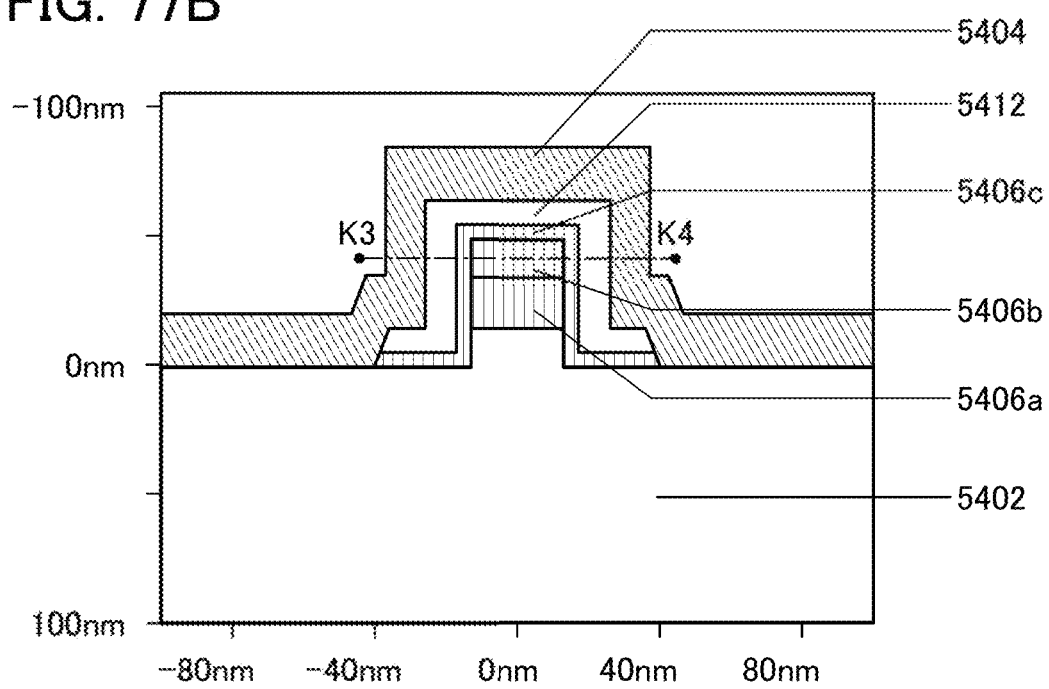

FIG. 77A illustrates a cross-sectional view of a transistor in the channel length direction and FIG. 77B illustrates a cross-sectional view of the transistor in the channel width direction. Note that FIG. 77B is the cross-sectional view at 0 nm in FIG. 77A.

The transistor illustrated in FIGS. 77A and 77B includes an insulating film 5402, an oxide semiconductor film 5406a, an oxide semiconductor film 5406b, an oxide semiconductor film 5406c, a conductive film 5416a, a conductive film 5416b, an insulating film 5412, and a conductive film 5404.

The oxide semiconductor film 5406a is provided over the insulating film 5402. The oxide semiconductor film 5406b is provided over the oxide semiconductor film 5406a. The conductive films 5416a and 5416b are provided over the oxide semiconductor film 5406b. The oxide semiconductor film 5406c is provided over the oxide semiconductor film 5406b, the conductive film 5416a, and the conductive film 5416b. The insulating film 5412 is provided over the oxide semiconductor film 5406c. The conductive film 5404 is provided over the insulating film 5412.

In the transistor illustrated in FIGS. 77A and 77B, the conductive film 5416a and the conductive film 5416b have functions as a source electrode and a drain electrode, the conductive film 5404 has a function as a gate electrode, and the insulating film 5412 has a function as a gate insulator.

As illustrated in FIG. 77B, the transistor has an s-channel structure in which the oxide semiconductor film 5406b is electrically surrounded by the conductive film 5404. That is, the transistor in FIGS. 77A and 77B has a structure similar to that of the transistor in FIGS. 72A to 72C. Therefore, for components of the transistor in FIGS. 77A and 77B, the description of the transistor in FIGS. 72A to 72C can be referred to.

FIGS. 78A to 78C are band diagrams taken along dashed-dotted line K1-K2 in FIG. 77A. Here, a drain voltage (e.g., 1 V) is applied between the conductive film 5416a and the conductive film 5416b. FIG. 78A illustrates the case where as a gate voltage, a negative voltage (e.g., −3 V) is applied between the conductive film 5404 and the conductive film 5416a; FIG. 78B illustrates the case where no gate voltage is applied; FIG. 78C illustrates the case where a positive voltage (e.g., 3 V) is applied as a gate voltage. In FIGS. 78A to 78F, solid line $E_C$ indicates the energy of the conduction band minimum, solid line $E_V$ indicates the energy of the valence band maximum, and dashed line $E_{Fn}$ indicates the energy of the quasi-Fermi level of electrons.

FIGS. 78D to 78F are band diagrams taken along dashed-dotted line K3-K4 in FIG. 77B. Here, drain voltage (e.g., 1V) is applied between the conductive film 5416a and the conductive film 5416b. FIG. 78D illustrates the case where a negative voltage (e.g., −3 V) is applied as a gate voltage; FIG. 78E illustrates the case where no gate voltage is applied; and FIG. 78F illustrates the case where a positive voltage (e.g., 3V) is applied as a gate voltage.

As shown in FIG. 78A, when a negative gate voltage is applied, a potential barrier is formed between the source and the drain and thus the drain current is difficult to flow. When no gate voltage is applied as in the case in FIG. 78B, the potential barrier between the source and the drain is lowered, and thus the drain current starts to flow. When a positive gate voltage is applied as in the case in FIG. 78C, the potential barrier between the source and the drain disappears and thus the drain current flows.

As shown in FIGS. 78D to 78F, the band of the oxide semiconductor film 5406b is hardly curved by the gate voltage. In other words, the energy of the conduction band minimum and the energy of the valence band maximum are changed only by a fixed amount due to the applied gate voltage.

At least part of this embodiment can be implemented in combination with any of the embodiments described in this specification as appropriate.

Embodiment 5

In this embodiment, a structure example of a touch panel module including a touch panel of one embodiment of the present invention and an IC will be described with reference to drawings.

Figure 79:
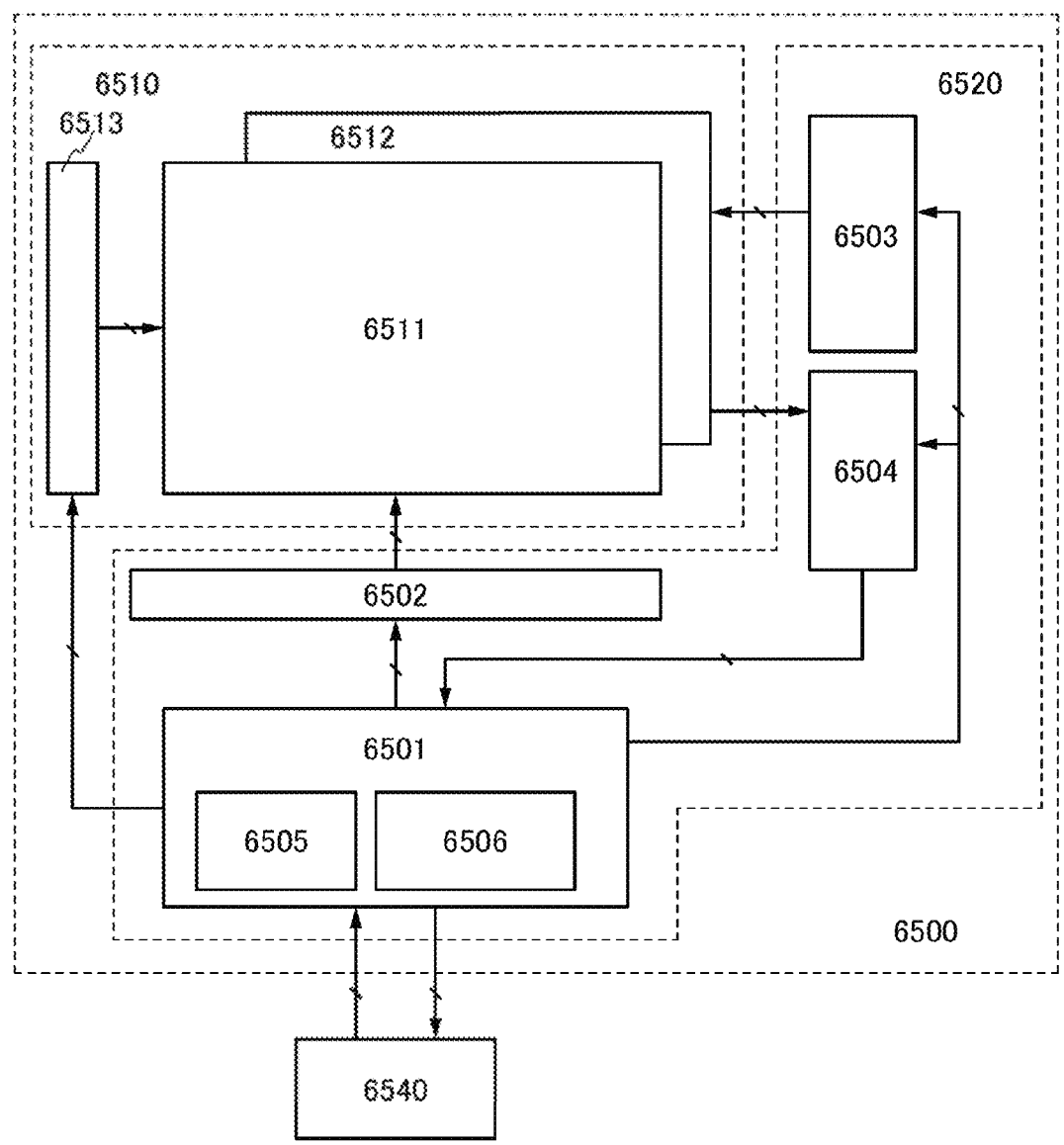
FIG. 79 is a block diagram of a touch panel module of one embodiment.

FIG. 79 is a block diagram of a touch panel module 6500. The touch panel module 6500 includes a touch panel 6510 and an IC 6520.

The touch panel 6510 includes a display portion 6511, an input portion 6512, and a scan line driver circuit 6513. The display portion 6511 includes a plurality of pixels, a plurality of signal lines, and a plurality of scan lines and has a function of displaying an image. The input portion 6512 includes a plurality of sensor elements for sensing an object that is in contact with or approaches the touch panel 6510 and functions as a touch sensor. The scan line driver circuit 6513 has a function of outputting scan signals to the scan lines included in the display portion 6511.

The display portion 6511 and the input portion 6512 are separately illustrated in the touch panel 6510 for simplicity; however, a so-called in-cell touch panel having both a function of displaying an image and a function of a touch sensor is preferable.

As a touch sensor that can be used for the input portion 6512, a capacitive touch sensor can be used. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive touch sensor is preferable because multiple points can be sensed simultaneously.

As the input portion 6512, any of various sensors that can sense the approach or contact of an object such as a finger or a stylus can be used. For the touch sensor, in addition to a capacitive type, a variety of types such as a resistive type, a surface acoustic wave type, an infrared type, and an optical type can be used, for example.

As typical examples of the in-cell touch panel, a hybrid in-cell type and a full-in-cell type can be given. The hybrid in-cell type refers to a structure in which an electrode and the like included in a touch sensor are provided for each of a substrate that supports a display element and a counter substrate. The full-in-cell type refers to a structure in which an electrode and the like included in a touch sensor are provided over a substrate that supports a display element. In the case of the full-in-cell touch panel, a structure of a counter substrate can be simplified, which is preferable. In particular, when an electrode included in a display element also serves as an electrode in a touch sensor in the full-in-cell touch sensor, a manufacturing process can be simplified and manufacturing cost can be reduced, which is preferable.

The resolution of the display portion 6511 is preferably as high as HD (number of pixels: 1280×720), FHD (number of pixels: 1920×1080), WQHD (number of pixels: 2560× 1440), WQXGA (number of pixels: 2560×1600), 4K (number of pixels: 3840×2160), or 8K (number of pixels: 7680× 4320). In particular, resolution of 4K, 8K, or higher is preferable. The pixel density (definition) of the pixels in the display portion 6511 is higher than or equal to 300 ppi, preferably higher than or equal to 500 ppi, more preferably higher than or equal to 800 ppi, more preferably higher than or equal to 1000 ppi, more preferably higher than or equal to 1200 ppi. The display portion 6511 with such high resolution and high definition enables an increase in a realistic sensation, sense of depth, and the like in personal use such as portable use and home use.

The IC 6520 includes a circuit unit 6501, a signal line driver circuit 6502, a sensor driver circuit 6503, and a sensing circuit 6504. The circuit unit 6501 includes a timing controller 6505, an image processing circuit 6506, and the like.

The signal line driver circuit 6502 has a function of outputting a video signal that is an analog signal to a signal line included in the display portion 6511. For example, the signal line driver circuit 6502 can include a shift register circuit and a buffer circuit in combination. The touch panel 6510 may include a demultiplexer circuit connected to a signal line.

The sensor driver circuit 6503 has a function of outputting a signal for driving a sensor element included in the input portion 6512. As the sensor driver circuit 6503, a shift register circuit and a buffer circuit can be used in combination, for example.

The sensing circuit 6504 has a function of outputting, to the circuit unit 6501, an output signal from the sensor element included in the input portion 6512. The sensing circuit 6504 can include an amplifier circuit and an analog-digital converter (ADC), for example. In that case, the sensing circuit 6504 converts an analog signal output from the input portion 6512 into a digital signal to be output to the circuit unit 6501.

The image processing circuit 6506 included in the circuit unit 6501 has a function of generating and outputting a signal for driving the display portion 6511 of the touch panel 6510, a function of generating and outputting a signal for driving the input portion 6512, and a function of analyzing a signal output from the input portion 6512 and outputting the signal to a CPU 6540.

As specific examples, the image processing circuit 6506 has the following functions: a function of generating a video signal in accordance with an instruction from the CPU 6540; a function of performing signal processing on a video signal in accordance with the specification of the display portion 6511, converting the signal into an analog video signal, and supplying the converted signal to the signal line driver circuit 6502; a function of generating a driving signal output to the sensor driver circuit 6503 in accordance with an instruction from the CPU 6540; and a function of analyzing a signal input from the sensing circuit 6504 and outputting the analyzed signal to the CPU 6540 as positional information.

The timing controller 6505 may have a function of generating a signal (e.g., a clock signal or a start pulse signal) on the basis of a synchronization signal included in a video signal or the like on which the image processing circuit 6506 performs processing and outputting the signal to the scan line driver circuit 6513 and the sensor driver circuit 6503. Furthermore, the timing controller 6505 may have a function of generating and outputting a signal for determining timing when the sensing circuit 6504 outputs a signal. Here, the timing controller 6505 preferably outputs a signal synchronized with the signal output to the scan line driver circuit 6513 and a signal synchronized with the signal output to the sensor driver circuit 6503. In particular, it is preferable that a period in which data in a pixel in the display portion 6511 is rewritten and a period in which sensing is performed with the input portion 6512 be separately provided. For example, the touch panel 6510 can be driven by dividing one frame period into a period in which data in a pixel is rewritten and a period in which sensing is performed. Furthermore, detection sensitivity and detection accuracy can be increased, for example, by providing two or more sensing periods in one frame period.

The image processing circuit 6506 can include a processor, for example. A microprocessor such as a digital signal processor (DSP) or a graphics processing unit (GPU) can be used, for example. Furthermore, such a microprocessor may be obtained with a programmable logic device (PLD) such as a field programmable gate array (FPGA) or a field programmable analog array (FPAA). The image processing circuit 6506 interprets and executes instructions from various programs with the processor to process various kinds of data and control programs. The programs executed by the processor may be stored in a memory region included in the processor or a memory device which is additionally provided.

A transistor which includes an oxide semiconductor in a channel formation region and has an extremely low off-state current can be used in the display portion 6511 or the scan line driver circuit 6513 included in the touch panel 6510, the circuit unit 6501, the signal line driver circuit 6502, the sensor driver circuit 6503, or the sensing circuit 6504 included in the IC 6520, the CPU 6540 provided outside the touch panel module 6500, or the like. With the use of the transistor having an extremely low off-state current as a switch for holding electric charge (data) which flows into a capacitor serving as a memory element, a long data retention period can be ensured. For example, by utilizing the characteristic for a register or a cache memory of the image processing circuit 6506, normally off computing is achieved where the image processing circuit 6506 operates only when needed and data on the previous processing is stored in the memory element in the rest of time; thus, power consumption of the touch panel module 6500 and an electronic device on which the touch panel module 6500 is mounted can be reduced.

Although the structure where the circuit unit 6501 includes the timing controller 6505 and the image processing circuit 6506 is used here, the image processing circuit 6506 itself or a circuit having a function of part of the image processing circuit 6506 may be provided outside the IC 6520. Alternatively, the CPU 6540 may have a function of the image processing circuit 6506 or part thereof. For example, the circuit unit 6501 can include the signal line driver circuit 6502, the sensor driver circuit 6503, the sensing circuit 6504, and the timing controller 6505.

Although the example where the IC 6520 includes the circuit unit 6501 is shown here, the structure where the circuit unit 6501 is not included in the IC 6520 may be employed. In that case, the IC 6520 can include the signal line driver circuit 6502, the sensor driver circuit 6503, and the sensing circuit 6504. For example, in the case where the touch panel module 6500 includes a plurality of ICs, the circuit unit 6501 may be separately provided and a plurality of ICs 6520 without the circuit unit 6501 may be provided, and alternatively, the IC 6520 and an IC including only the signal line driver circuit 6502 can be provided in combination.

When an IC has a function of driving the display portion 6511 of the touch panel 6510 and a function of driving the input portion 6512 as described above, the number of ICs mounted on the touch panel module 6500 can be reduced; accordingly, cost can be reduced.

Figure 80A:
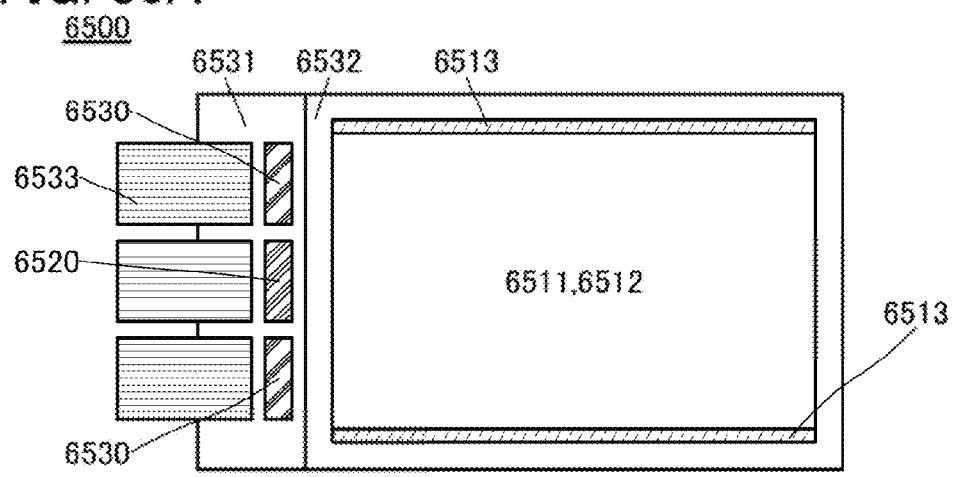
FIGS. 80A to 80C each illustrate a structure example of a touch panel module of one embodiment.
Figure 80B:
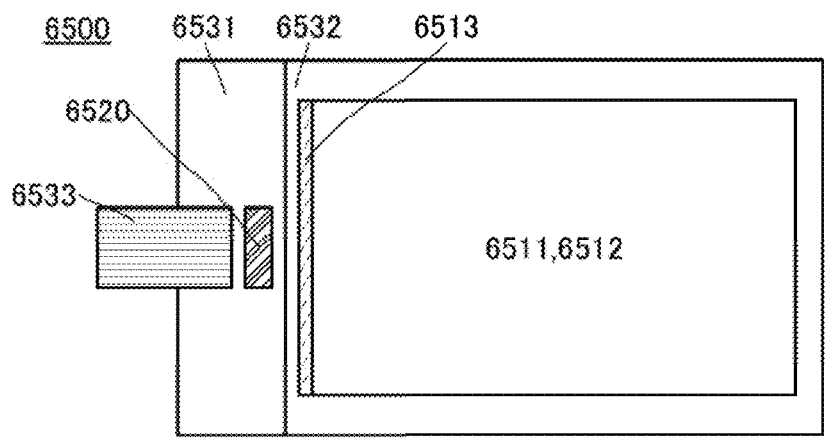
Figure 80C:
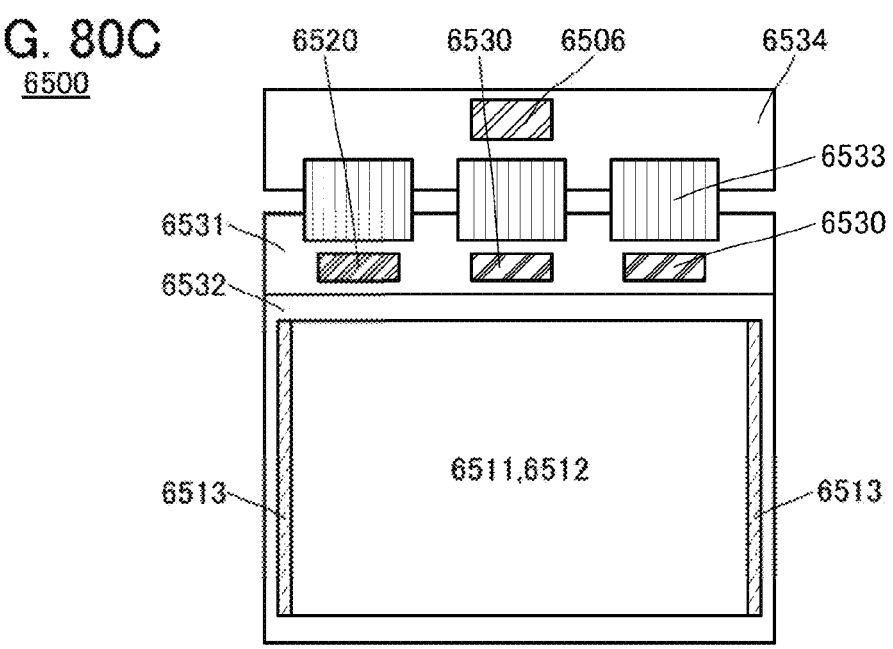

FIGS. 80A to 80C are each a schematic diagram of the touch panel module 6500 on which the IC 6520 is mounted.

In FIG. 80A, the touch panel module 6500 includes a substrate 6531, a counter substrate 6532, a plurality of FPCs 6533, the IC 6520, ICs 6530, and the like. The display portion 6511, the input portion 6512, and the scan line driver circuits 6513 are provided between the substrate 6531 and the counter substrate 6532. The IC 6520 and the ICs 6530 are mounted on the substrate 6531 by a COG method or the like.

The IC 6530 is an IC in which only the signal line driver circuit 6502 is provided in the above-described IC 6520 or an IC in which the signal line driver circuit 6502 and the circuit unit 6501 are provided in the above-described IC 6520. The IC 6520 and the ICs 6530 are supplied with a signal from the outside through the FPCs 6533. Furthermore, a signal can be output to the outside from the IC 6520 or the ICs 6530 through the FPCs 6533.

FIG. 80A illustrates an example where the display portion 6511 is positioned between two scan line driver circuits 6513. The ICs 6530 are provided in addition to the IC 6520. Such a structure is preferable in the case where the display portion 6511 has extremely high resolution.

FIG. 80B illustrates an example where one IC 6520 and one FPC 6533 are provided. It is preferable to bring functions into one IC 6520 in this manner because the number of components can be reduced. In the example in FIG. 80B, the scan line driver circuit 6513 is provided along a side close to the FPC 6533 among two short sides of the display portion 6511.

FIG. 80C illustrates an example where a printed circuit board (PCB) 6534 on which the image processing circuit 6506 and the like are mounted is provided. The ICs 6520 and 6530 over the substrate 6531 are electrically connected to the PCB 6534 through the FPCs 6533. The above-described structure without the image processing circuit 6506 can be applied to the IC 6520.

In each of FIGS. 80A to 80C, the IC 6520 or the IC 6530 may be mounted on the FPC 6533, not on the substrate 6531. For example, the IC 6520 or the IC 6530 may be mounted on the FPC 6533 by a chip on film (COF) method, a tape automated bonding (TAB) method, or the like.

A structure where the FPC 6533, the IC 6520 (and the IC 6530), or the like is provided on a short side of the display portion 6511 as illustrated in FIGS. 80A and 80B enables the frame of the display device to be narrowed; thus, the structure is preferably used for electronic devices such as smartphones, mobile phones, and tablet terminals, for example. The structure with the PCB 6534 illustrated in FIG. 80C can be preferably used for television devices, monitors, tablet terminals, or laptop personal computers, for example.

At least part of this embodiment can be implemented in combination with any of the other embodiments described in this specification as appropriate.

Embodiment 6

In this embodiment, a display module and electronic devices that include the display device of one embodiment of the present invention will be described with reference to FIG. 81, FIGS. 82A to 82H, and FIGS. 83A and 83B.

Figure 81:
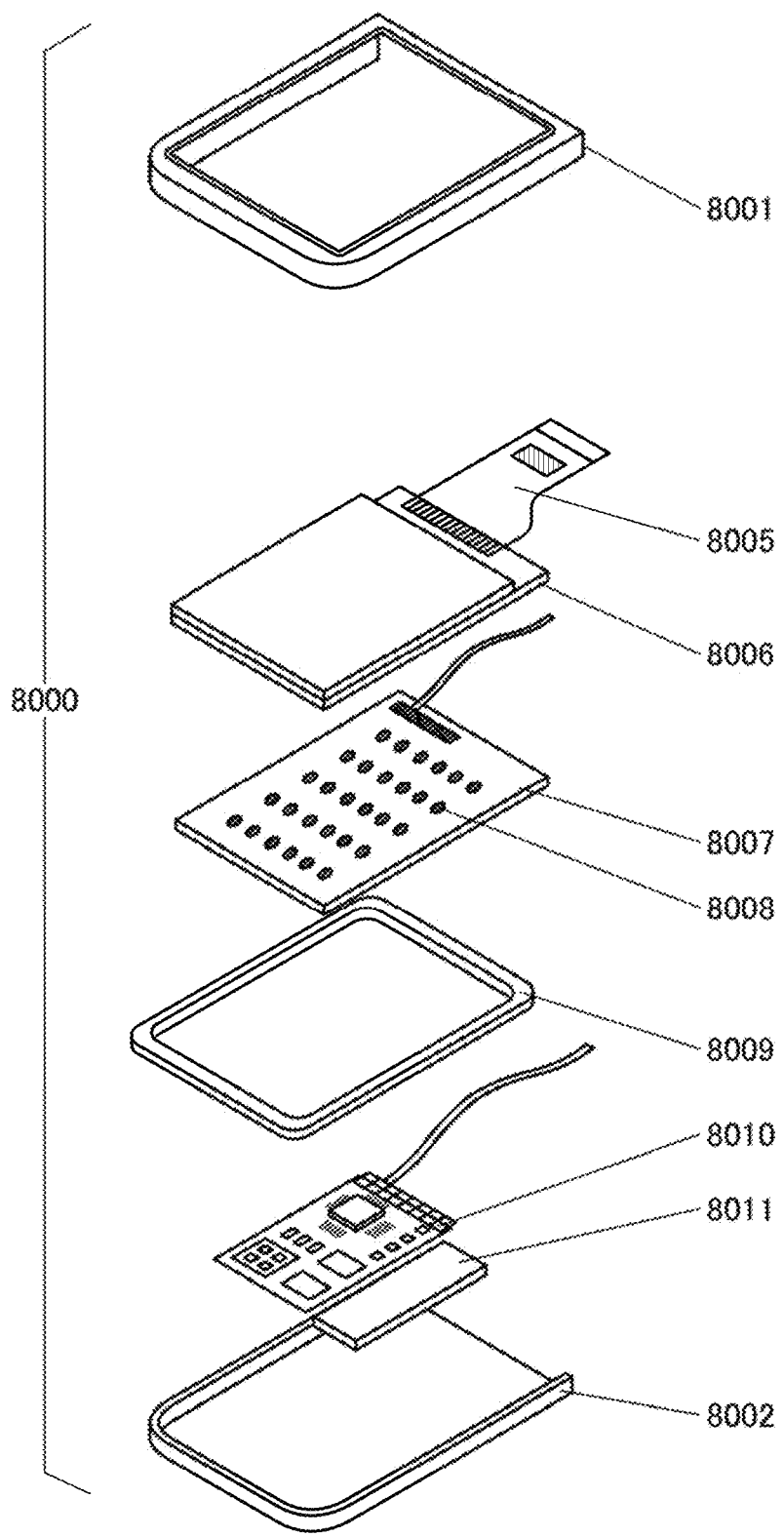
FIG. 81 illustrates a display module of one embodiment.

In a display module 8000 illustrated in FIG. 81, a display panel 8006 connected to an FPC 8005, a backlight 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the size of the display panel 8006.

The display panel 8006 includes a capacitive touch sensor.

The backlight 8007 includes a light source 8008.

Note that although a structure in which the light source 8008 is provided over the backlight 8007 is illustrated in FIG. 81, one embodiment of the present invention is not limited to this structure. For example, a structure in which the light source 8008 is provided at an end portion of the backlight 8007 and a light diffusion plate is further provided may be employed.

Note that the backlight 8007 need not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 may also function as a radiator plate.

The printed board 8010 is provided with a power supply circuit and a signal processing circuit for outputting a video signal and a clock signal. As a power source for supplying electric power to the power supply circuit, an external commercial power source or a power source using the battery 8011 provided separately may be used. The battery 8011 can be omitted in the case of using a commercial power source.

The display module 8000 can be additionally provided with a component such as a polarizing plate, a retardation plate, or a prism sheet.

FIGS. 82A to 82H and FIGS. 83A and 83B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 82A:
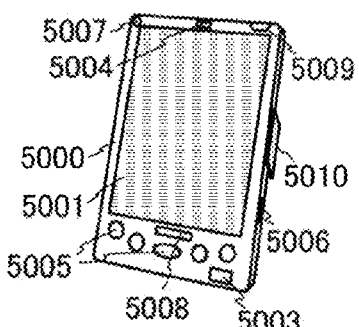
FIGS. 82A to 82H each illustrate an electronic device of one embodiment.
Figure 82B:
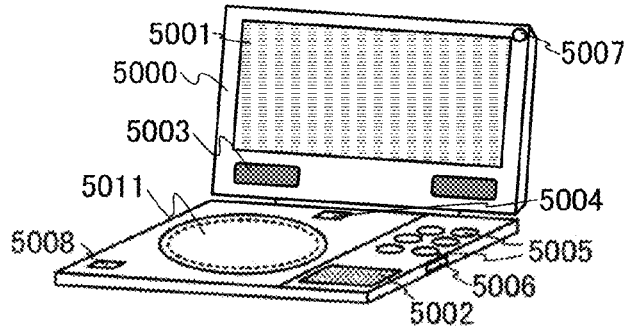
Figure 82C:
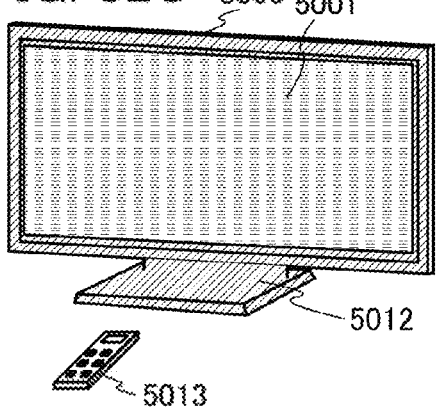
Figure 82D:
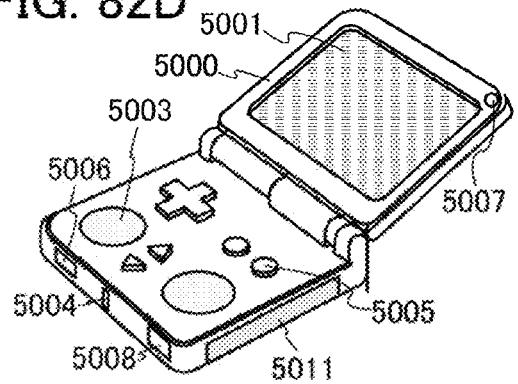
Figure 82E:
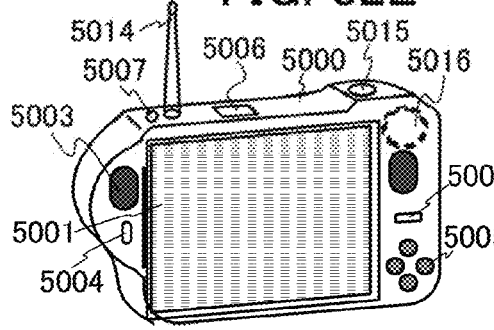
Figure 82F:
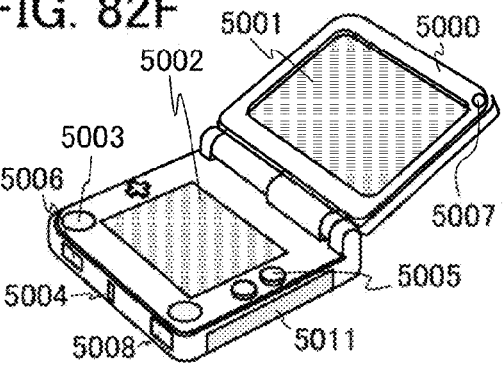
Figure 82G:
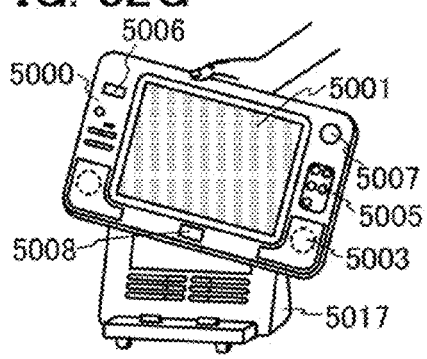
Figure 82H:
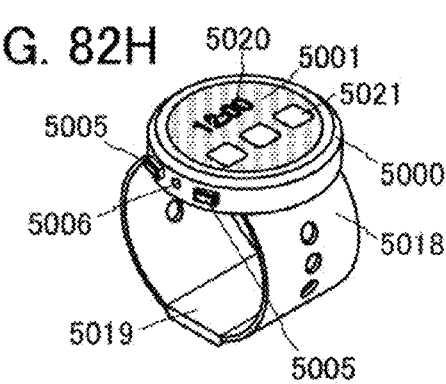
Figure 83A:
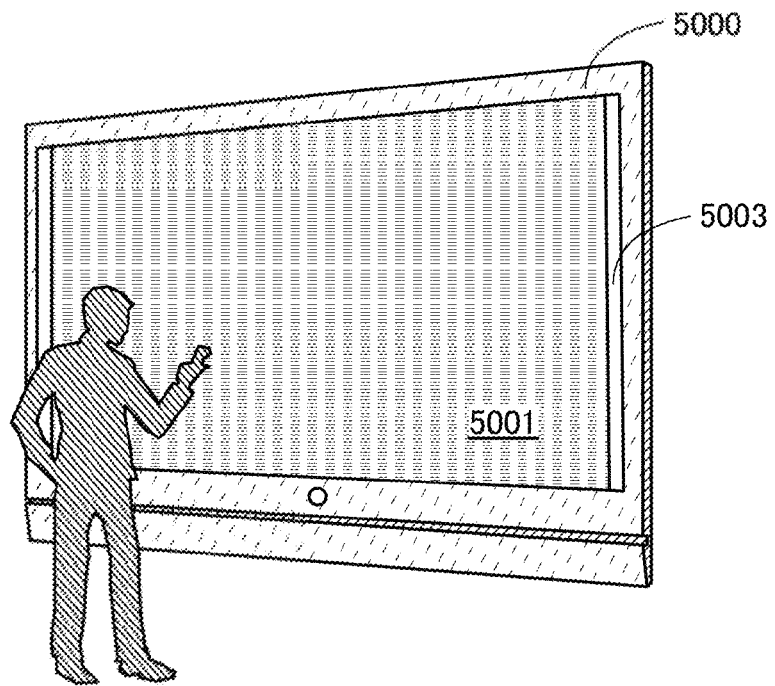
FIGS. 83A and 83B each illustrate an electronic device of one embodiment.
Figure 83B:
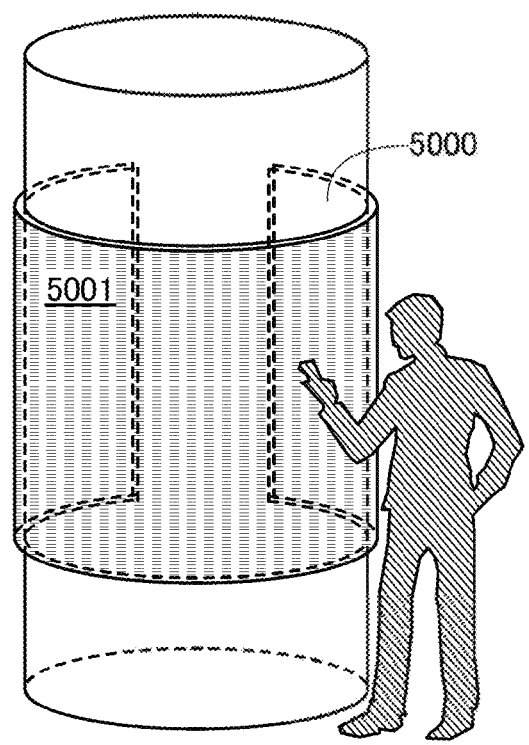

FIG. 82A illustrates a mobile computer, which can include a switch 5009, an infrared port 5010, and the like in addition to the above components. FIG. 82B illustrates a portable image reproducing device provided with a recording medium (e.g., a DVD reproducing device), which can include a second display portion 5002, a recording medium reading portion 5011, and the like in addition to the above components. FIG. 82C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013. FIG. 82D illustrates a portable game machine, which can include the recording medium reading portion 5011 and the like in addition to the above components. FIG. 82E illustrates a digital camera that has a television reception function and can include an antenna 5014, a shutter button 5015, an image receiving portion 5016, and the like in addition to the above components. FIG. 82F illustrates a portable game machine, which can include the second display portion 5002, the recording medium reading portion 5011, and the like in addition to the above components. FIG. 82G illustrates a portable television receiver, which can include a charger 5017 capable of transmitting and receiving signals, and the like in addition to the above components. FIG. 82H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like. FIG. 83A illustrates a digital signage. FIG. 83B illustrates a digital signage mounted on a cylindrical pillar.

The electronic devices illustrated in FIGS. 82A to 82H and FIGS. 83A and 83B can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is utilized on a plurality of display portions, or the like. Furthermore, the electronic device including an image receiving portion can have a function of taking a still image, a function of taking a moving image, a function of automatically or manually correcting a taken image, a function of storing a taken image in a recording medium (an external recording medium or a recording medium incorporated in the camera), a function of displaying a taken image on a display portion, or the like. Note that the functions of the electronic devices illustrated in FIGS. 82A to 82H and FIGS. 83A and 83B are not limited thereto, and the electronic devices can have a variety of functions.

The electronic devices in this embodiment each include a display portion for displaying some kind of information. The display device of one embodiment of the present invention can be used for the display portion.

At least part of this embodiment can be implemented in combination with any of the other embodiments described in this specification as appropriate.

This application is based on Japanese Patent Application serial no. 2015-120272 filed with Japan Patent Office on Jun. 15, 2015, and Japanese Patent Application serial no. 2016-101794 filed with Japan Patent Office on May 20, 2016, the entire contents of which are hereby incorporated by reference.

What is claimed is:
1. A display device comprising:
a first substrate;
a first pixel comprising:
  a first transistor;
  a first pixel electrode electrically connected to the first transistor; and
  a first conductive film comprising a region functioning as a common electrode;
a second pixel comprising:
  a second transistor;
  a second pixel electrode electrically connected to the second transistor; and
  a second conductive film comprising a region functioning as a common electrode;
a first insulating film over the first conductive film and the second pixel electrode;
a second substrate over the first insulating film; and
a third conductive film and a fourth conductive film over the second substrate,
wherein the first pixel and the second pixel are over the first substrate,
wherein the first conductive film and the second pixel electrode are on a same plane, and
wherein the first pixel electrode and the second conductive film are over the first insulating film.

2. The display device according to claim 1, wherein in each of the first transistor and the second transistor, a semiconductor layer where a channel is formed comprises polycrystalline silicon.

3. The display device according to claim 1, wherein in each of the first transistor and the second transistor, a semiconductor layer where a channel is formed comprises an oxide semiconductor.

4. The display device according to claim 1,
wherein the first transistor and the second transistor each comprise:
  a gate electrode;
  a gate insulating film over the gate electrode;
  a first oxide semiconductor film in a position overlapping with the gate electrode over the gate insulating film;
  a source electrode and a drain electrode electrically connected to the first oxide semiconductor film;
  a second insulating film over the first oxide semiconductor film, the source electrode, and the drain electrode; and
  a second oxide semiconductor film in a position overlapping with the first oxide semiconductor film over the second insulating film,
wherein the first insulating film is over the second oxide semiconductor film, and
wherein the first conductive film and the second pixel electrode each comprise the second oxide semiconductor film.

5. The display device according to claim 4,
wherein the first oxide semiconductor film and the second oxide semiconductor film each comprise In, Zn, and oxygen, and
wherein the first oxide semiconductor film and the second oxide semiconductor film each comprise Al, Ti, Ga, Y, Zr, La, Ce, Nd, Sn, or Hf.

6. The display device according to claim 4,
wherein the second insulating film comprises oxygen, and
wherein the first insulating film comprises hydrogen.

7. The display device according to claim 1,
wherein the first conductive film serves as a first electrode of a touch sensor,
wherein the second conductive film serves as a second electrode of the touch sensor, and
wherein the first conductive film and the second conductive film intersect with each other.

8. An electronic device comprising:
the display device according to claim 1; and
at least one of a switch, a speaker, and a housing.

9. A display device comprising:
a first substrate;
a first pixel comprising:

a first transistor;
a first pixel electrode electrically connected to the first transistor; and
a first conductive film;
a second pixel comprising:
a second transistor;
a second pixel electrode electrically connected to the second transistor; and
a second conductive film;
a first insulating film over the first conductive film and the second pixel electrode; and
a second substrate over the first insulating film,
wherein the first pixel and the second pixel are over the first substrate,
wherein the first conductive film and the second pixel electrode are on a same plane, and
wherein the first pixel electrode and the second conductive film are over the first insulating film.

10. The display device according to claim 9, wherein in each of the first transistor and the second transistor, a semiconductor layer where a channel is formed comprises polycrystalline silicon.

11. The display device according to claim 9, wherein in each of the first transistor and the second transistor, a semiconductor layer where a channel is formed comprises an oxide semiconductor.

12. The display device according to claim 9,
wherein the first transistor and the second transistor each comprise:
a gate electrode;
a gate insulating film over the gate electrode;
a first oxide semiconductor film in a position overlapping with the gate electrode over the gate insulating film;
a source electrode and a drain electrode electrically connected to the first oxide semiconductor film;
a second insulating film over the first oxide semiconductor film, the source electrode, and the drain electrode; and
a second oxide semiconductor film in a position overlapping with the first oxide semiconductor film over the second insulating film,
wherein the first insulating film is over the second oxide semiconductor film, and
wherein the first conductive film and the second pixel electrode each comprise the second oxide semiconductor film.

13. The display device according to claim 12,
wherein the first oxide semiconductor film and the second oxide semiconductor film each comprise In, Zn, and oxygen, and
wherein the first oxide semiconductor film and the second oxide semiconductor film each comprise Al, Ti, Ga, Y, Zr, La, Ce, Nd, Sn, or Hf.

14. The display device according to claim 12,
wherein the second insulating film comprises oxygen, and
wherein the first insulating film comprises hydrogen.

15. The display device according to claim 9,
wherein the first conductive film serves as a first electrode of a touch sensor,
wherein the second conductive film serves as a second electrode of the touch sensor, and
wherein the first conductive film and the second conductive film intersect with each other.

16. An electronic device comprising:
the display device according to claim 9; and
at least one of a switch, a speaker, and a housing.

* * * * *